(12) United States Patent
Valouch et al.

(10) Patent No.: US 10,775,505 B2
(45) Date of Patent: Sep. 15, 2020

(54) DETECTOR FOR AN OPTICAL DETECTION OF AT LEAST ONE OBJECT

(71) Applicant: Trinamix GmbH, Ludwigshafen (DE)

(72) Inventors: Sebastian Valouch, Lampertheim (DE); Ingmar Bruder, Neuleiningen (DE); Robert Send, Karlsruhe (DE); Christoph Lungenschmied, Mannheim (DE); Wilfried Hermes, Karlsruhe (DE); Erwin Thiel, Siegen (DE); Stephan Irle, Siegen (DE)

(73) Assignee: Trinamix GmbH, Ludwigshafen (DE)

( * ) Notice: Subject to any disclaimer, the term of this patent is extended or adjusted under 35 U.S.C. 154(b) by 344 days.

(21) Appl. No.: 15/547,664

(22) PCT Filed: Jan. 28, 2016

(86) PCT No.: PCT/EP2016/051817
§ 371 (c)(1),
(2) Date: Jul. 31, 2017

(87) PCT Pub. No.: WO2016/120392
PCT Pub. Date: Aug. 4, 2016

(65) Prior Publication Data
US 2018/0017679 A1 Jan. 18, 2018

(30) Foreign Application Priority Data

Jan. 30, 2015 (EP) ..................................... 15153215
Mar. 3, 2015 (EP) ..................................... 15157363
(Continued)

(51) Int. Cl.
*G01S 17/66* (2006.01)
*G01S 7/481* (2006.01)
(Continued)

(52) U.S. Cl.
CPC ............ *G01S 17/66* (2013.01); *A63F 13/213* (2014.09); *A63F 13/30* (2014.09); *A63F 13/655* (2014.09);
(Continued)

(58) Field of Classification Search
CPC . G01C 3/06; G01S 17/66; G01S 17/89; G01S 17/46; G01S 3/786; G01S 3/781
See application file for complete search history.

(56) References Cited

U.S. PATENT DOCUMENTS 3,035,176 A 5/1962 Kis et al.
3,112,197 A 11/1963 Neugebauer et al.
(Continued)

FOREIGN PATENT DOCUMENTS

CA 1065054 10/1979
CA 2196563 12/1996
(Continued)

OTHER PUBLICATIONS

International Search Report and Written Opinion dated May 27, 2016, in PCT/EP2016/051817, filed Jan. 28, 2016.
(Continued)

*Primary Examiner* — Luke D Ratcliffe
(74) *Attorney, Agent, or Firm* — Oblon, McClelland, Maier & Neustadt, L.L.P.

(57) ABSTRACT

Disclosed herein is a detector (110) containing: at least one longitudinal optical sensor (114), wherein the longitudinal optical sensor (114); and at least one evaluation device (140), wherein the evaluation device (140) is designed to generate at least one item of information on a longitudinal position of the object (112) by evaluating the longitudinal sensor signal of the longitudinal optical sensor (114). Also
(Continued)

disclosed herein are articles containing the detector (110), and methods for optical detection of objects using the detector (110).

22 Claims, 22 Drawing Sheets

(30) Foreign Application Priority Data

| Jul. 27, 2015 | (EP) | 15178493 |
|---|---|---|
| Oct. 28, 2015 | (EP) | 15191960 |
| Dec. 3, 2015 | (EP) | 15197728 |

(51) Int. Cl.

| H01L 31/09 | (2006.01) |
|---|---|
| H01L 27/30 | (2006.01) |
| H01L 27/146 | (2006.01) |
| H01L 31/0224 | (2006.01) |
| A63F 13/213 | (2014.01) |
| A63F 13/30 | (2014.01) |
| A63F 13/655 | (2014.01) |
| G01S 17/06 | (2006.01) |
| H01L 51/42 | (2006.01) |
| H01L 51/00 | (2006.01) |

(52) U.S. Cl.
CPC ............ *G01S 7/4816* (2013.01); *G01S 17/06* (2013.01); *H01L 27/14601* (2013.01); *H01L 27/14665* (2013.01); *H01L 27/307* (2013.01); *H01L 31/0224* (2013.01); *H01L 31/09* (2013.01); *H01L 51/4253* (2013.01); *H01L 51/0036* (2013.01)

(56) References Cited

U.S. PATENT DOCUMENTS

| 3,384,752 | A | 5/1968 | Odone |
|---|---|---|---|
| 3,562,785 | A | 2/1971 | Craig |
| 3,564,268 | A | 2/1971 | Bayne et al. |
| 3,937,950 | A | 2/1976 | Hosoe et al. |
| 3,954,340 | A | 5/1976 | Blomqvist et al. |
| 4,023,033 | A | 5/1977 | Bricot et al. |
| 4,053,240 | A | 10/1977 | Aizawa et al. |
| 4,079,247 | A | 3/1978 | Briscot et al. |
| 4,256,513 | A | 3/1981 | Yoshida |
| 4,286,035 | A | 8/1981 | Nishizima et al. |
| 4,346,293 | A | 8/1982 | Fetzer |
| 4,469,945 | A | 9/1984 | Hoeberechts et al. |
| 4,524,276 | A | 6/1985 | Ohtombe |
| 4,565,761 | A | 1/1986 | Katagiri et al. |
| 4,584,704 | A | 4/1986 | Ferren |
| 4,593,187 | A | 6/1986 | Grotts et al. |
| 4,602,158 | A | 7/1986 | Barrett |
| 4,603,258 | A | 7/1986 | Sher et al. |
| 4,647,193 | A | 3/1987 | Rosenfeld |
| 4,675,535 | A | 6/1987 | Tsunekawa et al. |
| 4,694,172 | A | 9/1987 | Powell et al. |
| 4,760,004 | A | 7/1988 | Rochat et al. |
| 4,760,151 | A | 7/1988 | Rochat et al. |
| 4,767,211 | A | 8/1988 | Munakata et al. |
| 4,773,751 | A | 9/1988 | Matsuda et al. |
| 4,927,721 | A | 5/1990 | Gratzel et al. |
| 4,952,472 | A | 8/1990 | Baranyi et al. |
| 5,082,363 | A | 1/1992 | Nakanishi et al. |
| 5,216,476 | A | 6/1993 | Lanckton |
| 5,227,985 | A | 7/1993 | Dementhon et al. |
| 5,235,377 | A | 8/1993 | Ide et al. |
| 5,291,066 | A | 3/1994 | Neugebauer et al. |
| 5,350,644 | A | 9/1994 | Graetzel et al. |
| 5,355,241 | A | 10/1994 | Kelley |
| 5,375,008 | A | 12/1994 | Guerreri |
| 5,512,997 | A | 4/1996 | Ogawa |
| 5,576,975 | A | 11/1996 | Sasaki et al. |
| 5,589,928 | A | 12/1996 | Babbitt et al. |
| 5,856,844 | A | 1/1999 | Batterman et al. |
| 6,061,122 | A | 5/2000 | Hoshino et al. |
| 6,163,371 | A | 12/2000 | Kato et al. |
| 6,191,881 | B1 | 2/2001 | Tajima |
| 6,229,913 | B1 | 5/2001 | Nayar et al. |
| 6,266,142 | B1 | 7/2001 | Junkins et al. |
| 6,359,211 | B1 | 3/2002 | Spitler et al. |
| 6,417,836 | B1 | 7/2002 | Kumar et al. |
| 6,512,233 | B1 | 1/2003 | Sato et al. |
| 6,785,028 | B1 * | 8/2004 | Atsuumi ............... G02B 26/128 250/201.4 |
| 6,930,297 | B1 | 8/2005 | Nakamura |
| 6,995,445 | B2 | 2/2006 | Forrest et al. |
| 7,022,966 | B2 | 4/2006 | Gonzo et al. |
| 7,049,601 | B2 | 5/2006 | Agano |
| 7,196,317 | B1 | 3/2007 | Meissner et al. |
| 7,247,851 | B2 | 7/2007 | Okada et al. |
| 7,301,608 | B1 | 11/2007 | Mendenhall et al. |
| 7,417,716 | B2 | 8/2008 | Nagasaka et al. |
| 7,626,569 | B2 | 12/2009 | Lanier |
| 7,677,742 | B2 | 3/2010 | Hillmer et al. |
| 7,768,498 | B2 | 8/2010 | Wey |
| 7,773,070 | B2 | 8/2010 | Trisnadi et al. |
| 7,939,932 | B2 | 5/2011 | Martin |
| 8,013,901 | B2 | 9/2011 | Fukuhara et al. |
| 8,019,166 | B2 | 9/2011 | Cheng et al. |
| 8,107,056 | B1 | 1/2012 | Riza |
| 8,144,173 | B2 | 3/2012 | Baba |
| 8,228,299 | B1 | 7/2012 | Maloney et al. |
| 8,231,809 | B2 | 7/2012 | Pschirer et al. |
| 8,345,003 | B1 | 1/2013 | Trisnadi et al. |
| 8,363,526 | B2 | 1/2013 | Hotta et al. |
| 8,390,793 | B2 | 3/2013 | Yamaguchi et al. |
| 8,411,289 | B2 | 4/2013 | Takahashi |
| 8,477,580 | B2 | 7/2013 | Yamamoto et al. |
| 8,563,855 | B2 | 10/2013 | Pschirer et al. |
| 8,593,565 | B2 | 11/2013 | Shuster |
| 8,902,354 | B2 | 12/2014 | Shuster |
| 8,908,157 | B2 | 12/2014 | Eisele et al. |
| 9,104,910 | B2 | 8/2015 | Huang |
| 9,385,326 | B2 | 7/2016 | Wonneberger et al. |
| 9,389,315 | B2 | 7/2016 | Bruder et al. |
| 9,428,518 | B2 | 8/2016 | Wonneberger et al. |
| 9,557,856 | B2 | 1/2017 | Send et al. |
| 9,646,365 | B1 | 5/2017 | Hinkel et al. |
| 9,665,182 | B2 | 5/2017 | Send et al. |
| 9,741,954 | B2 | 8/2017 | Bruder et al. |
| 9,787,899 | B1 | 10/2017 | Hinkel et al. |
| 9,829,564 | B2 | 11/2017 | Bruder et al. |
| 9,919,999 | B2 | 3/2018 | Koenemann et al. |
| 9,958,535 | B2 | 5/2018 | Send et al. |
| 9,989,623 | B2 | 6/2018 | Send et al. |
| 10,012,532 | B2 | 7/2018 | Send et al. |
| 10,094,927 | B2 | 10/2018 | Send et al. |
| 10,120,078 | B2 | 11/2018 | Bruder et al. |
| 10,290,817 | B2 | 5/2019 | Battagliarin et al. |
| 2001/0025938 | A1 | 10/2001 | Imai |
| 2002/0011576 | A1 | 1/2002 | Cho et al. |
| 2003/0017360 | A1 | 1/2003 | Tai et al. |
| 2003/0094607 | A1 | 5/2003 | Guenther et al. |
| 2003/0128351 | A1 | 7/2003 | Schmidt |
| 2003/0132391 | A1 | 7/2003 | Agano |
| 2003/0227635 | A1 | 12/2003 | Muller |
| 2004/0178325 | A1 | 9/2004 | Forrest et al. |
| 2004/0190117 | A1 | 9/2004 | Kubaink |
| 2004/0216625 | A1 | 11/2004 | Birnstock et al. |
| 2005/0052120 | A1 | 3/2005 | Gupta et al. |
| 2005/0061957 | A1 | 3/2005 | Kase |
| 2005/0122308 | A1 | 6/2005 | Bell et al. |
| 2005/0184301 | A1 | 8/2005 | Nagasaka et al. |
| 2005/0217720 | A1 | 10/2005 | Rey-Mermet et al. |
| 2005/0268957 | A1 | 12/2005 | Enomoto et al. |
| 2005/0269616 | A1 | 12/2005 | Andriessen |
| 2006/0044546 | A1 | 3/2006 | Lewin et al. |
| 2006/0049397 | A1 | 3/2006 | Pfeiffer et al. |
| 2006/0065833 | A1 | 3/2006 | Craig et al. |

(56) References Cited

U.S. PATENT DOCUMENTS

| | | |
|---|---|---|
| 2006/0075585 A1 | 4/2006 | Krieger et al. |
| 2006/0082546 A1 | 4/2006 | Wey |
| 2007/0008515 A1 | 1/2007 | Otani et al. |
| 2007/0010924 A1 | 1/2007 | Otani et al. |
| 2007/0046625 A1 | 3/2007 | Yee |
| 2007/0080925 A1 | 4/2007 | Radivojevic et al. |
| 2007/0109558 A1 | 5/2007 | Harding |
| 2007/0122927 A1 | 5/2007 | Li et al. |
| 2007/0176165 A1 | 8/2007 | Forrest et al. |
| 2007/0183047 A1 | 8/2007 | Phillips et al. |
| 2007/0206181 A1 | 9/2007 | Arenberg et al. |
| 2008/0013005 A1 | 1/2008 | Deane |
| 2008/0080789 A1 | 4/2008 | Marks |
| 2008/0157965 A1 | 7/2008 | Shahar |
| 2008/0170750 A1 | 7/2008 | Gordon |
| 2008/0259310 A1 | 10/2008 | Wada |
| 2008/0269482 A1 | 10/2008 | Pschirer et al. |
| 2008/0284925 A1 | 11/2008 | Han |
| 2008/0297487 A1 | 12/2008 | Hotelling et al. |
| 2009/0009747 A1 | 1/2009 | Wolf |
| 2009/0046543 A1 | 2/2009 | De Hoog et al. |
| 2009/0097010 A1 | 4/2009 | Yamaguchi |
| 2009/0153841 A1 | 6/2009 | Ophey et al. |
| 2009/0185158 A1 | 7/2009 | Wolf |
| 2009/0188547 A1 | 7/2009 | Hayashi et al. |
| 2009/0225319 A1 | 9/2009 | Lee |
| 2009/0231582 A1 | 9/2009 | Aebischer |
| 2009/0322677 A1 | 12/2009 | Lee et al. |
| 2010/0073462 A1 | 3/2010 | Lee et al. |
| 2010/0091263 A1 | 4/2010 | Kumagai et al. |
| 2010/0141927 A1 | 6/2010 | Hashimoto et al. |
| 2010/0141964 A1 | 6/2010 | Horsch |
| 2010/0194942 A1 | 8/2010 | Wada |
| 2010/0231513 A1 | 9/2010 | Deliwala |
| 2010/0258179 A1 | 10/2010 | Wieting |
| 2010/0279458 A1 | 11/2010 | Yeh |
| 2010/0282309 A1 | 11/2010 | Pschirer et al. |
| 2010/0283868 A1 | 11/2010 | Clark et al. |
| 2010/0297405 A1 | 11/2010 | Flores et al. |
| 2011/0032365 A1 | 2/2011 | Yett |
| 2011/0055846 A1 | 3/2011 | Perez et al. |
| 2011/0096319 A1 | 4/2011 | Otani et al. |
| 2011/0099105 A1 | 4/2011 | Mennie et al. |
| 2011/0103215 A1 | 5/2011 | Hotta et al. |
| 2011/0122287 A1 | 5/2011 | Kunishige et al. |
| 2011/0123188 A1 | 5/2011 | Cardwell et al. |
| 2011/0127788 A1 | 6/2011 | Nakanishi |
| 2011/0181553 A1 | 7/2011 | Brown et al. |
| 2011/0194097 A1 | 8/2011 | Yamaguchi et al. |
| 2011/0284756 A1 | 11/2011 | Miko et al. |
| 2011/0286661 A1 | 11/2011 | Lee et al. |
| 2011/0297235 A1 | 12/2011 | Bergmann |
| 2011/0306413 A1 | 12/2011 | Bickerstaff et al. |
| 2011/0317146 A1 | 12/2011 | Gu et al. |
| 2012/0013885 A1 | 1/2012 | Yang et al. |
| 2012/0061587 A1 | 3/2012 | Wu |
| 2012/0062517 A1 | 3/2012 | Lai et al. |
| 2012/0063287 A1 | 3/2012 | Yamamoto et al. |
| 2012/0105690 A1 | 5/2012 | Waqas et al. |
| 2012/0160298 A1 | 6/2012 | Kanamoto et al. |
| 2012/0162410 A1 | 6/2012 | Vaillant |
| 2012/0206336 A1 | 8/2012 | Bruder et al. |
| 2012/0242867 A1 | 9/2012 | Shuster |
| 2012/0249998 A1 | 10/2012 | Eisele et al. |
| 2012/0250137 A1 | 10/2012 | Maxik et al. |
| 2012/0262365 A1 | 10/2012 | Mallinson |
| 2012/0262696 A1 | 10/2012 | Eisele et al. |
| 2012/0289672 A1 | 11/2012 | Kastler et al. |
| 2012/0293651 A1 | 11/2012 | Kawamata et al. |
| 2012/0320160 A1 | 12/2012 | Drazic |
| 2012/0328906 A1 | 12/2012 | Kwon et al. |
| 2013/0033579 A1 | 2/2013 | Wajs |
| 2013/0076695 A1 | 3/2013 | Gomez et al. |
| 2013/0135604 A1 | 5/2013 | Gogolla et al. |
| 2013/0201492 A1 | 8/2013 | Takahashi |
| 2013/0222551 A1 | 8/2013 | Shamir et al. |
| 2013/0235390 A1 | 9/2013 | Holzapfel et al. |
| 2013/0266210 A1 | 10/2013 | Morgan-Mar et al. |
| 2013/0271818 A1 | 10/2013 | Maxik et al. |
| 2013/0320302 A1 | 12/2013 | Park et al. |
| 2014/0015242 A1 | 1/2014 | Forrest |
| 2014/0043610 A1 | 2/2014 | Engel et al. |
| 2014/0066656 A1 | 3/2014 | Bruder et al. |
| 2014/0078376 A1 | 3/2014 | Shuster |
| 2014/0124782 A1 | 5/2014 | Jung et al. |
| 2014/0132724 A1 | 5/2014 | Choi et al. |
| 2014/0209789 A1 | 7/2014 | Hu |
| 2014/0211295 A1 | 7/2014 | Maxik et al. |
| 2014/0217329 A1 | 8/2014 | Hayoz et al. |
| 2014/0233028 A1 | 8/2014 | Englund |
| 2014/0291480 A1* | 10/2014 | Bruder ............... G01C 3/06 250/206 |
| 2014/0347442 A1 | 11/2014 | Wang et al. |
| 2014/0368726 A1 | 12/2014 | Gladnick |
| 2015/0029326 A1 | 1/2015 | Backman et al. |
| 2015/0085166 A1 | 3/2015 | Shuster |
| 2015/0111337 A1 | 4/2015 | Welker et al. |
| 2015/0124241 A1 | 5/2015 | Eisele et al. |
| 2015/0124268 A1 | 5/2015 | Bruder et al. |
| 2015/0132887 A1 | 5/2015 | Welker et al. |
| 2015/0170400 A1 | 6/2015 | Seitz et al. |
| 2015/0286340 A1 | 10/2015 | Send et al. |
| 2015/0346911 A1 | 12/2015 | Christiansson |
| 2015/0372046 A1 | 12/2015 | Kim et al. |
| 2016/0099429 A1 | 4/2016 | Bruder et al. |
| 2016/0124074 A1 | 5/2016 | Wonneberger et al. |
| 2016/0127664 A1 | 5/2016 | Bruder et al. |
| 2016/0139243 A1 | 5/2016 | Send et al. |
| 2016/0140786 A1 | 5/2016 | Wang |
| 2016/0155575 A1 | 6/2016 | Yamato et al. |
| 2016/0177177 A1 | 6/2016 | Koenemann et al. |
| 2016/0211464 A1 | 7/2016 | Tanabe et al. |
| 2016/0218302 A1 | 7/2016 | Hermes et al. |
| 2016/0224110 A1 | 8/2016 | Massonneau et al. |
| 2016/0248021 A1 | 8/2016 | Sundarraj et al. |
| 2016/0255323 A1 | 9/2016 | Wajs |
| 2016/0266257 A1 | 9/2016 | Bruder et al. |
| 2016/0286199 A1 | 9/2016 | Wajs et al. |
| 2016/0320489 A1 | 11/2016 | Send et al. |
| 2016/0364015 A1 | 12/2016 | Send et al. |
| 2017/0039793 A1 | 2/2017 | Send et al. |
| 2017/0074652 A1 | 3/2017 | Send et al. |
| 2017/0082426 A1 | 3/2017 | Bruder et al. |
| 2017/0082486 A1 | 3/2017 | Send et al. |
| 2017/0123593 A1 | 5/2017 | Send et al. |
| 2017/0183295 A1 | 6/2017 | Koenemann et al. |
| 2017/0205230 A1 | 7/2017 | Send et al. |
| 2017/0219694 A1 | 8/2017 | Send et al. |
| 2017/0219709 A1 | 8/2017 | Send et al. |
| 2017/0237926 A1 | 8/2017 | Bruder et al. |
| 2017/0250334 A1 | 8/2017 | Hermes et al. |
| 2017/0263868 A1 | 9/2017 | Tanabe et al. |
| 2017/0309828 A1 | 10/2017 | Tanabe et al. |
| 2017/0363465 A1 | 12/2017 | Send et al. |
| 2017/0363741 A1 | 12/2017 | Send et al. |
| 2018/0003993 A1 | 1/2018 | Send et al. |
| 2018/0007343 A1 | 1/2018 | Send et al. |
| 2018/0017679 A1 | 1/2018 | Valouch et al. |
| 2018/0031672 A1 | 2/2018 | Bruder et al. |
| 2018/0044357 A1 | 2/2018 | Spielmann et al. |
| 2018/0067213 A1 | 3/2018 | Send et al. |
| 2018/0136319 A1 | 5/2018 | Send et al. |
| 2018/0182980 A1 | 6/2018 | Lennartz et al. |
| 2018/0210064 A1 | 7/2018 | Send et al. |
| 2018/0231376 A1 | 8/2018 | Send et al. |
| 2018/0238993 A1 | 8/2018 | Send et al. |
| 2018/0243045 A1 | 8/2018 | Franjic et al. |
| 2018/0249051 A1 | 8/2018 | Send et al. |
| 2018/0276843 A1 | 9/2018 | Send et al. |
| 2018/0329024 A1 | 11/2018 | Send et al. |
| 2018/0356501 A1 | 12/2018 | Send et al. |
| 2019/0129035 A1 | 5/2019 | Valouch et al. |
| 2019/0129036 A1 | 5/2019 | Valouch et al. |
| 2019/0140129 A1 | 5/2019 | Valouch et al. |

(56) References Cited

U.S. PATENT DOCUMENTS

| | | | |
|---|---|---|---|
| 2019/0157470 A1 | 5/2019 | Send et al. |
| 2019/0170849 A1 | 6/2019 | Hermes et al. |
| 2019/0172964 A1 | 6/2019 | Hermes et al. |
| 2019/0198206 A1 | 6/2019 | Ter Maat et al. |
| 2019/0277703 A1 | 9/2019 | Valouch et al. |
| 2020/0003899 A1 | 1/2020 | Lungenschmied et al. |

FOREIGN PATENT DOCUMENTS

| | | |
|---|---|---|
| CN | 1270706 | 10/2000 |
| CN | 1677053 A | 10/2005 |
| CN | 1723564 A | 1/2006 |
| CN | 1777859 | 5/2006 |
| CN | 1809801 A | 7/2006 |
| CN | 1894976 | 1/2007 |
| CN | 1896686 A | 1/2007 |
| CN | 101129074 | 2/2008 |
| CN | 101290348 A | 10/2008 |
| CN | 101449181 | 6/2009 |
| CN | 101650173 A | 2/2010 |
| CN | 101655350 | 2/2010 |
| CN | 101859439 A | 10/2010 |
| CN | 102096962 | 6/2011 |
| CN | 201897828 | 7/2011 |
| CN | 102435136 | 5/2012 |
| CN | 102506754 A | 6/2012 |
| CN | 102549380 | 7/2012 |
| CN | 102549381 A | 7/2012 |
| CN | 102737435 | 10/2012 |
| CN | 102833569 | 12/2012 |
| CN | 103106411 A | 5/2013 |
| CN | 103322910 A | 9/2013 |
| CN | 103403494 | 11/2013 |
| CN | 103492835 | 1/2014 |
| CN | 103649677 | 3/2014 |
| CN | 103650478 | 3/2014 |
| DE | 2 417 854 | 10/1974 |
| DE | 25 01 124 A1 | 8/1975 |
| DE | 32 25 372 A1 | 2/1983 |
| DE | 42 11 875 | 10/1993 |
| DE | 196 04 856 | 8/1997 |
| DE | 10146752 | 4/2002 |
| DE | 10 2005 043 627 A1 | 3/2007 |
| DE | 10 2005 053 995 | 5/2007 |
| DE | 10 2007 037 875 A1 | 2/2009 |
| DE | 10 2010 042 278 | 4/2012 |
| DE | 20 2012 009 070 | 1/2013 |
| DE | 10 2014 108 353 A1 | 12/2014 |
| EP | 0112169 A2 | 6/1984 |
| EP | 0 185 450 A2 | 6/1986 |
| EP | 0 309 631 | 4/1989 |
| EP | 0 754 930 A2 | 1/1997 |
| EP | 1 176 646 A1 | 1/2002 |
| EP | 1 191 819 | 3/2002 |
| EP | 1 330 117 | 7/2003 |
| EP | 1 373 272 | 1/2004 |
| EP | 1 667 246 A1 | 6/2006 |
| EP | 1 832 910 | 9/2007 |
| EP | 1 947 477 | 7/2008 |
| EP | 2 205 657 A1 | 7/2010 |
| EP | 2 220 141 A1 | 8/2010 |
| EP | 2 507 286 A2 | 10/2012 |
| EP | 2 527 866 A1 | 11/2012 |
| EP | 2725617 A1 | 4/2014 |
| EP | 2 735 542 | 5/2014 |
| EP | 2 813 324 | 12/2014 |
| EP | 2818493 A1 | 12/2014 |
| EP | 15 153 215 | 1/2015 |
| EP | 2 831 180 | 2/2015 |
| EP | 15 157 363 | 3/2015 |
| EP | 15 164 653 | 4/2015 |
| EP | 2 884 303 A1 | 6/2015 |
| EP | 15 177 275 | 7/2015 |
| EP | 15 180 353 | 8/2015 |
| EP | 15 180 354 | 8/2015 |
| EP | 15 185 005 | 9/2015 |
| EP | 15 191 960 | 10/2015 |
| EP | 15 196 238 | 11/2015 |
| EP | 15 196 239 | 11/2015 |
| EP | 15 197 744 | 12/2015 |
| EP | 15 155 835 | 2/2016 |
| EP | 16 155 834 | 2/2016 |
| EP | 16 155 845 | 2/2016 |
| EP | 3 008 421 | 4/2016 |
| EP | 3 008 757 | 4/2016 |
| EP | 3 036 503 | 6/2016 |
| GB | 2 432 723 | 5/2007 |
| JP | S59-50579 | 3/1984 |
| JP | 59-79805 | 5/1984 |
| JP | 61-89501 | 5/1986 |
| JP | S61-135280 | 6/1986 |
| JP | 61-186804 | 8/1986 |
| JP | 61-245579 | 10/1986 |
| JP | 64-17485 | 1/1989 |
| JP | H02-170004 | 6/1990 |
| JP | 04-240817 | 8/1992 |
| JP | 5-48833 A | 2/1993 |
| JP | 05-240640 | 9/1993 |
| JP | 6-133321 | 5/1994 |
| JP | 7-146113 | 6/1995 |
| JP | 7-318630 | 12/1995 |
| JP | 8-159714 | 6/1996 |
| JP | 8-292586 A | 11/1996 |
| JP | 10-26513 A | 1/1998 |
| JP | 10-221064 | 8/1998 |
| JP | H11-230860 | 8/1999 |
| JP | 11-257917 | 9/1999 |
| JP | 11-325825 | 11/1999 |
| JP | 3110095 | 11/2000 |
| JP | 2001-516150 | 9/2001 |
| JP | 2002-176191 | 6/2002 |
| JP | 2003-307407 | 10/2003 |
| JP | 2004-508691 | 3/2004 |
| JP | 2005-509909 | 4/2005 |
| JP | 2005-189087 | 7/2005 |
| JP | 2005-241340 A | 9/2005 |
| JP | 2005-296268 | 10/2005 |
| JP | 2006-514366 | 4/2006 |
| JP | 2007-521559 | 8/2007 |
| JP | 2007-530978 | 11/2007 |
| JP | 2008-522418 | 6/2008 |
| JP | 2008-164538 | 7/2008 |
| JP | 2009-257890 | 11/2009 |
| JP | 2010-081002 | 4/2010 |
| JP | 2010-218770 | 9/2010 |
| JP | 2010-531520 | 9/2010 |
| JP | 2011-503673 | 1/2011 |
| JP | 2011-027707 | 2/2011 |
| JP | 2012-519584 | 8/2012 |
| JP | 2012-522248 | 9/2012 |
| JP | 2012-229964 | 11/2012 |
| JP | 2012-231154 | 11/2012 |
| JP | 2013-051674 | 3/2013 |
| TW | 2011-40111 A | 11/2011 |
| WO | 99-09603 | 2/1999 |
| WO | WO 01/29576 A1 | 4/2001 |
| WO | WO 02/076988 | 10/2002 |
| WO | WO 02/101838 A1 | 12/2002 |
| WO | 03/012371 A1 | 2/2003 |
| WO | WO 03/098617 | 11/2003 |
| WO | WO 2004/072909 | 8/2004 |
| WO | WO 2004/114112 A1 | 12/2004 |
| WO | WO 2005/106965 A1 | 11/2005 |
| WO | WO 2007/006717 | 1/2007 |
| WO | WO 2007/054470 A1 | 5/2007 |
| WO | WO 2008/122531 | 10/2008 |
| WO | WO 2008/145172 | 12/2008 |
| WO | WO 2009/013282 A1 | 1/2009 |
| WO | WO 2009/021859 | 2/2009 |
| WO | WO 2009/053291 A1 | 4/2009 |
| WO | WO 2009/058115 A1 | 5/2009 |
| WO | WO 2009/105801 | 9/2009 |
| WO | WO 2010/088032 A2 | 8/2010 |
| WO | WO 2010/094636 A1 | 8/2010 |

(56) References Cited

FOREIGN PATENT DOCUMENTS

| WO | WO 2010/118409 | 10/2010 |
|---|---|---|
| WO | WO 2010/118450 | 10/2010 |
| WO | WO 2011/067192 A2 | 6/2011 |
| WO | WO 2011/083722 | 7/2011 |
| WO | WO 2011/091967 A2 | 8/2011 |
| WO | WO 2012/001628 A1 | 1/2012 |
| WO | WO 2012/046181 A1 | 4/2012 |
| WO | WO 2012/049038 A1 | 4/2012 |
| WO | WO 2012/085803 A1 | 6/2012 |
| WO | 2012/110924 A1 | 8/2012 |
| WO | WO 2012/115593 | 8/2012 |
| WO | WO 2012/139354 | 10/2012 |
| WO | 2012/152812 A1 | 11/2012 |
| WO | 2012/168395 A1 | 12/2012 |
| WO | WO 2006/134370 | 12/2012 |
| WO | WO 2013/009676 | 1/2013 |
| WO | WO 2013/090960 | 6/2013 |
| WO | WO 2013/091016 A1 | 6/2013 |
| WO | 2013/118037 A1 | 8/2013 |
| WO | WO 2013/116883 | 8/2013 |
| WO | WO 2013/144177 A1 | 10/2013 |
| WO | WO 2013/156101 A1 | 10/2013 |
| WO | 2013/170982 A1 | 11/2013 |
| WO | 2014/086722 A1 | 6/2014 |
| WO | 2014/097181 A1 | 6/2014 |
| WO | 2014/097489 A1 | 6/2014 |
| WO | WO 2014/123522 | 8/2014 |
| WO | 2014/178923 A2 | 11/2014 |
| WO | 2014/198623 A1 | 12/2014 |
| WO | 2014/198625 A1 | 12/2014 |
| WO | 2014/198626 A1 | 12/2014 |
| WO | 2014/198629 A1 | 12/2014 |
| WO | 2015/024871 A1 | 2/2015 |
| WO | WO 2015/081362 | 6/2015 |
| WO | WO 2015/091607 | 6/2015 |
| WO | WO 2015/150989 | 10/2015 |
| WO | WO 2015/159192 | 10/2015 |
| WO | WO 2015/161989 | 10/2015 |
| WO | WO 2015/162528 | 10/2015 |
| WO | WO 2015/176981 | 11/2015 |
| WO | WO 2015/177784 A2 | 11/2015 |
| WO | 2015/193804 A2 | 12/2015 |
| WO | 2016/005893 A1 | 1/2016 |
| WO | WO 2016/012274 | 1/2016 |
| WO | 2016/051323 A1 | 4/2016 |
| WO | WO 2016/066494 | 5/2016 |
| WO | 2016/092449 A1 | 6/2016 |
| WO | 2016/092454 A1 | 6/2016 |
| WO | WO 2016/083914 | 6/2016 |
| WO | WO 2016/146725 | 9/2016 |
| WO | WO 2017/089553 | 6/2017 |
| WO | WO 2017/144401 | 8/2017 |
| WO | WO 2018/096083 | 5/2018 |
| WO | WO 2018/115073 | 6/2018 |
| WO | WO 2018/146138 | 8/2018 |
| WO | WO 2018/146146 | 8/2018 |
| WO | WO 2018/167215 | 9/2018 |
| WO | WO 2018/193045 | 10/2018 |
| WO | WO 2019/002199 | 1/2019 |
| WO | WO 2019/011803 | 1/2019 |
| WO | WO 2019/038354 | 2/2019 |
| WO | WO 2019/042956 | 3/2019 |
| WO | WO 2019/042959 | 3/2019 |

OTHER PUBLICATIONS

R. M. Schaffert, "A New High-Sensitivity Organic Photoconductor for Electrophotography", *IBM J. Res. Develop.*, 1971, p. 75-89.
P. Gregory, Ed., *Chemistry and Technology of printing and imaging systems*, Chapman & Hall, 1996, Chap. 4, R.S. Gairns, *Electrophotography*, p. 76-112.
Pekkola et al., "Focus-Induced Photoresponse: a novel way to measure distances with photodetectors", *Scientific Reports* (2018) 8:9208, 8 pages.
L. Pintilie, et al., "Field-effect-assisted photoconductivity in PbS films deposited on silicon dioxide", *J. Appl. Phys.* 91, p. 5782, 2002.
International Preliminary Report on Patentability and Written Opinion dated Aug. 22, 2019 in PCT/EP2018/053057.
International Search Report dated May 20, 2016, in PCT/EP2016/054532.
Linyi Bian, et al., "Recent Progress in the Design of Narrow Bandgap Conjugated Polymers for High-Efficiency Organic Solar Cells", Progress in Polymer Science, vol. 37, 2012, pp. 1292-1331.
Antonio Facchetti, "Polymer donor-polymer acceptor (all-polymer) solar Cells", Materials Today, vol. 16 No. 4, Apr. 2013, pp. 123-132.
Graham H. Carey, et al., "Colloidal Quantum Dot Solar Cells", Chemical Reviews, vol. 115 No. 23, 2015, pp. 12732-12763.
Jason P. Clifford, et al., "Fast, Sensitive and Spectrally Tunable Colloidal Quantum-Dot Photodetectors", Nature Nanotechnology, Jan. 2009, pp. 1-5.
Kotaro Fukushima, et al., "Crystal Structures and Photocarrier Generation of Thioindigo Derivatives", Journal of Physical Chemistry B, vol. 102 No. 31, 1998, pp. 5985-5990.
Serap Günes, et al., "Hybrid Solar Cells", Inorganica Chimica Acta, vol. 361, 2008, pp. 581-588.
R. S. Mane, et al., "Chemical Deposition Method for Metal Chalcogenide Thin Films", Materials Chemistry and Physics, vol. 65, 2000, pp. 1-31.
Wilfried Hermes, "Emerging Thin-Film Photovoltaic Technologies", Chemie Ingenieur Technik, 2015, vol. 87 No. 4, pp. 376-389.
Paul H. Keck, "Photoconductivity in Vacuum Coated Selenium Films", Journal Optical Society of America, vol. 42 No. 4, Apr. 1952, pp. 221-225, with cover page.
Frank H. Moser, et al., "Phthalocyanine Compounds", Reinhold Publishing Corporation, 1963, p. 69-76 with cover pages.
M. Popescu, "Disordered Chalcogenide Optoelectronic Materials: Phenomena and Applications", Journal of Optoelectronics and Advanced Materials, vol. 7 No. 4, Aug. 2005, pp. 2189-2210.
Friedrich Andreas Sperlich, "Electron Paramagnetic Resonance Spectroscopy of Conjugated Polymers and Fullerenes for Organic Photovoltaics", Julius-Maximilians-Universität Würzburg, 2013, pp. 1-127.
F. Stöckmann, "Superlinear Photoconductivity", Physica Status Solidi, vol. 34, 1969, pp. 751-757.
Evangelos Theocharous, "Absolute Linearity Measurements on a PbS Detector in the Infrared", Applied Optics, vol. 45 No. 11, Apr. 10, 2006, pp. 2381-2386.
Evangelos Theocharous, et al., "Absolute Linearity Measurements on HgCdTe Detectors in the Infrared Region", Applied Optics, vol. 43 No. 21, Jul. 20, 2004, pp. 4182-4188.
Arthur L. Thomas, "Phthalocyanine Research and Applications", CRC Press, 1990, pp. 253-271 with cover pages.
Office Action dated Dec. 18, 2018, in Japanese Patent Application No. 2016-518930.
Baeg et al., "Organic Light Detectors: Photodiodes and Phototransistors", *Advanced Materials*, vol. 25, No. 31, Mar. 11, 2013, pp. 4267-4295.
Office Action issued Jan. 3, 2018, in Chinese Patent Application No. 201610552144.7 parallel to U.S. Appl. No. 15/364,680.
Ikeoka, et al., "Real-Time Depth Estimation with Wide Detectable Range Using Horizontal Planes of Sharp Focus Proceedings", ACIVS 2011: Advanced Concepts for Intelligent Vision Systems, pp. 669-680 (with English Abstract) (https://link.springer.com/chapter/10.1007/978-3-642-23687-7_60).
Office Action dated Jul. 9, 2018, in Japanese Patent Application No. 2017-007544.
Xing Lin, et al., "Coded focal stack photography", Computational Photography (ICCP), 2013 IEEE International Conference On, Apr. 19, 2013, XP032424246, pp. 1-9.
Nabeel A. Riza, et al., "Noncontact distance sensor using spatial signal processing", Optics Letters, Optical Society of America, vol. 34, No. 4, Feb. 15, 2009, XP001522006, pp. 434-436.
Nabeel A. Riza, et al., "Smart agile lens remote optical sensor for three-dimensional object shape measurements", Applied Optics, Optical Society of America, vol. 49, No. 7, Mar. 1, 2010. XP001552714, pp. 1139-1150.

(56) References Cited

OTHER PUBLICATIONS

J. Robertson, "High Dielectric Constant Oxides", *European Physical Journal Applied Physics*, vol. 28, No. 3, pp. 265-291, 2004.
J.A. Kittl et al., "High-k Dielectrics for Future Generation Memory Devices", *Microelectronic Engineering*, Vo. 86 (2009) 1789-1795.
Serap Günes, et al., "Hybrid Solar Cells", *Inorganica Chimica Acta* 361, (2008), p. 581-588.
John E. Anthony, et al., "n-Type Organic Semiconductors in Organic Electronics", *Adv. Mater.* 2010, 22, pp. 3876-3892.
Tian-yi Li, et al., "Small Molecule Near-Infrared Boron Dipyrromethene Donors for Organic Tandem Solar Cells", *J. Am. Chem. Soc.* 2017, 139, 13636-13639.
Christian Ulrich et al., "Organic Thin-Film Photovoltaic Cells Based on Oligothiophenes with Reduced Bandgap", *Adv. Funct. Mater.* 2007, 17, pp. 2991-2999.
Ronald Gresser, et al., "Synthesis and Characterization of Near-Infrared Absorbing Benzannulated Aza-BODIPY Dyes", *Chem. Eur. J.* 2011, 17, pp. 2939-2947.
Amaresh Mishra, et al., "Small Molecule Organic Semiconductors on the Move: Promises for Future Solar Energy Technology", *Angew. Chem. Int. Ed.* 2012, 51, 2020-2067.
Huifeng Yao, et al., "Molecular Design of Benzodithiophene-Based Organic Photovoltaic Materials", *Chem. Rev.* 2016, 116, 7397-7457.
Moritz Riede, et al., "Efficient Organic Tandem Solar Cells based on Small Molecules", *Adv. Funct. Mater.* 2011, 21, pp. 3019-3028.
Rico Schueppel, et al., "Controlled Current Matching in Small Molecule Organic Tandem Solar Cells Using Doped Spacer Layers", *J. Appl. Phys.* 107, 044503, 2010.
Jan Meiss et al., "Fluorinated Zinc Phthalocyanine as Donor for Efficient Vacuum-Deposited Organic Solar Cells," *Adv. Funct. Mater.* 2012, 22, pp. 405-414.
International Search Report dated Nov. 7, 2017, in corresponding PCT/EP2017/057867.
International Search Report dated Jul. 7, 2017, in corresponding PCT/EP2017/057825.
Office Action dated Mar. 5, 2018, in corresponding Chinese Patent Application No. 201480056299.0.
International Preliminary Report on Patentability and Written Opinion dated Feb. 22, 2018 in PCT/EP2016/069049).
*Wikipedia*, Article denoted, "Thermocouple", retrieved Jul. 20, 2016.
Chinese Office Action dated Jan. 29. 2019, in Chinese Patent Application No. 201580036919.9.
Street (Ed.): Technology and Applications of Amorphous Silicon, Springer-Verlag Heidelberg, 2010. pp. 346-349.
International Search Report dated Aug. 17, 2017, in corresponding PCT/EP2017/060057.
International Search Report dated Aug. 1, 2017, in corresponding PCT/EP2017/060058.
Walter Fuhs, "Hydrogenated Amorphous Silicon—Material Properties and Device Applications", in S. Baranovski, Charge Transport in Disordered Solids, Wiley, p. 97-147, 2006.
Extended Search Report dated Aug. 23, 2011 in Europe Application No. 11154531.5 (With English Translation of Category of Cited Documents).
Erwin Bacher, et al., "Synthesis and Characterization of Photo-Cross-Linkable Hole-Conducting Polymers", Macromolecules, vol. 38, 2005, pp. 1640-1647.
H. Bruce Goodbrand, et al., "Ligand-Accelerated Catalysis of the Ullmann Condensation: Application to Hole Conducting Triarylamines", J. Org. Chem., vol. 64, 1999, pp. 670-674.
Felix E. Goodson, et al., "Palladium-Catalyzed Synthesis of Pure, Regiodefined Polymeric Triarylamines", J. Am. Chem. Soc., vol. 121, 1999, pp. 7527-7539.
John F. Hartwig, "Transition Metal Catalyzed Synthesis of Arylamines and Aryl Ethers from Aryl Halides and Triflates: Scope and Mechanism", Angew. Chem. Int. Ed., vol. 37, 1998, pp. 2046-2067.
Sheila I. Hauck, et al., "Tetraazacyclophanes by Palladium-Catalyzed Aromatic Amination. Geometrically Defined, Stable, High-Spin Diradicals", Organic Letters, vol. 1, No. 13, 1999, pp. 2057-2060.
Ping-Hsin Huang, et al., "Synthesis and Characterization of new fluorescent two-photon absorption chromophores", J. Mater. Chem., vol. 16, 2006, pp. 850-857.
Qinglan Huang, et al., "Molecularly 'Engineered' Anode Adsorbates for Probing OLED Interfacial Structure—Charge Injection/Luminance Relationships: Large, Structure-Dependent Effects", J. Am. Chem. Soc., vol. 125, 2003, pp. 14704-14705.
A. Balionyte, et al., "Carbazolyl-substituted triphenyldiamine derivatives as novel photoconductive amorphous molecular materials", Journal of Photochemistry and Photobiology A: Chemistry, vol. 162, 2004, pp. 249-252.
G. R. A. Kumara, et al., "Fabrication of Dye-Sensitized Solar Cells Using Triethylamine Hydrothiocyanate as a CuI Crystal Growth Inhibitor", Langmuir, vol. 18, 2002, pp. 10493-10495.
Lukas Schmidt-Mende, et al., "Organic Dye for Highly Efficient Solid-State Dye-Sensitized Solar Cells", Adv. Mater., vol. 17, No. 7, 2005, pp. 813-815.
James Lindley, "Copper Assisted Nucleophilic Substitution of Aryl Halogen", Tetrahedron, vol. 40, No. 9, 1984, pp. 1433-1456.
Yunqi Liu, et al., "Synthesis and characterization of a novel bipolar polymer for light-emitting diodes", Chem. Commun., vol. 24, 1998, pp. 2747-2748.
Narukuni Hirata, et al., "Interface engineering for solid-state dye-sensitised nanocrystalline solar cells: the use of an organic redox cascade", Chem. Commun., vol. 5, 2006, pp. 535-537.
Qingjiang Yu, et al., "High-Efficiency Dye-Sensitized Solar Cells: The Influence of Lithium Ions on Exciton Dissociation, Charge Recombination, and Surface States", ACS Nano, vol. 4, No. 10, 2010, pp. 6032-6038.
Bin Peng, et al., "Systematic investigation of the role of compact $TiO_2$ solar cells", Coordination Chemistry Reviews, vol. 248, 2004, pp. 1479-1489.
Jiun Yi Shen, et al., "High $T_9$ blue emitting materials for electroluminescent devices", J. Mater. Chem., vol. 15, 2005, pp. 2455-2463.
Tobat P. I. Saragi, et al., "Comparison of Charge-Carrier Transport in Thin Films of Spiro-Linked Compounds and Their Corresponding Parent Compounds", Adv. Funct. Mater., vol. 16, 2006, pp. 966-974.
V. P. S. Perera, et al., "Dye-Sensitized Solid-State Photovoltaic Cells Based on Dye Multilayer-Semiconductor Nanostructures", J. Phys. Chem. B, vol. 107, 2003, pp. 13758-13761.
U. Bach, et al., "Solid-state dye-sensitized mesoporous $TiO_2$ solar cells with high photon-to-electron conversion efficiencies", Nature, vol. 395, 1998, pp. 583-585.
John P. Wolfe, et al., "Rational Development of Practical Catalysts for Aromatic Carbon-Nitrogen Bond Formation", Acc. Chem. Res. vol. 31, 1998, pp. 805-818.
Bryant H. Yang, et al., "Palladium-Catalyzed amination of aryl halides and sulfonates", Journal of Organometallic Chemistry, vol. 576, 1999, pp. 125-146.
Zhong Hui Li, et al., "Synthesis and Functional Properties of Strongly Luminescent Diphenylamino End-Capped Oligophenylenes", J. Org. Chem., vol. 69, 2004, pp. 921-927.
Brian O'Regan, et al., "A low-cost, high-efficiency solar cell based on dye-sensitized colloidal $TiO_2$ films", Letters to Nature, vol. 353, 1991, pp. 737-740.
International Search Report dated Sep. 24, 2014 in PCT/EP2014/061682.
International Preliminary Report on Patentability and Written Opinion dated Dec. 15, 2015 in PCT/EP2014/061682.
International Preliminary Report on Patentability and Written Opinion dated Dec. 23, 2015 in PCT/EP2014/061695.
International Search Report and Written Opinion dated May 31, 2012 in PCT/IB2012/050592 filed on Feb. 9, 2012.
Supplementary European Search Report dated Nov. 19, 2014, issued in corresponding European Patent Application No. EP 12 74 6808.
Volker Viereck, et al., Large-area applications of optical MEMS: micromirror arrays guide daylight, optimize indoor illumination, Optical Components, Photonik International 2, 2009, pp. 48-49.

(56) References Cited

OTHER PUBLICATIONS

C.U. Murade, et al., "High speed adaptive liquid microlens array", Optics Express, vol. 20, No. 16, Jul. 30, 2012, pp. 18180-18187.

Jason Heikenfeld, et al., "Recent Progress in Arrayed Electrowetting Optics", Optics & Photonics News, vol. 20, No. 1, Jan. 1, 2009, pp. 20-26.

Tao Peng, "Algorithms and models for 3-D shape measurement using digital fringe projections", Dissertation, University of Maryland (College Park, Md.), Jan. 16, 2007, 268 pages (http://drum.lib.umd.edu//handle/1903/6654;http://en.wikipedia.org/wiki/Gray_code; http://en.wikipedia.org/wiki/Structured-light_3D_scanner).

Jie-Ci Yang et al., "An Intelligent Automated Door Control System Based on a Smart", Sensors, 2013, 13(5), pp. 5923-5936; doi:10.3390/s130505923 www.mdpi.com/journal/sensors.

Tomas Leijtens, et al., "Hole Transport Materials with Low Glass Transition Temperatures and High Solubility for Application in Solid-State Dye-Sensitized Solar Cells", ACS Nano, vol. 6, No. 2, 2012, pp. 1455-1462 www.acsnano.org.

International Search Report and Written Opinion dated Oct. 31, 2014 in PCT/EP2014/067466 filed Aug. 15, 2014.

Paul Pargas, "Phenomena of Image Sharpness Recognition of CdS and CdSe Photoconductors" Journal of the Optical Society of America, vol. 54, No. 4, Apr. 1964, pp. 516-519.

Paul Pargas, "A Lens Measuring Method Using Photoconductive Cells" Journal of the SMPTE, vol. 74, Jun. 1965, pp. 501-504.

Jack T. Billings, "An Improved Method for Critical Focus of Motion-Picture Optical Printers" Journal of the SMPTE, vol. 80, Aug. 1971, pp. 624-628.

International Search Report dated Sep. 9, 2014 in PCT/EP2014/061688 filed Jun. 5, 2014.

Written Opinion of the International Searching Authority dated Sep. 9, 2014 in PCT/EP2014/061688 filed Jun. 5, 2014.

International Search Report and Written Opinion of the International Searching Authority dated Mar. 12, 2015 in PCT/EP2014/078155 Filed Dec. 17, 2014.

International Search Report and Written Opinion of the International Searching Authority dated May 16, 2014 in PCT/IB2013/061095.

Seigo Ito, et al., "High-Efficiency Organic-Dye-Sensitized Solar Cells Controlled by Nanocrystalline-$TiO_2$ Electrode Thickness", Adv. Mater., vol. 18, 2006, pp. 1202-1205.

Atte Haapalinna, et al., "Measurement of the Absolute Linearity of Photodetectors with a Diode Laser," Meas. Sci. Technol., 10, (1999) 1075-1078.

M. R. Andersen, et al., "Kinect Depth Sensor Evaluation for Computer Vision Applications",Electrical and Computer Engineering, Technical Report ECE-TR-6, Aarhus University, 2012, 39 pages.

Takumi Kinoshita, et al., "Wideband dye-sensitized solar cells employing a phosphine-coordinated ruthenium sensitizer", Nature Photonics, vol. 7, 2013, pp. 535-239.

Office Action dated Apr. 22, 2015 in Chinese Patent Application No. 201280018328.5 (submitting English translation only).

International Search Report and Written Opinion dated Sep. 3, 2014 in PCT/EP2014/061691.

International Preliminary Report on Patentability dated Sep. 25, 2015 in PCT/EP2014/061691.

Kuthirumal, S., et al., "Flexible Depth of Field Photography," IEEE Transactions on Pattern Analysis and Machine Intelligence, vol. 33, No. 1 (2011), pp. 58-71.

Hiura Shinsaku et al., "Depth Measurement by the Multi-Focus Camera," Computer Vision and Pattern Recognition, 1998. Proceedings. 1998 IEEE Computer Society Conference on Santa Barbara, CA, USA, Jun. 23-25, 1998, pp. 953-959.

International Preliminary Report on Patentability and Written Opinion dated Dec. 23, 2015 in PCT/EP2014/061688.

Denis Klimentjew, et al., "Multi Sensor Fusion of Camera and 3D Laser Range Finder for Object Recognition" 2010 IEEE International Conference on Multisensor Fusion and Integration for Intelligent Systems, 2010, pp. 236-241.

International Search Report and Written Opinion dated Nov. 21, 2014 in PCT/EP2014/067465.

"So funktioniert die DLP-Technologie" DLP-Technologie—www.dlp.com/de/technology/how-dlp-works, 2014, 2 Pages.

"New—Ultra-Compact Pockels Cells with Brewster Polarizer and Waveplate for Laser Q-Switching" Leysop Ltd, Manfacturers and Suppliers of Electro-Optic Components—http://www.leysop.com/integrated_pockels_cell.htm, Aug. 4, 2013, 2 Pages.

D. Scaramuzza, et al., "Extrinsic Self Calibration of a Camera and a 3D Laser Range Finder from Natural Scenes" 2007 IEEE/RSJ International Conference on Intelligent Robots and Systems, 2007, 8 pages.

International Search Report dated Aug. 28, 2015, in PCT/IB2015/052769, filed Apr. 16, 2015.

International Search Report and Written Opinion dated Jun. 30, 2015 in PCT/IB15/052233 Filed Mar. 26, 2015.

International Search Report dated Sep. 22, 2015, in Application No. PCT/IB2015/052785, filed on Apr. 16, 2015.

International Search Report dated Nov. 27, 2015, in PCT/IB2015/055121, filed Jul. 7, 2015.

International Search Report and Written Opinion dated Mar. 29, 2016, in PCT/IB2015/054536, filed Jun. 16, 2015.

International Search Report and Written Opinion dated Jan. 18, 2016 in PCT/IB2015/057412 filed Sep. 28, 2015.

Wang, Feng-Peng et al., "Distance Measurement using Digital Cameras Based on Laser Spot Detection", published on Jun. 30, 2011, School of Physics and Electronic Information, Gannan Normal University, Ganzhou 341000, China (with English Abstract).

Bahaa E. A. Saleh, et al., "Fundamentals of Photonics" John Wiley & Sons, Inc., Chapter 3, 1991, pp. 80-107 (with Cover Page).

International Search Report dated Mar. 21, 2016, in PCT/IB2015/059406.

International Search Report and Written Opinion in PCT/IB2015/059411 dated Mar. 16, 2016 filed Dec. 7, 2015.

Nam-Trung Nguyen, "Micro-optofluidic Lenses: A review", Biomicrofluidics, 2010, vol. 4, 031501-15.

Uriel Levy et al., "Tunable optofluidic devices", Microfluid Nanofluid, 2008, vol. 4, pp. 97-105.

International Search Report dated Mar. 15, 2016 in PCT/IB2015/059404 filed Dec. 7, 2015.

International Search Report and Written Opinion dated Mar. 21, 2016, in PCT/IB2015/059403, filed Dec. 7, 2015.

International Preliminary Report and Written Opinion dated Mar. 10, 2016, in PCT/IB2015/059404.

International Search Report dated Mar. 22, 2016 in PCT/IB2015/059408 filed Dec. 7, 2015.

International Preliminary Report on Patentability dated Aug. 1, 2017, in PCT/EP2016/051817.

Kurt Konolige et al., "A Low-Cost Laser Distance Sensor", *2008 IEEE International Conference on Robotics and Automation*, Pasadena, CA, May 19-23, 2008.

X. Jiang et al., Dreidimensionales Computersehen, Chapter 2, Springer, Berlin Heidelberg (1997).

http://www.plenoptic.info/pages/refocusing.html

C. Hahne, A. Aggoun, S. Haxha, V. Velisavljevic, and J. Fernández, "Light field geometry of a standard plenoptic camera," Opt. Express 22, 26659-26673 (2014).

C. Hahne, A. Aggoun, S. Haxha, V. Velisavljevic, and J. Fernández. "Baseline of virtual cameras acquired by a standard pienoptic camera setup," in 3D-TV-Conference: The True Vision—Capture, Transmission and Display of 3D Video (3DTV-CON), Jul. 2-4, 2014.

C. Hahne, A. Aggoun, and V. Velisavljevic, "The refocusing distance of a standard plenoptic photograph," in 3D-TV-Conference: The True Vision—Capture, Transmission and Display of 3D Video (3DTV-CON), Jul. 8-10, 2015.

C. Hahne and A. Aggoun, "Embedded FIR filter design for real-time refocusing using a standard plenoptic video camera," Proc. SPIE 9023, in Digital Photography X, 902305 (Mar. 7, 2014).

A.G. Pattantyus-Abraham, I.J. Kramer, A.R. Barkhouse, X. Wang, G. Konstantatos, R. Debnath, L. Levina, I. Raabe, M.K. Nazeeruddin, M. Grätzel, and E.H. Sargent, *Depleted-Heterojunction Colloidal Quantum Dot Solar Cells*, ACS NANO 4 (6), May 24, 2010.

(56) References Cited

OTHER PUBLICATIONS

R. Martins and E. Fortunato, *Thin Film Position Sensitive Detectors: from 1D to 3D Applications*, Chap. 8 in R. A. Street (Ed.), *Technology and Applications of Amorphous Silicon*, Springer, 2010.
International Search Report dated Oct. 20, 2017 in PCT/EP2017/068956 filed on Jul. 27, 2017.
Leskela, M. et al., "Preparation of lead sulfide thin films by the atomic layer epitaxy process," Pergamon Press plc, Vacuum/vol. 41/Nos. 4-6, pp. 1457-1459 (1990).
Dasgupta, N. et al., "Fabrication and Characterization of Lead Sulfide Thin Films by Atomic Layer Deposition," The Electrochemical Society, ECS Transactions, 16 (4) 29-36 (2008), Total 8 pages.
Dasgupta, N. et al., "Design of an atomic layer deposition reactor for hydrogen sulfide compatibility," Review of Scientific Instruments 81, 044102 (2010). Total 6 pages.
Xu, J. et al., "Atomic layer deposition of absorbing thin films on nanostructured electrodes for short-wavelength infrared photosensing," AIP Publishing, Applied Physics Letters 107, 153105 (2015), Total 5 pages.
Blount, G., et al., "Photoconductive properties of chemically deposited PbS with dielectric overcoatings," AIP Publishing, Journal of Applied Physics 46, 3489 (1975), Total 12 pages.
Groner, M. et al., "Low-Temperature Al2O3 Atomic Layer Deposition," American Chemical Society, Chem. Mater., vol. 16, No. 4, 2004, pp. 639-645.
Yoon, W. et al., "Electrical Measurement Under Atmospheric Conditions of PbSe Nanocrystal Thin Films Passivated by Remote Plasma Atomic Layer Deposition of Al2O3," IEEE Transactions on Nanotechnology. vol. 12, No. 2, Mar. 2013, pp. 146-151.
Hu, C., et al., "Air-stable short-wave infrared PbS colloidal quantum dot photoconductors passivated with Al2O3 atomic layer deposition," AIP Publishing, Applied Physics Letters 105, 171110 (2014), Total 5 pages.
Liu, Y.. et al., "Robust, Functional Nanocrystal Solids by Infilling with Atomic Layer Deposition," ACS Publications, American Chemical Society, Nano Letters 2011, 11, pp. 5349-5355.
Liu, Y., et al., "PbSe Quantum Dot Field-Effect Transistors with Air-Stable Electron Mobilities above 7 $cm^2$ $V^{-1}$ $s^{-1}$," ACS Publications, American Chemical Society, Nano Letters 2013, 13, pp. 1578-1587.
George, S., "Atomic Layer Deposition: An Overview," American Chemical Society, Chem. Rev. 2010. 110, pp. 111-131.
Konstantatos, G., et al., "Engineering the Temporal Response of Photoconductive Photodetectors via Selective Introduction of Surface Trap States," American Chemical Society, Nano Letters 2008, vol. 8, No. 5, pp. 1446-1450.
Soci, C., et al., "ZnO Nanowire UV Photodetectors with High Internal Gain," American Chemical Society, Nano Letters 2007, vol. 7, No. 4, pp. 1003-1009.
List of integrated circuit packaging types (Wikipedia article, downloaded Jan. 15, 2019 from https://en.wikipedia.org/wiki/List_of_integrated_circuit_packaging_types).
List of integrated circuit packaging types, Dimension Reference (Wikipedia article, downloaded Jan. 15, 2019 from https://en.wikipedia.org/wiki/List_of_integrated_circuit_packaging_types#PIN-PITCH).
International Search Report and Written Opinion dated Nov. 17, 2016, in PCT/EP2016/071628, filed Sep. 14, 2016.
"Telezentrisches Objektiv" Retrieved from the Internet: https://de.wikipedia.org/wiki/Telezentrisches_Objektiv. Date of retrieval: Sep. 11, 2015, 3 Pages. (Cited on p. 53, line No. 40 in the Specification of related case U.S. Appl. No. 15/758,135.
Benjamin F. Grewe, et al., "Fast Two-Layer Two-Photon Imaging of Neuronal Cell Populations Using an Electrically Tunable Lens," *Biomedical Optics Express*, vol. 2, No. 7, Jul. 1, 2011 (pp. 2035-2046).
Petr Bartu et al, "Conformable Large-AreaPposition-Sensitive Photodetectors Based on Luminescence-Collecting Silicone Waveguides," *Journal of Applied Physics*, 107, 123101 (2010).
Roland Stolarski, "Fluorescent Naphthalimide Dyes for Polyester Fibres," *Fibres & Textiles* in Eastern Europe, vol. 17, No. 2 (73) pp. 91-95 (2009).
Ayse Aktas et al., "Synthesis, Characterization, Electrochemical and Spectroelectrochemical Properties of Peripherally Tetra-Substituted Metal-Free and Metallophthalocyanines," *Dyes and Pigments*, 99, (2013) 613-619.
Hairong Li, et al., "Syntheses and Properties of Octa-, Tetra-, and Di-Hydroxy-Substituted Phthalocyanines," *Tetrahedron*, 65 (2009) 3357-3363.
"Methine Dyes and Pigments," *Ullmann's Encyclopedia of Industrial Chemistry*, vol. 23 (2012).
Jing Liu, et al., "Sulfone-Rhodamines: A New Class of Near-Infrared Fluorescent Dyes for Bioimagin," *ACS Applied Materials & Interfaces*, 8, 22953-22962 (2016).
E. Noelting et al., "Berichte der deutschen chemischen Gesellschaft", *Band*, 38, S. 3516-3527 (1905).
T. Nedelcev et al., "Preparation and Characterization of a New Derivative of Rhodamine B with an Alkoxysilane Moiety," *Dyes and Pigments*, 76 (2008), 550-556.
Aurore Loudet et al., "BODIPY Dyes and Their Derivatives: Syntheses and Spectroscopic Properties," *Chem.Rev.*, 107 (2007) 4981-4932.
Weill Zhao, et al., "Conformationally Restricted Aza-Bodipy: A Highly fluorescent, Stable, Near-Infrared-Absorbing Dye", *Angew. Chem. Int. Ed.*, 44 (2005) 1677-1679.
Georg M. Fischer, et al., "Near-Infrared Dyes and Fluorophores Based on Diketopyrrolopyrroles," *Angew. Chem. Int. Ed*. 46 (2007) 3750-3753.
Amaresh Mishra et al., "Small Molecule Organic Semiconductors on the Move: Promises for Future Solar Energy Technology," *Angew. Chem. Int. Ed*., 51, (2012), 2020-2067.
G. Seybold et al., "New Perylene and Violanthrone Dyestuffs for Fluorescent Collectors," *Dyes and Pigments*, 11 (1989) 303-317.
Nam-Trung Nguyen, "Micro-Optofluidic Lenses: A Review", *Biomicrofluidics*, 4, (2010) 031501.
Uriel Levy et al., "Tunable Optofluidic Devices," *Microfluid Nanofluid* (2008) 4: 97-105.
Robert Koeppe et al., "Video-Speed Detection of the Absolute Position of a Light Point on a Large-Area Photodetector Based on Luminescent Waveguides," *Optics Express*, vol. 18, No. 3, (Feb. 1, 2010), 2209.
Japanese Office Action dated Nov. 5, 2019, in corresponding Japanese Patent Application No. 2017-558775 w/English translation.
Wikipedia—Printed Circuit Board: https://en.wikipedia.org/wiki/Printed_circuit_board (25 pages).
ISO 21348 Definitions of Solar Irradiance Spectral Categories, http://SpaceWx.com.

* cited by examiner

DETECTOR FOR AN OPTICAL DETECTION OF AT LEAST ONE OBJECT

FIELD OF THE INVENTION

The invention relates to a detector for an optical detection of at least one object, in particular, for determining a position of at least one object, specifically with regard to a depth or both to the depth and a width of the at least one object. Furthermore, the invention relates to a human-machine interface, an entertainment device, a scanning system, a tracking system, a stereoscopic system; and a camera. Further, the invention relates to a method for optical detection of at least one object and to various uses of the detector. Such devices, methods and uses can be employed for example in various areas of daily life, gaming, traffic technology, mapping of spaces, production technology, security technology, medical technology or in the sciences. However, further applications are possible.

Prior Art

Various detectors for optically detecting at least one object are known on the basis of optical sensors. WO 2012/110924 A1 discloses a detector comprising at least one optical sensor, wherein the optical sensor exhibits at least one sensor region. Herein, the optical sensor is designed to generate at least one sensor signal in a manner dependent on an illumination of the sensor region. According to the so-called "FiP effect", the sensor signal, given the same total power of the illumination, is hereby dependent on a geometry of the illumination, in particular on a beam cross-section of the illumination on the sensor region. The detector furthermore has at least one evaluation device designated to generate at least one item of geometrical information from the sensor signal, in particular at least one item of geometrical information about the illumination and/or the object.

WO 2014/097181 A1 discloses a method and a detector for determining a position of at least one object, by using at least one transversal optical sensor and at least one longitudinal optical sensor. Preferably, a stack of longitudinal optical sensors is employed, in particular to determine a longitudinal position of the object with a high degree of accuracy and without ambiguity. Further, WO 2014/097181 A1 discloses a human-machine interface, an entertainment device, a tracking system, and a camera, each comprising at least one such detector for determining a position of at least one object.

WO 2014/198629 A1 discloses a detector for determining a position of at least one object comprising at least one longitudinal optical sensor, the optical sensor being adapted to detect a light beam traveling from the object towards the detector. Herein, the longitudinal optical sensor has at least one matrix of pixels and at least one evaluation device, the evaluation device being adapted to determine a number N of pixels of the optical sensor which are illuminated by the light beam, the evaluation device further being adapted to determine at least one longitudinal coordinate of the object by using the number N of pixels which are illuminated by the light beam.

Among other applications, metal chalcogenide thin films are known to be applicable as a photoconductive material, as e.g. described in B. Heimann, W. Heimann, *Fernsehkameraröhren—Eigenschaften und Anwendungen*, Sonderdruck aus Fernseh- and Kino-Technik, 32, 1-12, 1978, or in R. S. Mane, C. D. Lokhande, *Chemical deposition method for metal chalcogenide thin films*, Materials Chemistry and Physics 65, 1-31, 2000. Especially for a fabrication of large-area photoconductors, a deposition of these films by vacuum evaporation, sputtering and chemical methods such as chemical vapor deposition, spray pyrolysis, electrodeposition, anodization, electro-conversion, electro-less dip growth, successive ionic adsorption and reaction, chemical bath deposition, or solution-gas interface techniques may be performed.

In particular, by depositing a layer of such a photoconductive material on a substrate, such as a ceramic substrate, and providing respective electrically conducting contacts, a photoconductive cell, also abbreviated as a 'photocell', may be obtained. The photoconductive cell may be employed in different types of circuits and applications, especially as a photo detector for the visible and infrared (IR) spectral range. Herein, the resistivity of the photoconductive material decreases with increasing illumination, thus, allowing more photocurrent to flow. Accordingly, a signal current from the photoconductive detector can be varied over a wide range by adjusting the applied voltage.

In order to demonstrate the importance of detector linearity in spectrophotometry, E. Theo-charous, *Absolute linearity measurements on a PbS detector in the infrared*, Appl. Optics, 45, 2381-86, 2006 deals with the linearity of lead sulfide (PbS) IR detectors. For this purpose, the linearity factor versus the irradiance for different illumination conditions, such as different spot sizes on the sensor region of the IR detector, was investigated. Herein, the irradiance is a physical quantity in $\mu W/mm^2$ describing an incident power on the sensor region divided by an area of the sensor region. The experimental results show that a deviation from linearity becomes significant (>1%) for an irradiance of 10 $nW/mm^2$. For a larger irradiance of 1 $\mu W/mm^2$, the linearity depends on the spot size on the sensor region. Further, the occurrence of the FiP effect in mercury cadmium telluride (HgCdTE; MCT) is demonstrated in FIG. 3 of E. Theocharous, J. Ishii, and N. P. Fox, Absolute linearity measurements on HgCdTe detectors in the infrared region, Appl. Optics, 43, 4182-88, 2004.

Further, U.S. Pat. No. 4,767,211 A discloses an apparatus for and a method of measuring a boundary surface of a sample. Therein, a ratio of the light quantity of a part of reflected light from a sample which travels in the vicinity of the optical axis of the reflected light, to the light quantity of another part of the reflected light which is directed to a position deviating from the optical axis by a predetermined distance is used to accurately measure a boundary surface of a sample. Since the accuracy of measurement is increased by using the above ratio, light capable of passing through the sample can be used as incident light. Thus, a deep hole in the surface of the sample and a void such as an air bubble in a living being sample, which cannot be measured by the prior art, can be measured very accurately.

U.S. Pat. No. 3,035,176 A discloses a navigation instrument for determining the range of an object, utilizing visible light from the object. The light is received through a condensing lens and directed to a beam splitting pellicle which provides two identical images of the object to two photocells. One of the photocells is stationary and the other is movable. The stationary photocell receives less illumination from the object than does the movable photocell because it is closer to the pellicle so that its light sensitive surface receives a smaller fraction of the light flux from the pellicle. The cross-sectional area of the beam at the stationary photocell is larger than the sensitive area of the photocell. The focal length of the lens is somewhat greater than the total distance from the lens to the pellicle and from the pellicle to the stationary photocell. The other photocell is movable through a small range of distances which is slightly larger than the focal range of the lens. The instrument is focused on the object by moving the movable photocell and by comparing the currents provided through the two photocells. When the movable photocell is in the image plane so that the instrument is focused the ratio of currents is at a maximum. Thus, generally, U.S. Pat. No. 3,035,176 A employs the fact that only parts of a light beam may be detected by a detector, wherein the parts actually detected depend on certain details of the light beam itself and of the positioning of the photodetector relative to the object, thereby enabling distance measurements. These distance measurements, however, imply the use of a plurality of sensors, the use of moving parts and, thus, make use of a rather complex and voluminous optical setup.

U.S. Pat. No. 3,937,950 A discloses a system for detecting the distinction of the object image characterized in that respectively on a photoelectric transducing element presenting electrodes on both extremities along the longer sides of a photoelectric semiconductor presenting considerably short sides as compared with the long sides and on a photoelectric transducing element presenting electrodes on both extremities along the shorter sides of a photoelectric semiconductor presenting considerably short sides as compared with the long sides an object image is formed by means of an optics and that the distinction of the above mentioned object image is detected by detecting the electric characteristics variable corresponding to the distinction of the above mentioned object image, of each of the above mentioned photoelectric transducing elements. The system comprises a movable image forming optical system, a photoelectric transducing means positioned behind the optical system to receive an image formed by the optical system, electrical circuit means coupled to the elements for generating an electrical signal in response to the intensity distribution of the light on the phototransducing means, the first transducing means and second transducing means being connected to the circuit means to produce the electrical signal combining the output of the first transducing means with the output of the second transducing means, and signal responding means coupled to said electrical circuit means in the path of light from the image forming optical system for detecting the image sharpness. Herein, the photoelectric transducing means has a first elongated photoelectric transducing element having a semiconductor and electrodes deposited on both long sides of the semiconductor and a second elongated photoelectric transducing element having a semiconductor and electrodes deposited on both short sides of the semiconductor. Further, the first transducing means and the second transducing means are positioned in the path of light from the image forming optical system to receive light from the object. Again, as in U.S. Pat. No. 3,035,176 A, the system as disclosed there makes use of a plurality of sensors and corresponding beam splitting means, wherein a combined sensor signal is generated electronically from the sensor signal of the single sensors. Thus, a rather voluminous and complex system is proposed, the miniaturization of which is rather challenging. Further, again, moving parts are used which further increase the complexity of the system.

In U.S. Pat. No. 3,562,785 A, a method of determining the accuracy of focus of an image is disclosed. Therein, a measurement of the degree of focus of an image is determined, wherein a pair of light sensitive elements is exposed to the image. In a first embodiment, a pair of photoconductive elements is physically positioned in different focal planes while, in a second embodiment, a light diffusing medium is associated with one of a pair of photosensitive elements whereby that element will receive only average or background illumination. In both embodiments, as the degree of focus of image is varied, an electrical output signal commensurate with focus is generated.

In U.S. Pat. No. 3,384,752 A, an arrangement for ascertaining the maximum sharpness of an image is disclosed, chiefly the image of an objective. The arrangement comprises a photo-luminescent element adapted to receive said image and to produce a replica thereof in accordance with non-linear curve of response of the light produced versus the light received at the different points of the image and a photosensitive element to measure the average intensity of the light produced by said photoluminescent element.

In U.S. Pat. No. 4,053,240, a method and an apparatus is disclosed for detecting the sharpness of the object image suited for optical instruments such as a camera and for adjusting the focus of the optics by means of photoelectric means presenting a non-linear resistance-illumination characteristics such as CdS or CdSe. Such an object image may be formed by means of the optics on the above mentioned photoelectric means presenting the electrodes at both ends along the longer side of a photoelectric semiconductor whose longer side is extremely long as compared with the shorter side as well as on the above mentioned photoelectric means presenting the electrodes at both ends along the shorter side of the photoelectric semiconductor. An object distance measuring system which digitally displays the distance between camera and photographing object when an automatic focusing operation is carried out is also disclosed.

In P. Pargas, *A Lens Measuring Method using Photoconductive Cells*, J. SMPTE 74, 1965, pp. 501-504, an evaluation of lens characteristics is disclosed by using a method based on changes in the light distribution which take place in the image plane as the image of high-contrast target is moved through focus. A photoconductive surface in the image plane measures the information in the image. The output of the proposed instrument indicates the degree of sharpness of the image. Similarly, in P. Pargas, *Phenomena of Image Sharpness Recognition of CdS and CdSe Photoconductors*, J. Opt. Soc. America. 54, 1964, pp. 516-519, a theory is presented to account for the fact that a photoconductive cell can detect when an image projected on it is in sharpest focus. Therein, use is made of the findings that the conductance of a photoconductive cell varies when the distribution of light on the photoconductive surface is changed. The theory is based on the assumption that each of the smallest particles in the photoconductive surface is treated as an individual photoconductor in a series-parallel connection with all other particles.

Similarly, in J. T. Billings, *An Improved Method for Critical Focus of Motion-Picture Optical Printers*, J. SMPTE 80, 1971, pp. 624-628, a sharpness meter is disclosed which is used as a tool to determine optimum focus on motion-picture optical printers. The concept is based on the photoconductive behavior of CdS or CdSe cells. The resistance of the overall cell depends both on the amount of light impinging on the cell and the distribution of the light. In the device, the difference in electrical response of two photocells, one with a diffuser and one without, is amplified. A maximum deflection of a meter at sharpest focus that is independent of the total amount of light is detected.

Further, M. Popescu, *Disordered Chalcogenide optoelectronic materials: phenomena and applications*, J. Optoelectronics and Adv. Mat. 7, 2005, pp. 2189-220, describes a number of glassy, amorphous, and disordered chalcogenide materials which might be suitable for optoelectronic applications as well as physical and/or chemical effects which can be observed in this kind of materials.

W. Hermes, D. Waldmann, M. Agari, K. Schierle-Arndt, and P. Erk, *Emerging Thin-Film Photovoltaic Technologies*, Chem. Ing. Tech. 2015, 87, No. 4, 376-389 provide an overview over thin-film photovoltaic technologies. Herein, an organics-based solar cell, in particular in a dye-sensitized solar cell (DSSC), a kesterite solar cell which, in particular, may comprise a thin film of copper zinc tin sulfide (CZTS), and a hybrid solar cell based on organic-inorganic halide perovskite absorbers, especially on methylammonium lead iodide ($CH_3NH_3PbI_3$), are presented as promising candidates for high solar efficiency.

Further, J. P. Clifford, G. Konstantatos, K. W. Johnston, S. Hoogland, L. Levina, and E. H. Sargent, *Fast, sensitive and spectrally tunable colloidal quantum-dot photodetectors*, Nature Nanotechnology 4, January 2009, describe ultrasensitive photodetectors based on solution-process colloidal quantum dots (CQD) operating in both the visible and infrared. Accordingly, a spacing between individual CODs may be controlled by a length of an organic ligand used to passivate their surfaces, which has been proved to be a determining factor with respect to a charge-carrier mobility and, consequently, a conductivity of CQD films. Contrary to state-of-the-art devices which either exhibit considerably long response times on the scale of seconds for changes with respect to the illumination or suffer from a low sensitivity, the authors show that the temporal response of CQD devices is determined by two components, i.e. electron drift, being a fast process, and electron diffusion, being a slow process. Taking this observation into account, tunable CQD photodiodes operable in the visible and/or the infrared spectral range capable of excluding the diffusion component, which exhibit a considerable improvement with respect to the product of sensitivity and bandwidth, have been provided. For this purpose, photodiodes based on a Schottky barrier at an interface between a PbS CQD film and an aluminum contact have been used, wherein a planar, transparent indium tin oxide (ITO) thin film on a glass substrate forms an opposing Ohmic contact. An incident light beam through the glass substrate generates electrons and holes in the CQD film which are collected at the aluminum contact and the ITO film, respectively. As a result, a depletion region may form in the CQD film at a metal-CQD interface, whereas the remaining volume of the CQD film may be considered as a p-type semiconductor. Herein, the PbS CQDs used had diameters of approx. 6 nm, thus, providing an increased value of 0.86 eV for an effective bandgap (compared to 0.42 eV for bulk PbS), which results in an absorption feature around 1450 nm.

Furthermore, G. H. Carey, A. L. Abdelhady, Z. Ning, S. M. Thon, O. M. Bakr, and E. H. Sargent, *Colloidal Quantum Dot Solar Cells*, Chem. Rev. 115 (23), 2015, pp 12732-12763, provide a review concerning photovoltaic devices comprising doped semiconductor CQD films which are combined, along with asymmetric electrodes, with a metal or with another semiconductor in order to generate a complete solar cell. As a result, a Schottky barrier cell may be obtained with the metal, while the at least two semiconductors may, preferably, combine into at least one of a CQD-CQD p-n junction, a CQD-titanium dioxide p-n junction, or a CQD-CQD-zinc oxide p-i-n junction. Herein, the state of the art related to synthesizing quantum dot solutions which may comprise desired properties with respect to band gap, absorption, and dispersity; converting the solutions into CQD films which may comprise desired properties with regard to quantum dot packing, surface passivation, absorption, and conductivity; and constructing material stacks around the CQD film for generating the complete solar cell are addressed.

Despite the advantages implied by the above-mentioned devices and detectors, there still is a need for improvements with respect to a simple, cost-efficient and, still, reliable spatial detector.

Problem Addressed by the Invention

Therefore, a problem addressed by the present invention is that of specifying a device and a method for optically detecting at least one object which at least substantially avoid the disadvantages of known devices and methods of this type. In particular, an improved simple, cost-efficient and, still, reliable spatial detector for determining the position of an object in space not only by using light beams in the visible spectral range but also in the infrared spectral range, in particular in the near-infrared spectral range, would be desirable.

SUMMARY OF THE INVENTION

This problem is solved by the invention with the features of the independent patent claims. Advantageous developments of the invention, which can be realized individually or in combination, are presented in the dependent claims and/or in the following specification and detailed embodiments.

As used herein, the expressions "have", "comprise" and "contain" as well as grammatical variations thereof are used in a non-exclusive way. Thus, the expression "A has B" as well as the expression "A comprises B" or "A contains B" may both refer to the fact that, besides B, A contains one or more further components and/or constituents, and to the case in which, besides B, no other components, constituents or elements are present in A.

In a first aspect of the present invention, a detector for optical detection, in particular, for determining a position of at least one object, specifically with regard to a depth or to both the depth and a width of the at least one object is disclosed.

The "object" generally may be an arbitrary object, chosen from a living object and a non-living object. Thus, as an example, the at least one object may comprise one or more articles and/or one or more parts of an article. Additionally or alternatively, the object may be or may comprise one or more living beings and/or one or more parts thereof, such as one or more body parts of a human being, e.g. a user, and/or an animal.

As used herein, a "position" generally refers to an arbitrary item of information on a location and/or orientation of the object in space. For this purpose, as an example, one or more coordinate systems may be used, and the position of the object may be determined by using one, two, three or more coordinates. As an example, one or more Cartesian coordinate systems and/or other types of coordinate systems may be used. In one example, the coordinate system may be a coordinate system of the detector in which the detector has a predetermined position and/or orientation. As will be outlined in further detail below, the detector may have an optical axis, which may constitute a main direction of view of the detector. The optical axis may form an axis of the coordinate system, such as a z-axis. Further, one or more additional axes may be provided, preferably perpendicular to the z-axis.

Thus, as an example, the detector may constitute a coordinate system in which the optical axis forms the z-axis and in which, additionally, an x-axis and a y-axis may be provided which are perpendicular to the z-axis and which are perpendicular to each other. As an example, the detector and/or a part of the detector may rest at a specific point in this coordinate system, such as at the origin of this coordinate system. In this coordinate system, a direction parallel or antiparallel to the z-axis may be regarded as a longitudinal direction, and a coordinate along the z-axis may be considered a longitudinal coordinate. An arbitrary direction perpendicular to the longitudinal direction may be considered a transversal direction, and an x- and/or y-coordinate may be considered a transversal coordinate.

Alternatively, other types of coordinate systems may be used. Thus, as an example, a polar coordinate system may be used in which the optical axis forms a z-axis and in which a distance from the z-axis and a polar angle may be used as additional coordinates. Again, a direction parallel or antiparallel to the z-axis may be considered a longitudinal direction, and a coordinate along the z-axis may be considered a longitudinal coordinate. Any direction perpendicular to the z-axis may be considered a transversal direction, and the polar coordinate and/or the polar angle may be considered a transversal coordinate.

As used herein, the detector for optical detection generally is a device which is adapted for providing at least one item of information on the position of the at least one object. The detector may be a stationary device or a mobile device. Further, the detector may be a stand-alone device or may form part of another device, such as a computer, a vehicle or any other device. Further, the detector may be a hand-held device. Other embodiments of the detector are feasible.

The detector may be adapted to provide the at least one item of information on the position of the at least one object in any feasible way. Thus, the information may e.g. be provided electronically, visually, acoustically or in any arbitrary combination thereof. The information may further be stored in a data storage of the detector or a separate device and/or may be provided via at least one interface, such as a wireless interface and/or a wire-bound interface.

The detector for an optical detection of at least one object according to the present invention comprises:
- at least one longitudinal optical sensor, wherein the longitudinal optical sensor has at least one sensor region, wherein the longitudinal optical sensor is designed to generate at least one longitudinal sensor signal in a manner dependent on an illumination of the sensor region by a light beam, wherein the longitudinal sensor signal, given the same total power of the illumination, is dependent on a beam cross-section of the light beam in the sensor region, wherein the sensor region comprises at least one photoconductive material, wherein an electrical conductivity in the photoconductive material, given the same total power of the illumination, is dependent on the beam cross-section of the light beam in the sensor region, wherein the longitudinal sensor signal is dependent on the electrical conductivity; and
- at least one evaluation device, wherein the evaluation device is designed to generate at least one item of information on a longitudinal position of the object by evaluating the longitudinal sensor signal of the longitudinal optical sensor.

Herein, the components listed above may be separate components. Alternatively, two or more of the components as listed above may be integrated into one component. Further, the at least one evaluation device may be formed as a separate evaluation device independent from the transfer device and the longitudinal optical sensors, but may preferably be connected to the longitudinal optical sensors in order to receive the longitudinal sensor signal. Alternatively, the at least one evaluation device may fully or partially be integrated into the longitudinal optical sensors.

As used herein, the "longitudinal optical sensor" is generally a device which is designed to generate at least one longitudinal sensor signal in a manner dependent on an illumination of the sensor region by the light beam, wherein the longitudinal sensor signal, given the same total power of the illumination, is dependent, according to the so-called "FiP effect" on a beam cross-section of the light beam in the sensor region. The longitudinal sensor signal may generally be an arbitrary signal indicative of the longitudinal position, which may also be denoted as a depth. As an example, the longitudinal sensor signal may be or may comprise a digital and/or an analog signal. As an example, the longitudinal sensor signal may be or may comprise a voltage signal and/or a current signal. Additionally or alternatively, the longitudinal sensor signal may be or may comprise digital data. The longitudinal sensor signal may comprise a single signal value and/or a series of signal values. The longitudinal sensor signal may further comprise an arbitrary signal which is derived by combining two or more individual signals, such as by averaging two or more signals and/or by forming a quotient of two or more signals. For potential embodiments of the longitudinal optical sensor and the longitudinal sensor signal, reference may be made to the optical sensor as disclosed in WO 2012/110924 A1.

According to the present invention, the at least one longitudinal optical sensor exhibits at least one sensor region, wherein the sensor region comprises at least one photoconductive material. As used herein, the term "photoconductive material" refers to a material which is capable of sustaining an electrical current and, therefore, exhibits a specific electrical conductivity, wherein, specifically, the electrical conductivity is dependent on the illumination of the material. Since an electrical resistivity is defined as the reciprocal value of the electrical conductivity, alternatively, the term "photoresistive material" may also be used to denominate the same kind of material. In this kind of material, the electrical current may be guided via at least one first electrical contact through the material to at least one second electrical contact, wherein the first electrical contact is isolated from the second electrical contact while both the first electrical contact and the second electrical contact are in direct connection with the material. For this purpose, the direct connection may be provided by any known measure known from the state of the art, such as plating, welding, soldering, or depositing electrically highly conductive substances, in particular metals like gold, silver, platinum or palladium as well as alloys comprising at least one of the mentioned metals, at the contact zones.

Further, the sensor region of the longitudinal optical sensor is illuminated by at the least one light beam. Given the same total power of the illumination, the electrical conductivity of the sensor region, therefore, depends on the beam cross-section of the light beam in the sensor region, be denominated as a "spot size" generated by the incident beam within the sensor region. Thus, the observable property that the electrical conductivity of the photoconductive material depends on an extent of the illumination of the sensor region comprising the photoconductive material by an incident light beam particularly accomplishes that two light beams comprising the same total power but generating different spot sizes on the sensor region provide different values for the electrical conductivity of the photoconductive material in the sensor region and are, consequently, distinguishable with respect to each other.

Further, since the longitudinal sensor signal is determined by applying an electrical signal, such as a voltage signal and/or a current signal, the electrical conductivity of the material which is traversed by the electrical signal is, therefore, taken into account when determining the longitudinal sensor signal. As will be explained below in more detail, an application of a bias voltage source and of a load resistor employed in series with the longitudinal optical sensor may preferably be used here. As a result, the longitudinal optical sensor which comprises a photoconductive material within the sensor region, thus, principally allows determining the beam cross-section of the light beam in the sensor region from a recording of the longitudinal sensor signal, such as by comparing at least two longitudinal sensor signals, at least one item of information on the beam cross-section, specifically on the beam diameter.

Further, since the beam cross-section of the light beam in the sensor region, according to the above-mentioned FP effect, given the same total power of the illumination, depends on the longitudinal position or depth of an object which emits or reflects the light beam which impinges on the sensor region, the longitudinal optical sensor may, therefore, be applied to determining a longitudinal position of the respective object.

As already known from WO 2012/110924 A1, the longitudinal optical sensor is designed to generate at least one longitudinal sensor signal in a manner dependent on an illumination of the sensor region, wherein the sensor signal, given the same total power of the illumination depends on a beam cross-section of the illumination on the sensor region. As an example, a measurement of a photocurrent I as a function of a position of a lens is provided there, wherein the lens is configured for focusing electromagnetic radiation onto the sensor region of the longitudinal optical sensor. During the measurement, the lens is displaced relative to the longitudinal optical sensor in a direction perpendicular to the sensor region in a manner that, as a result, the diameter of the light spot on the sensor region changes. In this particular example in which a photovoltaic device, in particular, a dye solar cell, is employed as the material in the sensor region, the signal of the longitudinal optical sensor, in this case a photocurrent, clearly depends on the geometry of the illumination such that, outside a maximum at the focus of the lens, the photocurrent falls to less than 10% of its maximum value.

This effect is particularly striking with respect to similar measurements performed by using silicon diodes and germanium diodes as the material in the sensor region. In this case in which optical sensors of a conventional type are used, the sensor signal, given the same total power, is substantially independent of a geometry of the illumination of the sensor region. Thus, according to the FiP-effect, the longitudinal sensor signal, given the same total power, may exhibit at least one pronounced maximum for one or a plurality of focusings and/or for one or a plurality of specific sizes of the light spot on the sensor region or within the sensor region. For purposes of comparison, an observation of a maximum of the longitudinal sensor signal in a condition in which the corresponding material is impinged by a light beam with the smallest possible cross-section, such as when the material may be located at or near a focal point as affected by an optical lens, may be denominated as a "positive FiP-effect". As has been found so far, the above-mentioned photovoltaic device, in particular, the dye solar cell, provides a positive FiP-effect under these circumstances.

According to the present invention, a photoconductive material is proposed as a further class of materials being appropriate to be employed in a longitudinal optical sensor which is designed to generate at least one longitudinal sensor signal in a manner dependent on an illumination of the sensor region, wherein the sensor signal, given the same total power of the illumination, depends on a beam cross-section of the illumination on the sensor region. As will be shown below in more detail, this class of photoconductive materials may exhibit a "negative FiP-effect", which, in correspondence to the definition of the positive FiP-effect, describes an observation of a minimum of the longitudinal sensor signal under a condition in which the corresponding material is impinged by a light beam with the smallest available beam cross-section, in particular, when the material may be located at or near a focal point as effected by an optical lens. Consequently, the photoconductive material may, thus, preferably be used under circumstances in which an appearance of the negative FiP-effect may be advantageous or required.

Within this regard, the difference between a photoconductive material and a photovoltaic material may be addressed here. In a longitudinal optical sensor comprising a photovoltaic material, an illumination of the respective sensor region may generate charge carriers which may provide a photoelectric current or a photoelectric voltage to be determined. As an example, when a light beam may be incident upon a photovoltaic material, the electrons which may be present in a valence band of the material may absorb energy and, thus being excited, may jump to the conduction band where they may behave as free conductive electrons. On the contrary, in a longitudinal optical sensor comprising a photoconductive material, the resistivity of the sensor region may be varied by the illumination of the corresponding sensor region, whereby the observable change in electrical conductivity of the material may be monitored by a variation in a voltage applied across the material or in an alteration of the value of a current applied through the material, such as by an application of a bias voltage across the material.

For this purpose, a bias voltage source and a load resistor may, particularly, be employed in series with the longitudinal optical sensor. As used herein, the term "bias voltage source" generally refers to a device being configured to apply a bias voltage across a material of the longitudinal optical sensor. The property of the longitudinal optical sensor may, thus, be electrically adjustable by the biasing device. Herein, the biasing device may be configured to apply at least one bias voltage to the longitudinal optical sensor. As will be outlined in further detail below, a property of the longitudinal optical sensor may be adjustable by using different bias voltages.

This difference in behavior of the photoconductive material with respect to the photovoltaic material may be explained by a reasonable assumption that a density of the generated charge carriers may be proportional to the photon irradiance, wherein, however, at higher carrier densities, there may be a higher probability of electron-hole recombination, which may also be called "Auger recombination". Herein, Auger recombination may be considered as a dominant loss mechanism. Therefore, as the intensity of the photon irradiance may increase, the carrier lifetime might decrease, which may result in the described effect in the photoconductive material. As a result, the longitudinal optical sensor comprising a photoconductive material may, in general, exhibit a behavior which may significantly be different and vary from the properties of the known longitudinal optical sensor which comprises a photovoltaic material.

For the purposes of the present invention, the photoconductive material as used in the sensor region of the longitudinal optical sensor may, preferably, comprise an inorganic photoconductive material, an organic photoconductive material, a combination thereof and/or a solid solution thereof and/or a doped variant thereof. As used herein, the term "solid solution" refers to a state of the photoconductive material in which at least one solute may be comprised in a solvent, whereby a homogeneous phase is formed and wherein the crystal structure of the solvent may, generally, be unaltered by the presence of the solute. By way of example, the binary CdTe may be solved in ZnTe leading to $Cd_{1-x}Zn_xTe$, wherein x can vary from 0 to 1. As further used herein, the term "doped variant" may refer to a state of the photoconductive material in which single atoms apart from the constituents of the material itself are introduced onto sites within the crystal which are occupied by intrinsic atoms in the undoped state. By way of example, a pure silicon crystal may be doped with one or more of boron, aluminum, gallium, indium, phosphorous, arsenic, antimony, germanium, or other atoms, particularly, in order to modify the chemical and/or physical properties of the silicon crystal.

Within this regard, the inorganic photoconductive material may, in particular, comprise one or more of selenium, tellurium, a selenium-tellurium alloy, a metal oxide, a group IV element or compound, i.e. an element from group IV or a chemical compound with at least one group IV element, a group III-V compound, i.e. a chemical compound with at least one group III element and at least one group V element, a group II-VI compound, i.e. a chemical compound with, on one hand, at least one group II element or at least one group XII element and, on the other hand, at least one group VI element, and/or a chalcogenide, which might, preferably, be selected from a group comprising sulfide chalcogenides, selenide chalcogenides, ternary chalcogenides, quaternary and higher chalcogenides. However, other inorganic photoconductive materials may equally be appropriate.

With respect to selenium (Se), it may be mentioned that this material has long been known to exhibit photoconductive properties and has, therefore, been employed in early television, vidicon camera tubes, and xerography, and may still be used in the sensor region in photoconductive cells. Concerning selenium-tellurium alloys, P. H. Keck, *Photoconductivity in Vacuum Coated Selenium Films*, J. Opt. Soc. of America, 42, p. 221-225, 1952, describes photoconductive selenium layers comprising an addition of 5 to 9 wt. % tellurium which, thus, is capable to increase the photoconductivity compared to a selenium layer without additional tellurium and, moreover, yields a high spectral response over the whole optical spectrum from 400 nm to 800 nm. Further, in order to provide photoconductive properties, U.S. Pat. No. 4,286,035 A discloses that the amount of tellurium in the selenium-tellurium alloy may further be increased from 5 wt. % up to 20 wt. % by simultaneously adding a concentration of at least one halogen in the photoconductive layer in a range from 5 ppm to 500 ppm, wherein the halogen is selected from the group consisting of fluorine, chlorine, bromine, and iodine.

As mentioned above, the chalcogenide, preferably selected from a group comprising sulfide chalcogenides, selenide chalcogenides, telluride chalcogenides, ternary chalcogenides, quaternary and higher chalcogenides, may preferably be appropriate to be used as the photoconductive material in the sensor region of the longitudinal optical sensor. This preference may particularly be based on a reason that this kind of material has already known to be both cost-efficient and reliable in many different areas of application, including optical detectors for the infrared spectral range.

In particular, the sulfide chalcogenide may be selected from a group comprising lead sulfide (PbS), cadmium sulfide (CdS), zinc sulfide (ZnS), mercury sulfide (HgS), silver sulfide ($Ag_2S$), manganese sulfide (MnS), bismuth trisulfide ($Bi_2S_3$), antimony trisulfide ($Sb_2S_3$), arsenic trisulfide ($As_2S_3$), tin (II) sulfide (SnS), tin (IV) disulfide ($SnS_2$), indium sulfide ($In_2S_3$), copper sulfide (CuS or $Cu_2S$), cobalt sulfide (CoS), nickel sulfide (NiS), molybdenum disulfide ($MoS_2$), iron disulfide ($FeS_2$), and chromium trisulfide ($CrS_3$).

In particular, the selenide chalcogenide may be selected from a group comprising lead selenide (PbSe), cadmium selenide (CdSe), zinc selenide (ZnSe), bismuth triselenide ($Bi_2Se_3$), mercury selenide (HgSe), antimony triselenide ($Sb_2Se_3$), arsenic triselenide ($As_2Se_3$), nickel selenide (NiSe), thallium selenide (TlSe), copper selenide (CuSe or $Cu_2Se$), molybdenum diselenide ($MoSe_2$), tin selenide (SnSe), and cobalt selenide (CoSe), and indium selenide ($In_2Se_3$). Further, solid solutions and/or doped variants of the mentioned compounds or of other compounds of this kind may also be feasible.

In particular, the telluride chalcogenide may be selected from a group comprising lead telluride (PbTe), cadmium telluride (CdTe), zinc telluride (ZnTe), mercury telluride (HgTe), bismuth tritelluride ($Bi_2Te_3$), arsenic tritelluride ($As_2Te_3$), antimony tritelluride ($Sb_2Te_3$), nickel telluride (NiTe), thallium telluride (TlTe), copper telluride (CuTe), molybdenum ditelluride ($MoTe_2$), tin telluride (SnTe), and cobalt telluride (CoTe), silver telluride ($Ag_2Te$), and indium telluride ($In_2Te_3$). Further, solid solutions and/or doped variants of the mentioned compounds or of other compounds of this kind may also be feasible.

In particular, the ternary chalcogenide may be selected from a group comprising mercury cadmium telluride (HgCdTe; MCT), mercury zinc telluride (HgZnTe), mercury cadmium sulfide (HgCdS), lead cadmium sulfide (PbCdS), lead mercury sulfide (PbHgS), copper indium disulfide ($CuInS_2$; CIS), cadmium sulfoselenide (CdSSe), zinc sulfoselenide (ZnSSe), thallous sulfoselenide (TlSSe), cadmium zinc sulfide (CdZnS), cadmium chromium sulfide ($CdCr_2S_4$), mercury chromium sulfide ($HgCr_2S_4$), copper chromium sulfide ($CuCr_2S_4$), cadmium lead selenide (CdPbSe), copper indium diselenide ($CuInSe_2$), indium gallium arsenide (InGaAs), lead oxide sulfide ($Pb_2OS$), lead oxide selenide ($Pb_2OSe$), lead sulfoselenide (PbSSe), arsenic selenide telluride ($As_2Se_2Te$), indium gallium phosphide (InGaP), gallium arsenide phosphide (GaAsP), aluminum gallium phosphide (AlGaP), cadmium selenite ($CdSeO_3$), cadmium zinc telluride (CdZnTe), and cadmium zinc selenide (CdZnSe), further combinations by applying compounds from the above listed binary chalcogenides and/or binary III-V-compounds. Further, solid solutions and/or doped variants of the mentioned compounds or of other compounds of this kind may also be feasible.

With regard to quaternary and higher chalcogenides, this kind of material may be selected from a quaternary and higher chalcogenide which may be known to exhibit suitable photoconductive properties. In particular, a compound having a composition of $Cu(In, Ga)S/Se_2$ or of $Cu_2ZnSn(S/Se)_4$ may be feasible for this purpose.

With regard to the III-V compound, this kind of semiconducting material may be selected from a group comprising indium antimonide (InSb), boron nitride (BN), boron phosphide (BP), boron arsenide (BAs), aluminum nitride (AlN), aluminum phosphide (AlP), aluminum arsenide (AlAs), aluminum antimonide (AlSb), indium nitride (InN), indium phosphide (InP), indium arsenide (InAs), indium antimonide (InSb), gallium nitride (GaN), gallium phosphide (GaP), gallium arsenide (GaAs), and gallium antimonide (GaSb). Further, solid solutions and/or doped variants of the mentioned compounds or of other compounds of this kind may also be feasible.

With regard to the II-VI compound, this kind of semiconducting material may be selected from a group comprising cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), mercury selenide (HgSe), mercury telluride (HgTe), cadmium zinc telluride (CdZnTe), mercury cadmium telluride (HgCdTe), mercury zinc telluride (HgZnTe), and mercury zinc selenide (CdZnSe). However, other II-VI compounds may be feasible. Further, solid solutions of the mentioned compounds or of other compounds of this kind may also be applicable.

In a further preferred embodiment, the photoconductive material may be provided in form of a colloidal film which comprises quantum dots. This state of the photoconductive material which may exhibit slightly or significantly modified chemical and/or physical properties with respect to a homogeneous layer of the same material may, thus, also be denoted as colloidal quantum dots (CQD). As used herein, the term "quantum dots" refers to a state of the photoconductive material in which the photoconductive material may comprise electrically conducting particles, such as electrons or holes, which are confined in all three spatial dimensions to a small volume that is usually denominated as a "dot". Herein, the quantum dots may exhibit a size which can, for simplicity, be considered as diameter of a sphere that might approximate the mentioned volume of the particles. In this preferred embodiment, the quantum dots of the photoconductive material may, in particular, exhibit a size from 1 nm to 100 nm, preferably from 2 nm to 100 nm, more preferred from 2 nm to 15 nm. Consequently, the thin film which comprises the quantum dots of the photoconductive material, may exhibits a thickness from 1 nm to 100 nm, preferably from 2 nm to 100 nm, more preferred from 2 nm to 15 nm, provided that the quantum dots actually comprised in a specific thin film may exhibit a size being below the thickness of the specific thin film. In practice, the quantum dots may comprise nanometer-scale semiconductor crystals which might be capped with surfactant molecules and dispersed in a solution in order to form the colloidal film. Herein, the surfactant molecules may be selected to allow determining an average distance between the individual quantum dots within the colloidal film, in particular, as a result from the approximate spatial extension of the selected surfactant molecules. Further, depending on the synthesis of ligands, quantum dots may exhibit hydrophilic or hydrophobic properties. The CQD can be produced by applying a gas-phase, a liquid-phase, or a solid-phase approach. Hereby, various ways for a synthesis of the CQD are possible, in particular by employing known processes such as thermal spraying, colloidal synthesis, or plasma synthesis. However, other production processes may also be feasible.

Further in this preferred embodiment, the photoconductive material may, preferably, be selected from one of the photoconductive materials as mentioned above, more particular, from the group comprising lead sulfide (PbS), lead selenide (PbSe), lead telluride (PbTe), cadmium telluride (CdTe), indium phosphide (InP), cadmium sulfide (CdS), cadmium selenide (CdSe), indium antimonide (InSb), mercury cadmium telluride (HgCdTe; MCT), copper indium sulfide (CIS), copper indium gallium selenide (CIGS), zinc sulfide (ZnS), zinc selenide (ZnSe), a perovskite structure materials $ABC_3$, wherein A denotes an alkaline metal or an organic cation, B=Pb, Sn, or Cu, and C a halide, and copper zinc tin sulfide (CZTS). Further, solid solutions and/or doped variants of the mentioned compounds or of other compounds of this kind may also be feasible. Core shell structures of the materials of this kind of materials may also be feasible. However, other photoconductive materials may also be feasible.

In a particular embodiment, the thin film comprising the quantum dots of the photoconductive material may be arranged between two individual conductive layers, i.e. a first conductive layer and a second conductive layer. Herein, the two individual conductive layers may, preferably, be arranged in form of a sandwich structure, i.e. in a manner that the thin film may adjoin both the first conductive layer and the second conductive layer while the first conductive layer and the second conductive layer may be separated from each other. In this particular embodiment, the first conductive layer may, preferably, be selected to exhibit at least partially optically transparent properties with respect to the incident light beam. As a result, at least a partition of the incident light beam may be able to pass through the first conductive layer in order to reach the thin film which comprises the colloidal quantum dots of the photoconductive material. For this purpose, the first conductive layer may, in particular, comprise an at least partially transparent semiconducting material, wherein the semiconducting material may, preferably, be selected from the group comprising an at least partially transparent semiconducting metal oxide or a doped variant thereof. Herein, the semiconducting material may, especially, be selected from known at least one transparent metal oxide, in particular from indium tin oxide (ITO), fluorine-doped tin oxide (SnO2:F; FTO), magnesium oxide (MgO), aluminum zinc oxide (AZO), antimony tin oxide ($SnO_2/Sb_2O_5$), or a perovskite transparent conductive oxide, such as $SrVO_3$, or $CaVO_3$, or, alternatively, from metal nanowires, such as Ag nanowires.

As described above, the first conductive layer may, preferably, be selected to exhibit at least partially optically transparent properties in order to allow at least a partition of the incident light beam passing through the first conductive layer in order to reach the thin film comprising the colloidal quantum dots. Alternatively or in addition, the second conductive layer may, thus, also be selected to exhibit at least partially optically transparent properties. On the other hand, in case the first conductive layer may already be at least partially transparent, a larger variety of different materials, including optically intransparent materials, may be employed for the second conductive layer. Thus, the second conductive layer may comprise an evaporated metal layer which may easily be provided by known evaporation techniques. In particular, the evaporated metal layer may comprise one or more of silver, aluminum, platinum, magnesium, chromium, titanium, or gold. Alternatively, the second conductive layer may comprise a layer of graphene.

In an alternative embodiment, a layer of an electrically conducting organic polymer may be employed as the second conductive layer. Herein, poly(3,4-ethylenedioxythiophene) (PEDOT) or a dispersion of PEDOT and a polystyrene sulfonic acid (PEDOT:PSS) may be selected as the electrically conducting polymer. Further, in particular for allowing a better electronic contact, a split electrode having at least two separate electrodes which each may comprise an evaporated metal contact may be arranged on top of the layer of the electrically conducting polymer. Herein, the evaporated metal contacts may, in particular, comprise one or more of silver, aluminum, platinum, magnesium, chromium, titanium, or gold. Alternatively, at least one of the two separate electrodes may comprise a layer of graphene.

In this embodiment, a Schottky barrier may, additionally, form at an interface between the thin film comprising the quantum dots and one of the conductive layers which may exhibit properties which are sufficient for forming the Schottky barrier. As generally used, the term "Schottky barrier", refers to an energy barrier for electrons which may appear at a boundary layer between a semiconductor layer and an adjacent metal layer which may, in contrast to an Ohmic contact as described below in more detail, exhibit a rectifying characteristic, thus, allowing the electronic device comprising the Schottky barrier being used as a diode. By way of example, the incident light beam which may traverse the first transparent conductive layers, such as the transparent indium tin oxide (ITO) electrode, may generate charge carriers, i.e. electrons and holes, within the thin film comprising the quantum dots. Further, the charge carriers may be collected at the boundaries towards both the transparent first conductive layers and a second conductive layer, which may, preferably be an aluminum electrode. As a result, a depletion region may form within the thin film towards the Schottky barrier located at the interface between the first conductive layer and the thin film, whereas the remaining volume of the thin film may behave as a p-type semiconductor layer.

In a special embodiment, a blocking layer may, additionally, be arranged between the first conductive layer and the thin film of the photoconductive material comprising the colloidal quantum dots. As used herein, the term "blocking layer" refers to a thin layer which may be adapted to influence a path of permeating electrically conducting particles, in particular of electrons or holes, with respect to the adjacent layers in an electronic element, such as to prevent a short-circuiting of the adjacent layers or to prevent a recombination of permeating conductive particles as provided by one of the adjacent layers with oppositely charged particles, such as ions, located in the other of the adjacent layers. In this special embodiment, the blocking layer may, preferably, comprise a thin film of an electrically conducting material, in particular one or more of titanium dioxide ($TiO_2$) or zinc oxide (ZnO). In this special embodiment the blocking layer may act as an n-type contact and, since the quantum dots are usually p-type entities, may, thus, provide the p-n junction. An alternative setup in which the quantum dots may be n-type entities and which, thus, can comprise a p-type blocking layer, such as a layer of molybdenum oxide ($MoO_3$), may also be possible.

With regard to the metal oxides, this kind of semiconducting material may be selected from a known metal oxide which may exhibit photoconductive properties, particularly from the group comprising copper (II) oxide (CuO), copper (I) oxide ($CuO_2$), nickel oxide (NiO), zinc oxide (ZnO), silver oxide ($Ag_2O$), manganese oxide (MnO), titanium dioxide ($TiO_2$), barium oxide (BaO), lead oxide (PbO), cerium oxide ($CeO_2$), bismuth oxide ($Bi_2O_3$), cadmium oxide (CdO), ferrite ($Fe_3O_4$), and perovskite oxides ($ABC_3$, wherein A is a divalent cation, B a tetravalent cation, and C=O). Further ternary, quarternary or higher metal oxides may also be applicable. Furthermore, solid solutions and/or doped variants of the mentioned compounds or of other compounds of this kind, which could be stoichiometric compounds or off-stoichiometric compounds, may also be feasible. As explained later in more detail, it may be preferable to select a metal oxide which might, simultaneously, also exhibit transparent or translucent properties.

With regard to a group IV element or compound, this kind of semiconducting material may be selected from a group comprising doped diamond (C), doped silicon (Si), silicon carbide (SiC), and silicon germanium (SiGe), wherein the semiconducting material may be selected from a crystalline, or, preferably, from a microcrystalline or an amorphous semiconducting material. For providing a silicon-based photoconductor which may, especially simultaneously, exhibit a high resistivity, a high charge-carrier lifetime, and a low surface recombination rate, doped silicon comprising a low dopant concentration and a low defect density, such as existing in silicon float zone wafers, may preferably be selected. For this purpose, the silicon wafer may, in particular, exhibit

- a dopant concentration of atoms of the dopant material of $10^{13}$ cm$^{-3}$, $10^{12}$ cm$^{-3}$, $10^{11}$ cm$^{-3}$ or less;
- an electrical resistivity of $5 \cdot 10^2$ Ω·cm, preferred of $5 \cdot 10^3$ Ω·cm, more preferred of $10^4$ Ω·cm, or higher; and
- a thickness in a range between 500 µm, more preferred 300 µm, and 1 µm, more preferred 10 µm, for providing, on one hand, the desired high charge-carrier lifetime and, on the other hand, an amount of material sufficient for absorbing a significant amount of light at a target wavelength.

In a particularly preferred embodiment, the photoconductive material may be contacted by a so-called "Ohmic contact". As used herein, the Ohmic contact may refer to an electrical junction which exhibits a linear current-voltage ratio according to Ohm's law but does not comprise any photovoltaic properties as described elsewhere. By contrast, an electrical junction which does not exhibit a linear current-voltage ratio may be denominated as "non-Ohmic". Within this regard, non-Ohmic contacts are, generally, known to appear in a number of embodiments, including but not limited to a p-n junction and to a Schottky barrier as described elsewhere herein. For providing the Ohmic contact, gold, silver, silver-nickel, silver-iron, silver-graphite, silver-cadmium oxide, silver-tin oxide, copper, platinum, palladium, paliney alloys, indium, gallium, indium amalgam, or graphene may be employed, wherein the indium or the gallium may preferably be used in combination with cadmium sulfide (CdS) while the indium amalgam may particularly be suited for a use with other II-VI compounds. However, depending on details of the actual production process, an Ohmic contact or non-Ohmic junction may be obtained.

Generally, semiconductor materials with a three-dimensional crystal structure and an optical gap close to or below the spectral region of application are likely to be of interest if trap levels may be introduced either by doping with a further material or by obtaining a nanocrystalline, a microcrystalline, or an amorphous structure. Doping may, particularly, be achieved by adding metal atoms or salts to the semiconductor in a manner that the band structure of the semiconductor, preferably the conduction band, may be augmented by energy levels of the doping material, preferably with energy levels which are energetically above or below the conduction band. As a particular example, according to F. Stöckmann, *Superlinear photoconductivity*, Phys. Stat. Solidi 34, 751-757, 1969, it may be possible that both the positive FiP-effect and the negative FiP-effect may be achieved in a photoconductive material, wherein the photoconductive material may be subject to a different position and/or concentration of traps and/or recombination centers within the selected photoconductive material.

Alternatively or in addition, the organic photoconductive material may, in particular, be or comprise an organic compound, in particular an organic compound which may be known to comprise appropriate photoconductive properties, preferably polyvinylcarbazole, a compound which is generally used in xerography. However, a large number of other organic molecules which will be described below in more detail may also be feasible.

With regard to printing and imaging systems, reference may be made to the article P. Gregory, Ed., *Chemistry and Technology of printing and imaging systems*, Chapman & Hall, 1996, Chap. 4, R. S. Gairns, *Electrophotography*, p. 76-112, wherein the technology of xerography and respective photoconductors which are used in xerography are described. Herein, as a particular example, a system first presented by R. M. Schaffert, *IBM J. Res. Develop.*, 1971, p. 75-89, and comprising a charge-transfer complex based on polyvinylcarbazole (1) as a donor molecule with trinitrofluorenone (2) as an acceptor molecule may be used:

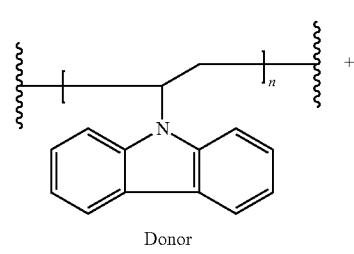

Donor (1)

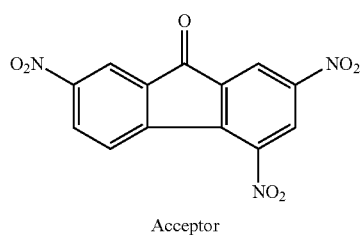

Acceptor (2)

What can be derived from this example is that the organic photoconductors generally differ from their inorganic counterparts in that they may, particularly as a tribute to the nature of the corresponding photoconduction process, comprise a system of two different kinds of organic materials. The reason for this selection may be found in an observation that light striking the organic photoconductor located in an electrical field might be absorbed and may, subsequently, generate a pair of electrical charges which can, further, be transported in form of an electrical current which generates an influence on the photoconductivity of the organic photoconductor.

When using organic photoconductors, it may, thus, be feasible to separate the mentioned two kinds of processes, i.e. generating the electrical charges, on one hand, from transporting the electrical charges, on the other hand, by employing two different kinds of organic materials, which may be denoted as a donor-like "electron donor material" or "charge-generation material", abbreviated to "CGM" and as an acceptor-like "electron acceptor material" or "charge-transport material", abbreviated to "CTM". As can be derived from the example as described above, the polyvinylcarbazole (1) may be considered as the charge-generation material while the trinitrofluorenone (2) may be regarded as the charge-transport material which act as the donor molecule and the acceptor molecule, respectively, in the above-mentioned system comprising the organic charge-transfer complex.

In a particularly preferred embodiment, the organic photoconductors may, thus, comprise at least one conjugated aromatic molecule, preferably a highly conjugated aromatic molecule, in particular a dye or a pigment, preferably to be employed as the charge-generation material. Within this respect, particularly preferred examples of conjugated aromatic molecules exhibiting photoconductive properties include phthalocyanines, such as metal phthalocyanines, in particular TiO-phthalocyanine; naphthalocyanines, such as metal-naphthalocyanines, in particular TiO-naphthalocyanine; subphthalocyanines, such as metal-subphthalocyanines; perylenes, anthracenes; pyrenes; oligo- and polythiophenes; fullerenes; indigoid dyes, such as thioindigos; bis-azo pigments; squarylium dyes; thiapyrilium dyes; azulenium dyes; dithioketo-pyrrolopyrroles; quinacridones; and other organic materials which may exhibit photoconductive properties, such as dibromoanthanthrone, or a derivative or a combination thereof. However, further conjugated aromatic molecules or, in addition, other kinds of organic materials, also in combination with inorganic materials, may also be feasible.

With regard to phthalocyanines, reference may be may made to Frank H. Moser and Arthur L. Thomas, *Phthalocyanine Compounds*, Reinhold Publishing, New York, 1963, p. 69-76, as well as to Arthur L. Thomas, *Phthalocyanine Research and Applications*, CRC Press, Boca Raton, 1990, p. 253-272. As presented there, dihydrogenphthalocyanine (3) or a metal phthalocyanine (4) may preferably be used in the detector according to the present invention:

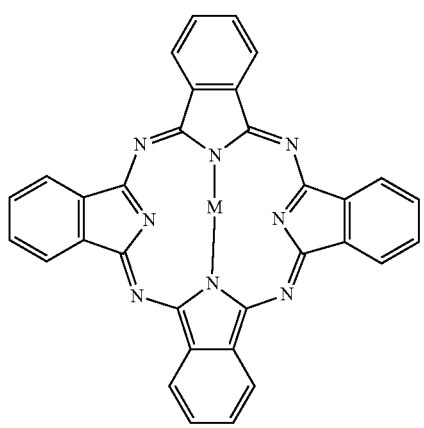

(3)

-continued (4)

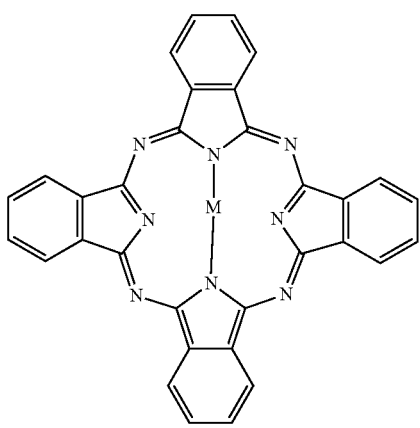

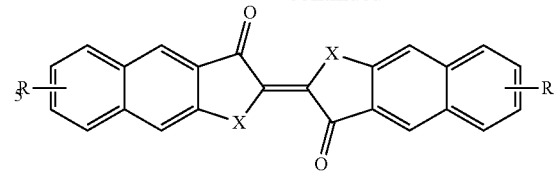

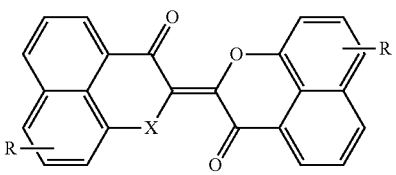

top: (5a), center: (5b), bottom: (5c)

wherein the metal phthalocyanine (4) may, preferably, comprise a metal M selected from magnesium (Mg), copper (Cu), germanium (Ge), or zinc (Zn), or from a metal comprised in an inorganic compound, such as one of Al—Cl, Ga—Cl, In—Cl, TiOCl, VO, TiO, HGa, Si(OH)$_2$, Ge(OH)$_2$, Sn(OH)$_2$, or Ga(OH).

With respect to indigoid dyes, reference may be made to U.S. Pat. No. 4,952,472 A, in which the following three structures (5a, 5b, 5c), wherein X may equal O, S, or Se, are disclosed:

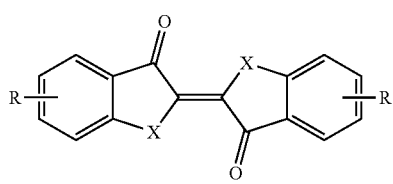

Herein, a preferred indigoid may comprise the compound 4,4',7,7'-tetrachlorothioindigo (6) which is, for example, disclosed in K. Fukushima et al., *Crystal Structures and Photocarrier Generation of Thioindigo Derivatives*, J. Chem. Phys. B, 102, 1988, p. 5985-5990:

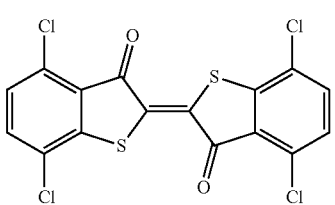

(6)

With regard to bis-azo pigments, a preferred example may be chlorodiane blue (7), which comprises the following structure:

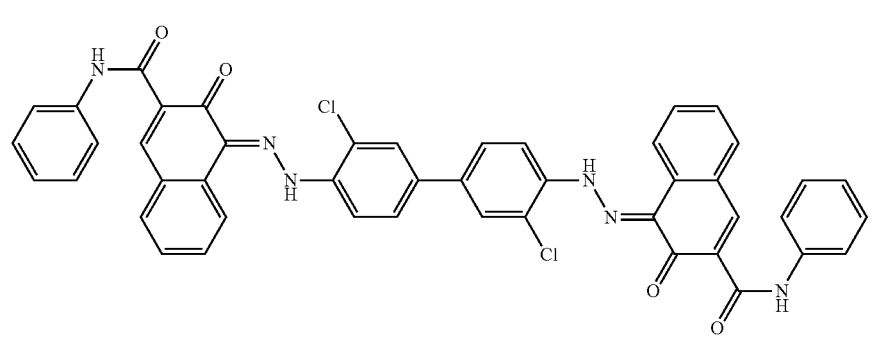

(7)

With respect to perylene derivatives, preferably perylenebisimides (8a) or perylenemonoimides (8b), wherein R is an organic residue, preferably a branched or unbranched alkyl chain, may be used as photoconductive organic material:

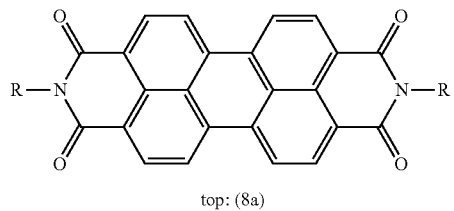

top: (8a)

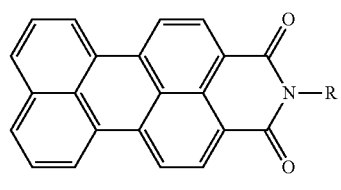

top: (8a), bottom: (8b)

With regard to squarylium dyes, a preferred example may comprise the following molecule (9):

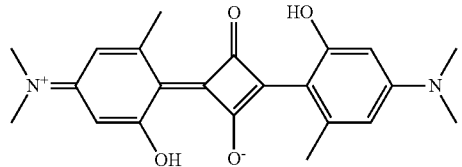

With respect to thiapyrilium dyes, a preferred example may comprise molecule (10) having the following structure:

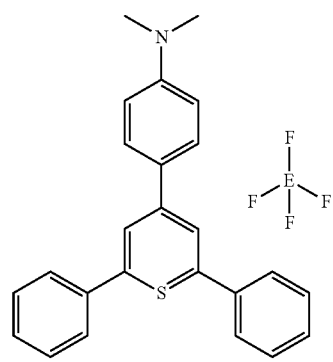

Further, U.S. Pat. No. 4,565,761 A discloses a number of azulenium dyes, such as the following preferred compound (11):

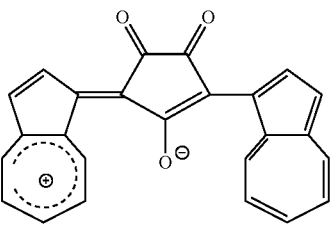

Concerning dithioketo-pyrrolopyrroles, U.S. Pat. No. 4,760,151 A discloses a number of compounds, such as the following preferred molecule (12):

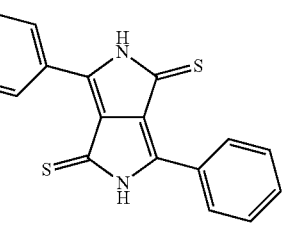

With regard to quinacridones, U.S. Pat. No. 4,760,004 A discloses different thioquinacridones and isothio-quinacridones, including the following preferred photoconductive compound (13):

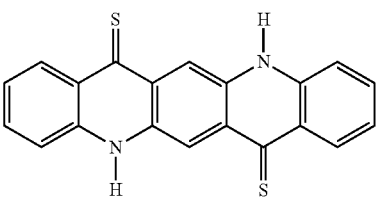

As mentioned above, further organic materials, such as dibromoanthanthrone (14), may also exhibit photoconductive properties being sufficient for being used in the detector according to the present invention:

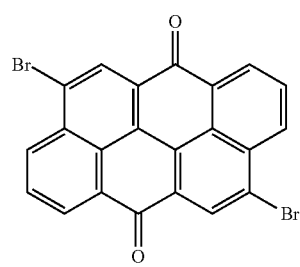

Furthermore, a mixture comprising at least one photoconductor and at least one sensitizer, such as further specified, for example, in U.S. Pat. No. 3,112,197 A or EP 0 112 169 A2 or in a respective reference therein, may also be suitable for being used in the detector according to the present invention. Accordingly, a photoconductive layer which comprises a dye sensitizer may be used for this purpose.

Preferably, the electron donor material and the electron acceptor material may be comprised within a layer which comprises the photoconductive material in form of a mixture. As generally used, the term "mixture" relates to a blend of two or more individual compounds, wherein the individual compounds within the mixture maintain their chemical identity. In a particularly preferred embodiment, the mixture may comprise the electron donor material and the electron acceptor material in a ratio from 1:100 to 100:1, more preferred from 1:10 to 10:1, in particular in a ratio of from 1:2 to 2:1, such as 1:1. However, other ratios of the respective compounds may also be applicable, in particular depending on the kind and number of individual compounds being involved. Preferably, the electron donor material and the electron acceptor material as comprised in form of the mixture may constitute an interpenetrating network of donor domains, in which the electron donor material may predominantly, particularly completely, be present, and of acceptor domains, in which the electron acceptor material may predominantly, in particular completely, be present, wherein interfacial areas between the donor domains and the acceptor domains may exist, and wherein as conductive paths in form of percolation pathways may connect the corresponding domains to the respective electrodes.

In a further preferred embodiment, the electron donor material in the photoconductive layer may comprise a donor polymer, in particular an organic donor polymer, whereas the electron acceptor material may comprise an acceptor small molecule, preferably selected from the group comprising a fullerene-based electron acceptor material, tetracyanoquinodimethane (TCNQ), a perylene derivate, and an acceptor polymer. Thus, the electron donor material may comprise a donor polymer while the electron acceptor material may comprise an acceptor polymer, thus providing a basis for an all-polymer photoconductive layer. In a particular embodiment, a copolymer may, simultaneously, be constituted from one of the donor polymers and from one of the acceptor polymers and which may, therefore, also be denominated as a "push-pull copolymer" based on the respective function of each of the constituents of the copolymer. As generally used, the term "polymer" refers to a macromolecular composition generally comprising a large number of molecular repeat units which are usually denominated as "monomers" or "monomeric units". For the purposes of the present invention, however, a synthetic organic polymer may be preferred. Within this regard, the term "organic polymer" refers to the nature of the monomeric units which may, generally, be attributed as organic chemical compounds. As used herein, the term "donor polymer" refers to a polymer which may particularly be adapted to provide electrons as the electron donor material. Analogously, the term "acceptor polymer" refers to a polymer which may particularly be adapted to receive electrons as the electron acceptor material. Preferably, the layer comprising the organic electron donor material and the organic electron acceptor material may exhibit a thickness from 100 nm to 2000 nm.

Thus, the at least one electron donor material may comprise a donor polymer, in particular an organic donor polymer. Preferably, the donor polymer may comprise a conjugated system, in which delocalized electrons may be distributed over a group of atoms being bonded together by alternating single and multiple bonds, wherein the conjugated system may be one or more of cyclic, acyclic, and linear. Thus, the organic donor polymer may, preferably, be selected from one or more of the following polymers:

poly[3-hexylthiophene-2,5-diyl] (P3HT),
poly[3-(4-n-octyl)-phenylthiophene] (POPT),
poly[3-10-n-octyl-3-phenothiazine-vinylenethiophene-co-2,5-thiophene] (PTZV-PT), poly[4,8-bis[(2-ethylhexyl)oxy]benzo[1,2-b:4,5-b]dithiophene-2,6-diyl][3-fluoro-2-[(2-ethylhexyl)carbonyl]thieno[3,4-b]thiophenediyl] (PTB7),
poly[thiophene-2,5-diyl-alt-[5,6-bis(dodecyloxy)benzo[c][1,2,5]thiadiazole]-4,7-diyl] (PBT-T1),
poly[2,6-(4,4-bis-(2-ethylhexyl)-4H-cyclopenta[2,1-b3,4-b]dithiophene)-alt-4,7(2,1,3-benzothiadiazole)] (PCPDTBT),
poly[5,7-bis(4-decanyl-2-thienyl)-thieno(3,4-b)diathiazolethiophene-2,5] (PDDTT),
poly[N-9'-heptadecanyl-2,7-carbazole-alt-5,5-(4',7'-di-2-thienyl-2',1',3'-benzothiadiazole)] (PCDTBT), or
poly[(4,4'-bis(2-ethylhexyl)dithieno[3,2-b;2',3'-d]silole)-2,6-diyl-alt-(2,1,3-benzothia-diazole)-4,7-diyl] (PS-BTBT),
poly[3-phenylhydrazone thiophene] (PPHT),
poly[2-methoxy-5-(2-ethylhexyloxy)-1,4-phenylenevinylene] (MEH-PPV),
poly[2-methoxy-5-(2'-ethylhexyloxy)-1,4-phenylene-1,2-ethenylene-2,5-dimethoxy-1,4-phenylene-1,2-ethenylene] (M3EH-PPV),
poly[2-methoxy-5-(3',7'-dimethyloctyloxy)-1,4-phenylenevinylene] (MDMO-PPV),
poly[9,9-di-octylfluorene-co-bis-N,N-4-butylphenyl-bis-N,N-phenyl-1,4-phenylenediamine] (PFB),
or a derivative, a modification, or a mixture thereof.

However, other kinds of donor polymers or further electron donor materials may also be suitable, in particular polymers which are sensitive in the infrared spectral range, especially above 1000 nm, preferably diketopyrrolopyrrol polymers, in particular, the polymers as described in EP 2 818 493 A1, more preferably the polymers denoted as "P-1" to "P-10" therein; benzodithiophene polymers as disclosed in WO 2014/086722 A1, especially diketopyrrolopyrrol polymers comprising benzodithiophene units; dithienobenzofuran polymers according to US 2015/0132887 A1, especially dithienobenzofuran polymers comprising diketopyrrolopyrrol units; phenantro[9, 10-B]furan polymers as described in US 2015/0111337 A1, especially phenantro[9, 10-B]furan polymers which comprise diketopyrrolopyrrol units; and polymer compositions comprising diketopyrrolopyrrol oligomers, in particular, in an oligomer-polymer ratio of 1:10 or 1:100, such as disclosed in US 2014/0217329 A1.

As further mentioned above, the electron acceptor material may, preferably, comprise a fullerene-based electron acceptor material. As generally used, the term "fullerenes" refers to cage-like molecules of pure carbon, including Buckminster fullerene (C60) and the related spherical fullerenes. In principle, the fullerenes in the range of from C20 to C2000 may be used, the range C60 to C96 being preferred, particularly C60, C70 and C84. Mostly preferred are fullerenes which are chemically modified, in particular one or more of:

[6,6]-phenyl-C61-butyric acid methyl ester (PC60BM),
[6,6]-Phenyl-C71-butyric acid methyl ester (PC70BM),
[6,6]-phenyl C84 butyric acid methyl ester (PC84BM), or an indene-C60 bisadduct (ICBA), but also dimers comprising one or two C60 or C70 moieties, in particular a diphenylmethanofullerene (DPM) moiety comprising one attached oligoether (OE) chain (C70-DPM-OE), or a diphenylmethanofullerene (DPM) moiety comprising two attached oligoether (OE) chains (C70-DPM-OE2), or a derivative, a modification, or a mixture thereof. However, TCNQ, or a perylene derivative may also be suitable.

Alternatively or in addition, the electron acceptor material may, preferably, comprise an acceptor polymer. Generally, conjugated polymers based on cyanated poly(phenylenevinylene), benzothiadiazole, perylene or naphthalenediimide are preferred for this purpose. In particular, the acceptor polymer may, preferably, be selected from one or more of the following polymers:

a cyano-poly[phenylenevinylene] (CN-PPV), such as C6-CN-PPV or C8-CN-PPV, poly[5-(2-(ethylhexyloxy)-2-methoxycyanoterephthalyliden] (MEH-CN-PPV), poly[oxa-1,4-phenylene-1,2-(1-cyano)-ethylene-2,5-dioctyloxy-1,4-phenylene-1,2-(2-cyano)-ethylene-1,4-phenylene] (CN-ether-PPV), poly[1,4-dioctyloxyl-p-2,5-dicyanophenylenevinylene] (DOCN-PPV), poly[9,9'-dioctylfluoreneco-benzothiadiazole] (PF8BT), or a derivative, a modification, or a mixture thereof. However, other kinds of acceptor polymers may also be suitable.

For more details concerning the mentioned compounds which may be used as the donor polymer or the electron acceptor material, reference may be made to the review articles by L. Biana, E. Zhua, J. Tanga, W. Tanga, and F. Zhang, Progress in Polymer Science 37, 2012, p. 1292-1331, A. Facchetti, Materials Today, Vol. 16, No. 4, 2013, p. 123-132, and S. Günes and N. S. Sariciftci, Inorganica Chimica Acta 361, 2008, p. 581-588, as well as the respective references cited therein. Further compounds are described in the dissertation of F. A. Sperlich, *Electron Paramagnetic Resonance Spectroscopy of Conjugated Polymers and Fullerenes for Organic Photovoltaics*, Julius-Maximilians-Universitat Würzburg, 2013, and the references cited therein.

Using a layer of the organic photoconductive materials exhibits a number of advantages, in particular with respect to the known inorganic photoconductive materials. The layer of the organic photoconductive materials may, preferably, be produced by known high-throughput methods, in particular by a deposition method, preferably a coating method, more preferred a spin-coating method, a slot-coating method, or a blade-coating method, or, alternatively, by evaporation. By this kind of process a transparent, semitransparent or translucent layer may easily be obtained which may exhibit a thickness from 100 µm to 2000 µm, in particular from 200 µm to 750 µm. The transparency, semitransparency or translucency of the organic photoconductive materials as obtained in this manner, thus, allows providing a stack of longitudinal sensors which each comprises a layer of this kind of materials. As will be explained below in more detail, the optical detector according to the present invention, however, differs in a particular respect to the known IR detectors in which a chalcogenide photoconductive material, such as lead sulfide (PbS), lead selenide (PbSe), mercury cadmium telluride (HgCdTe; also abbreviated to 'MCT'), or mercury zinc telluride (HgZnTe; also abbreviated to 'MZT'), has already been employed. Whereas in an IR detector according to the state of the art, it is essential for various reasons, such as to obtain an excellent signal quality, in particular, in order to achieve a high signal-to-noise ratio under often difficult measurement conditions, to illuminate the sensor region, which may comprise one or more of the mentioned or other chalcogenide photoconductive materials, as far as possible. From this point of view, it would be considered as completely deceptive even to contemplate reducing the cross-section of a light beam which may impinge on the sensor region. In the known art of IR detectors, it is rather best practice to completely illuminate the sensor region; any deviation therefrom would be considered as an erroneous experimental set-up.

In contrast with this long-known conception according to the state of the art, it may, nevertheless, be particularly advantageous to, still, vary the cross-section of a light beam which may impinge onto the sensor region that comprises a photoconductive material, preferably, one or more photoconductive material as described above and/or below in more detail. By evaluating the longitudinal sensor signal of the longitudinal optical sensor in an evaluation device it may, thus, in a rather surprising manner by employing this specific combination, be possible to generate at least one item of information on a longitudinal position, such as a depth, of the object which may, previously, have emitted and/or reflected the light beam which, thereafter, may have impinged onto the sensor region of the optical detector. Consequently, using an appropriate photoconductive material in combination with a variation of the cross-section of an incident light beam impinging on this photoconductive material and the application of a specifically adapted evaluation device may, thus, open extended measurement options which have not been possible so far.

As used herein, the term "evaluation device" generally refers to an arbitrary device designed to generate the items of information, i.e. the at least one item of information on the position of the object. As an example, the evaluation device may be or may comprise one or more integrated circuits, such as one or more application-specific integrated circuits (ASICs), and/or one or more data processing devices, such as one or more computers, preferably one or more microcomputers and/or microcontrollers. Additional components may be comprised, such as one or more preprocessing devices and/or data acquisition devices, such as one or more devices for receiving and/or preprocessing of the sensor signals, such as one or more AD-converters and/or one or more filters. As used herein, the sensor signal may generally refer to one of the longitudinal sensor signal and, if applicable, to the transversal sensor signal. Further, the evaluation device may comprise one or more data storage devices. Further, as outlined above, the evaluation device may comprise one or more interfaces, such as one or more wireless interfaces and/or one or more wire-bound interfaces.

The at least one evaluation device may be adapted to perform at least one computer program, such as at least one computer program performing or supporting the step of generating the items of information. As an example, one or more algorithms may be implemented which, by using the sensor signals as input variables, may perform a predetermined transformation into the position of the object.

The evaluation device may particularly comprise at least one data processing device, in particular an electronic data processing device, which can be designed to generate the items of information by evaluating the sensor signals. Thus, the evaluation device is designed to use the sensor signals as input variables and to generate the items of information on the transversal position and the longitudinal position of the object by processing these input variables. The processing can be done in parallel, subsequently or even in a combined manner. The evaluation device may use an arbitrary process for generating these items of information, such as by calculation and/or using at least one stored and/or known relationship. Besides the sensor signals, one or a plurality of further parameters and/or items of information can influence said relationship, for example at least one item of information about a modulation frequency. The relationship can be determined or determinable empirically, analytically or else semi-empirically. Particularly preferably, the relationship comprises at least one calibration curve, at least one set of calibration curves, at least one function or a combination of the possibilities mentioned. One or a plurality of calibration curves can be stored for example in the form of a set of values and the associated function values thereof, for example in a data storage device and/or a table. Alternatively or additionally, however, the at least one calibration curve can also be stored for example in parameterized form and/or as a functional equation. Separate relationships for processing the sensor signals into the items of information may be used. Alternatively, at least one combined relationship for processing the sensor signals is feasible. Various possibilities are conceivable and can also be combined.

By way of example, the evaluation device can be designed in terms of programming for the purpose of determining the items of information. The evaluation device can comprise in particular at least one computer, for example at least one microcomputer. Furthermore, the evaluation device can comprise one or a plurality of volatile or nonvolatile data memories. As an alternative or in addition to a data processing device, in particular at least one computer, the evaluation device can comprise one or a plurality of further electronic components which are designed for determining the items of information, for example an electronic table and in particular at least one look-up table and/or at least one application-specific integrated circuit (ASIC).

The detector has, as described above, at least one evaluation device. In particular, the at least one evaluation device can also be designed to completely or partly control or drive the detector, for example by the evaluation device being designed to control at least one illumination source and/or to control at least one modulation device of the detector. The evaluation device can be designed, in particular, to carry out at least one measurement cycle in which one or a plurality of sensor signals, such as a plurality of sensor signals, are picked up, for example a plurality of sensor signals of successively at different modulation frequencies of the illumination.

The evaluation device is designed, as described above, to generate at least one item of information on the position of the object by evaluating the at least one sensor signal. Said position of the object can be static or may even comprise at least one movement of the object, for example a relative movement between the detector or parts thereof and the object or parts thereof. In this case, a relative movement can generally comprise at least one linear movement and/or at least one rotational movement. Items of movement information can for example also be obtained by comparison of at least two items of information picked up at different times, such that for example at least one item of location information can also comprise at least one item of velocity information and/or at least one item of acceleration information, for example at least one item of information about at least one relative velocity between the object or parts thereof and the detector or parts thereof. In particular, the at least one item of location information can generally be selected from: an item of information about a distance between the object or parts thereof and the detector or parts thereof, in particular an optical path length; an item of information about a distance or an optical distance between the object or parts thereof and the optional transfer device or parts thereof; an item of information about a positioning of the object or parts thereof relative to the detector or parts thereof; an item of information about an orientation of the object and/or parts thereof relative to the detector or parts thereof; an item of information about a relative movement between the object or parts thereof and the detector or parts thereof; an item of information about a two-dimensional or three-dimensional spatial configuration of the object or of parts thereof, in particular a geometry or form of the object. Generally, the at least one item of location information can therefore be selected for example from the group consisting of: an item of information about at least one location of the object or at least one part thereof; information about at least one orientation of the object or a part thereof; an item of information about a geometry or form of the object or of a part thereof, an item of information about a velocity of the object or of a part thereof, an item of information about an acceleration of the object or of a part thereof, an item of information about a presence or absence of the object or of a part thereof in a visual range of the detector.

The at least one item of location information can be specified for example in at least one coordinate system, for example a coordinate system in which the detector or parts thereof rest. Alternatively or additionally, the location information can also simply comprise for example a distance between the detector or parts thereof and the object or parts thereof. Combinations of the possibilities mentioned are also conceivable.

In a particular embodiment of the present invention, the detector may comprise at least two longitudinal optical sensors, wherein each longitudinal optical sensor may be adapted to generate at least one longitudinal sensor signal. As an example, the sensor regions or the sensor surfaces of the longitudinal optical sensors may, thus, be oriented in parallel, wherein slight angular tolerances might be tolerable, such as angular tolerances of no more than 10°, preferably of no more than 5°. Herein, preferably all of the longitudinal optical sensors of the detector, which may, preferably, be arranged in form of a stack along the optical axis of the detector, may be transparent. Thus, the light beam may pass through a first transparent longitudinal optical sensor before impinging on the other longitudinal optical sensors, preferably subsequently. Thus, the light beam from the object may subsequently reach all longitudinal optical sensors present in the optical detector. Herein, the different longitudinal optical sensors may exhibit the same or different spectral sensitivities with respect to the incident light beam.

Preferably, the detector according to the present invention may comprise a stack of longitudinal optical sensors as disclosed in WO 2014/097181 A1, particularly in combination with one or more transversal optical sensors. As an example, one or more transversal optical sensors may be located on a side of the stack of longitudinal optical sensors facing towards the object. Alternatively or additionally, one or more transversal optical sensors may be located on a side of the stack of longitudinal optical sensors facing away from the object. Again, additionally or alternatively, one or more transversal optical sensors may be interposed in between the longitudinal optical sensors of the stack. However, embodiments which may only comprise a single longitudinal optical sensor but no transversal optical sensor may still be possible, such as in a case wherein only determining the depth of the object may be desired.

As used herein, the term "transversal optical sensor" generally refers to a device which is adapted to determine a transversal position of at least one light beam traveling from the object to the detector. With regard to the term position, reference may be made to the definition above.

Thus, preferably, the transversal position may be or may comprise at least one coordinate in at least one dimension perpendicular to an optical axis of the detector. As an example, the transversal position may be a position of a light spot generated by the light beam in a plane perpendicular to the optical axis, such as on a light-sensitive sensor surface of the transversal optical sensor. As an example, the position in the plane may be given in Cartesian coordinates and/or polar coordinates. Other embodiments are feasible. For potential embodiments of the transversal optical sensor, reference may be made to WO 2014/097181 A1. However, other embodiments are feasible and will be outlined in further detail below.

The transversal optical sensor may provide at least one transversal sensor signal. Herein, the transversal sensor signal may generally be an arbitrary signal indicative of the transversal position. As an example, the transversal sensor signal may be or may comprise a digital and/or an analog signal. As an example, the transversal sensor signal may be or may comprise a voltage signal and/or a current signal. Additionally or alternatively, the transversal sensor signal may be or may comprise digital data. The transversal sensor signal may comprise a single signal value and/or a series of signal values. The transversal sensor signal may further comprise an arbitrary signal which may be derived by combining two or more individual signals, such as by averaging two or more signals and/or by forming a quotient of two or more signals.

In a first embodiment similar to the disclosure according to WO 2014/097181 A1, the transversal optical sensor may be a photo detector having at least one first electrode, at least one second electrode and at least one photovoltaic material, wherein the photovoltaic material may be embedded in between the first electrode and the second electrode. Thus, the transversal optical sensor may be or may comprise one or more photo detectors, such as one or more organic photodetectors and, most preferably, one or more dye-sensitized organic solar cells (DSCs, also referred to as dye solar cells), such as one or more solid dye-sensitized organic solar cells (s-DSCs). Thus, the detector may comprise one or more DSCs (such as one or more sDSCs) acting as the at least one transversal optical sensor and one or more DSCs (such as one or more sDSCs) acting as the at least one longitudinal optical sensor.

In contrast to this known embodiment, a preferred embodiment of the transversal optical sensor according to the present invention may comprise a layer of the photoconductive material, preferably an inorganic photoconductive material, such as one of the photoconductive materials as mentioned above and/or below. Herein, the layer of the photoconductive material may comprise a composition selected from a homogeneous, a crystalline, a polycrystalline, a microcrystalline, a nanocrystalline and/or an amorphous phase. Preferably, the layer of the photoconductive material may be embedded in between two layers of a transparent conducting oxide, preferably comprising indium tin oxide (ITO), fluorine doped tin oxide (FTO), or magnesium oxide (MgO), wherein one of the two layers may be replaced by metal nanowires, in particular by Ag nanowires. However, other material may be feasible, in particular according to the desired transparent spectral range.

Further, at least two electrodes may be present for recording the transversal optical signal. In a preferred embodiment, the at least two electrodes may actually be arranged in the form of at least two physical electrodes, wherein each physical electrode may comprise an electrically conducting material, preferably a metallically conducting material, more preferred a highly metallically conducting material such as copper, silver, gold, an alloy or a composition which comprises these kinds of materials, or graphene. Herein, each of the at least two physical electrodes may, preferably, be arranged in a manner that a direct electrical contact between the respective electrode and the photoconductive layer in the optical sensor may be achieved, particularly in order to acquire the longitudinal sensor signal with as little loss as possible, such as due to additional resistances in a transport path between the optical sensor and the evaluation device.

However, In a particular embodiment, one or more of the mentioned physical electrodes may be replaced at least partially by an electrically conducting beam, in particular a beam of electrically conducting particles, preferably electrons, which may be arranged in a manner that the electrically conducting beam impinges on the sensor region and, thereby, may be capable of generating a direct electrical contact between the respective electrically conducting beam and the photoconductive layer in the optical sensor. By providing this direct electrical contact to the photoconductive layer, the electrically conducting beam may, similarly, act as a means for transporting at least a part of the longitudinal sensor signal from the optical sensor to the evaluation device.

Preferably, at least one of the electrodes of the transversal optical sensor may be a split electrode having at least two partial electrodes, wherein the transversal optical sensor may have a sensor area, wherein the at least one transversal sensor signal may indicate an x- and/or a y-position of the incident light beam within the sensor area. The sensor area may be a surface of the photo detector facing towards the object. The sensor area preferably may be oriented perpendicular to the optical axis. Thus, the transversal sensor signal may indicate a position of a light spot generated by the light beam in a plane of the sensor area of the transversal optical sensor. Generally, as used herein, the term "partial electrode" refers to an electrode out of a plurality of electrodes, adapted for measuring at least one current and/or voltage signal, preferably independent from other partial electrodes. Thus, in case a plurality of partial electrodes is provided, the respective electrode is adapted to provide a plurality of electric potentials and/or electric currents and/or voltages via the at least two partial electrodes, which may be measured and/or used independently.

The transversal optical sensor may further be adapted to generate the transversal sensor signal in accordance with the electrical currents through the partial electrodes. Thus, a ratio of electric currents through two horizontal partial electrodes may be formed, thereby generating an x-coordinate, and/or a ratio of electric currents through to vertical partial electrodes may be formed, thereby generating a y-coordinate. The detector, preferably the transversal optical sensor and/or the evaluation device, may be adapted to derive the information on the transversal position of the object from at least one ratio of the currents through the partial electrodes. Other ways of generating position coordinates by comparing currents through the partial electrodes are feasible.

The partial electrodes may generally be defined in various ways, in order to determine a position of the light beam in the sensor area. Thus, two or more horizontal partial electrodes may be provided in order to determine a horizontal coordinate or x-coordinate, and two or more vertical partial electrodes may be provided in order to determine a vertical coordinate or y-coordinate. Thus, the partial electrodes may be provided at a rim of the sensor area, wherein an interior space of the sensor area remains free and may be covered by one or more additional electrode materials. As will be outlined in further detail below, the additional electrode material preferably may be a transparent additional electrode material, such as a transparent metal and/or a transparent conductive oxide and/or, most preferably, a transparent conductive polymer.

By using the transversal optical sensor, wherein one of the electrodes is a split electrode with three or more partial electrodes, currents through the partial electrodes may be dependent on a position of the light beam in the sensor area. This may generally be due to the fact that Ohmic losses or resistive losses may occur on the way from a location of generation of electrical charges due to the impinging light onto the partial electrodes. Thus, besides the partial electrodes, the split electrode may comprise one or more additional electrode materials connected to the partial electrodes, wherein the one or more additional electrode materials provide an electrical resistance. Thus, due to the Ohmic losses on the way from the location of generation of the electric charges to the partial electrodes through with the one or more additional electrode materials, the currents through the partial electrodes depend on the location of the generation of the electric charges and, thus, to the position of the light beam in the sensor area. For details of this principle of determining the position of the light beam in the sensor area, reference may be made to the preferred embodiments below and/or to the physical principles and device options as disclosed in WO 2014/097181 A1 and the respective references therein.

Accordingly, the transversal optical sensor may comprise the sensor area, which, preferably, may be transparent to the light beam travelling from the object to the detector. The transversal optical sensor may, therefore, be adapted to determine a transversal position of the light beam in one or more transversal directions, such as in the x- and/or in the y-direction. For this purpose, the at least one transversal optical sensor may further be adapted to generate at least one transversal sensor signal. Thus, the evaluation device may be designed to generate at least one item of information on a transversal position of the object by evaluating the transversal sensor signal of the longitudinal optical sensor.

Further embodiments of the present invention referred to the nature of the light beam which propagates from the object to the detector. As used herein, the term "light" generally refers to electromagnetic radiation in one or more of the visible spectral range, the ultraviolet spectral range and the infrared spectral range. Therein, in partial accordance with standard ISO-21348, the term visible spectral range generally refers to a spectral range of 380 nm to 760 nm. The term infrared (IR) spectral range generally refers to electromagnetic radiation in the range of 760 nm to 1000 µm, wherein the range of 760 nm to 1.4 µm is usually denominated as the near infrared (NIR) spectral range, and the range from 15 µm to 1000 µm as the far infrared (FIR) spectral range. The term ultraviolet spectral range generally refers to electromagnetic radiation in the range of 1 nm to 380 nm, preferably in the range of 100 nm to 380 nm. Preferably, light as used within the present invention is visible light, i.e. light in the visible spectral range.

However, the detector according to the present invention may comprise at least one specific embodiment of the longitudinal optical sensor, wherein the specific embodiment of the longitudinal optical sensor may, furthermore, be designed in such a way that the illumination of the sensor region by the light beam might, in addition to being sensitive to the beam cross-section of the light beam in the sensor region, cause an increase in temperature within the sensor region. As a result of the temperature increase in the sensor region, the electrical conductivity of the longitudinal sensor signal may be affected in such a manner that, given the same total power of the illumination, a change of the longitudinal sensor signal upon illumination of the sensor region by the light beam might be used to determine a value for the temperature increase within the sensor region.

In other words, the specific embodiment of the longitudinal optical sensor might be considered as being sensitive to heat radiation, which is, generally, attributed to a wavelength of the light beam in the infrared spectral range, in particular from 5 µm to 15 µm. Usually, this kind of detectors which are adapted to determine the heat radiation are denominated as "bolometers" or, if they exhibit a lateral size in the micrometer range, such as from 10 µm to 100 µm in each of two dimensions, as "micro-bolometers". As a particular advantage of micro-bolometers, the optical detector comprising this kind of arrangement may be employed in an uncooled fashion, and thus may, thus, be able by using a simple setup and without cooling, to provide measured values for the temperature increase at the sensor region as well as other kinds of measurement parameters which may be derived therefrom, such as a heat flow.

Particularly, the photoconductive material as used within this kind of micro-bolometer, may comprise one or more of the inorganic photoconductive material as described above and/or below as long as the photoconductive material may exhibit a sufficient detection efficiency within the mentioned spectral range from 5 µm to 15 µm. Preferably, the photoconductive material as employed in the micro-bolometer may be a chalcogenide which may be selected from the group comprising sulfide chalcogenides, selenide chalcogenides, telluride chalcogenides, ternary chalcogenides, quaternary and higher chalcogenides. Alternatively or in addition, the photoconductive material as employed in the micro-bolometer may be a pnictogenide which may be selected from the group comprising nitride pnictogenides, phosphide pnictogenides, arsenide pnictogenides, antimonide pnictogenides, ternary pnictogenides, quarternary and higher pnictogenides. As generally used, the term "pnictogenide" refers to a chemical compound which comprises a nitride, a phosphide, an arsenide, an antimonide or a bismuthide anion. Furthermore, other kinds of materials, in particular vanadium oxides ($VO_2$ or $VO_x$), amorphous silicon (a-Si), or a platinum-silicon alloy (Pt:Si) may also be feasible for the purpose of the photoconductive material used within this kind of micro-bolometer.

Within this regard, most preferably, the sulfide chalcogenide may be selected from lead sulfide (PbS) or zinc sulfide (ZnS), and the selenide chalcogenide from lead selenide (PbSe), cadmium selenide (CdSe), or zinc selenide (ZnSe), while the ternary chalcogenide may especially be selected from mercury cadmium telluride (HgCdTe), mercury zinc telluride (HgZnTe), or mercury cadmium sulfide (HgCdS), the nitride pnictogenide may be selected from indium nitride (InN), gallium nitride (GaN), or indium gallium nitride (InGaN), the phosphide pnictogenide from indium phosphide (InP), gallium phosphide (GaP), or indium gallium phosphide (InGaP), the arsenic pnictogenide from indium arsenide (InAs), gallium arsenide (GaAs), or indium gallium arsenide (InGaAs), and the antimonide pnictogenide from indium antimonide (InSb), gallium antimonide (GaSb), or indium gallium antimonide (InGaSb), while the ternay pnictogenide may be selected from indium gallium phosphide (InGaP), gallium arsenide phosphide (GaAsP), or aluminum gallium phosphide (AlGaP).

In a particular embodiment, in the optical detector according to the present invention, at least two longitudinal optical sensors, preferably a plurality of the longitudinal optical sensors, may be present as an array and arranged, particularly, perpendicular to an optical axis as determined by a path of the light beam within the optical detector. Herein, each of the longitudinal optical sensors may be considered as an individual resistor, and the plurality of the longitudinal optical sensors within the array may, preferably, be considered as a matrix of individual resistors. For a purpose of acquiring the longitudinal optical sensor signal of the longitudinal optical sensors within the matrix, an aggregate resistance of the individual resistors within the matrix may, in accordance with the present invention, depend on a number N of the longitudinal optical sensors in the array which are illuminated by the incident light beam. Herein, each of the longitudinal optical sensors may be considered as an element or a picture element, i.e. a pixel, within the array. As a result, an array of interconnected individual resistors may, thus, be obtained in which the aggregate resistance of the complete array or a part thereof may depend on the number of the illuminated pixels.

In particular for further evaluation purposes, the evaluation device may, furthermore, be adapted to determine the number N of the longitudinal optical sensors within the array which are illuminated by the light beam. In addition, the evaluation device may especially be adapted to determine at least one longitudinal coordinate of the object by using the number N of the longitudinal optical sensors which are illuminated by the light beam. For this purpose, the optical sensor may, in particular, be adapted to generate at least one signal which might indicate an intensity of the illumination for each of the pixels within the array. In a preferred embodiment, the evaluation device may, thus, be adapted to compare, for each of the pixels, the signal to at least one threshold in order to determine whether the pixel is an illuminated pixel or not. Further, in order to determine the longitudinal coordinate of the object, the evaluation device may also be configured for using a predetermined relationship between the number N of pixels being illuminated by the light beam and the longitudinal coordinate. Herein, the predetermined relationship may, especially, be based on an assumption of the light beam being a Gaussian light beam.

In a particularly preferred embodiment, the longitudinal optical sensors which are arranged in the array may, furthermore, be designed in a way that the illumination of the sensor region by the light beam may, as described above and/or below, additionally cause a temperature increase within the sensor region. Consequently, the electrical conductivity of the sensor region, given the same total power of the illumination, may, thus, further be dependent on the temperature in the sensor region and, as a result, the longitudinal sensor signal, given the same total power of the illumination, may, therefore, further depend on the temperature in the sensor region. As already described above, the array of the longitudinal optical sensors might, thus, be considered as being sensitive to heat radiation, i.e. to a wavelength of the incident light beam in the infrared spectral range, in particular from 5 µm to 15 µm. As a result, an interconnected array of "bolometers" or, if the lateral size of the bolometers may be in the micrometer range, such as from 10 µm to 100 µm in each of two dimensions, an interconnected array of "micro-bolometers" may, thus, be obtained. Again, the optical detector comprising the mentioned array of the micro-bolometers may exhibit the particular advantage that it might be employed in an uncooled fashion, thus, being able to save construction expenditures as well as a considerable amount of energy. Therefore, by using a simple setup and without cooling, a matrix of measurement values for the temperature increase across the sensor region and measurement parameters derived therefrom, such as the heat flow, may be determined. Further, the array of the micro-bolometers may, also, be employed to detect at least one object which might exhibit a temperature above the temperature of the volume surrounding the one or more objects, i.e. above room temperature.

The term "light beam" generally refers to an amount of light emitted into a specific direction. Thus, the light beam may be a bundle of the light rays having a predetermined extension in a direction perpendicular to a direction of propagation of the light beam. Preferably, the light beam may be or may comprise one or more Gaussian light beams which may be characterized by one or more Gaussian beam parameters, such as one or more of a beam waist, a Rayleigh-length or any other beam parameter or combination of beam parameters suited to characterize a development of a beam diameter and/or a beam propagation in space.

The light beam might be admitted by the object itself, i.e. might originate from the object. Additionally or alternatively, another origin of the light beam is feasible. Thus, as will be outlined in further detail below, one or more illumination sources might be provided which illuminate the object, such as by using one or more primary rays or beams, such as one or more primary rays or beams having a predetermined characteristic. In the latter case, the light beam propagating from the object to the detector might be a light beam which is reflected by the object and/or a reflection device connected to the object.

As outlined above, the at least one longitudinal sensor signal, given the same total power of the illumination by the light beam, is, according to the FiP effect, dependent on a beam cross-section of the light beam in the sensor region of the at least one longitudinal optical sensor. As used herein, the term beam cross-section generally refers to a lateral extension of the light beam or a light spot generated by the light beam at a specific location. In case a circular light spot is generated, a radius, a diameter or a Gaussian beam waist or twice the Gaussian beam waist may function as a measure of the beam cross-section. In case non-circular light-spots are generated, the cross-section may be determined in any other feasible way, such as by determining the cross-section of a circle having the same area as the non-circular light spot, which is also referred to as the equivalent beam cross-section. Within this regard, it may be possible to employ the observation of an extremum, i.e. a maximum or a minimum, of the longitudinal sensor signal, in particular a global extremum, under a condition in which the corresponding material, such as a photovoltaic material, may be impinged by a light beam with the smallest possible cross-section, such as when the material may be located at or near a focal point as affected by an optical lens. In case the extremum is a maximum, this observation may be denominated as the positive FiP-effect, while in case the extremum is a minimum, this observation may be denominated as the negative FiP-effect.

Thus, irrespective of the material actually comprised in the sensor region but given the same total power of the illumination of the sensor region by the light beam, a light beam having a first beam diameter or beam cross-section may generate a first longitudinal sensor signal, whereas a light beam having a second beam diameter or beam-cross section being different from the first beam diameter or beam cross-section generates a second longitudinal sensor signal being different from the first longitudinal sensor signal. Thus, by comparing the longitudinal sensor signals, at least one item of information on the beam cross-section, specifically on the beam diameter, may be generated. For details of this effect, reference may be made to WO 2012/110924 A1. Accordingly, the longitudinal sensor signals generated by the longitudinal optical sensors may be compared, in order to gain information on the total power and/or intensity of the light beam and/or in order to normalize the longitudinal sensor signals and/or the at least one item of information on the longitudinal position of the object for the total power and/or total intensity of the light beam. Thus, as an example, a maximum value of the longitudinal optical sensor signals may be detected, and all longitudinal sensor signals may be divided by this maximum value, thereby generating normalized longitudinal optical sensor signals, which, then, may be transformed by using the above-mentioned known relationship, into the at least one item of longitudinal information on the object. Other ways of normalization are feasible, such as a normalization using a mean value of the longitudinal sensor signals and dividing all longitudinal sensor signals by the mean value. Other options are possible. Each of these options may be appropriate to render the transformation independent from the total power and/or intensity of the light beam. In addition, information on the total power and/or intensity of the light beam might, thus, be generated.

Specifically in case one or more beam properties of the light beam propagating from the object to the detector are known, the at least one item of information on the longitudinal position of the object may thus be derived from a known relationship between the at least one longitudinal sensor signal and a longitudinal position of the object. The known relationship may be stored in the evaluation device as an algorithm and/or as one or more calibration curves. As an example, specifically for Gaussian beams, a relationship between a beam diameter or beam waist and a position of the object may easily be derived by using the Gaussian relationship between the beam waist and a longitudinal coordinate.

This embodiment may, particularly, be used by the evaluation device in order to resolve an ambiguity in the known relationship between a beam cross-section of the light beam and the longitudinal position of the object. Thus, even if the beam properties of the light beam propagating from the object to the detector are known fully or partially, it is known that, in many beams, the beam cross-section narrows before reaching a focal point and, afterwards, widens again. Thus, before and after the focal point in which the light beam has the narrowest beam cross-section, positions along the axis of propagation of the light beam occur in which the light beam has the same cross-section. Thus, as an example, at a distance z0 before and after the focal point, the cross-section of the light beam is identical. Thus, in case only one longitudinal optical sensor with a specific spectral sensitivity is used, a specific cross-section of the light beam might be determined, in case the overall power or intensity of the light beam is known. By using this information, the distance z0 of the respective longitudinal optical sensor from the focal point might be determined. However, in order to determine whether the respective longitudinal optical sensor is located before or behind the focal point, additional information is required, such as a history of movement of the object and/or the detector and/or information on whether the detector is located before or behind the focal point. In typical situations, this additional information may not be provided. Therefore, additional information may be gained in order to resolve the above-mentioned ambiguity. Thus, in case the evaluation device, by evaluating the longitudinal sensor signals, recognizes that the beam cross-section of the light beam on a first longitudinal optical sensor is larger than the beam cross-section of the light beam on a second longitudinal optical sensor, wherein the second longitudinal optical sensor is located behind the first longitudinal optical sensor, the evaluation device may determine that the light beam is still narrowing and that the location of the first longitudinal optical sensor is situated before the focal point of the light beam. Contrarily, in case the beam cross-section of the light beam on the first longitudinal optical sensor is smaller than the beam cross-section of the light beam on the second longitudinal optical sensor, the evaluation device may determine that the light beam is widening and that the location of the second longitudinal optical sensor is situated behind the focal point. Thus, generally, the evaluation device may be adapted to recognize whether the light beam widens or narrows, by comparing the longitudinal sensor signals of different longitudinal sensors.

For further details with regard to determining the at least one item of information on the longitudinal position of the object by employing the evaluation device according to the present invention, reference may made to the description in WO 2014/097181 A1. Thus, generally, the evaluation device may be adapted to compare the beam cross-section and/or the diameter of the light beam with known beam properties of the light beam in order to determine the at least one item of information on the longitudinal position of the object, preferably from a known dependency of a beam diameter of the light beam on at least one propagation coordinate in a direction of propagation of the light beam and/or from a known Gaussian profile of the light beam.

In addition to the at least one longitudinal coordinate of the object, at least one transversal coordinate of the object may be determined. Thus, generally, the evaluation device may further be adapted to determine at least one transversal coordinate of the object by determining a position of the light beam on the at least one transversal optical sensor, which may be a pixelated, a segmented or a large-area transversal optical sensor, as further outlined also in WO 2014/097181 A1.

In addition, the detector may comprise at least one transfer device, such as an optical lens, in particular one or more refractive lenses, particularly converging thin refractive lenses, such as convex or biconvex thin lenses, and/or one or more convex mirrors, which may further be arranged along the common optical axis. Most preferably, the light beam which emerges from the object may in this case travel first through the at least one transfer device and thereafter through the single transparent longitudinal optical sensor or the stack of the transparent longitudinal optical sensors until it may finally impinge on an imaging device. As used herein, the term "transfer device" refers to an optical element which may be configured to transfer the at least one light beam emerging from the object to optical sensors within the detector, i.e. the at least two longitudinal optical sensors and the at least one optional transversal optical sensor. Thus, the transfer device can be designed to feed light propagating from the object to the detector to the optical sensors, wherein this feeding can optionally be effected by means of imaging or else by means of non-imaging properties of the transfer device. In particular the transfer device can also be designed to collect the electromagnetic radiation before the latter is fed to the transversal and/or longitudinal optical sensor.

In addition, the at least one transfer device may have imaging properties. Consequently, the transfer device comprises at least one imaging element, for example at least one lens and/or at least one curved mirror, since, in the case of such imaging elements, for example, a geometry of the illumination on the sensor region can be dependent on a relative positioning, for example a distance, between the transfer device and the object. As used herein, the transfer device may be designed in such a way that the electromagnetic radiation which emerges from the object is transferred completely to the sensor region, for example is focused completely onto the sensor region, in particular if the object is arranged in a visual range of the detector.

Generally, the detector may further comprise at least one imaging device, i.e. a device capable of acquiring at least one image. The imaging device can be embodied in various ways. Thus, the imaging device can be for example part of the detector in a detector housing. Alternatively or additionally, however, the imaging device can also be arranged outside the detector housing, for example as a separate imaging device. Alternatively or additionally, the imaging device can also be connected to the detector or even be part of the detector. In a preferred arrangement, the stack of the transparent longitudinal optical sensors and the imaging device are aligned along a common optical axis along which the light beam travels. Thus, it may be possible to locate an imaging device in the optical path of the light beam in a manner that the light beam travels through the stack of the transparent longitudinal optical sensors until it impinges on the imaging device. However, other arrangements are possible.

As used herein, an "imaging device" is generally understood as a device which can generate a one-dimensional, a two-dimensional, or a three-dimensional image of the object or of a part thereof. In particular, the detector, with or without the at least one optional imaging device, can be completely or partly used as a camera, such as an IR camera, or an RGB camera, i.e. a camera which is designed to deliver three basic colors which are designated as red, green, and blue, on three separate connections. Thus, as an example, the at least one imaging device may be or may comprise at least one imaging device selected from the group consisting of: a pixelated organic camera element, preferably a pixelated organic camera chip; a pixelated inorganic camera element, preferably a pixelated inorganic camera chip, more preferably a CCD- or CMOS-chip; a monochrome camera element, preferably a monochrome camera chip; a multicolor camera element, preferably a multicolor camera chip; a full-color camera element, preferably a full-color camera chip. The imaging device may be or may comprise at least one device selected from the group consisting of a monochrome imaging device, a multi-chrome imaging device and at least one full color imaging device. A multi-chrome imaging device and/or a full color imaging device may be generated by using filter techniques and/or by using intrinsic color sensitivity or other techniques, as the skilled person will recognize. Other embodiments of the imaging device are also possible.

The imaging device may be designed to image a plurality of partial regions of the object successively and/or simultaneously. By way of example, a partial region of the object can be a one-dimensional, a two-dimensional, or a three-dimensional region of the object which is delimited for example by a resolution limit of the imaging device and from which electromagnetic radiation emerges. In this context, imaging should be understood to mean that the electromagnetic radiation which emerges from the respective partial region of the object is fed into the imaging device, for example by means of the at least one optional transfer device of the detector. The electromagnetic rays can be generated by the object itself, for example in the form of a luminescent radiation. Alternatively or additionally, the at least one detector may comprise at least one illumination source for illuminating the object.

In particular, the imaging device can be designed to image sequentially, for example by means of a scanning method, in particular using at least one row scan and/or line scan, the plurality of partial regions sequentially. However, other embodiments are also possible, for example embodiments in which a plurality of partial regions is simultaneously imaged. The imaging device is designed to generate, during this imaging of the partial regions of the object, signals, preferably electronic signals, associated with the partial regions. The signal may be an analogue and/or a digital signal. By way of example, an electronic signal can be associated with each partial region. The electronic signals can accordingly be generated simultaneously or else in a temporally staggered manner. By way of example, during a row scan or line scan, it is possible to generate a sequence of electronic signals which correspond to the partial regions of the object, which are strung together in a line, for example. Further, the imaging device may comprise one or more signal processing devices, such as one or more filters and/or analogue-digital-converters for processing and/or preprocessing the electronic signals.

Light emerging from the object can originate in the object itself, but can also optionally have a different origin and propagate from this origin to the object and subsequently toward the optical sensors. The latter case can be affected for example by at least one illumination source being used. The illumination source can be embodied in various ways. Thus, the illumination source can be for example part of the detector in a detector housing. Alternatively or additionally, however, the at least one illumination source can also be arranged outside a detector housing, for example as a separate light source. The illumination source can be arranged separately from the object and illuminate the object from a distance. Alternatively or additionally, the illumination source can also be connected to the object or even be part of the object, such that, by way of example, the electromagnetic radiation emerging from the object can also be generated directly by the illumination source. By way of example, at least one illumination source can be arranged on and/or in the object and directly generate the electromagnetic radiation by means of which the sensor region is illuminated. This illumination source can for example be or comprise an ambient light source and/or may be or may comprise an artificial illumination source. By way of example, at least one infrared emitter and/or at least one emitter for visible light and/or at least one emitter for ultraviolet light can be arranged on the object. By way of example, at least one light emitting diode and/or at least one laser diode can be arranged on and/or in the object. The illumination source can comprise in particular one or a plurality of the following illumination sources: a laser, in particular a laser diode, although in principle, alternatively or additionally, other types of lasers can also be used; a light emitting diode; an incandescent lamp; a neon light; a flame source; a heat source; an organic light source, in particular an organic light emitting diode; a structured light source. Alternatively or additionally, other illumination sources can also be used. It is particularly preferred if the illumination source is designed to generate one or more light beams having a Gaussian beam profile, as is at least approximately the case for example in many lasers. For further potential embodiments of the optional illumination source, reference may be made to one of WO 2012/110924 A1 and WO 2014/097181 A1. Still, other embodiments are feasible.

The at least one optional illumination source generally may emit light in at least one of: the ultraviolet spectral range, preferably in the range of 200 nm to 380 nm; the visible spectral range (380 nm to 780 nm); the infrared spectral range, preferably in the range of 780 nm to 3.0 micrometers. Most preferably, the at least one illumination source is adapted to emit light in the visible spectral range, preferably in the range of 500 nm to 780 nm, most preferably at 650 nm to 750 nm or at 690 nm to 700 nm. Herein, it is particularly preferred when the illumination source may exhibit a spectral range which may be related to the spectral sensitivities of the longitudinal sensors, particularly in a manner to ensure that the longitudinal sensor which may be illuminated by the respective illumination source may provide a sensor signal with a high intensity which may, thus, enable a high-resolution evaluation with a sufficient signal-to-noise-ratio.

In a particularly preferred embodiment of the present invention, the longitudinal optical sensor may be provided in a form of a layer of the at least one photoconductive material, which may comprise a chalcogenide, preferably lead sulfide (PbS), lead selenide (PbSe) or another appropriate material. Herein, the layer of the photoconductive material may be fabricated by applying at least one deposition method which may be selected from the group consisting of: vacuum evaporation, sputtering, chemical vapor deposition, spray pyrolysis, electrodeposition, anodization, electro-conversion, electro-less dip growth, successive ionic adsorption and reaction, chemical bath deposition, and solution-gas interface techniques. As a result, the layer of the photoconductive material may exhibit a thickness in the range from 10 nm to 1000 µm, in particular from 100 nm to 10 µm. However other photoconductive materials as mentioned above and/or below may also be feasible for this purpose and may also be treated in the same or in a similar fashion.

Preferably, the photoconductive material may be fabricated by depositing the respective material on an insulating substrate, preferably on a ceramic substrate, in particular for providing mechanical stability to the layer of the photoconductive material. In this manner, by depositing the selected layer on the appropriate substrate and providing at least two electrodes as electrically conducting contacts, the longitudinal optical sensor according to the present invention may, thus, be obtained. Herein, an illumination of the photoconductive material in the sensor region by an incident light beam results in a variation of the electrical conductivity in the illuminated layer of the photoconductive material which, given the same total power of the illumination, depends on the beam cross-section of the light beam in the sensor region. Consequently, upon impingement of the sensor region by the light beam the at least two electrodes may provide the longitudinal sensor signal which depends on the electrical conductivity of the photoconductive material and, thus, allows determining the beam cross-section of the light beam in the sensor region, as described elsewhere. In this preferred embodiment, the incident light beam may directly impinge on the photoconductive material, or may first impinge on the substrate until it may reach the sensor region in the photoconductive material, in which case it may be advantageous to employ a transparent substrate or at least a translucent substrate, such as a glass substrate or a quartz substrate.

Irrespective of the actual configuration of this preferred embodiment, a comparatively simple and cost-efficient setup for the longitudinal optical sensor may be obtained. This advantage may particularly become obvious when compared to the longitudinal optical sensor as, for example, depicted in WO 2012/110924 A1 or WO 2014/097181 A1, wherein more layers of different types of materials may be required. Nevertheless, the lower number of layers which may be used here may still provide a working embodiment for the longitudinal optical sensor. However, other embodiments may also be appropriate as the setup for the longitudinal optical sensor according to the present invention.

Furthermore, the detector can have at least one modulation device for modulating the illumination, in particular for a periodic modulation, in particular a periodic beam interrupting device. A modulation of the illumination should be understood to mean a process in which a total power of the illumination is varied, preferably periodically, in particular with one or a plurality of modulation frequencies. In particular, a periodic modulation can be effected between a maximum value and a minimum value of the total power of the illumination. The minimum value can be 0, but can also be >0, such that, by way of example, complete modulation does not have to be effected. The modulation can be effected for example in a beam path between the object and the optical sensor, for example by the at least one modulation device being arranged in said beam path. Alternatively or additionally, however, the modulation can also be effected in a beam path between an optional illumination source—described in even greater detail below—for illuminating the object and the object, for example by the at least one modulation device being arranged in said beam path. A combination of these possibilities is also conceivable. The at least one modulation device can comprise for example a beam chopper or some other type of periodic beam interrupting device, for example comprising at least one interrupter blade or interrupter wheel, which preferably rotates at constant speed and which can thus periodically interrupt the illumination. Alternatively or additionally, however, it is also possible to use one or a plurality of different types of modulation devices, for example modulation devices based on an electro-optical effect and/or an acousto-optical effect. Once again alternatively or additionally, the at least one optional illumination source itself can also be designed to generate a modulated illumination, for example by said illumination source itself having a modulated intensity and/or total power, for example a periodically modulated total power, and/or by said illumination source being embodied as a pulsed illumination source, for example as a pulsed laser. Thus, by way of example, the at least one modulation device can also be wholly or partly integrated into the illumination source. Various possibilities are conceivable.

Accordingly, the detector can be designed in particular to detect at least two longitudinal sensor signals in the case of different modulations, in particular at least two longitudinal sensor signals at respectively different modulation frequencies. The evaluation device can be designed to generate the geometrical information from the at least two longitudinal sensor signals. As described in WO 2012/110924 A1 and WO 2014/097181 A1, it is possible to resolve ambiguities and/or it is possible to take account of the fact that, for example, a total power of the illumination is generally unknown. By way of example, the detector can be designed to bring about a modulation of the illumination of the object and/or at least one sensor region of the detector, such as at least one sensor region of the at least one longitudinal optical sensor, with a frequency of 0.05 Hz to 1 MHz, such as 0.1

Hz to 10 kHz. As outlined above, for this purpose, the detector may comprise at least one modulation device, which may be integrated into the at least one optional illumination source and/or may be independent from the illumination source. Thus, at least one illumination source might, by itself, be adapted to generate the above-mentioned modulation of the illumination, and/or at least one independent modulation device may be present, such as at least one chopper and/or at least one device having a modulated transmissibility, such as at least one electro-optical device and/or at least one acousto-optical device.

According to the present invention, it may be advantageous in order to apply at least one modulation frequency to the optical detector as described above. However, it may still be possible to directly determine the longitudinal sensor signal without applying a modulation frequency to the optical detector. As will be demonstrated below in more detail, an application of a modulation frequency may not be required under many relevant circumstances in order to acquire the desired longitudinal information about the object. As a result, the optical detector may, thus, not be required to comprise a modulation device which may further contribute to the simple and cost-effective setup of the spatial detector. As a further result, a spatial light modulator may be used in a time-multiplexing mode rather than a frequency-multiplexing mode or in a combination thereof.

In a further aspect of the present invention, a detector for optical detection, in particular, for determining a position of at least one object, specifically with regard to a depth of the at least one object, is disclosed. The detector for an optical detection of at least one object according to the present invention comprises:

at least one longitudinal optical sensor, wherein the longitudinal optical sensor has at least one sensor region, wherein the longitudinal optical sensor is designed to generate at least one longitudinal sensor signal in a manner dependent on an illumination of the sensor region by a light beam, wherein the longitudinal sensor signal, given the same total power of the illumination, is dependent on a beam cross-section of the light beam in the sensor region, wherein the sensor region comprises at least one material capable of sustaining an electrical current, wherein at least one property of the material, given the same total power of the illumination, is dependent on the beam cross-section of the light beam in the sensor region, wherein the longitudinal sensor signal is dependent on the at least one property; and at least one evaluation device, wherein the evaluation device is designed to generate at least one item of information on a longitudinal position of the object by evaluating the longitudinal sensor signal of the longitudinal optical sensor.

According to this further aspect of the present invention, the sensor region comprises at least one material which is capable of sustaining an electrical current, such as a metal or a semiconducting material, Herein, at least one property of the material, being the electrical conductivity of the material or another material property, such as a thermal conductivity, an absorbance, a scattering property, a dielectric property, a magnetic property, or an optical property of the material, in particular a polarization, a reflectance, a refractive index, or a transmission, of the material, given the same total power of the illumination, is dependent on the beam cross-section of the light beam in the sensor region.

As a result, the longitudinal sensor signal is dependent on the at least one property of the material as employed here for the purposes of the detector according to the present invention. Consequently, measuring the at least one property by recoding the at least one longitudinal sensor signal allows determining the beam cross-section of the light beam in the sensor region and, thus, as described above, generating at least one item of information on a longitudinal position of the object. Herein, the longitudinal signal may be an electrical signal, such as a voltage or a current, but may, first, be a physical signal of a different kind, in particular an optical signal, which may, thereafter, be transformed into an electrical signal, which may, then, be further treated as the longitudinal sensor signal. For further details concerning this aspect of the present invention, reference may be made to the description of the other aspects of the optical detector as provided above and/or below.

In a particularly preferred embodiment of the present invention, the material capable of sustaining an electrical current comprises amorphous silicon, also abbreviated as "a-Si". As generally used, the term "amorphous silicon" relates to a non-crystalline allotropic form of silicon. As further known from the state of the art, the amorphous silicon can be obtained by depositing it as a layer, especially as a thin film, onto an appropriate substrate. However, other methods may be applicable. Further, the amorphous silicon may especially be passivated by using hydrogen, by which application a number of dangling bonds within the amorphous silicon may be reduced by several orders of magnitude. As a result, hydrogenated amorphous silicon, usually abbreviated to "a-Si:H", may exhibit a low amount of defects, thus, allow using it for optical devices.

In this particular embodiment, the longitudinal optical sensor may be a photo detector having at least one first electrode and at least one second electrode while the amorphous silicon may, preferably, be located between the first electrode and the second electrode. In particular for a purpose of facilitating the light beam which may impinge the longitudinal optical sensor to arrive at a layer comprising the amorphous silicon, at least one of the electrodes, in particular the electrode which may be located within the path of the incident light beam, may be selected to be at least partially optically transparent. Herein, the at least partially optically transparent electrode may comprise at least one transparent conductive oxide (TCO), in particular at least one of indium-doped tin oxide (ITO), fluorine-doped tin oxide (FTO), aluminum-doped zinc oxide (AZO), or a perovskite TCO, such as $SrVO_3$, or $CaVO_3$, or, alternatively, metal nanowires, in particular Ag or Cu nanowires. However, other kinds of optically transparent materials which may be suited as electrode material may also be applicable. The one or more remaining electrodes, also denominated as "back electrodes", may also be optically intransparent, in particularly as long as they are located outside the path of the light beam within the longitudinal optical sensor. Herein, the at least one optically intransparent electrode may, preferably, comprise a metal electrode, in particular one or more of a silver (Ag) electrode, a platinum (Pt) electrode, an aluminum (Al) electrode, or a gold (Au) electrode, or, alternatively, a graphene electrode. Preferably, the optically intransparent electrode may comprise a uniform metal layer. Alternatively, the optically intransparent electrode may be a split electrode being arranged as a number of partial electrodes or in form of a metallic grid.

Preferably, the amorphous silicon which is located between the first electrode and the second electrode may be arranged in form of a PIN diode. As generally used, the term "PIN diode" refers to an electronic device which comprises an i-type semiconductor layer that is located between an n-type semiconductor layer and a p-type semiconductor layer. As known from the state of the art, while in the n-type semiconducting layer charge carriers are predominantly provided by electrons, in the p-type semiconducting layer the charge carriers are predominantly provided by holes. In a preferred embodiment, the p-type semiconducting layer can partially or wholly be comprised of amorphous silicon carbide. Further, the i-type semiconducting layer comprises an undoped intrinsic amorphous silicon. In particular, in the Longitudinal optical sensor according to the present invention, the i-type semiconductor layer may exhibit a thickness which may exceed the thickness of each of the n-type semiconductor layer and the p-type semiconductor layer, in particular by a factor of at least 2, preferably of at least 5, more preferred of at Least 10 or more. As an example, the thickness of the i-type semiconducting layer may be from 100 nm to 3000 nm, in particular from 600 nm to 800 nm, whereas the thickness of both the n-type and the p-type semiconductor layer may be from 5 nm to 100 nm, in particular from 10 nm to 60 nm.

Photovoltaic diodes which are provided in the form of a PIN diode comprising amorphous silicon are, generally, known to exhibit a non-linear frequency response. As a result, the positive and/or the negative FiP effect may be observable in the longitudinal sensor which may, moreover, be substantially frequency-independent in a range of a modulation frequency of the light beam of 0 Hz to 50 kHz. Experimental results which demonstrate an occurrence of the mentioned features will be presented below in more detail. Further, the optical detector comprising the amorphous silicon may exhibits the particular advantages of abundance of the respective semiconducting material, of an easy production route, and of a considerably high signal-to-noise ratio compared to other known FiP devices.

Further, taking into account a behavior of an external quantum efficiency of the PIN diode vs. the wavelength of the incident beam may provide insight into a wavelength range of the incident beam for which the PIN diode may particularly be suitable. Herein, the term "external quantum efficiency" refers to a fraction of photon flux which may contribute to the photocurrent in the present sensor. As a result, the PIN diode which comprises the amorphous silicon may exhibit a particularly high value for the external quantum efficiency within the wavelength range which may extend from 380 nm to 700 nm whereas the external quantum efficiency may be lower for wavelengths outside this range, in particular for wavelengths below 380 nm, i.e. within the UV range, and for wavelengths above 700 nm, in particular within the NIR range, thereby being vanishingly small above 800 nm. Consequently, the PIN diode which the amorphous silicon in at least one of the semiconductor layers may preferably be employed in the detector according to the present invention for the optical detection of the at least one object when the incident beam has a wavelength within a range which covers most of the visual spectral range, especially from 380 nm to 700 nm.

Alternatively, a further PIN diode may be provided which could preferably be employed in the detector according to the present invention when the incident beam may have a wavelength within the UV spectral range. As used herein, the term "UV spectral range" may cover a partition of the electromagnetic spectrum from 1 nm to 400 nm, in particular from 100 nm to 400 nm, and can be subdivided into a number of ranges as recommended by the ISO standard ISO-21348, wherein the alternative PIN diode provided here may particularly be suitable for the Ultraviolet A range, abbreviated to "UVA", from 400 nm to 315 nm and/or the Ultraviolet B range, abbreviated to "UVB" from 315 nm to 280 nm. For this purpose, the alternative PIN diode may exhibit the same or a similar arrangement as the PIN diode comprising the amorphous silicon as described above and/or below, wherein the amorphous silicon (a-Si) or the hydrogenated amorphous silicon (a-Si:H), respectively, may at least partially be replaced by an amorphous alloy of silicon and carbon (a-SiC) or, preferably, by a hydrogenated amorphous silicon carbon alloy (a-SiC:H). This kind of alternative PIN diode may exhibit a high external quantum efficiency within the UV wavelength range preferably, over the complete UVA and UVB wavelength range from 280 nm to 400 nm. Herein, the hydrogenated amorphous silicon carbon alloy (a-SiC:H) may, preferably, be produced in a plasma-enhanced deposition process, typically by using $SiH_4$ and $CH_4$ as process gases. However, other production methods for providing a-SiC:H may also be applicable.

As known from prior art, a layer comprising the hydrogenated amorphous silicon carbon alloy a-SiC:H may usually exhibit a hole mobility which may significantly be smaller compared to an electron mobility in a layer comprising the hydrogenated amorphous silicon a-Si:H. Thus, the layer comprising a-SiC:H may be employed as a p-doped hole extraction layer, particularly arranged on the side of a device at which the light beam may enter the device. As a result of this arrangement, a distance over which holes might have to travel in order to be able to contribute to the photocurrent can considerably reduced. Consequently, it may, thus, be advantageous to provide a PIN diode in the detector according to the present invention in which the p-type semiconductor layer may exhibit a thickness from 2 nm to 20 nm, preferably from 4 nm to 10 nm, such as about 5 nm. Still, a particular light beam having a wavelength in the UV spectral range, especially within the UVA spectral range and/or the UVB spectral range, which may impinge on a side of the PIN diode comprising this kind of thin p-type semiconductor layer may be absorbed therein. In addition, this kind of thin layer may, further, allow electrons to traverse the layer and, thus, to enter into the adjacent i-type semiconductor layer of the PIN diode. Herein, the i-type semiconductor layer which may, preferably, also comprise a-SiC:H may, equally, exhibit a thickness from 2 nm to 20 nm, preferably from 4 nm to 10 nm, such as about 5 nm. However, other kinds of PIN diodes in which at least one of the semiconductor layers may comprise at least partially a-SiC:H may also be feasible.

As described above, non-linear effects which are involved in the production of the photocurrent may constitute a basis for the occurrence of the FiP effect in the longitudinal sensor being equipped with a PIN diode comprising these kinds of semiconductor layers. As a result, this kind of longitudinal sensors may, in particular, be used in applications in which a UV response may be required, such as for being able to observe optical phenomena in the UV spectral range, or suitable, such as when an active target which may emit at least one wavelength within the UV spectral range might be used.

Alternatively, a further PIN diode may be provided which could preferably be employed in the detector according to the present invention when the incident beam may have a wavelength within the NIR spectral range. As used herein, the term "NIR spectral range", which may also abbreviated to "IR-A", may cover a partition of the electromagnetic spectrum from 760 nm to 1400 nm as recommended by the ISO standard ISO-21348. For this purpose, the alternative PIN diode may exhibit the same or a similar arrangement as the PIN diode comprising the amorphous silicon as described above and/or below, wherein the amorphous silicon (a-Si) or the hydrogenated amorphous silicon (a-Si:H), respectively, may at least partially be replaced by one of a microcrystalline silicon (µc-Si), preferably a hydrogenated microcrystalline silicon (µc-Si:H), or an amorphous alloy of germanium and silicon (a-GeSi), preferably a hydrogenated amorphous germanium silicon alloy (a-GeSi:H). This further kind of PIN diode may exhibit a high external quantum efficiency over a wavelength range which may at least partially cover the NIR wavelength range from 760 nm to 1400 nm, in particular at least from 760 nm to 1000 nm. By way of example, the PIN diode comprising µc-Si has a non-negligible quantum efficiency over a wavelength range which approximately extends from 500 nm to 1100 nm.

Herein, the hydrogenated microcrystalline silicon (µc-Si:H) may, preferably, be produced from a gaseous mixture of $SiH_4$ and $CH_4$. As a result, a two-phase material on a substrate comprising microcrystallites having a typical size of 5 nm to 30 nm and being located between ordered columns of the substrate material spaced apart 10 nm to 200 nm with respect to each other may be obtained. However, another production method for providing µc-Si:H may also be applicable which may, however not necessarily, lead to an alternative arrangement of the µc-Si:H. Further, the hydrogenated amorphous germanium silicon alloy (a-GeSi:H) may, preferably, be produced by using $SiH_4$, $GeH_4$, and $H_2$ as process gases within a common reactor. Also here, other production methods for providing a-GeSi:H may be feasible.

Comparing both µc-Si:H and a-GeSi:H to a-Si:H, the semiconductor layers comprising µc-Si:H and a-GeSi:H may have a similar or an increased disorder-induced localization of charge carriers, thus, exhibiting a considerably non-linear frequency response. As described above, this may constitute a basis for the occurrence of the FiP effect in the longitudinal sensor being equipped with a PIN diode comprising these kinds of semiconductor layers. As a result, this kind of longitudinal sensors may, in particular, be used in applications in which a NIR response may be required, such as in night vision or fog vision, or suitable, such as when an active target emitting at least one wavelength within the NIR spectral range may be used, for example, in a case in which it might be advantageous when animals or human beings may be left undisturbed by using an NIR illumination source.

In a further aspect of the present invention, a detector for optical detection, in particular, for determining a position of at least one object, specifically with regard to a depth of the at least one object, is disclosed. The detector for an optical detection of at least one object according to the present invention comprises:
  at least one longitudinal optical sensor, wherein the longitudinal optical sensor has at least one sensor region, wherein the longitudinal optical sensor is designed to generate at least one longitudinal sensor signal in a manner dependent on an illumination of the sensor region by a light beam, wherein the longitudinal sensor signal, given the same total power of the illumination, is dependent on a beam cross-section of the light beam in the sensor region, wherein the longitudinal optical sensor, given the same total power of the illumination, is capable of generating at least one longitudinal sensor signal being dependent on the beam cross-section of the light beam in the sensor region such that an amplitude of the longitudinal sensor signal decreases with decreasing cross-section of a light spot generated by the light beam in the sensor region; and
  at least one evaluation device, wherein the evaluation device is designed to generate at least one item of information on a longitudinal position of the object by evaluating the longitudinal sensor signal of the longitudinal optical sensor.

According to this further aspect of the present invention, the longitudinal optical sensor, given the same total power of the illumination, is capable of generating at least one longitudinal sensor signal which is dependent on the beam cross-section of the light beam in the sensor region. Herein, a dependency of at least one longitudinal sensor signal on the beam cross-section of the light beam in the sensor region may be observed according to which an amplitude of the longitudinal sensor signal decreases with decreasing cross-section of a light spot generated by the light beam in the sensor region. As described above, this observation may be denominated as the "negative FiP" effect.

Consequently, recording the at least one longitudinal sensor signal allows determining the beam cross-section of the light beam in the sensor region and, thus, as described above, generating at least one item of information on a longitudinal position of the object. For further details concerning this aspect of the present invention, reference may be made to the description of the other aspects of the optical detector as provided above and/or below.

In a further aspect of the present invention, a detector for optical detection, in particular, for determining a position of at least one object, specifically with regard to a depth of the at least one object, is disclosed. The detector for an optical detection of at least one object according to the present invention comprises:
  at least one longitudinal optical sensor, wherein the longitudinal optical sensor has at least one sensor region, wherein the longitudinal optical sensor is designed to generate at least one longitudinal sensor signal in a manner dependent on an illumination of the sensor region by a light beam, wherein the longitudinal sensor signal, given the same total power of the illumination, is dependent on a beam cross-section of the light beam in the sensor region, wherein the longitudinal optical sensor, given the same total power of the illumination, is capable of generating at least one longitudinal sensor signal being dependent on the beam cross-section of the light beam in the sensor region, wherein a minimum of the longitudinal sensor signal occurs under a condition in which the sensor region is impinged by a light beam with the smallest available beam cross-section; and
  at least one evaluation device, wherein the evaluation device is designed to generate at least one item of information on a longitudinal position of the object by evaluating the longitudinal sensor signal of the longitudinal optical sensor.

According to this further aspect of the present invention, the longitudinal optical sensor, given the same total power of the illumination, is capable of generating at least one longitudinal sensor signal which is dependent on the beam cross-section of the light beam in the sensor region. Herein, a dependency of at least one longitudinal sensor signal on the beam cross-section of the light beam in the sensor region may be observed according to which a minimum of the longitudinal sensor signal occurs under a condition in which the sensor region is impinged by a light beam with the smallest available beam cross-section, in particular, when the material may be located at or near a focal point as effected by an optical lens comprised in the optical detector. As described above, this observation provides a different description of the so-called "negative FiP" effect.

Consequently, recording the at least one longitudinal sensor signal allows determining the beam cross-section of the light beam in the sensor region and, thus, as described above, generating at least one item of information on a longitudinal position of the object. For further details concerning this aspect of the present invention, reference may be made to the description of the other aspects of the optical detector as provided above and/or below.

In a further aspect of the present invention, a detector for optical detection, in particular, for determining a position of at least one object, specifically with regard to a depth of the at least one object, is disclosed. The detector for an optical detection of at least one object according to the present invention comprises:

- at least one longitudinal optical sensor, wherein the longitudinal optical sensor has at least one sensor region, wherein the longitudinal optical sensor is designed to generate at least one longitudinal sensor signal in a manner dependent on an illumination of the sensor region by a light beam, wherein the longitudinal sensor signal, given the same total power of the illumination, is dependent on a beam cross-section of the light beam in the sensor region, wherein the longitudinal sensor is substantially frequency-independent in a range of a modulation frequency of the light beam of 0 Hz to 500 Hz; and
- at least one evaluation device, wherein the evaluation device is designed to generate at least one item of information on a longitudinal position of the object by evaluating the longitudinal sensor signal of the longitudinal optical sensor.

According to this further aspect of the present invention, the longitudinal optical sensor, given the same total power of the illumination, is dependent on the beam cross-section of the light beam in the sensor region. Herein, the longitudinal sensor is substantially frequency-independent in a range of a modulation frequency of the light beam of 0 Hz to 500 Hz. Thereby, the term "substantially" describes an observation that an amplitude of the longitudinal sensor varies less than 10%, preferably less than 1% when the modulation frequency of the light beam is varied within the indicated frequency range. As described above, this description refers to the observation that the "FiP" effect may also occur at low frequencies, in particular at 0 Hz, which indicates that no modulation frequency is present, apart from unavoidable naturally or technically occurring modulation frequencies in the vicinity surrounding the optical detector.

Consequently, recording the at least one longitudinal sensor signal in the indicated frequency range allows determining the beam cross-section of the light beam in the sensor region and, thus, as described above, generating at least one item of information on a longitudinal position of the object. For further details concerning this aspect of the present invention, reference may be made to the description of the other aspects of the optical detector as provided above and/or below.

In a further aspect of the present invention, a detector for optical detection, in particular, for determining a position of at least one object, specifically with regard to a depth of the at least one object, is disclosed. The detector for an optical detection of at least one object according to the present invention comprises:

- at least one longitudinal optical sensor, wherein the longitudinal optical sensor has at least one sensor region, wherein the longitudinal optical sensor is designed to generate at least one longitudinal sensor signal in a manner dependent on an illumination of the sensor region by a light beam, wherein the longitudinal sensor signal, given the same total power of the illumination, is dependent on a beam cross-section of the light beam in the sensor region, wherein the longitudinal optical sensor comprises at least one photodiode driven in a photoconductive mode, wherein an electrical conductivity of the sensor region, given the same total power of the illumination, is dependent on the beam cross-section of the light beam in the sensor region, wherein the longitudinal sensor signal is dependent on the electrical conductivity; and
- at least one evaluation device, wherein the evaluation device is designed to generate at least one item of information on a longitudinal position of the object by evaluating the longitudinal sensor signal of the longitudinal optical sensor.

According to this further aspect of the present invention, the longitudinal optical sensor comprises at least one photodiode driven in a photoconductive mode within the sensor region. As used herein, the "photodiode" refers to a known electronic element which comprises an electrically conducting material, in particular a semiconducting material, which exhibits a pn-junction or a PIN structure, i.e. at least two types of the material inside the photodiode, wherein the at least two types of materials comprises a different kind of doping, being denominated as "p-type" and "n-type" material, which may, further, be separated by an intrinsic "i"-type region. Known materials which are commonly used in photodiodes include silicon (Si), germanium (Ge), indium gallium arsenide (InGaAs), lead (II) sulfide (PbS), and mercury cadmium telluride (HgCdTe). However, other materials may be feasible.

As used herein, the "photoconductive mode" refers to an electrical circuit employing a photodiode, wherein the at least one photodiode is comprised in a reverse biased mode, i.e. wherein the cathode of the photodiode is driven with a positive voltage with respect to the anode. This is in contrast to the so-called "photovoltaic mode", which uses a zero bias. Applying the photoconductive mode to the photodiode, generally, leads to the observation that, given the same total power of the illumination, the photocurrent is found to be dependent on the beam cross-section of the light beam in the sensor region. Consequently, since the longitudinal sensor signal is dependent on the electrical conductivity, recording the at least one longitudinal sensor signal, thus, allows determining the beam cross-section of the light beam in the sensor region and, thus, as described above, generating at least one item of information on a longitudinal position of the object.

The observation that, given the same total power of the illumination, the photocurrent is found to be dependent on the beam cross-section of the light beam in the sensor region may, further, be employed for electrically adjusting the electrical conductivity of the longitudinal optical sensor comprising at least one photodiode by applying different bias voltages to the photodiode. Herein, the electrical conductivity of the longitudinal optical sensor may be electrically adjustable by using the bias voltage source. For this purpose, the bias voltage source may be configured to apply at least two different bias voltages to the photodiode in a manner that it may be possible to switch between at least two operational modes of the longitudinal optical sensor, in particular by using a switching device.

Thus, on one hand, a non-zero bias voltage may be applied to the photodiode, specifically a reverse biased mode, such as described elsewhere in this application, in a manner that the photodiode may, thus, be driven in the photoconductive mode. Under such a first condition, the longitudinal optical sensor may, consequently, be considered adopting a first operational mode. On the other hand, a zero bias may be used, such that the photodiode may be unbiased and, thus, be driven in the photovoltaic mode as described above. Under such a second condition, the longitudinal optical sensor may, therefore, be considered adopting a second operational mode. Accordingly, the switching device may be adapted to exert an influence on the bias voltage source in order to set the bias voltage, such as described here. As used herein, the term "operational mode" may refer to a definite state, in particular to an operating state, of the longitudinal optical sensor. Herein, the operational mode may depend on an adjustable value for the electrical conductivity of the longitudinal optical sensor such that the longitudinal optical sensor, in the first operational mode, may generate a first longitudinal sensor signal and, in the second operational mode, a second longitudinal sensor signal, wherein the first longitudinal sensor signal and the second longitudinal sensor signal differ from each other. As a result, the longitudinal optical sensor may, thus, be configured for the optical detection of the at least one object in at least two operational modes. Herein, adjusting the longitudinal optical sensor may require a certain time period in order to settle into an altered operational mode after the bias voltage has been changed. However, the time period between detecting the photocurrent in a first operational mode and, subsequently, in a second operational mode or vice-versa may be arranged as short as possible.

For further details concerning this aspect of the present invention, reference may be made to the description of the other aspects of the optical detector as provided above and/or below.

In a further preferred embodiment, the photodiode as comprised in this kind of FiP device can be arranged in form of a thin-film solar cell having at least one p-type absorber material, at least one n-type semiconductor layer, and, in addition, at least one pair of electrodes. Herein, the p-type absorber material and the n-type semiconductor layer form the photodiode while the electrodes may be required for collecting charge carriers. In addition, further kinds of layers may be present within this type of thin-film solar cell, in particular, at least one substrate, at least one back contact layer, at least one buffer layer and/or at least one protection layer. A particular example for a preferred arrangement of this kind of thin-film solar cell which may, especially, be suitable for being used as one of the photodiodes in the longitudinal optical sensor according to the present invention is described later in more detail.

In particular, the p-type absorber material as being used for the purposes of the present invention may exhibit a diamond-like structure, thus, comprising a number of tetravalent atoms. As a result, the p-type absorber material may be selected from one or more of diamond (C), silicon (Si), silicon carbide (SiC), silicon germanium (SiGe), or germanium (Ge). Alternatively, the p-type absorber material may exhibit a modified diamond-like structure, wherein one or more of the tetravalent atoms of the diamond-like structure may be substituted by an atom combination which may, in particular, affect an average of four valence electrons within the modified structure. As an example, a III-V compound comprising one chemical element from each of the groups III and V of the periodic table may be suitable for this purpose since two tetravalent atoms which jointly comprise 2×4=8 valence electrons may, accordingly, be replaced by 3+5=8 valence electrons. As a further example, a I-III-VI$_2$ compound comprising one chemical element from each of the groups I and III and two chemical elements from the group VI may also be used since four tetravalent atoms jointly comprising 4×4=16 valence electrons may, here, be replaced by 1+4+(2×6)=16 valence electrons. However, other kinds of combinations may also be feasible.

Thus, the p-type absorber material may, preferably, be selected from the group comprising
- a III-V compound, in particular indium antimonide (InSb), gallium nitride (GaN), gallium arsenide (GaAs), indium gallium arsenide (InGaAs), or aluminum gallium phosphide (AlGaP);
- a II-VI compound, in particular cadmium telluride (CdTe), or mercury cadmium telluride (HgCdTe, also abbreviated to "MCT") which may be considered as II-VI ternary alloy of CdTe and HgTe;
- a I-III-VI$_2$ compound, in particular copper indium sulfide (CuInS$_2$; CIS) and, more preferred, copper indium gallium selenide (CIGS) which may be considered as a solid solution of copper indium selenide (CIS) and copper gallium selenide (CuGaSe$_2$), thus, comprising a chemical formula of CuIn$_x$Ga$_{(1-x)}$Se$_2$, wherein x can vary from 0, i.e. pure CuGaSe$_2$, to 1, i.e. pure CIS;
- a I$_2$-II-IV-VI$_4$ compound, in particular copper zinc tin sulfide (CZTS), copper zinc tin selenide (CZTSe), or a copper-zinc-tin sulfur-selenium chalcogenide (CZTSSe); and a halide perovskite compound, especially a compound comprising an alkaline cation, or, in particular, an organic-inorganic halide perovskite, such as a methylammonium metal halide (CH$_3$NH$_3$MX$_3$ with M being a divalent metal, such as Pb or Sn, and X=Cl, Br, or I), preferably methylammonium lead iodide (CH$_3$NH$_3$PbI$_3$).

Hereby, compounds, such as CZTS, which neither comprise rare chemical elements, such as Indium (In), nor toxic chemical elements, such as cadmium (Cd), may especially be preferred. However, further types of compounds and/or additional examples may also be feasible.

In addition, further considerations may, however, concern a sensitivity of the addressed p-type absorber material with particular respect to an absorption rate as a function of the wavelength of the incident light beam. Within this respect, the mentioned I-III-VI$_2$ compounds CIS and CIGS as well as the mentioned I$_2$-II-IV-VI$_4$ compounds CZTS, CZTSe, and CZTSSe may particularly be used for related purposes within both the visual spectral range and the NIR spectral range from 780 nm to 1300 nm. For longer wavelengths, in particular above 1300 nm, the II-VI compounds InSb and HgCdTe (MCT) can, however, be a preferred choice.

Further, the n-type semiconductor layer within this type of thin-film solar cell may, preferably, comprise cadmium sulfide (CdS) or, in particular, for avoiding toxic cadmium (Cd) one or more of zinc sulfide (ZnS), zinc oxide (ZnO), or zinc hydroxide (ZnOH).

In a further aspect of the present invention, an arrangement comprising at least two individual detectors according to any of the preceding embodiments, preferably two or three individual optical sensors, which may be placed at two distinct locations is proposed. Herein, the at least two detectors preferably may have identical optical properties but might also be different with respect from each other. In addition, the arrangement may further comprise at least one illumination source. Herein, the at least one object might be illuminated by using at least one illumination source which generates primary light, wherein the at least one object elastically or inelastically reflects the primary light, thereby generating a plurality of light beams which propagate to one of the at least two detectors. The at least one illumination source may form or may not form a constituent part of each of the at least two detectors. By way of example, the at least one illumination source itself may be or may comprise an ambient light source and/or may be or may comprise an artificial illumination source. This embodiment is preferably suited for an application in which at least two detectors, preferentially two identical detectors, are employed for acquiring depth information, in particular, for the purpose to providing a measurement volume which extends the inherent measurement volume of a single detector.

Within this regard, the individual optical sensor may, preferably, be spaced apart from the other individual optical sensors comprised by the detector in order to allow acquiring an individual image which may differ from the images taken by the other individual optical sensors. In particular, the individual optical sensors may be arranged in separate beam paths in a collimated arrangement in order to generate a single circular, three-dimensional image. Thus, the individual optical sensors may be aligned in a manner that they are located parallel to the optical axis and may, in addition, exhibit an individual displacement in an orientation perpendicular to the optical axis of the detector. Herein, an alignment may be achieved by adequate measures, such as by adjusting a location and orientation of the individual optical sensor and/or the corresponding transfer element. Thus, the two individual optical sensors may, preferably, be spaced apart in a manner that they may be able to generate or increase a perception of depth information, especially in a fashion that the depth information may be obtained by combining visual information as derived from the two individual optical sensors having overlapping fields of view, such as the visual information as obtained by binocular vision. For this purpose, the individual optical sensors may, preferably be spaced apart from each other by a distance from 1 cm to 100 cm, preferably from 10 cm to 25 cm, as determined in the direction perpendicular to the optical axis. As used herein, the detector as provided in this embodiment may, in particular, be part of a "stereoscopic system" which will be described below in more detail. Besides allowing stereoscopic vision, further particular advantages of the stereoscopic system which are primarily based on a use of more than one optical sensor may, in particular, include an increase of the total intensity and/or a lower detection threshold.

In a further aspect of the present invention, a human-machine interface for exchanging at least one item of information between a user and a machine is proposed. The human-machine interface as proposed may make use of the fact that the above-mentioned detector in one or more of the embodiments mentioned above or as mentioned in further detail below may be used by one or more users for providing information and/or commands to a machine. Thus, preferably, the human-machine interface may be used for inputting control commands.

The human-machine interface comprises at least one detector according to the present invention, such as according to one or more of the embodiments disclosed above and/or according to one or more of the embodiments as disclosed in further detail below, wherein the human-machine interface is designed to generate at least one item of geometrical information of the user by means of the detector wherein the human-machine interface is designed to assign the geometrical information to at least one item of information, in particular to at least one control command.

In a further aspect of the present invention, an entertainment device for carrying out at least one entertainment function is disclosed. As used herein, an entertainment device is a device which may serve the purpose of leisure and/or entertainment of one or more users, in the following also referred to as one or more players. As an example, the entertainment device may serve the purpose of gaming, preferably computer gaming. Additionally or alternatively, the entertainment device may also be used for other purposes, such as for exercising, sports, physical therapy or motion tracking in general. Thus, the entertainment device may be implemented into a computer, a computer network or a computer system or may comprise a computer, a computer network or a computer system which runs one or more gaming software programs.

The entertainment device comprises at least one human-machine interface according to the present invention, such as according to one or more of the embodiments disclosed above and/or according to one or more of the embodiments disclosed below. The entertainment device is designed to enable at least one item of information to be input by a player by means of the human-machine interface. The at least one item of information may be transmitted to and/or may be used by a controller and/or a computer of the entertainment device.

In a further aspect of the present invention, a tracking system for tracking the position of at least one movable object is provided. As used herein, a tracking system is a device which is adapted to gather information on a series of past positions of the at least one object or at least one part of an object. Additionally, the tracking system may be adapted to provide information on at least one predicted future position of the at least one object or the at least one part of the object. The tracking system may have at least one track controller, which may fully or partially be embodied as an electronic device, preferably as at least one data processing device, more preferably as at least one computer or microcontroller. Again, the at least one track controller may comprise the at least one evaluation device and/or may be part of the at least one evaluation device and/or might fully or partially be identical to the at least one evaluation device.

The tracking system comprises at least one detector according to the present invention, such as at least one detector as disclosed in one or more of the embodiments listed above and/or as disclosed in one or more of the embodiments below. The tracking system further comprises at least one track controller. The tracking system may comprise one, two or more detectors, particularly two or more identical detectors, which allow for a reliable acquisition of depth information about the at least one object in an overlapping volume between the two or more detectors. The track controller is adapted to track a series of positions of the object, each position comprising at least one item of information on a position of the object at a specific point in time.

The tracking system may further comprise at least one beacon device connectable to the object. For a potential definition of the beacon device, reference may be made to WO 2014/097181 A1. The tracking system preferably is adapted such that the detector may generate an information on the position of the object of the at least one beacon device, in particular to generate the information on the position of the object which comprises a specific beacon device exhibiting a specific spectral sensitivity. Thus, more than one beacon exhibiting a different spectral sensitivity may be tracked by the detector of the present invention, preferably in a simultaneous manner. Herein, the beacon device may fully or partially be embodied as an active beacon device and/or as a passive beacon device. As an example, the beacon device may comprise at least one illumination source adapted to generate at least one light beam to be transmitted to the detector. Additionally or alternatively, the beacon device may comprise at least one reflector adapted to reflect light generated by an illumination source, thereby generating a reflected light beam to be transmitted to the detector.

In a further aspect of the present invention, a scanning system for determining at least one position of at least one object is provided. As used herein, the scanning system is a device which is adapted to emit at least one light beam being configured for an illumination of at least one dot located at at least one surface of the at least one object and for generating at least one item of information about the distance between the at least one dot and the scanning system. For the purpose of generating the at least one item of information about the distance between the at least one dot and the scanning system, the scanning system comprises at least one of the detectors according to the present invention, such as at least one of the detectors as disclosed in one or more of the embodiments listed above and/or as disclosed in one or more of the embodiments below.

Thus, the scanning system comprises at least one illumination source which is adapted to emit the at least one light beam being configured for the illumination of the at least one dot located at the at least one surface of the at least one object. As used herein, the term "dot" refers to a small area on a part of the surface of the object which may be selected, for example by a user of the scanning system, to be illuminated by the illumination source. Preferably, the dot may exhibit a size which may, on one hand, be as small as possible in order to allow the scanning system determining a value for the distance between the illumination source comprised by the scanning system and the part of the surface of the object on which the dot may be located as exactly as possible and which, on the other hand, may be as large as possible in order to allow the user of the scanning system or the scanning system itself, in particular by an automatic procedure, to detect a presence of the dot on the related part of the surface of the object.

For this purpose, the illumination source may comprise an artificial illumination source, in particular at least one laser source and/or at least one incandescent lamp and/or at least one semiconductor light source, for example, at least one light-emitting diode, in particular an organic and/or inorganic light-emitting diode. On account of their generally defined beam profiles and other properties of handleability, the use of at least one laser source as the illumination source is particularly preferred. Herein, the use of a single laser source may be preferred, in particular in a case in which it may be important to provide a compact scanning system that might be easily storable and transportable by the user. The illumination source may thus, preferably be a constituent part of the detector and may, therefore, in particular be integrated into the detector, such as into the housing of the detector. In a preferred embodiment, particularly the housing of the scanning system may comprise at least one display configured for providing distance-related information to the user, such as in an easy-to-read manner. In a further preferred embodiment, particularly the housing of the scanning system may, in addition, comprise at least one button which may be configured for operating at least one function related to the scanning system, such as for setting one or more operation modes. In a further preferred embodiment, particularly the housing of the scanning system may, in addition, comprise at least one fastening unit which may be configured for fastening the scanning system to a further surface, such as a rubber foot, a base plate or a wall holder, such comprising as magnetic material, in particular for increasing the accuracy of the distance measurement and/or the handleablity of the scanning system by the user.

In a particularly preferred embodiment, the illumination source of the scanning system may, thus, emit a single laser beam which may be configured for the illumination of a single dot located at the surface of the object. By using at least one of the detectors according to the present invention at least one item of information about the distance between the at least one dot and the scanning system may, thus, be generated. Hereby, preferably, the distance between the illumination system as comprised by the scanning system and the single dot as generated by the illumination source may be determined, such as by employing the evaluation device as comprised by the at least one detector. However, the scanning system may, further, comprise an additional evaluation system which may, particularly, be adapted for this purpose. Alternatively or in addition, a size of the scanning system, in particular of the housing of the scanning system, may be taken into account and, thus, the distance between a specific point on the housing of the scanning system, such as a front edge or a back edge of the housing, and the single dot may, alternatively, be determined.

Alternatively, the illumination source of the scanning system may emit two individual laser beams which may be configured for providing a respective angle, such as a right angle, between the directions of an emission of the beams, whereby two respective dots located at the surface of the same object or at two different surfaces at two separate objects may be illuminated. However, other values for the respective angle between the two individual laser beams may also be feasible. This feature may, in particular, be employed for indirect measuring functions, such as for deriving an indirect distance which may not be directly accessible, such as due to a presence of one or more obstacles between the scanning system and the dot or which may otherwise be hard to reach. By way of example, it may, thus, be feasible to determine a value for a height of an object by measuring two individual distances and deriving the height by using the Pythagoras formula. In particular for being able to keep a predefined level with respect to the object, the scanning system may, further, comprise at least one leveling unit, in particular an integrated bubble vial, which may be used for keeping the predefined level by the user.

As a further alternative, the illumination source of the scanning system may emit a plurality of individual laser beams, such as an array of laser beams which may exhibit a respective pitch, in particular a regular pitch, with respect to each other and which may be arranged in a manner in order to generate an array of dots located on the at least one surface of the at least one object. For this purpose, specially adapted optical elements, such as beam-splitting devices and mirrors, may be provided which may allow a generation of the described array of the laser beams.

Thus, the scanning system may provide a static arrangement of the one or more dots placed on the one or more surfaces of the one or more objects. Alternatively, illumination source of the scanning system, in particular the one or more laser beams, such as the above described array of the laser beams, may be configured for providing one or more light beams which may exhibit a varying intensity over time and/or which may be subject to an alternating direction of emission in a passage of time. Thus, the illumination source may be configured for scanning a part of the at least one surface of the at least one object as an image by using one or more light beams with alternating features as generated by the at least one illumination source of the scanning device. In particular, the scanning system may, thus, use at least one row scan and/or line scan, such as to scan the one or more surfaces of the one or more objects sequentially or simultaneously.

In a further aspect of the present invention, a stereoscopic system for generating at least one single circular, three-dimensional image of at least one object is provided. As used herein, the stereoscopic system as disclosed above and/or below may comprise at least two of the FiP sensors as the optical sensors, wherein a first FiP sensor may be comprised in a tracking system, in particular in a tracking system according to the present invention, while a second FiP sensor may be comprised in a scanning system, in particular in a scanning system according to the present invention. Herein, the FiP sensors may, preferably, be arranged in separate beam paths in a collimated arrangement, such as by aligning the FiP sensors parallel to the optical axis and individually displaced perpendicular to the optical axis of the stereoscopic system. Thus, the FiP sensors may be able to generate or increase a perception of depth information, especially, by obtaining the depth information by a combination of the visual information derived from the individual FiP sensors which have overlapping fields of view and are, preferably, sensitive to an individual modulation frequency. For this purpose, the individual FiP sensors may, preferably, be spaced apart from each other by a distance from 1 cm to 100 cm, preferably from 10 cm to 25 cm, as determined in the direction perpendicular to the optical axis. In this preferred embodiment, the tracking system may, thus, be employed for determining a position of a modulated active target while the scanning system which is adapted to project one or more dots onto the one or more surfaces of the one or more objects may be used for generating at least one item of information about the distance between the at least one dot and the scanning system. In addition, the stereoscopic system may further comprise a separate position sensitive device being adapted for generating the item of information on the transversal position of the at least one object within the image as described elsewhere in this application.

Besides allowing stereoscopic vision, further particular advantages of the stereoscopic system which are primarily based on a use of more than one optical sensor may, in particular, include an increase of the total intensity and/or a lower detection threshold. Further, whereas in a conventional stereoscopic system which comprises at least two conventional position sensitive devices corresponding pixels in the respective images have to be determined by applying considerable computational effort, in the stereoscopic system according to the present invention which comprises at least two FiP sensors the corresponding pixels in the respective images being recorded by using the FiP sensors, wherein each of the FiP sensors may be operated with a different modulation frequency, may apparently be assigned with respect to each other. Thus, it may be emphasized that the stereoscopic system according to the present invention may allow generating the at least one item of information on the longitudinal position of the object as well as on the transversal position of the object with reduced effort.

For further details of the stereoscopic system, reference may be made to the description of the tracking system and the scanning system, respectively.

In a further aspect of the present invention, a camera for imaging at least one object is disclosed. The camera comprises at least one detector according to the present invention, such as disclosed in one or more of the embodiments given above or given in further detail below. Thus, the detector may be part of a photographic device, specifically of a digital camera. Specifically, the detector may be used for 3D photography, specifically for digital 3D photography. Thus, the detector may form a digital 3D camera or may be part of a digital 3D camera. As used herein, the term "photography" generally refers to the technology of acquiring image information of at least one object. As further used herein, a "camera" generally is a device adapted for performing photography. As further used herein, the term "digital photography" generally refers to the technology of acquiring image information of at least one object by using a plurality of light-sensitive elements adapted to generate electrical signals indicating an intensity of illumination, preferably digital electrical signals. As further used herein, the term "3D photography" generally refers to the technology of acquiring image information of at least one object in three spatial dimensions. Accordingly, a 3D camera is a device adapted for performing 3D photography. The camera generally may be adapted for acquiring a single image, such as a single 3D image, or may be adapted for acquiring a plurality of images, such as a sequence of images. Thus, the camera may also be a video camera adapted for video applications, such as for acquiring digital video sequences.

Thus, generally, the present invention further refers to a camera, specifically a digital camera, more specifically a 3D camera or digital 3D camera, for imaging at least one object. As outlined above, the term imaging, as used herein, generally refers to acquiring image information of at least one object. The camera comprises at least one detector according to the present invention. The camera, as outlined above, may be adapted for acquiring a single image or for acquiring a plurality of images, such as image sequence, preferably for acquiring digital video sequences. Thus, as an example, the camera may be or may comprise a video camera. In the latter case, the camera preferably comprises a data memory for storing the image sequence.

In a further aspect of the present invention, a method for determining a position of at least one object is disclosed. The method preferably may make use of at least one detector according to the present invention, such as of at least one detector according to one or more of the embodiments disclosed above or disclosed in further detail below. Thus, for optional embodiments of the method, reference might be made to the description of the various embodiments of the detector.

The method comprises the following steps, which may be performed in the given order or in a different order. Further, additional method steps might be provided which are not listed. Further, two or more or even all of the method steps might be performed simultaneously, at least partially. Further, two or more or even all of the method steps might be performed twice or even more than twice, repeatedly.

The method according to the present invention comprises the following steps:

generating at least one longitudinal sensor signal by using at least one longitudinal optical sensor, wherein the longitudinal sensor signal is dependent on an illumination of a sensor region of the longitudinal optical sensor by a light beam, wherein the longitudinal sensor signal, given the same total power of the illumination, is dependent on a beam cross-section of the light beam in the sensor region, wherein the sensor region comprises at least one photoconductive material, wherein an electrical conductivity of the sensor region, given the same total power of the illumination, is dependent on the beam cross-section of the light beam in the sensor region, wherein the longitudinal sensor signal is dependent on the electrical conductivity; and generating at least one item of information on a longitudinal position of the object by evaluating the longitudinal sensor signal of the longitudinal optical sensor.

As described above, the photoconductive material may, in a preferred embodiment, be provided as a thin film comprising colloidal quantum dots (CQD). Herein, the CQD film may, preferably, be deposited onto a first conductive layer, wherein the first conductive layer may comprise an at least partially transparent semiconducting material which may, preferably, be selected from the group comprising an at least partially transparent semiconducting metal oxide or a doped variant thereof, in particular selected from indium tin oxide (ITO), fluorine-doped tin oxide (SnO2:F; FTO), aluminum zinc oxide (AZO), antimony tin oxide ($SnO_2/Sb_2O_5$), or a perovskite TCO, such as $SrVO_3$, or $CaVO_3$, or, alternatively, from metal nanowires, such as Ag or Cu nanowires. Herein, the CQD film may be provided as a solution of the quantum dots in an unpolar organic solvent, wherein the solvent may, preferably, be selected from the group comprising octane, toluene, cyclohexane, n-heptane, benzene, chlorobenzene, acetonitrile, dimethylformamide (DMF), and chloroform. Preferably, the quantum dots may be provided in a concentration from 10 mg/ml to 200 mg/ml, preferably from 50 mg/ml to 100 mg/ml, in the organic solvent.

Generally, the CQD film may be provided as a single layer or as at least two separately processed layers, preferably as exactly two separate layers. However, three, four, five, or six separate processed may also be feasible. Irrespective whether a single layer or multiple layers may be processed, the CQD film may, preferably be provided by a deposition method, preferably by a coating method, more preferred by a spin-coating or slot coating; by ink-jet printing; or by a blade coating method. Herein, the CQD film may undergo a treatment with an organic agent, wherein the organic agent may, preferably, be selected from the group comprising thioles and amines, in particular from 1,2-ethanedithiol (edt), 1,2- and 1,3-Benzenedithiol (bdt), and butyiamine. By way of example, for treatment of a colloidal film which comprises lead sulfide quantum dots (PbS CQD), the organic agent butylamine has successfully been employed. However, other organic agents, such as 1,2-ethanedithiol, 1,2- and/or 1,3-Benzenedithiol (bdt), or oleic acid, may also be feasible. After the treatment with the organic agent, the CQD film is, preferably, dried at a temperature from 50° C. to 250° C., preferably from 80° C. to 180° C., more preferred from 100° C. to 120° C. As further described above, an n-type material layer might, firstly, be deposited in a direct manner onto the first conductive layer before the CQD film may be deposited onto the blocking layer. Herein, the blocking layer may comprise a thin film of an electrically conducting material, preferably titanium dioxide ($TiO_2$) or zinc oxide (ZnO).

As further described above, a second conductive layer may, additionally, be deposited onto the single or multiple CQD film, wherein the second conductive layer may comprise an at least partially transparent semiconducting material or, preferably, an intransparent electrically conducting material, more preferred an evaporated metal layer, in particular one or more of silver, aluminum, platinum, chromium, titanium, or gold; or, alternatively, a layer of graphene.

Alternatively, the second conductive layer may comprise a layer of an electrically conducting polymer, in particular, poly(3,4-ethylenedioxythiophene) (PEDOT) or a dispersion of PEDOT and a polystyrene sulfonic acid (PEDOT:PSS). Herein, a split electrode comprising evaporated metal contacts may, additionally, be arranged on top of the layer of the electrically conducting polymer, wherein the evaporated metal contacts may, in particular, comprise one or more of silver, aluminum, platinum, titanium, chromium, or gold; or, alternatively, a layer of graphene.

For further details concerning the method according to the present invention, reference may be made to the description of the optical detector as provided above and/or below.

In a further aspect of the present invention, a use of a detector according to the present invention is disclosed. Therein, a use of the detector for a purpose of determining a position, in particular a depth, of an object is proposed, in particular, for a purpose of use selected from the group consisting of: a distance measurement, in particular in traffic technology; a position measurement, in particular in traffic technology; an entertainment application; a security application; a human-machine interface application; a tracking application; a scanning application; a stereoscopic vision application; a photography application; an imaging application or camera application; a mapping application for generating maps of at least one space; a homing or tracking beacon detector for vehicles; a distance and/or position measurement of objects with a thermal signature (hotter or colder than background); a machine vision application; a robotic application.

Specifically, the optical detector according to the present invention may, particularly depending on the kind of photoconductive material selected for the corresponding sensor region, be used as an optical detector for electromagnetic waves over a considerably wide spectral range. Within this regard, the ultraviolet (UV), visible, near infrared (NIR), infrared (IR), far infrared (FIR) spectral range may particularly be preferred. As non-limiting examples, the following kinds of photoconductive materials may, particularly, be selected:

doped diamond (C), zinc oxide (ZnO), titanium oxide ($TiO_2$), gallium nitride (GaN), gallium phosphide (GaP) or silicon carbide (SiC) for the UV spectral range;

silicon (Si), gallium arsenide (GaAs), cadmium sulfide (CdS), cadmium telluride (CdTe), copper indium sulfide ($CuInS_2$; CIS), copper indium gallium selenide (CIGS), copper zinc tin sulfide (CZTS), quantum dots comprising lead sulfide (PbS), indium phosphide (InP), or an organic photoconductor as described above for the visible spectral range;

indium gallium arsenide (InGaAs), silicon (Si), germanium (Ge), cadmium telluride (CdTe), copper indium sulfide ($CuInS_2$; CIS), copper indium gallium selenide (CIGS), copper zinc tin sulfide (CZTS), or quantum dots comprising lead sulfide (PbS) for the NIR spectral range, wherein CdTe, CIS, CIGS, and CZTS are particularly preferred for wavelengths above 850 nm;

lead sulfide (PbS) for the IR spectral range; and lead selenide (PbSe), mercury cadmium telluride (HgCdTe; MCT), or indium antimonide (InSb) for the FIR spectral range.

Within this regard, it may particularly be emphasized that many of the mentioned photoconductive materials are well known as cost-efficient, long-term stable and reliable materials which have been developed over many years, especially for optimized sensing, particularly for the indicated spectral ranges. It may, therefore, be considered as a particular advantage of the present invention to be able to adapt commercially already available materials for the extended purposes as proposed by the present invention.

Further uses of the optical detector according to the present invention may also refer to combinations with applications for which photoconductive cells have already been applied successfully, such as determining the presence or absence of an object; extending optical applications, e.g. camera exposure control, auto slide focus, automated rear view mirrors, electronic scales, automatic gain control, particularly in modulated light sources, automatic headlight dimmers, night (street) light controls, oil burner flame outs, or smoke detectors; or other applications, such as in densitometers, e.g. determining the density of toner in photocopy machines; or in colorimetric measurements.

Thus, generally, the devices according to the present invention, such as the detector, may be applied in various fields of uses. Specifically, the detector may be applied for a purpose of use, selected from the group consisting of: a position measurement in traffic technology; an entertainment application; a security application; a human-machine interface application; a tracking application; a photography application; a mapping application for generating maps of at least one space, such as at least one space selected from the group of a room, a building and a street; a mobile application; a webcam; an audio device; a dolby surround audio system; a computer peripheral device; a gaming application; a camera or video application; a security application; a surveillance application; an automotive application; a transport application; a medical application; a sports' application; a machine vision application; a vehicle application; an airplane application; a ship application; a spacecraft application; a building application; a construction application; a cartography application; a manufacturing application; a use in combination with at least one state-of-the-art sensing technology, such as a time-of-flight detector, radar, lidar, ultrasonic sensors, or interferometry. Additionally or alternatively, applications in local and/or global positioning systems may be named, especially landmark-based positioning and/or navigation, specifically for use in cars or other vehicles (such as trains, motorcycles, bicycles, trucks for cargo transportation), robots or for use by pedestrians. Further, indoor positioning systems may be named as potential applications, such as for household applications and/or for robots used in manufacturing, logistics, surveillance, or maintenance technology.

Thus, firstly, the devices according to the present invention may be used in mobile phones, tablet computers, laptops, smart panels or other stationary or mobile or wearable computer or communication applications. Thus, the devices according to the present invention may be combined with at least one active light source, such as a light source emitting light in the visible range or infrared spectral range, in order to enhance performance. Thus, as an example, the devices according to the present invention may be used as cameras and/or sensors, such as in combination with mobile software for scanning and/or detecting environment, objects and living beings. The devices according to the present invention may even be combined with 2D cameras, such as conventional cameras, in order to increase imaging effects. The devices according to the present invention may further be used for surveillance and/or for recording purposes or as input devices to control mobile devices, especially in combination with voice and/or gesture recognition. Thus, specifically, the devices according to the present invention acting as human-machine interfaces, also referred to as input devices, may be used in mobile applications, such as for controlling other electronic devices or components via the mobile device, such as the mobile phone. As an example, the mobile application including at least one device according to the present invention may be used for controlling a television set, a game console, a music player or music device or other entertainment devices.

Further, the devices according to the present invention may be used in webcams or other peripheral devices for computing applications. Thus, as an example, the devices according to the present invention may be used in combination with software for imaging, recording, surveillance, scanning, or motion detection. As outlined in the context of the human-machine interface and/or the entertainment device, the devices according to the present invention are particularly useful for giving commands by facial expressions and/or body expressions. The devices according to the present invention can be combined with other input generating devices like e.g. mouse, keyboard, touchpad, microphone etc. Further, the devices according to the present invention may be used in applications for gaming, such as by using a webcam. Further, the devices according to the present invention may be used in virtual training applications and/or video conferences. Further, devices according to the present invention may be used to recognize or track hands, arms, or objects used in a virtual or augmented reality application, especially when wearing head mounted displays.

Further, the devices according to the present invention may be used in mobile audio devices, television devices and gaming devices, as partially explained above. Specifically, the devices according to the present invention may be used as controls or control devices for electronic devices, entertainment devices or the like. Further, the devices according to the present invention may be used for eye detection or eye tracking, such as in 2D- and 3D-display techniques, especially with transparent displays for augmented reality applications and/or for recognizing whether a display is being looked at and/or from which perspective a display is being looked at. Further, devices according to the present invention may be used to explore a room, boundaries, obstacles, in connection with a virtual or augmented reality application, especially when wearing a head-mounted display.

Further, the devices according to the present invention may be used in or as digital cameras such as DSC cameras and/or in or as reflex cameras such as SLR cameras. For these applications, reference may be made to the use of the devices according to the present invention in mobile applications such as mobile phones, as disclosed above.

Further, the devices according to the present invention may be used for security or surveillance applications. Thus, as an example, at least one device according to the present invention can be combined with one or more digital and/or analogue electronics that will give a signal if an object is within or outside a predetermined area (e.g. for surveillance applications in banks or museums). Specifically, the devices according to the present invention may be used for optical encryption. Detection by using at least one device according to the present invention can be combined with other detection devices to complement wavelengths, such as with IR, x-ray, UV-VIS, radar or ultrasound detectors. The devices according to the present invention may further be combined with an active infrared light source to allow detection in low light surroundings. The devices according to the present invention are generally advantageous as compared to active detector systems, specifically since the devices according to the present invention avoid actively sending signals which may be detected by third parties, as is the case e.g. in radar applications, ultrasound applications, LIDAR or similar active detector devices. Thus, generally, the devices according to the present invention may be used for an unrecognized and undetectable tracking of moving objects. Additionally, the devices according to the present invention generally are less prone to manipulations and irritations as compared to conventional devices.

Further, given the ease and accuracy of 3D detection by using the devices according to the present invention, the devices according to the present invention generally may be used for facial, body and person recognition and identification. Therein, the devices according to the present invention may be combined with other detection means for identification or personalization purposes such as passwords, finger prints, iris detection, voice recognition or other means. Thus, generally, the devices according to the present invention may be used in security devices and other personalized applications.

Further, the devices according to the present invention may be used as 3D barcode readers for product identification.

In addition to the security and surveillance applications mentioned above, the devices according to the present invention generally can be used for surveillance and monitoring of spaces and areas. Thus, the devices according to the present invention may be used for surveying and monitoring spaces and areas and, as an example, for triggering or executing alarms in case prohibited areas are violated. Thus, generally, the devices according to the present invention may be used for surveillance purposes in building surveillance or museums, optionally in combination with other types of sensors, such as in combination with motion or heat sensors, in combination with image intensifiers or image enhancement devices and/or photomultipliers.

Further, the devices according to the present invention may be used in public spaces or crowded spaces to detect potentially hazardous activities such as commitment of crimes such as theft in a parking lot or unattended objects such as unattended baggage in an airport.

Further, the devices according to the present invention may advantageously be applied in camera applications such as video and camcorder applications. Thus, the devices according to the present invention may be used for motion capture and 3D-movie recording. Therein, the devices according to the present invention generally provide a large number of advantages over conventional optical devices. Thus, the devices according to the present invention generally require a lower complexity with regard to optical components. Thus, as an example, the number of lenses may be reduced as compared to conventional optical devices, such as by providing the devices according to the present invention having one lens only. Due to the reduced complexity, very compact devices are possible, such as for mobile use. Conventional optical systems having two or more lenses with high quality generally are voluminous, such as due to the general need for voluminous beam-splitters. Further, the devices according to the present invention generally may be used for focus/autofocus devices, such as autofocus cameras. Further, the devices according to the present invention may also be used in optical microscopy, especially in confocal microscopy.

Further, the devices according to the present invention generally are applicable in the technical field of automotive technology and transport technology. Thus, as an example, the devices according to the present invention may be used as distance control and surveillance sensors, such as for adaptive cruise control, emergency brake assist, lane departure warning, surround view, blind spot detection, traffic sign detection, traffic sign recognition, lane recognition, rear cross traffic alert, light source recognition for adapting the head light intensity and range depending on approaching traffic or vehicles driving ahead, adaptive front-lighting systems, automatic control of high beam head lights, adaptive cut-off lights in front light systems, glare-free high beam front lighting systems, marking animals, obstacles, or the like by headlight illumination, rear cross traffic alert, and other driver assistance systems, such as advanced driver assistance systems, or other automotive and traffic applications. Further, devices according to the present invention may be used in driver assistance systems which may, particularly, be adapted for anticipating maneuvers of the driver beforehand for collision avoidance. Further, the devices according to the present invention can also be used for velocity and/or acceleration measurements, such as by analyzing a first and second time-derivative of position information gained by using the detector according to the present invention. This feature generally may be applicable in automotive technology, transportation technology or general traffic technology. Applications in other fields of technology are feasible. A specific application in an indoor positioning system may be the detection of positioning of passengers in transportation, more specifically to electronically control the use of safety systems such as airbags. Herein, the use of an airbag may, especially, be prevented in a case in which the passenger may be located within the vehicle in a manner that a use of the airbag might cause an injury, in particular a severe injury, with the passenger. Further, in vehicles such as cars, trains, planes or the like, especially in autonomous vehicles, devices according to the present invention may be used to determine whether a driver pays attention to the traffic or is distracted, or asleep, or tired, or incapable of driving, such as due to the consumption of alcohol or other drugs.

In these or other applications, generally, the devices according to the present invention may be used as stand-alone devices or in combination with other sensor devices, such as in combination with radar and/or ultrasonic devices. Specifically, the devices according to the present invention may be used for autonomous driving and safety issues. Further, in these applications, the devices according to the present invention may be used in combination with infrared sensors, radar sensors, which are sonic sensors, two-dimensional cameras or other types of sensors. In these applications, the generally passive nature of the devices according to the present invention is advantageous. Thus, since the devices according to the present invention generally do not require emitting signals, the risk of interference of active sensor signals with other signal sources may be avoided. The devices according to the present invention specifically may be used in combination with recognition software, such as standard image recognition software. Thus, signals and data as provided by the devices according to the present invention typically are readily processable and, therefore, generally require lower calculation power than established stereovision systems such as LIDAR. Given the low space demand, the devices according to the present invention such as cameras may be placed at virtually any place in a vehicle, such as on or behind a window screen, on a front hood, on bumpers, on lights, on mirrors or other places and the like. Various detectors according to the present invention such as one or more detectors based on the effect disclosed within the present invention can be combined, such as in order to allow autonomously driving vehicles or in order to increase the performance of active safety concepts. Thus, various devices according to the present invention may be combined with one or more other devices according to the present invention and/or conventional sensors, such as in the windows like rear window, side window or front window, on the bumpers or on the lights.

A combination of at least one device according to the present invention such as at least one detector according to the present invention with one or more rain detection sensors is also possible. This is due to the fact that the devices according to the present invention generally are advantageous over conventional sensor techniques such as radar, specifically during heavy rain. A combination of at least one device according to the present invention with at least one conventional sensing technique such as radar may allow for a software to pick the right combination of signals according to the weather conditions.

Further, the devices according to the present invention may generally be used as break assist and/or parking assist and/or for speed measurements. Speed measurements can be integrated in the vehicle or may be used outside the vehicle, such as in order to measure the speed of other cars in traffic control. Further, the devices according to the present invention may be used for detecting free parking spaces in parking lots.

Further, the devices according to the present invention may generally be used for vision, in particular for vision under difficult visibility conditions, such as in night vision, fog vision, or fume vision. For achieving this purpose, the optical detector may comprise a specifically selected photoconductive material which may be sensitive at least within a wavelength range in which small particles, such as particles being present in smoke or fume, or small droplets, such as droplets being present in fog, mist or haze, may not reflect an incident light beam or only a small partition thereof. As generally know, the reflection of the incident light beam may be small or negligent in a case in which the wavelength of the incident beam exceeds the size of the particles or of the droplets, respectively. Further, might vision may be enabled by detecting thermal radiation being emitted by a bodies and objects. Thus, the optical detector which comprises the specifically selected photoconductive material which may particularly be sensitive within the infrared (IR) spectral range, preferably within the near infrared (NIR) spectral range, may, thus, allow good visibility even at night, in fume, smoke, fog, mist, or haze.

Further, the devices according to the present invention may be used in the fields of medical systems and sports. Thus, in the field of medical technology, surgery robotics, e.g. for use in endoscopes, may be named, since, as outlined above, the devices according to the present invention may require a low volume only and may be integrated into other devices. Specifically, the devices according to the present invention having one lens, at most, may be used for capturing 3D information in medical devices such as in endoscopes. Further, the devices according to the present invention may be combined with an appropriate monitoring software, in order to enable tracking and analysis of movements. This may allow an instant overlay of the position of a medical device, such as an endoscope or a scalpel, with results from medical imaging, such as obtained from magnetic resonance imaging, x-ray imaging, or ultrasound imaging. These applications are specifically valuable e.g. in medical treatments where precise location information is important such as in brain surgery and long-distance diagnosis and tele-medicine. Further, the devices according to the present invention may be used in 3D-body scanning. Body scanning may be applied in a medical context, such as in dental surgery, plastic surgery, bariatric surgery, or cosmetic plastic surgery, or it may be applied in the context of medical diagnosis such as in the diagnosis of myofascial pain syndrome, cancer, body dysmorphic disorder, or further diseases. Body scanning may further be applied in the field of sports to assess ergonomic use or fit of sports equipment.

Body scanning may further be used in the context of clothing, such as to determine a suitable size and fitting of clothes. This technology may be used in the context of tailor-made clothes or in the context of ordering clothes or shoes from the internet or at a self-service shopping device such as a micro kiosk device or customer concierge device. Body scanning in the context of clothing is especially important for scanning fully dressed customers.

Further, the devices according to the present invention may be used in the context of people counting systems, such as to count the number of people in an elevator, a train, a bus, a car, or a plane, or to count the number of people passing a hallway, a door, an aisle, a retail store, a stadium, an entertainment venue, a museum, a library, a public location, a cinema, a theater, or the like. Further, the 3D-function in the people counting system may be used to obtain or estimate further information about the people that are counted such as height, weight, age, physical fitness, or the like. This information may be used for business intelligence metrics, and/or for further optimizing the locality where people may be counted to make it more attractive or safe. In a retail environment, the devices according to the present invention in the context of people counting may be used to recognize returning customers or cross shoppers, to assess shopping behavior, to assess the percentage of visitors that make purchases, to optimize staff shifts, or to monitor the costs of a shopping mall per visitor. Further, people counting systems may be used for anthropometric surveys. Further, the devices according to the present invention may be used in public transportation systems for automatically charging passengers depending on the length of transport. Further, the devices according to the present invention may be used in playgrounds for children, to recognize injured children or children engaged in dangerous activities, to allow additional interaction with playground toys, to ensure safe use of playground toys or the like.

Further, the devices according to the present invention may be used in construction tools, such as a range meter that determines the distance to an object or to a wall, to assess whether a surface is planar, to align or objects or place objects in an ordered manner, or in inspection cameras for use in construction environments or the like.

Further, the devices according to the present invention may be applied in the field of sports and exercising, such as for training, remote instructions or competition purposes. Specifically, the devices according to the present invention may be applied in the fields of dancing, aerobic, football, soccer, basketball, baseball, cricket, hockey, track and field, swimming, polo, handball, volleyball, rugby, sumo, judo, fencing, boxing, golf, car racing, laser tag, battlefield simulation etc. The devices according to the present invention can be used to detect the position of a ball, a bat, a sword, motions, etc., both in sports and in games, such as to monitor the game, support the referee or for judgment, specifically automatic judgment, of specific situations in sports, such as for judging whether a point or a goal actually was made.

Further, the devices according to the present invention may be used in the field of auto racing or car driver training or car safety training or the like to determine the position of a car or the track of a car, or the deviation from a previous track or an ideal track or the like.

The devices according to the present invention may further be used to support a practice of musical instruments, in particular remote lessons, for example lessons of string instruments, such as fiddles, violins, violas, celli, basses, harps, guitars, banjos, or ukuleles, keyboard instruments, such as pianos, organs, keyboards, harpsichords, harmoniums, or accordions, and/or percussion instruments, such as drums, timpani, marimbas, xylophones, vibraphones, bongos, congas, timbales, djembes or tablas.

The devices according to the present invention further may be used in rehabilitation and physiotherapy, in order to encourage training and/or in order to survey and correct movements. Therein, the devices according to the present invention may also be applied for distance diagnostics.

Further, the devices according to the present invention may be applied in the field of machine vision. Thus, one or more of the devices according to the present invention may be used e.g. as a passive controlling unit for autonomous driving and or working of robots. In combination with moving robots, the devices according to the present invention may allow for autonomous movement and/or autonomous detection of failures in parts. The devices according to the present invention may also be used for manufacturing and safety surveillance, such as in order to avoid accidents including but not limited to collisions between robots, production parts and living beings. In robotics, the safe and direct interaction of humans and robots is often an issue, as robots may severely injure humans when they are not recognized. Devices according to the present invention may help robots to position objects and humans better and faster and allow a safe interaction. Given the passive nature of the devices according to the present invention, the devices according to the present invention may be advantageous over active devices and/or may be used complementary to existing solutions like radar, ultrasound, 2D cameras, IR detection etc. One particular advantage of the devices according to the present invention is the low likelihood of signal interference. Therefore multiple sensors can work at the same time in the same environment, without the risk of signal interference. Thus, the devices according to the present invention generally may be useful in highly automated production environments like e.g. but not limited to automotive, mining, steel, etc. The devices according to the present invention can also be used for quality control in production, e.g. in combination with other sensors like 2-D imaging, radar, ultrasound, IR etc., such as for quality control or other purposes. Further, the devices according to the present invention may be used for assessment of surface quality, such as for surveying the surface evenness of a product or the adherence to specified dimensions, from the range of micrometers to the range of meters. Other quality control applications are feasible. In a manufacturing environment, the devices according to the present invention are especially useful for processing natural products such as food or wood, with a complex 3-dimensional structure to avoid large amounts of waste material. Further, devices according to the present invention may be used to monitor the filling level of tanks, silos etc. Further, devices according to the present invention may be used to inspect complex products for missing parts, incomplete parts, loose parts, low quality parts, or the like, such as in automatic optical inspection, such as of printed circuit boards, inspection of assemblies or sub-assemblies, verification of engineered components, engine part inspections, wood quality inspection, label inspections, inspection of medical devices, inspection of product orientations, packaging inspections, food pack inspections, or the like.

Further, the devices according to the present invention may be used in vehicles, trains, airplanes, ships, spacecraft and other traffic applications. Thus, besides the applications mentioned above in the context of traffic applications, passive tracking systems for aircraft, vehicles and the like may be named. The use of at least one device according to the present invention, such as at least one detector according to the present invention, for monitoring the speed and/or the direction of moving objects is feasible. Specifically, the tracking of fast moving objects on land, sea and in the air including space may be named. The at least one device according to the present invention, such as the at least one detector according to the present invention, specifically may be mounted on a still-standing and/or on a moving device. An output signal of the at least one device according to the present invention can be combined e.g. with a guiding mechanism for autonomous or guided movement of another object. Thus, applications for avoiding collisions or for enabling collisions between the tracked and the steered object are feasible. The devices according to the present invention generally are useful and advantageous due to the low calculation power required, the instant response and due to the passive nature of the detection system which generally is more difficult to detect and to disturb as compared to active systems, like e.g. radar. The devices according to the present invention are particularly useful but not limited to e.g. speed control and air traffic control devices. Further, the devices according to the present invention may be used in automated tolling systems for road charges.

The devices according to the present invention may, generally, be used in passive applications. Passive applications include guidance for ships in harbors or in dangerous areas, and for aircraft when landing or starting. Wherein, fixed, known active targets may be used for precise guidance. The same can be used for vehicles driving on dangerous but well defined routes, such as mining vehicles. Further, the devices according to the present invention may be used to detect rapidly approaching objects, such as cars, trains, flying objects, animals, or the like. Further, the devices according to the present invention can be used for detecting velocities or accelerations of objects, or to predict the movement of an object by tracking one or more of its position, speed, and/or acceleration depending on time.

Further, as outlined above, the devices according to the present invention may be used in the field of gaming. Thus, the devices according to the present invention can be passive for use with multiple objects of the same or of different size, color, shape, etc., such as for movement detection in combination with software that incorporates the movement into its content. In particular, applications are feasible in implementing movements into graphical output. Further, applications of the devices according to the present invention for giving commands are feasible, such as by using one or more of the devices according to the present invention for gesture or facial recognition. The devices according to the present invention may be combined with an active system in order to work under e.g. low light conditions or in other situations in which enhancement of the surrounding conditions is required. Additionally or alternatively, a combination of one or more devices according to the present invention with one or more IR or VIS light sources is possible. A combination of a detector according to the present invention with special devices is also possible, which can be distinguished easily by the system and its software, e.g. and not limited to, a special color, shape, relative position to other devices, speed of movement, light, frequency used to modulate light sources on the device, surface properties, material used, reflection properties, transparency degree, absorption characteristics, etc. The device can, amongst other possibilities, resemble a stick, a racquet, a club, a gun, a knife, a wheel, a ring, a steering wheel, a bottle, a ball, a glass, a vase, a spoon, a fork, a cube, a dice, a figure, a puppet, a teddy, a beaker, a pedal, a switch, a glove, jewelry, a musical instrument or an auxiliary device for playing a musical instrument, such as a plectrum, a drumstick or the like. Other options are feasible.

Further, the devices according to the present invention may be used to detect and or track objects that emit light by themselves, such as due to high temperature or further light emission processes. The light emitting part may be an exhaust stream or the like. Further, the devices according to the present invention may be used to track reflecting objects and analyze the rotation or orientation of these objects.

Further, the devices according to the present invention may generally be used in the field of building, construction and cartography. Thus, generally, one or more devices according to the present invention may be used in order to measure and/or monitor environmental areas, e.g. countryside or buildings. Therein, one or more devices according to the present invention may be combined with other methods and devices or can be used solely in order to monitor progress and accuracy of building projects, changing objects, houses, etc. The devices according to the present invention can be used for generating three-dimensional models of scanned environments, in order to construct maps of rooms, streets, houses, communities or landscapes, both from ground or air. Potential fields of application may be construction, cartography, real estate management, land surveying or the like. As an example, the devices according to the present invention may be used in vehicles capable of flight, such as drones or multicopters, in order to monitor buildings, chimneys, production sites, agricultural production environments such as fields, production plants, or landscapes, to support rescue operations, to support work in dangerous environments, to support fire brigades in a burning location indoors or outdoors, to find or monitor one or more persons, animals, or moving objects, or for entertainment purposes, such as a drone following and recording one or more persons doing sports such as skiing or cycling or the like, which could be realized by following a helmet, a mark, a beacon device, or the like. Devices according to the present invention could be used recognize obstacles, follow a predefined route, follow an edge, a pipe, a building, or the like, or to record a global or local map of the environment. Further, devices according to the present invention could be used for indoor or outdoor localization and positioning of drones, for stabilizing the height of a drone indoors where barometric pressure sensors are not accurate enough, or for the interaction of multiple drones such as concertized movements of several drones or recharging or refueling in the air or the like.

Further, the devices according to the present invention may be used within an interconnecting network of home appliances such as CHAIN (Cedec Home Appliances Interoperating Network) to interconnect, automate, and control basic appliance-related services in a home, e.g. energy or load management, remote diagnostics, pet related appliances, child related appliances, child surveillance, appliances related surveillance, support or service to elderly or ill persons, home security and/or surveillance, remote control of appliance operation, and automatic maintenance support. Further, the devices according to the present invention may be used in heating or cooling systems such as an air-conditioning system, to locate which part of the room should be brought to a certain temperature or humidity, especially depending on the location of one or more persons. Further, the devices according to the present invention may be used in domestic robots, such as service or autonomous robots which may be used for household chores. The devices according to the present invention may be used for a number of different purposes, such as to avoid collisions or to map the environment, but also to identify a user, to personalize the robot's performance for a given user, for security purposes, or for gesture or facial recognition. As an example, the devices according to the present invention may be used in robotic vacuum cleaners, floor-washing robots, dry-sweeping robots, ironing robots for ironing clothes, animal litter robots, such as cat litter robots, security robots that detect intruders, robotic lawn mowers, automated pool cleaners, rain gutter cleaning robots, window washing robots, toy robots, telepresence robots, social robots providing company to less mobile people, or robots translating and speech to sign language or sign language to speech. In the context of less mobile people, such as elderly persons, household robots with the devices according to the present invention may be used for picking up objects, transporting objects, and interacting with the objects and the user in a safe way. Further the devices according to the present invention may be used in robots operating with hazardous materials or objects or in dangerous environments. As a non-limiting example, the devices according to the present invention may be used in robots or unmanned remote-controlled vehicles to operate with hazardous materials such as chemicals or radioactive materials especially after disasters, or with other hazardous or potentially hazardous objects such as mines, unexploded arms, or the like, or to operate in or to investigate insecure environments such as near burning objects or post disaster areas, or for manned or unmanned rescue operations in the air, in the sea, underground, or the like.

Further, the devices according to the present invention may be used in household, mobile or entertainment devices, such as a refrigerator, a microwave, a washing machine, a window blind or shutter, a household alarm, an air condition devices, a heating device, a television, an audio device, a smart watch, a mobile phone, a phone, a dishwasher, a stove or the like, to detect the presence of a person, to monitor the contents or function of the device, or to interact with the person and/or share information about the person with further household, mobile or entertainment devices. Herein, the devices according to the present invention may be used to support elderly or disabled persons, blind persons, or persons with limited vision abilities, such as in household chores or at work such as in devices for holding, carrying, or picking objects, or in a safety system with optical and/or acoustical signals adapted for signaling obstacles in the environment.

The devices according to the present invention may further be used in agriculture, for example to detect and sort out vermin, weeds, and/or infected crop plants, fully or in parts, wherein crop plants may be infected by fungus or insects. Further, for harvesting crops, the devices according to the present invention may be used to detect animals, such as deer, which may otherwise be harmed by harvesting devices. Further, the devices according to the present invention may be used to monitor the growth of plants in a field or greenhouse, in particular to adjust the amount of water or fertilizer or crop protection products for a given region in the field or greenhouse or even for a given plant. Further, in agricultural biotechnology, the devices according to the present invention may be used to monitor the size and shape of plants.

Further, the devices according to the present invention may be combined with sensors to detect chemicals or pollutants, electronic nose chips, microbe sensor chips to detect bacteria or viruses or the like, Geiger counters, tactile sensors, heat sensors, or the like. This may for example be used in constructing smart robots which are configured for handling dangerous or difficult tasks, such as in treating highly infectious patients, handling or removing highly dangerous substances, cleaning highly polluted areas, such as highly radioactive areas or chemical spills, or for pest control in agriculture.

One or more devices according to the present invention can further be used for scanning of objects, such as in combination with CAD or similar software, such as for additive manufacturing and/or 3D printing. Therein, use may be made of the high dimensional accuracy of the devices according to the present invention, e.g. in x-, y- or z-direction or in any arbitrary combination of these directions, such as simultaneously. Within this regard, determining a distance of an illuminated spot on a surface which may provide reflected or diffusely scattered light from the detector may be performed virtually independent of the distance of the light source from the illuminated spot. This property of the present invention is in direct contrast to known methods, such as triangulation or such as time-of-flight (TOF) methods, wherein the distance between the light source and the illuminated spot must be known a priori or calculated a posteriori in order to be able to determine the distance between the detector and the illuminated spot. In contrast hereto, for the detector according to the present invention is may be sufficient that the spot is adequately illuminated. Further, the devices according to the present invention may be used for scanning reflective surfaces, such of metal surfaces, independent whether they may comprise a solid or a liquid surface. Further, the devices according to the present invention may be used in inspections and maintenance, such as pipeline inspection gauges. Further, in a production environment, the devices according to the present invention may be used to work with objects of a badly defined shape such as naturally grown objects, such as sorting vegetables or other natural products by shape or size or cutting products such as meat or objects that are manufactured with a precision that is lower than the precision needed for a processing step.

Further, the devices according to the present invention may be used in local navigation systems to allow autonomously or partially autonomously moving vehicles or multicopters or the like through an indoor or outdoor space. A non-limiting example may comprise vehicles moving through an automated storage for picking up objects and placing them at a different location. Indoor navigation may further be used in shopping malls, retail stores, museums, airports, or train stations, to track the location of mobile goods, mobile devices, baggage, customers or employees, or to supply users with a location specific information, such as the current position on a map, or information on goods sold, or the like.

Further, the devices according to the present invention may be used to ensure safe driving of motorcycles, such as driving assistance for motorcycles by monitoring speed, inclination, upcoming obstacles, unevenness of the road, or curves or the like. Further, the devices according to the present invention may be used in trains or trams to avoid collisions.

Further, the devices according to the present invention may be used in handheld devices, such as for scanning packaging or parcels to optimize a logistics process. Further, the devices according to the present invention may be used in further handheld devices such as personal shopping devices, RFID-readers, handheld devices for use in hospitals or health environments such as for medical use or to obtain, exchange or record patient or patient health related information, smart badges for retail or health environments, or the like.

As outlined above, the devices according to the present invention may further be used in manufacturing, quality control or identification applications, such as in product identification or size identification (such as for finding an optimal place or package, for reducing waste etc.). Further, the devices according to the present invention may be used in logistics applications.

Thus, the devices according to the present invention may be used for optimized loading or packing containers or vehicles. Further, the devices according to the present invention may be used for monitoring or controlling of surface damages in the field of manufacturing, for monitoring or controlling rental objects such as rental vehicles, and/or for insurance applications, such as for assessment of damages. Further, the devices according to the present invention may be used for identifying a size of material, object or tools, such as for optimal material handling, especially in combination with robots. Further, the devices according to the present invention may be used for process control in production, e.g. for observing filling level of tanks. Further, the devices according to the present invention may be used for maintenance of production assets like, but not limited to, tanks, pipes, reactors, tools etc. Further, the devices according to the present invention may be used for analyzing 3D-quality marks. Further, the devices according to the present invention may be used in manufacturing tailor-made goods such as tooth inlays, dental braces, prosthesis, clothes or the like. The devices according to the present invention may also be combined with one or more 3D-printers for rapid prototyping, 3D-copying or the like. Further, the devices according to the present invention may be used for detecting the shape of one or more articles, such as for anti-product piracy and for anti-counterfeiting purposes.

Preferably, for further potential details of the optical detector, the method, the human-machine interface, the entertainment device, the tracking system, the camera and the various uses of the detector, in particular with regard to the transfer device, the longitudinal optical sensors, the evaluation device and, if applicable, to the transversal optical sensor, the modulation device, the illumination source and the imaging device, specifically with respect to the potential materials, setups and further details, reference may be made to one or more of WO 2012/110924 A1, US 2012/206336 A1, WO 2014/097181 A1, and US 2014/291480 A1, the full content of all of which is herewith included by reference.

The above-described detector, the method, the human-machine interface and the entertainment device and also the proposed uses have considerable advantages over the prior art. Thus, generally, a simple and, still, efficient detector for an accurate determining a position of at least one object in space may be provided. Therein, as an example, three-dimensional coordinates of an object or a part thereof may be determined in a fast and efficient way.

As compared to devices known in the art, the detector as proposed provides a high degree of simplicity, specifically with regard to an optical setup of the detector. Thus, in principle, a simple combination of a photoconductive material in combination with a variation of the cross-section of an incident light beam impinging on this photoconductive material in conjunction with an appropriate evaluation device is sufficient for reliable high precision position detection. This high degree of simplicity, in combination with the possibility of high precision measurements, is specifically suited for machine control, such as in human-machine interfaces and, more preferably, in gaming, tracking, scanning, and a stereoscopic vision. Thus, cost-efficient entertainment devices may be provided which may be used for a large number of gaming, entertaining, tracking, scanning, and stereoscopic vision purposes.

Further specific advantages of the present invention may refer to a high responsivity of the photoconductive material to both very low light levels (moonlight) and to very high light levels (direct sunlight), wherein the responsivity exhibits a wide dynamic range due to the observable resistance variation which may comprise several orders of magnitude between "light" and "no light". Further, the photoconductive material which may be available for a wide range of resistance values is known for its low noise distortion.

Summarizing, in the context of the present invention, the following embodiments are regarded as particularly preferred:

Embodiment 1: A detector for an optical detection of at least one object, comprising:

at least one longitudinal optical sensor, wherein the longitudinal optical sensor has at least one sensor region, wherein the longitudinal optical sensor is designed to generate at least one longitudinal sensor signal in a manner dependent on an illumination of the sensor region by a light beam, wherein the longitudinal sensor signal, given the same total power of the illumination, is dependent on a beam cross-section of the light beam in the sensor region, wherein the sensor region comprises at least one photoconductive material, wherein an electrical conductivity of the sensor region, given the same total power of the illumination, is dependent on the beam cross-section of the light beam in the sensor region, wherein the longitudinal sensor signal is dependent on the electrical conductivity; and at least one evaluation device, wherein the evaluation device is designed to generate at least one item of information on a longitudinal position of the object by evaluating the longitudinal sensor signal of the longitudinal optical sensor.

Embodiment 2: The detector according to the preceding embodiment, wherein the photoconductive material comprises an inorganic photoconductive material, an organic photoconductive material, or a combination thereof.

Embodiment 3: The detector according to the preceding embodiment, wherein the inorganic photoconductive material comprises one or more of selenium, tellurium, a selenium-tellurium alloy, a metal oxide, a group IV element or compound, a III-V compound, a II-VI compound, a chalcogenide, a pnictogenide, a halide, and solid solutions and/or doped variants thereof.

Embodiment 4: The detector according to the preceding embodiment, wherein the selenium-tellurium alloy comprises selenium and an addition of 5 to 9 wt. % tellurium.

Embodiment 5: The detector according to any one of the two preceding embodiments, wherein the selenium-tellurium alloy comprises selenium and an addition of 5 to 20 wt. % tellurium in a presence of a concentration of at least one halogen in a range from 5 ppm to 500 ppm, wherein the halogen is selected from the group consisting of fluorine, chlorine, bromine, and iodine.

Embodiment 6: The detector according to the three preceding embodiments, wherein the chalcogenide is selected from a group comprising sulfide chalcogenides, selenide chalcogenides, telluride chalcogenides, ternary chalcogenides, quaternary and higher chalcogenides.

Embodiment 7: The detector according to the preceding embodiment, wherein the sulfide chalcogenide is selected from a group comprising lead sulfide (PbS), cadmium sulfide (CdS), zinc sulfide (ZnS), mercury sulfide (HgS), silver sulfide ($Ag_2S$), manganese sulfide (MnS), bismuth trisulfide ($Bi_2S_3$), antimony trisulfide ($Sb_2S_3$), arsenic trisulfide ($As_2S_3$), tin (II) sulfide (SnS), tin (IV) disulfide ($SnS_2$), indium sulfide ($In_2S_3$), copper sulfide (CuS), cobalt sulfide (CoS), nickel sulfide (NiS), molybdenum disulfide ($MoS_2$), iron disulfide ($FeS_2$), chromium trisulfide ($CrS_3$), copper indium sulfide (CIS), copper indium gallium selenide (CIGS), copper zinc tin sulfide (CZTS), and solid solutions and/or doped variants thereof.

Embodiment 8: The detector according to any one of the two preceding embodiments, wherein the selenide chalcogenide is selected from a group comprising lead selenide (PbSe), cadmium selenide (CdSe), zinc selenide (ZnSe), bismuth triselenide ($Bi_2Se_3$), mercury selenide (HgSe), antimony triselenide ($Sb_2Se_3$), arsenic triselenide ($As_2Se_3$), nickel selenide (NiSe), thallium selenide (TlSe), copper selenide (CuSe), molybdenum diselenide ($MoSe_2$), tin selenide (SnSe), cobalt selenide (CoSe), indium selenide ($In_2Se_3$), copper zinc tin selenide (CZTSe), and solid solutions and/or doped variants thereof.

Embodiment 9: The detector according to any one of the three preceding embodiments, wherein the telluride chalcogenide is selected from a group comprising lead telluride (PbTe), cadmium telluride (CdTe), zinc telluride (ZnTe), mercury telluride (HgTe), bismuth tritelluride ($Bi_2Te_3$), arsenic tritelluride ($As_2Te_3$), antimony tritelluride ($Sb_2Te_3$), nickel telluride (NiTe), thallium telluride (TlTe), copper telluride (CuTe), molybdenum ditelluride ($MoTe_2$), tin telluride (SnTe), and cobalt telluride (CoTe), silver telluride ($Ag_2Te$), indium telluride ($In_2Te_3$), and solid solutions and/or doped variants thereof.

Embodiment 10: The detector according to any one of the four preceding embodiments, wherein the ternary chalcogenide is selected from a group comprising mercury cadmium telluride (HgCdTe), mercury zinc telluride (HgZnTe), mercury cadmium sulfide (HgCdS), lead cadmium sulfide (PbCdS), lead mercury sulfide (PbHgS), copper indium disulfide ($CuInS_2$), cadmium sulfoselenide (CdSSe), zinc sulfoselenide (ZnSSe), thallous sulfoselenide (TlSSe), cadmium zinc sulfide (CdZnS), cadmium chromium sulfide ($CdCr_2S_4$), mercury chromium sulfide ($HgCr_2S_4$), copper chromium sulfide ($CuCr_2S_4$), cadmium lead selenide (CdPbSe), copper indium diselenide ($CuInSe_2$), indium gallium arsenide (InGaAs), lead oxide sulfide ($Pb_2OS$), lead oxide selenide ($Pb_2OSe$), lead sulfoselenide (PbSSe), arsenic selenide telluride ($As_2Se_2Te$), indium gallium phosphide (InGaP), gallium arsenide phosphide (GaAsP), aluminum gallium phosphide (AlGaP), cadmium selenite ($CdSeO_3$), cadmium zinc telluride (CdZnTe), cadmium zinc selenide (CdZnSe), a copper-zinc-tin sulfur-selenium chalcogenide (CZTSSe), and solid solutions and/or doped variants thereof.

Embodiment 11: The detector according to any one of the eight preceding embodiments, wherein the metal oxide is selected from a group comprising copper (II) oxide (CuO), copper (I) oxide ($CuO_2$), nickel oxide (NiO), zinc oxide (ZnO), silver oxide ($Ag_2O$), manganese oxide (MnO), titanium dioxide ($TiO_2$), barium oxide (BaO), lead oxide (PbO), cerium oxide ($CeO_2$), bismuth oxide ($Bi_2O_3$), cadmium oxide (CdO), and solid solutions and/or doped variants thereof.

Embodiment 12: The detector according to any one of the nine preceding embodiments, wherein the II-VI compound is selected from a group comprising cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), mercury selenide (HgSe), mercury telluride (HgTe), cadmium zinc telluride (CdZnTe), mercury cadmium telluride (HgCdTe), mercury zinc telluride (HgZnTe), and mercury zinc selenide (CdZnSe), and solid solutions and/or doped variants thereof.

Embodiment 13: The detector according to any one of the preceding embodiments, wherein the photoconductive material is contacted by an Ohmic contact, wherein the Ohmic contact refers to an electrical junction which exhibits a linear current-voltage ratio according to Ohm's law, or by a non-Ohmic contact, wherein the non-Ohmic contact refers to an electrical junction which exhibits a non-linear current-voltage ratio, wherein the non-Ohmic contact is, preferably a Schottky barrier or a p-n junction.

Embodiment 14: The detector according to the preceding embodiment, wherein the Ohmic contact is provided by one or more selected from a group comprising gold, silver, silver-nickel, silver-iron, silver-graphite, silver-cadmium oxide, silver-tin oxide, copper, platinum, palladium, paliney alloys, indium, gallium, indium amalgam, graphene, and solid solutions and/or doped variants thereof.

Embodiment 15: The detector according to the preceding embodiment, wherein the Ohmic contact to cadmium sulfide (CdS) is provided by indium or gallium while the Ohmic contact to other II-VI compounds is provided by indium amalgam.

Embodiment 16: The detector according to any one of the thirteen preceding embodiments, wherein the III-V compound is selected from a group comprising indium antimonide (InSb), boron nitride (BN), boron phosphide (BP), boron arsenide (BAs), aluminum nitride (AlN), aluminum phosphide (AlP), aluminum arsenide (AlAs), aluminum antimonide (AlSb), indium nitride (InN), indium phosphide (InP), indium arsenide (InAs), indium antimonide (InSb), gallium nitride (GaN), gallium phosphide (GaP), gallium arsenide (GaAs), and gallium antimonide (GaSb), and solid solutions and/or doped variants thereof.

Embodiment 17: The detector according to any one of the eleven preceding embodiments, wherein the photoconductive material is provided as a colloidal film comprising quantum dots.

Embodiment 18: The detector according to the preceding embodiment, wherein the photoconductive material is selected from the group comprising lead sulfide (PbS), lead selenide (PbSe), lead telluride (PbTe), cadmium telluride (CdTe), indium phosphide (InP), cadmium sulfide (CdS), cadmium selenide (CdSe), indium antimonide (InSb), mercury cadmium telluride (HgCdTe), copper indium sulfide (CIS), copper indium gallium selenide (CIGS), and copper zinc tin sulfide (CZTS).

Embodiment 19: The detector according to any one of the three preceding embodiments, wherein the quantum dots exhibits a size from 1 nm to 100 nm, preferably from 2 nm to 100 nm, more preferred from 2 nm to 15 nm.

Embodiment 20: The detector according to any one of the four preceding embodiments, wherein the photoconductive material is provided as a thin-film which comprises the quantum dots.

Embodiment 21: The detector according to the preceding embodiment, wherein the thin film exhibits a thickness from 1 nm to 100 nm, preferably from 2 nm to 100 nm, more preferred from 2 nm to 15 nm, wherein the quantum dots exhibits a size below the thickness of the thin film.

Embodiment 22: The detector according to any one of the five preceding embodiments, wherein the film of the photoconductive material comprising the quantum dots is arranged between a first conductive layer and a second conductive layer in a sandwich structure, wherein the first conductive layer exhibits at least partially transparent properties with respect to the incident light beam.

Embodiment 23: The detector according to the preceding embodiment, wherein the first conductive layer comprises an at least partially transparent semiconducting material.

Embodiment 24: The detector according to the preceding embodiment, wherein the semiconducting material is selected from the group comprising an at least partially transparent semiconducting metal oxide or a doped variant thereof.

Embodiment 25: The detector according to the preceding embodiment, wherein the semiconducting material is selected from indium tin oxide (ITO), fluorine-doped tin oxide (SnO2:F; FTO), magnesium oxide (MgO), aluminum zinc oxide (AZO), antimony tin oxide ($SnO_2/Sb_2O_5$), a perovskite transparent conducting oxide, or a metal nanowire.

Embodiment 26: The detector according to any one of the four preceding embodiments, wherein a blocking layer is arranged between the first conductive layer and the film of the photoconductive material comprising the quantum dots.

Embodiment 27: The detector according to the preceding embodiment, wherein the blocking layer comprises a thin film of an electrically conducting material.

Embodiment 28: The detector according to any one of the two preceding embodiments, wherein the blocking layer is an n-type semiconductor and comprises one or more of titanium dioxide (TiO2) or zinc oxide (ZnO), or wherein the blocking layer is a p-type semiconductor comprising molybdenum oxide ($MoO_3$).

Embodiment 29: The detector according to any one of the seven preceding embodiments, wherein the second conductive layer comprises an intransparent electrically conducting material.

Embodiment 30: The detector according to the preceding embodiment, wherein the second conductive layer comprises an evaporated metal layer or a layer of graphene, wherein the evaporated metal layer preferably comprises one or more of silver, aluminum, platinum, magnesium, chromium, titanium, or gold.

Embodiment 31: The detector according to any one of the ten preceding embodiments, wherein the second conductive layer comprises a layer of an electrically conducting polymer.

Embodiment 32: The detector according to the preceding embodiment, wherein the electrically conducting polymer is selected poly(3,4-ethylenedioxythiophene) (PEDOT) or from a dispersion of PEDOT and a polystyrene sulfonic acid (PEDOT:PSS).

Embodiment 33: The detector according to any one of the two preceding embodiments, wherein a split electrode comprising contacts of an evaporated metal or of graphene is arranged on the layer of the electrically conducting polymer.

Embodiment 34: The detector according to the preceding embodiment, wherein the evaporated metal comprises one or more of silver, aluminum, platinum, magnesium, chromium, titanium, or gold.

Embodiment 35: The detector according to any one of the thirty-two preceding embodiments, wherein the group IV element or compound is selected from a group comprising doped diamond (C), doped silicon (Si), silicon carbide (SiC), and silicon germanium (SiGe), and solid solutions and/or doped variants thereof.

Embodiment 36: The detector according to the preceding embodiment, wherein the photoconductive material comprises doped silicon in form of a doped silicon wafer.

Embodiment 37: The detector according to the preceding embodiment, wherein the doped silicon wafer is a float zone wafer.

Embodiment 38: The detector according to any one the three preceding embodiments, wherein the doped silicon exhibits a dopant concentration of $10^{13}$ cm$^{-3}$ or less, preferably $10^{12}$ cm$^{-3}$ or less, more preferred $10^{11}$ cm$^{-3}$ or less.

Embodiment 39: The detector according to any one the four preceding embodiments, wherein the doped silicon exhibits an electrical resistivity of $5·10^2$ Ω·cm or more, preferred of $5·10^3$ Ω·cm or more, more preferred of $10^4$ Ω·cm or more.

Embodiment 40: The detector according to any one the five preceding embodiments, wherein the doped silicon exhibits and a thickness in a range between 500 μm, more preferred between 300 μm, and 1 μm, more preferred 10 μm.

Embodiment 41: The detector according to any one of the thirty-nine preceding embodiments, wherein the organic photoconductive material is an organic photoconductive material, wherein the organic photoconductive material comprises at least one conjugated aromatic molecule, preferably a highly conjugated aromatic molecule.

Embodiment 42: The detector according to the preceding embodiment, wherein the organic photoconductive material comprises at least one dye and/or at least one pigment.

Embodiment 43: The detector according to any one of the two preceding embodiments, wherein the organic photoconductive material is a system comprising a charge-transfer complex, wherein the charge-transfer complex comprises a charge-generation material and a charge-transport material.

Embodiment 44: The detector according to the preceding embodiment, wherein the charge-generation material acts as a donor and the charge-transport material acts as an acceptor within the charge-transfer complex.

Embodiment 45: The detector according to any one of the four preceding embodiments, wherein the organic photoconductive material comprises a compound, in particular as the charge-generation material, selected from the group consisting of: phthalocyanines, naphthalocyanines, subphthalocyanines, perylenes, anthracenes, pyrenes, oligo- and polythiophenes, fullerenes, indigoid dyes, bis-azo pigments, squarylium dyes, thiapyrilium dyes, azulenium dyes, dithioketo-pyrrolopyrroles, quinacridones, dibromoanthanthrone, polyvinylcarbazole, derivatives and combinations thereof.

Embodiment 46: The detector according to any one of the forty-four preceding embodiments, wherein the organic photoconductive material comprises an organic electron donor material and an organic electron acceptor material.

Embodiment 47: The detector according to the preceding embodiment, wherein the electron donor material and the electron acceptor material are comprised within a layer.

Embodiment 48: The detector according to the preceding embodiment, wherein the layer comprising the electron donor material and the electron acceptor material exhibits a thickness from 100 nm to 1000 nm.

Embodiment 49: The detector according to any one of the three preceding embodiments, wherein the electron donor material comprises an organic donor polymer.

Embodiment 50: The detector according to the preceding embodiment, wherein the donor polymer comprises a conjugated system, wherein the conjugated system is one or more of cyclic, acyclic, and linear.

Embodiment 51: The detector according to the preceding embodiment, wherein the donor polymer is one of poly(3-hexylthiophene-2,5·diyl) (P3HT), poly[3-(4-n-octyl)phenyl-thiophene] (POPT), poly[3-10-n-octyl-3-phenothiazine-vinylenethiophene-co-2,5-thiophene] (PTZV-PT), poly[4,8-bis[(2-ethylhexyl)oxy] benzo[1,2-b4,5-b]dithiophene-2,6-diyl][3-fluoro-2-[(2-ethylhexyl)carbonyl]thieno[3,4-b]thiophenediyl] (PTB7), poly{thiophene-2,5-diyl-alt-[5,6-bis (dodecyloxy)benzo[c][1,2,5]thiadiazole]-4,7-diyl} (PBT-T1), poly[2,6-(4,4-bis-(2-ethylhexyl)-4H-cyclopenta[2,1-b; 3,4-b]dithiophene)-alt-4,7(2,1,3-benzothiadiazole)] (PCPDTBT), poly(5,7-bis(4-decanyl-2-thienyl)-thieno(3,4-b)diathiazolethiophene-2,5) (PDDTT), poly[N-9'-heptadecanyl-2,7-carbazole-alt-5,5-(4',7'-di-2-thienyl-2',1',3'-benzothiadiazole)] (PCDTBT), poly[(4,4'-bis(2-ethylhexyl) dithieno[3,2-b;2',3'-d]silole)-2,6-diyl-alt-(2,1,3-benzothiadiazole)-4,7-diyl] (PSBTBT), poly[3-phenylhydrazone thiophene] (PPHT), poly[2-methoxy-5-(2-ethylhexyl-oxy)-1,4-phenylenevinylene] (MEH-PPV), poly [2-methoxy-5-(2'-ethylhexyloxy)-1,4-phenylene-1,2-ethenylene-2,5-dimethoxy-1,4-phenylene-1,2-ethenylene] (M3EH-PPV), poly[2-methoxy-5-(3',7'-dimethyloctyloxy)-1,4-phenylenevinylene] (MDMO-PPV), poly[9,9-di-octyl-fluorene-co-bis-N,N-4-butylphenyl-bis-N,N-phenyl-1,4-phenylenediamine] (PFB), or a derivative, a modification, or a mixture thereof.

Embodiment 52: The detector according to any one of the six preceding embodiments, wherein the electron acceptor material is a fullerene-based electron acceptor material.

Embodiment 53: The detector according to the preceding embodiment, wherein the fullerene-based electron acceptor material comprises at least one of [6,6]-phenyl-C61-butyric acid methyl ester (PC60BM), [6,6]-Phenyl-C71-butyric acid methyl ester (PC70BM), [6,6]-phenyl C84 butyric acid methyl ester (PC84BM), an indene-C60 bisadduct (ICBA), or a derivative, a modification, or a mixture thereof.

Embodiment 54: The detector according to any one of the two preceding embodiments, wherein the fullerene-based electron acceptor material comprises a dimer comprising one or two $C_{60}$ or $C_{70}$ moieties.

Embodiment 55: The detector according to the preceding embodiment, wherein the fullerene-based electron acceptor material comprises a diphenylmethanofullerene (DPM) moiety comprising one or two attached oligoether (OE) chains (C70-DPM-OE or C70-DPM-OE2, respectively).

Embodiment 56: The detector according to any one of the ten preceding embodiments, wherein the electron acceptor material is tetracyanoquinodimethane (TCNQ) or a perylene derivative.

Embodiment 57: The detector according to any one of the eleven preceding embodiments, wherein the electron acceptor material comprises an acceptor polymer.

Embodiment 58: The detector according to the preceding embodiment, wherein the acceptor polymer comprises a conjugated polymer based on one or more of a cyanated poly(phenylenevinylene), a benzothiadiazole, a perylene, a perylenediimide, or a naphthalenediimide.

Embodiment 59: The detector according to the preceding embodiment, wherein the acceptor polymer is selected from one or more of a cyano-poly[phenylenevinylene] (CN-PPV), poly[5-(2-(ethylhexyloxy)-2-methoxycyanoterephthalyliden] (MEH-CN-PPV), poly[oxa-1,4-phenylene-1,2-(1-cyano)-ethylene-2,5-dioctyloxy-1,4-phenylene-1,2-(2-cyano)-ethylene-1,4-phenylene] (CN-ether-PPV), poly[1,4-dioctyloxyl-p-2,5-dicyanophenylenevinylene] (DOCN- PPV), poly[9,9'-di-octylfluoreneco-benzothiadiazole] (PF8BT), or a derivative, a modification, or a mixture thereof.

Embodiment 60: The detector according to any one of the fourteen preceding embodiments, wherein the electron donor material and the electron acceptor material form a mixture.

Embodiment 61: The detector according to the preceding embodiment, wherein the mixture comprises the electron donor material and the electron acceptor material in a ratio from 1:100 to 100:1, more preferred from 1:10 to 10:1, in particular of from 1:2 to 2:1.

Embodiment 62: The detector according to any one of the sixteen preceding embodiments, wherein the electron donor material and the electron acceptor material comprise an interpenetrating network of donor and acceptor domains, interfacial areas between the donor and acceptor domains, and percolation pathways connecting the domains to the electrodes.

Embodiment 63: The detector according to any of the preceding embodiments, wherein the at least one longitudinal optical sensor is a transparent optical sensor.

Embodiment 64: The detector according to any of the preceding embodiments, wherein the sensor region of the longitudinal optical sensor is exactly one continuous sensor region, wherein the longitudinal sensor signal is a uniform sensor signal for the entire sensor region.

Embodiment 65: The detector according to any of the preceding embodiments, wherein the sensor region of the longitudinal optical sensor is formed by a surface of the respective device, wherein the surface faces towards the object or faces away from the object.

Embodiment 66: The detector according to any of the preceding embodiments, wherein the optical detector is adapted to generate the longitudinal sensor signal by one or more of measuring an electrical resistance or a conductivity of at least one part of the sensor region.

Embodiment 67: The detector according to the preceding embodiment, wherein the optical detector is adapted to generate the longitudinal sensor signal by performing at least one current-voltage measurement and/or at least one voltage-current-measurement.

Embodiment 68: The detector according to any of the preceding embodiments, further comprising a bias voltage source.

Embodiment 69: The detector according to the preceding embodiment, wherein the bias voltage source and a load resistor are arranged in series with the longitudinal optical sensor.

Embodiment 70: The detector according to any one of the two preceding embodiments, wherein a bias voltage is applied across the photoconductive material.

Embodiment 71: The detector according to any of the preceding embodiments, wherein the evaluation device is designed to generate the at least one item of information on the longitudinal position of the object from at least one predefined relationship between the geometry of the illumination and a relative positioning of the object with respect to the detector, preferably taking account of a known power of the illumination and optionally taking account of a modulation frequency with which the illumination is modulated.

Embodiment 72: The detector according to any one of the preceding embodiments, wherein the longitudinal optical sensor is furthermore designed in such a manner that the illumination of the sensor region by the light beam additionally causes an increase in temperature in the sensor region, wherein the electrical conductivity of the sensor region, given the same total power of the illumination, is further dependent on the temperature in the sensor region, wherein the longitudinal sensor signal, given the same total power of the illumination, is further dependent on the temperature in the sensor region.

Embodiment 73: The detector according to the preceding embodiment, wherein the light beam exhibits a wavelength from 7 μm to 15 μm.

Embodiment 74: The detector according to any one of the two preceding embodiments, wherein the photoconductive material comprises an inorganic photoconductive material according to any one of the embodiments 6 to 10.

Embodiment 75: The detector according to any one of the three preceding embodiments, wherein the optical detector is uncooled.

Embodiment 76: The detector according to any of the preceding embodiments, wherein the detector furthermore has at least one modulation device for modulating the illumination.

Embodiment 77: The detector according to any the preceding embodiment, wherein the light beam is a modulated light beam.

Embodiment 78: The detector according to the preceding embodiment, wherein the detector is designed to detect at least two longitudinal sensor signals in the case of different modulations, in particular at least two sensor signals at respectively different modulation frequencies, wherein the evaluation device is designed to generate the at least one item of information on the longitudinal position of the object by evaluating the at least two longitudinal sensor signals.

Embodiment 79: The detector according to any of the preceding embodiments, wherein the longitudinal optical sensor is furthermore designed in such a way that the longitudinal sensor signal, given the same total power of the illumination, is dependent on a modulation frequency of a modulation of the illumination.

Embodiment 80: The detector according to the preceding embodiment, wherein the light beam is a non-modulated continuous-wave light beam.

Embodiment 81: The detector according to any one of the preceding embodiments, furthermore comprising at least one illumination source.

Embodiment 82: The detector according to the preceding embodiment, wherein the illumination source is selected from: an illumination source, which is at least partly connected to the object and/or is at least partly identical to the object; an illumination source which is designed to at least partly illuminate the object with a primary radiation.

Embodiment 83: The detector according to the preceding embodiment, wherein the light beam is generated by a reflection of the primary radiation on the object and/or by light emission by the object itself, stimulated by the primary radiation.

Embodiment 84: The detector according to the preceding embodiment, wherein the spectral sensitivities of the longitudinal optical sensor is covered by the spectral range of the illumination source.

Embodiment 85: The detector according to any of the preceding embodiments, wherein the detector has at least two longitudinal optical sensors, wherein the longitudinal optical sensors are stacked.

Embodiment 86: The detector according to the preceding embodiment, wherein the longitudinal optical sensors are stacked along the optical axis.

Embodiment 87: The detector according to any of the two preceding embodiments, wherein the longitudinal optical sensors form a longitudinal optical sensor stack, wherein the sensor regions of the longitudinal optical sensors are oriented perpendicular to the optical axis.

Embodiment 88: The detector according to any of the three preceding embodiments, wherein the longitudinal optical sensors are arranged such that a light beam from the object illuminates all longitudinal optical sensors, preferably sequentially, wherein at least one longitudinal sensor signal is generated by each longitudinal optical sensor.

Embodiment 89: The detector according to any one of the preceding embodiments, wherein the longitudinal optical sensors are arranged as an array.

Embodiment 90: The detector according to the preceding embodiment, wherein the array of the longitudinal optical sensors is arranged perpendicular to the optical axis.

Embodiment 91: The detector according to any one of the two preceding embodiments, wherein the longitudinal optical sensors which are arranged in the array are furthermore designed in such a way that the illumination of the sensor region by the light beam additionally causes an increase in temperature in the sensor region, wherein the electrical conductivity of the sensor region, given the same total power of the illumination, is further dependent on the temperature in the sensor region, wherein the longitudinal sensor signal, given the same total power of the illumination, is further dependent on the temperature in the sensor region.

Embodiment 92: The detector according to the preceding embodiment, wherein the light beam exhibits a wavelength from 7 μm to 15 μm.

Embodiment 93: The detector according to any one of the two preceding embodiments, wherein the photoconductive material comprises an inorganic photoconductive material according to any one of the embodiments 6 to 10 or 28 to 44.

Embodiment 94: The detector according to any one of the two preceding embodiments, wherein the optical detector is uncooled.

Embodiment 95: The detector according to any one of the three preceding embodiments, wherein the longitudinal optical sensors in the array are arranged within a matrix of individual resistors, wherein an aggregate resistance of the individual resistors in the matrix depends on a number N of the longitudinal optical sensors within the array which are illuminated by the incident light beam.

Embodiment 96: The detector according to any of the four preceding embodiments, wherein the evaluation device is adapted to determine a number N of the longitudinal optical sensors which are illuminated by the light beam, the evaluation device further being adapted to determine at least one longitudinal coordinate of the object by using the number N of the longitudinal optical sensors which are illuminated by the light beam.

Embodiment 97: The detector according to the preceding embodiment, wherein the optical sensor is adapted to generate at least one signal indicating an intensity of illumination for each of the pixels.

Embodiment 98: The detector according to the preceding embodiment, wherein the evaluation device is adapted to compare, for each of the pixels, the signal to at least one threshold in order to determine whether the pixel is an illuminated pixel or not.

Embodiment 99: The detector according to any one of the three preceding embodiments, wherein the evaluation device is adapted to determine the longitudinal coordinate of the object by using a predetermined relationship between the number N of pixels which are illuminated by the light beam and the longitudinal coordinate.

Embodiment 100: The detector according to the preceding embodiment, wherein the predetermined relationship is based on the assumption of the light beam being a Gaussian light beam.

Embodiment 101: The detector according to any of the preceding embodiments, wherein the longitudinal optical sensor comprises at least one layer of the photoconductive material and at least two electrodes contacting the layer, wherein the at least two electrodes are applied at different locations of the layer of the photoconductive material.

Embodiment 102: The detector according to the preceding embodiment, wherein the at least two electrodes are applied to the same side of the layer.

Embodiment 103: The detector according to any of the two preceding embodiments, wherein the at least one layer of the photoconductive material is directly or indirectly applied to at least one substrate.

Embodiment 104: The detector according to any of the two preceding embodiments, wherein the substrate is an insulating substrate.

Embodiment 105: The detector according to any of the two preceding embodiments, wherein the substrate is at least partially transparent or translucent.

Embodiment 106: The detector according to any of the preceding embodiments, wherein the at least one longitudinal optical sensor comprises at least one transparent longitudinal optical sensor.

Embodiment 107: The detector according to any of the preceding embodiments, wherein the evaluation device is adapted to normalize the longitudinal sensor signals and to generate the information on the longitudinal position of the object independent from an intensity of the light beam.

Embodiment 108: The detector according to the preceding embodiment, wherein the evaluation device is adapted to recognize whether the light beam widens or narrows, by comparing the longitudinal sensor signals of different longitudinal sensors.

Embodiment 109: The detector according to any of the preceding embodiments, wherein the evaluation device is adapted to generate the at least one item of information on the longitudinal position of the object by determining a diameter of the light beam from the at least one longitudinal sensor signal.

Embodiment 110: The detector according to the preceding embodiment, wherein the evaluation device is adapted to compare the diameter of the light beam with known beam properties of the light beam in order to determine the at least one item of information on the longitudinal position of the object, preferably from a known dependency of a beam diameter of the light beam on at least one propagation coordinate in a direction of propagation of the light beam and/or from a known Gaussian profile of the light beam.

Embodiment 111: The detector according to any one of the preceding embodiments, further comprising at least one transversal optical sensor, the transversal optical sensor being adapted to determine a transversal position of the light beam traveling from the object to the detector, the transversal position being a position in at least one dimension perpendicular to an optical axis of the detector, the transversal optical sensor being adapted to generate at least one transversal sensor signal, wherein the evaluation device is further designed to generate at least one item of information on a transversal position of the object by evaluating the transversal sensor signal.

Embodiment 112: The detector according to the preceding embodiment, wherein the transversal optical sensor is a photo detector having at least one first electrode, at least one second electrode and at least one photoconductive material embedded in between two separate layers of a transparent conductive oxide, wherein the transversal optical sensor has a sensor area, wherein the first electrode and the second electrode are applied to different locations of one of the layers of the transparent conductive oxide, wherein the at least one transversal sensor signal indicates a position of the light beam in the sensor area.

Embodiment 113: The detector according to any of the two preceding embodiments, wherein the transversal optical sensor comprises a layer of a photoconductive material according to any one of Embodiments referring to a photoconductive material.

Embodiment 114: The detector according to the preceding embodiment, wherein the photoconductive material comprises an inorganic photoconductive material.

Embodiment 115: The detector according to the preceding embodiment, wherein the inorganic photoconductive material comprises a chalcogenide, preferably lead sulfide (PbS) or lead selenide (PbSe), according to the Embodiments referring to chalcogenide, or a doped silicon photoconductor according to the Embodiments referring to doped silicon.

Embodiment 116: The detector according to any one of the preceding embodiments, wherein the photoconductive material is provided as a layer of the photoconductive material being embedded in between two layers comprising a transparent conducting oxide or a metal nanowire, wherein the transparent conducting oxide, preferably, comprises indium tin oxide (ITO), fluorine doped tin oxide (FTO), aluminum doped zinc oxide (AZO), magnesium oxide (MgO), or a perovskite transparent conducting oxide.

Embodiment 117: The detector according to any of the six preceding embodiments, wherein the at least one transversal optical sensor comprises at least one transparent transversal optical sensor.

Embodiment 118: The detector according to any of the seven preceding embodiments, wherein the sensor area of the transversal optical sensor is formed by a surface of the transversal optical sensor, wherein the surface faces towards the object or faces away from the object.

Embodiment 119: The detector according to any of the eight preceding embodiments, wherein the first electrode and/or the second electrode are a split electrode comprising at least two partial electrodes.

Embodiment 120: The detector according to the preceding embodiment, wherein at least four partial electrodes are provided.

Embodiment 121: The detector according to any one of the two preceding embodiments, wherein electrical currents through the partial electrodes are dependent on a position of the light beam in the sensor area.

Embodiment 122: The detector according to the preceding embodiment, wherein the transversal optical sensor is adapted to generate the transversal sensor signal in accordance with the electrical currents through the partial electrodes.

Embodiment 123: The detector according to any of the two preceding embodiments, wherein the detector, preferably the transversal optical sensor and/or the evaluation device, is adapted to derive the information on the transversal position of the object from at least one ratio of the currents through the partial electrodes.

Embodiment 124: The detector according to any of the fourteen preceding embodiments, wherein the at least one transversal optical sensor is a transparent optical sensor.

Embodiment 125: The detector according to any of the ten preceding embodiments, wherein the transversal optical sensor and the longitudinal optical sensor are stacked along the optical axis such that a light beam travelling along the optical axis both impinges the transversal optical sensor and the at least two longitudinal optical sensors.

Embodiment 126: The detector according to the preceding embodiment, wherein the light beam subsequently passes through the transversal optical sensor and the at least two longitudinal optical sensors or vice versa.

Embodiment 127: The detector according to the preceding embodiment, wherein the light beam passes through the transversal optical sensor before impinging on one of the longitudinal optical sensors.

Embodiment 128: The detector according to any of the twelve preceding embodiments, wherein the transversal sensor signal is selected from the group consisting of a current and a voltage or any signal derived thereof.

Embodiment 129: The detector according to any one of the preceding embodiments, wherein the detector further comprises at least one imaging device.

Embodiment 130: The detector according to the preceding claim, wherein the imaging device is located in a position furthest away from the object.

Embodiment 131: The detector according to any of the two preceding embodiments, wherein the light beam passes through the at least one longitudinal optical sensor before illuminating the imaging device.

Embodiment 132: The detector according to any of the three preceding embodiments, wherein the imaging device comprises a camera.

Embodiment 133: The detector according to any of the four preceding embodiments, wherein the imaging device comprises at least one of: an inorganic camera; a monochrome camera; a multichrome camera; a full-color camera; a pixelated inorganic chip; a pixelated organic camera; a CCD chip, preferably a multi-color CCD chip or a full-color CCD chip; a CMOS chip; an IR camera; an RGB camera.

Embodiment 134: A detector for an optical detection of at least one object, comprising:
  at least one longitudinal optical sensor, wherein the longitudinal optical sensor has at least one sensor region, wherein the longitudinal optical sensor is designed to generate at least one longitudinal sensor signal in a manner dependent on an illumination of the sensor region by a light beam, wherein the longitudinal sensor signal, given the same total power of the illumination, is dependent on a beam cross-section of the light beam in the sensor region, wherein the sensor region comprises at least one material capable of sustaining an electrical current, wherein at least one property of the material, given the same total power of the illumination, is dependent on the beam cross-section of the light beam in the sensor region, wherein the longitudinal sensor signal is dependent on the at least one property; and
  at least one evaluation device, wherein the evaluation device is designed to generate at least one item of information on a longitudinal position of the object by evaluating the longitudinal sensor signal of the longitudinal optical sensor.

Embodiment 135: The detector according to the preceding embodiment, wherein the detector comprises one or more features according to any one the embodiments 2 to 133.

Embodiment 136: The detector according to any one of the two preceding embodiments, wherein the at least one property of the material is an electrical conductivity of the material or another material property.

Embodiment 137: The detector according to any one of the three preceding embodiments, wherein the material capable of sustaining an electrical current comprises amorphous silicon, an alloy comprising amorphous silicon, or microcrystalline silicon.

Embodiment 138: The detector according to the preceding embodiment, wherein the alloy comprising amorphous silicon is one of an amorphous alloy comprising silicon and carbon or an amorphous alloy comprising silicon and germanium.

Embodiment 139: The detector according to any one of the two preceding embodiments, wherein the amorphous silicon is passivated by using hydrogen.

Embodiment 140: The detector according to any one of the three preceding embodiments, wherein the longitudinal optical sensor is a photo detector having at least one first electrode, at least one second electrode, and the amorphous silicon, the alloy comprising amorphous silicon, or the microcrystalline silicon located between the first electrode and the second electrode, wherein at least one of the first electrode and the second electrode is a transparent electrode.

Embodiment 141: The detector according to the preceding embodiment, wherein the transparent electrode comprises a transparent conducting oxide (TCO), in particular indium tin oxide (ITO).

Embodiment 142: The detector according to any one of the two preceding embodiments, wherein the amorphous silicon, the alloy comprising amorphous silicon, or the microcrystalline silicon located between the first electrode and the second electrode is arranged as a PIN diode, wherein the PIN diode comprises an i-type semiconductor layer located between an n-type semiconductor layer and a p-type semiconductor layer.

Embodiment 143: The detector according to the preceding embodiment, wherein the i-type semiconductor layer comprises amorphous silicon and exhibits a thickness which exceeds the thickness of each of the n-type semiconductor layer and the p-type semiconductor layer, in particular by a factor of at least 2, preferably of at least 5, more preferred of at least 10.

Embodiment 144: The detector according to the pre-preceding embodiment, wherein the p-type semiconductor layer comprises an alloy of silicon and carbon, and exhibits a thickness from 2 nm to 20 nm, preferably from 4 nm to 10 nm.

Embodiment 145: The detector according to the preceding embodiment, wherein the i-type semiconductor layer comprises an alloy of silicon and carbon, and exhibits a thickness from 2 nm to 20 nm, preferably from 4 nm to 10 nm.

Embodiment 146: The detector according to any one of the six preceding embodiments, wherein the longitudinal sensor is substantially frequency-independent in a range of a modulation frequency of the light beam of 0 Hz to 50 kHz.

Embodiment 147: The detector according to the preceding embodiment, wherein the material property is an electrical property and/or an optical property of the material.

Embodiment 148: The detector according to the preceding embodiment, wherein the material property is selected from a group comprising a polarization, a reflectance, a refractive index, a transmission, a thermal conductivity, an absorbance, a scattering property, a dielectric property, and a magnetic property.

Embodiment 149: A detector for an optical detection of at least one object, comprising:

at least one longitudinal optical sensor, wherein the longitudinal optical sensor has at least one sensor region, wherein the longitudinal optical sensor is designed to generate at least one longitudinal sensor signal in a manner dependent on an illumination of the sensor region by a light beam, wherein the longitudinal sensor signal, given the same total power of the illumination, is dependent on a beam cross-section of the light beam in the sensor region, wherein the longitudinal optical sensor, given the same total power of the illumination, is capable of generating at least one longitudinal sensor signal being dependent on the beam cross-section of the light beam in the sensor region such that an amplitude of the longitudinal sensor signal decreases with decreasing cross-section of a light spot generated by the light beam in the sensor region; and at least one evaluation device, wherein the evaluation device is designed to generate at least one item of information on a longitudinal position of the object by evaluating the longitudinal sensor signal of the longitudinal optical sensor.

Embodiment 150: The detector according to the preceding embodiment, wherein the detector comprises one or more features according to any one the embodiments 2 to 133.

Embodiment 151: A detector for an optical detection of at least one object, comprising:

at least one longitudinal optical sensor, wherein the longitudinal optical sensor has at least one sensor region, wherein the longitudinal optical sensor is designed to generate at least one longitudinal sensor signal in a manner dependent on an illumination of the sensor region by a light beam, wherein the longitudinal sensor signal, given the same total power of the illumination, is dependent on a beam cross-section of the light beam in the sensor region, wherein the longitudinal optical sensor, given the same total power of the illumination, is capable of generating at least one longitudinal sensor signal being dependent on the beam cross-section of the light beam in the sensor region, wherein a minimum of the longitudinal sensor signal occurs under a condition in which the sensor region is impinged by a light beam with the smallest available beam cross-section; and at least one evaluation device, wherein the evaluation device is designed to generate at least one item of information on a longitudinal position of the object by evaluating the longitudinal sensor signal of the longitudinal optical sensor.

Embodiment 152: The detector according to the preceding embodiment, wherein the detector comprises one or more features according to any one the embodiments 2 to 133.

Embodiment 153: The detector according to any one of the two preceding embodiments, wherein the condition in which the sensor region is impinged by a light beam with the smallest available beam cross-section is achieved when the sensor region is located at or near a focal point as effected by an optical lens.

Embodiment 154: A detector for an optical detection of at least one object, comprising:

at least one longitudinal optical sensor, wherein the longitudinal optical sensor has at least one sensor region, wherein the longitudinal optical sensor is designed to generate at least one longitudinal sensor signal in a manner dependent on an illumination of the sensor region by a light beam, wherein the longitudinal sensor signal, given the same total power of the illumination, is dependent on a beam cross-section of the light beam in the sensor region, wherein the longitudinal sensor is substantially frequency-independent in a range of a modulation frequency of the light beam of 0 Hz to 500 Hz; and at least one evaluation device, wherein the evaluation device is designed to generate at least one item of information on a longitudinal position of the object by evaluating the longitudinal sensor signal of the longitudinal optical sensor.

Embodiment 155: The detector according to the preceding embodiment, wherein the detector comprises one or more features according to any one the embodiments 2 to 133.

Embodiment 156: The detector according to any one of the two preceding embodiments, wherein the longitudinal sensor is substantially frequency-independent in the range of the modulation frequency of the light beam of 0 Hz to 50 kHz.

Embodiment 157: The detector according to any one of the three preceding embodiments, wherein the longitudinal sensor comprises amorphous silicon.

Embodiment 158: The detector according to the preceding embodiment, wherein the amorphous silicon is passivated by using hydrogen.

Embodiment 159: The detector according to any one of the two preceding embodiments, wherein the longitudinal optical sensor is a photo detector having at least one first electrode, at least one second electrode, and the amorphous silicon located between the first and the second electrode, wherein at least one of the first electrode and the second electrode is a transparent electrode.

Embodiment 160: The detector according to the preceding embodiment, wherein the transparent electrode comprises a transparent conducting oxide (TCO), in particular indium tin oxide (ITO).

Embodiment 161: The detector according to any one of the two preceding embodiments, wherein the amorphous silicon located between the first and the second electrode is arranged as a PIN diode, wherein the PIN diode comprises an i-type semiconductor layer located between an n-type semiconductor layer and a p-type semiconductor layer.

Embodiment 162: The detector according to the preceding embodiment, wherein the i-type semiconductor layer exhibits a thickness which exceeds the thickness of each of the n-type semiconductor layer and the p-type semiconductor layer, in particular by a factor of at least 2, preferably of at least 5, more preferred of at least 10.

Embodiment 163: A detector for an optical detection of at least one object, comprising:
- at least one longitudinal optical sensor, wherein the longitudinal optical sensor has at least one sensor region, wherein the longitudinal optical sensor is designed to generate at least one longitudinal sensor signal in a manner dependent on an illumination of the sensor region by a light beam, wherein the longitudinal sensor signal, given the same total power of the illumination, is dependent on a beam cross-section of the light beam in the sensor region, wherein the longitudinal optical sensor comprises at least one photodiode driven in a photoconductive mode, wherein an electrical conductivity of the sensor region, given the same total power of the illumination, is dependent on the beam cross-section of the light beam in the sensor region, wherein the longitudinal sensor signal is dependent on the electrical conductivity; and
- at least one evaluation device, wherein the evaluation device is designed to generate at least one item of information on a longitudinal position of the object by evaluating the longitudinal sensor signal of the longitudinal optical sensor.

Embodiment 164: The detector according to the preceding embodiment, wherein the detector comprises one or more features according to any one the embodiments 2 to 133.

Embodiment 165: The detector according to any one of the two preceding embodiments, wherein the photoconductive mode refers to an electrical circuit employing a photodiode, wherein the at least one photodiode is comprised in a reverse biased mode, wherein the cathode of the photodiode is driven with a positive voltage with respect to the anode.

Embodiment 166: The detector according to any one of the three preceding embodiments, wherein the photodiode comprises at least one p-type absorber material, at least one n-type semiconductor layer, and at least one pair of electrodes.

Embodiment 167: The detector according to the preceding embodiment, wherein the p-type absorber material exhibits a diamond-like structure comprising tetravalent atoms.

Embodiment 168: The detector according to the preceding embodiment, wherein the p-type absorber material is selected from the group comprising diamond (C), silicon (Si), silicon carbide (SiC), and germanium (Ge), and solid solutions and/or doped variants thereof.

Embodiment 169: The detector according to any one of the three preceding embodiments, wherein the diamond-like structure is modified by substituting at least one of the tetravalent atoms by an atom combination comprising an average of four valence electrons.

Embodiment 170: The detector according to the preceding embodiment, wherein the p-type absorber material is selected from the group comprising II-V compounds, II-VI compounds, I-III-VI$_2$ compounds, and I$_2$-II-IV-VI$_4$ compounds.

Embodiment 171: The detector according to the preceding embodiment, wherein the p-type absorber material is selected from the group consisting of: amorphous silicon (a-Si), an alloy comprising amorphous silicon, microcrystalline silicon (μc-Si), germanium (Ge), indium antimonide (InSb), indium gallium arsenide (InGaAs), indium arsenide (InAs), gallium nitride (GaN), gallium arsenide (GaAs), aluminum gallium phosphide (AlGaP), cadmium telluride (CdTe), mercury cadmium telluride (HgCdTe), copper indium sulfide (CIS), copper indium gallium selenide (CIGS), copper zinc tin sulfide (CZTS), copper zinc tin selenide (CZTSe), copper-zinc-tin sulfur-selenium chalcogenide (CZTSSe), an organic-inorganic halide perovskite, in particular, methylammonium lead iodide ($CH_3NH_3PbI_3$), and solid solutions and/or doped variants thereof.

Embodiment 172: The detector according to any one of the five preceding embodiments, wherein the n-type semiconductor layer comprises cadmium sulfide (CdS), zinc sulfide (ZnS), zinc oxide (ZnO), or zinc hydroxide (ZnOH).

Embodiment 173: The detector according to any one of the ten preceding embodiments, comprising a bias voltage source.

Embodiment 174: The detector according to the preceding embodiment, wherein the bias voltage source and a load resistor are arranged in series with the longitudinal optical sensor.

Embodiment 175: The detector according to any one of the two preceding embodiments, wherein a bias voltage is applied across the photodiode.

Embodiment 176: The detector according to the preceding embodiment, wherein the photodiode is switchable between at least two different operational modes of the longitudinal optical sensor by applying at least two different values for the bias voltage across the photodiode.

Embodiment 177: The detector according to the preceding embodiment, wherein the photodiode is switchable between a first operational mode and a second operational mode, wherein, in the first operational mode, the photodiode is driven in the photoconductive mode and, in the second operational mode, the photodiode is driven in a photovoltaic mode.

Embodiment 178: The detector according to any one of the two preceding embodiments, wherein a switching device is adapted to exert an influence on the bias voltage source in order to set the bias voltage.

Embodiment 179: The detector according to the preceding embodiment, wherein the switching device is used for switching between the first operational mode and the second operational mode of the longitudinal optical sensor.

Embodiment 180: An arrangement comprising at least two detectors according to any of the preceding embodiments.

Embodiment 181: The arrangement according to any of the two preceding embodiments, wherein the arrangement further comprises at least one illumination source.

Embodiment 182: A human-machine interface for exchanging at least one item of information between a user and a machine, in particular for inputting control commands, wherein the human-machine interface comprises at least one detector according to any of the preceding embodiments relating to a detector, wherein the human-machine interface is designed to generate at least one item of geometrical information of the user by means of the detector wherein the human-machine interface is designed to assign to the geometrical information at least one item of information, in particular at least one control command.

Embodiment 183: The human-machine interface according to the preceding embodiment, wherein the at least one item of geometrical information of the user is selected from the group consisting of: a position of a body of the user; a position of at least one body part of the user; an orientation of a body of the user; an orientation of at least one body part of the user.

Embodiment 184: The human-machine interface according to any of the two preceding embodiments, wherein the human-machine interface further comprises at least one beacon device connectable to the user, wherein the human-machine interface is adapted such that the detector may generate an information on the position of the at least one beacon device.

Embodiment 185: The human-machine interface according to the preceding embodiment, wherein the beacon device comprises at least one illumination source adapted to generate at least one light beam to be transmitted to the detector.

Embodiment 186: An entertainment device for carrying out at least one entertainment function, in particular a game, wherein the entertainment device comprises at least one human-machine interface according to any of the preceding embodiments referring to a human-machine interface, wherein the entertainment device is designed to enable at least one item of information to be input by a player by means of the human-machine interface, wherein the entertainment device is designed to vary the entertainment function in accordance with the information.

Embodiment 187: A tracking system for tracking the position of at least one movable object, the tracking system comprising at least one detector according to any of the preceding embodiments referring to a detector, the tracking system further comprising at least one track controller, wherein the track controller is adapted to track a series of positions of the object, each comprising at least one item of information on a position of the object at a specific point in time.

Embodiment 188: The tracking system according to the preceding embodiment, wherein the tracking system further comprises at least one beacon device connectable to the object, wherein the tracking system is adapted such that the detector may generate an information on the position of the object of the at least one beacon device.

Embodiment 189: A scanning system for determining at least one position of at least one object, the scanning system comprising at least one detector according to any of the preceding embodiments relating to a detector, the scanning system further comprising at least one illumination source adapted to emit at least one light beam configured for an illumination of at least one dot located at at least one surface of the at least one object, wherein the scanning system is designed to generate at least one item of information about the distance between the at least one dot and the scanning system by using the at least one detector.

Embodiment 190: The scanning system according to the preceding embodiment, wherein the illumination source comprises at least one artificial illumination source, in particular at least one laser source and/or at least one incandescent lamp and/or at least one semiconductor light source.

Embodiment 191: The scanning system according to any one of the two preceding embodiments, wherein the illumination source emits a plurality of individual light beams, in particular an array of light beams exhibiting a respective pitch, in particular a regular pitch.

Embodiment 192: The scanning system according to any one of the three preceding embodiments, wherein the scanning system comprises at least one housing.

Embodiment 193: The scanning system according to the preceding embodiment, wherein the at least one item of information about the distance between the at least one dot and the scanning system distance is determined between the at least one dot and a specific point on the housing of the scanning system, in particular a front edge or a back edge of the housing.

Embodiment 194: The scanning system according to any one of the two preceding embodiments, wherein the housing comprises at least one of a display, a button, a fastening unit, a leveling unit.

Embodiment 195: A stereoscopic system comprising at least one tracking system according to any one of the embodiments which refer to the tracking system and at least one scanning system according to any one of the embodiments which refer to the scanning system, wherein the tracking system and the scanning system each comprise at least one optical sensor which are placed in a collimated arrangement in such a manner that they are aligned in an orientation parallel to the optical axis of the stereoscopic system and, concurrently, exhibit an individual displacement with respect to the orientation perpendicular to the optical axis of the stereoscopic system.

Embodiment 196: The stereoscopic system according to the preceding embodiment, wherein the tracking system and the scanning system each comprise at least one longitudinal optical sensor, wherein the sensor signals of the longitudinal optical sensors are combined for determining the item of information on the longitudinal position of the object.

Embodiment 197: The stereoscopic system according to the preceding embodiment, wherein the sensor signals of the longitudinal optical sensors are distinguishable with respect to each other by applying a different modulation frequency.

Embodiment 198: The stereoscopic system according to the preceding embodiment, wherein the stereoscopic system further comprises at least one transversal optical sensor, wherein the sensor signals of the transversal optical sensor are used for determining the item of information on the transversal position of the object.

Embodiment 199: The stereoscopic system according to the preceding embodiment, wherein a stereoscopic view of the object is obtained by combining the item of information on the longitudinal position of the object and the item of information on the transversal position of the object.

Embodiment 200: A camera for imaging at least one object, the camera comprising at least one detector according to any one of the preceding embodiments referring to a detector.

Embodiment 201: A method for an optical detection of at least one object, in particular by using a detector according to any of the preceding embodiments relating to a detector, comprising the following steps:
generating at least one longitudinal sensor signal by using at least one longitudinal optical sensor, wherein the longitudinal sensor signal is dependent on an illumination of a sensor region of the longitudinal optical sensor by a light beam, wherein the longitudinal sensor signal, given the same total power of the illumination, is dependent on a beam cross-section of the light beam in the sensor region, wherein the sensor region comprises at least one photoconductive material, wherein an electrical conductivity of the photoconductive material in the sensor region, given the same total power of the illumination, is dependent on the beam cross-section of the light beam in the sensor region, wherein the longitudinal sensor signal is dependent on the electrical conductivity; and
generating at least one item of information on a longitudinal position of the object by evaluating the longitudinal sensor signal of the longitudinal optical sensor.

Embodiment 202: The method according to the preceding embodiment, wherein the photoconductive material is provided as a film comprising colloidal quantum dots (CQD).

Embodiment 203: The method according to the preceding embodiment, wherein the CQD film is deposited onto a first conductive layer.

Embodiment 204: The method according to the preceding embodiment, wherein the first conductive layer comprises an at least partially transparent semiconducting material, preferably selected from the group comprising an at least partially transparent semiconducting metal oxide, a doped variant thereof, or a metal nanowire, wherein the transparent conducting oxide is, particularly, selected from indium tin oxide (ITO), fluorine doped tin oxide (FTO), aluminum doped zinc oxide (AZO), magnesium oxide (MgO), or a perovskite transparent conducting oxide.

Embodiment 205: The method according to any one of the three preceding embodiments, wherein the CQD film is provided as a solution of the quantum dots in an unpolar organic solvent, wherein the solvent is preferably selected from the group comprising octane, toluene, cyclohexane, chlorobenzene, n-heptane, benzene, dimethylformamide (DMF), acetonitrile, and chloroform, wherein the quantum dots are provided in a concentration from 10 mg/ml to 200 mg/ml, preferably from 50 mg/ml to 100 mg/ml, in the organic solvent.

Embodiment 206: The method according to any one of the four preceding embodiments, wherein the CQD film is provided as at least two separate layers.

Embodiment 207: The method according to any one of the five preceding embodiments, wherein the CQD film is provided by a deposition method, preferably by a coating method, more preferred by a spin-coating method.

Embodiment 208: The method according to the preceding embodiment, wherein the CQD film undergoes a treatment with an organic agent, wherein the organic agent is preferably selected from the group comprising thiols and amines, in particular from 1,2-ethanedithiol (edt), 1,2- and 1,3-benzenedithiol (bdt), and butylamine.

Embodiment 209: The method according to the preceding embodiment, wherein, after the treatment with the organic agent, the CQD film is dried at a temperature from 50° C. to 250° C., preferably from 80° C. to 180° C., more preferred from 100° C. to 120° C.

Embodiment 210: The method according to any one of the seven preceding embodiments, wherein a blocking layer is, firstly, directly deposited onto the first conductive layer until the
CQD film is deposited onto the blocking layer, wherein the blocking layer comprises a thin film of an electrically conducting material, preferably titanium dioxide ($TiO_2$) or zinc oxide (ZnO).

Embodiment 211: The method according to any one of the nine preceding embodiments, wherein a second conductive layer is deposited onto the CQD film.

Embodiment 212: The method according to the preceding embodiment, wherein the second conductive layer comprises an intransparent electrically conducting material, more preferred a an evaporated metal layer or a graphene layer, wherein the evaporated metal layer, particularly, comprises one or more of silver, aluminum, platinum, chromium, titanium, or gold.

Embodiment 213: The detector according to any one of the two preceding embodiments, wherein the second conductive layer comprises a layer of an electrically conducting polymer, in particular selected from poly(3,4-ethylenedioxythiophene) (PEDOT) or a dispersion of PEDOT and a polystyrene sulfonic acid (PEDOT:PSS), wherein a split electrode comprising contacts of an evaporated metal or of graphene is, preferably, arranged on the layer of the electrically conducting polymer, wherein the evaporated metal contacts, particularly, comprise one or more of silver, aluminum, platinum, titanium, chromium, or gold.

Embodiment 214: A use of a detector according to any one of the preceding embodiments relating to a detector for a purpose of, preferably simultaneously, determining a position, in particular a depth of an object.

Embodiment 215: The use of a detector according to the previous embodiment, for a purpose of use, selected from the group consisting of: a distance measurement, in particular in traffic technology; a position measurement, in particular in traffic technology; an entertainment application; a security application; a human-machine interface application; a tracking application; a scanning application; a photography application; an imaging application or camera application; a mapping application for generating maps of at least one space; a homing or tracking beacon detector for vehicles; a distance and/or position measurement of objects with a thermal signature (hotter or colder than background); a stereoscopic vision application; a machine vision application; a robotic application.

BRIEF DESCRIPTION OF THE FIGURES

Further optional details and features of the invention are evident from the description of preferred exemplary embodiments which follows in conjunction with the dependent claims. In this context, the particular features may be implemented alone or with features in combination. The invention is not restricted to the exemplary embodiments. The exemplary embodiments are shown schematically in the figures. Identical reference numerals in the individual figures refer to identical elements or elements with identical function, or elements which correspond to one another with regard to their functions.

Specifically, in the figures:

FIG. 6A), a mixture of an organic donor polymer and a fullerene-based electron acceptor material (FIGS. 6B to 6D), antimony trisulfide ($Sb_2S_3$; FIGS. 6E to 6G), and p-type doped crystalline silicon comprising a low dopant concentration and a low defect density (FIG. 6H);

FIGS. 10B to 10E), of microcrystalline silicon (μc-Si; FIG. 10F), and of gallium phosphide (GaP; FIG. 10G);

FIGS. 11A to 11J show further exemplary embodiments of the longitudinal optical sensor in the arrangement as a thin-film solar cell being used as a photodiode in the sensor region of a longitudinal optical sensor (FIGS. 11A and 11B), experimental results which demonstrate the occurrence of the FiP effect in the photodiode comprising cadmium telluride (CdTe; FIG. 11C), zinc cadmium telluride (ZnCdTe; FIG. 11D), copper indium gallium selenide (CIGS; FIG. 11E) or copper zinc tin sulfide (CZTS; FIGS. 11F to 11H), as p-type absorber material; and a further exemplary embodiment of a detector according to the present invention, wherein the longitudinal optical sensor has a sensor region comprising a photodiode (FIG. 11J)

EXEMPLARY EMBODIMENTS

Figure 1:
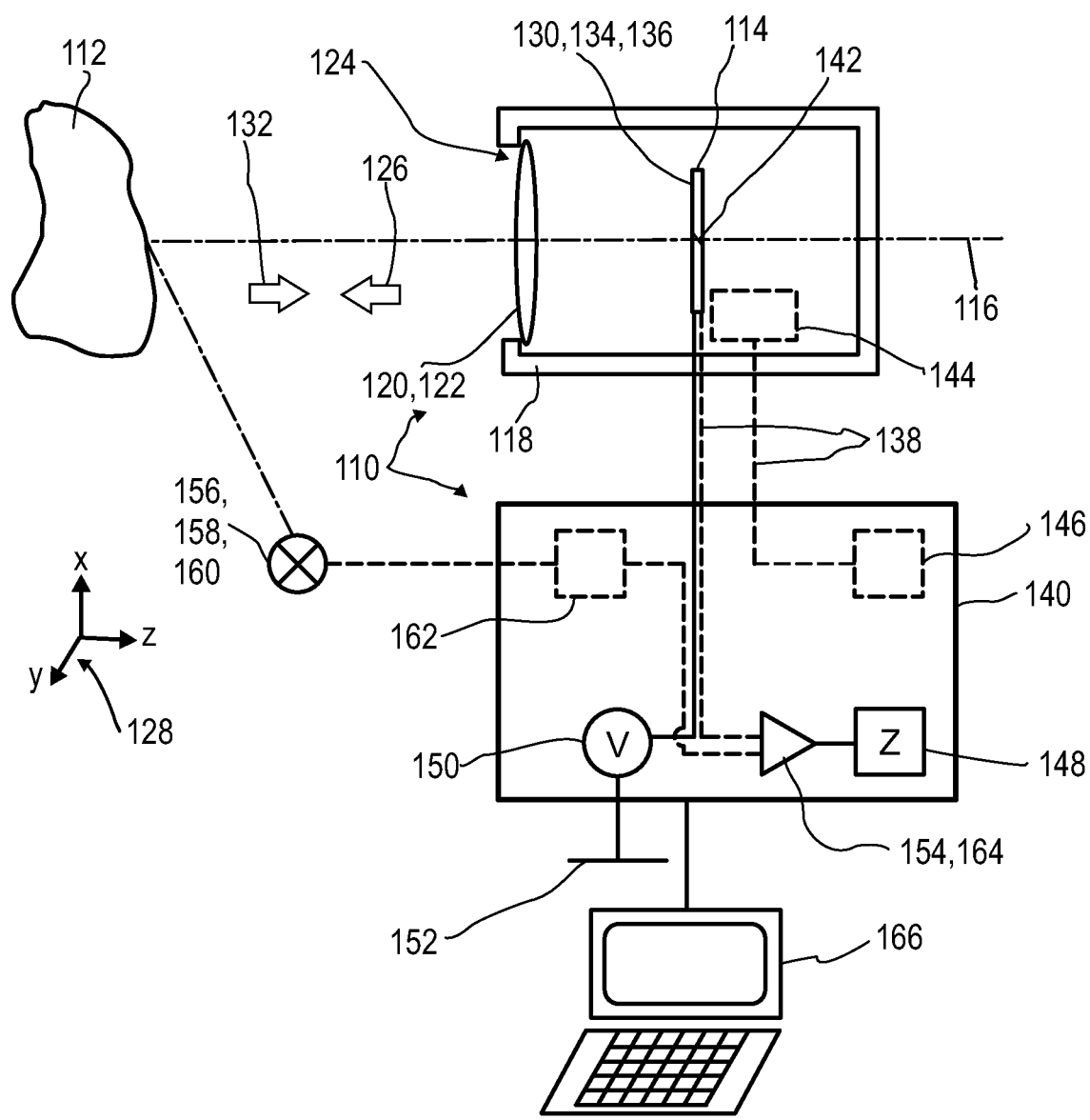
FIG. 1 shows an exemplary embodiment of a detector according to the present invention comprising a longitudinal optical sensor having a sensor region, wherein the sensor region comprises a photoconductive material.

FIG. 1 illustrates, in a highly schematic fashion, an exemplary embodiment of an optical detector 110 according to the present invention, for determining a position of at least one object 112. The optical detector 110 may preferably be adapted to be used as an infrared detector. However, other embodiments are feasible. The optical detector 110 comprises at least one longitudinal optical sensor 114, which, in this particular embodiment, is arranged along an optical axis 116 of the detector 110. Specifically, the optical axis 116 may be an axis of symmetry and/or rotation of the setup of the optical sensors 114. The optical sensors 114 may be located inside a housing 118 of the detector 110. Further, at least one transfer device 120 may be comprised, preferably a refractive lens 122. An opening 124 in the housing 118, which may, particularly, be located concentrically with regard to the optical axis 116, preferably defines a direction of view 126 of the detector 110. A coordinate system 128 may be defined, in which a direction parallel or antiparallel to the optical axis 116 is defined as a longitudinal direction, whereas directions perpendicular to the optical axis 116 may be defined as transversal directions. In the coordinate system 128, symbolically depicted in FIG. 1, a longitudinal direction is denoted by z and transversal directions are denoted by x and y, respectively. However, other types of coordinate systems 128 are feasible.

Further, the longitudinal optical sensor 114 is designed to generate at least one longitudinal sensor signal in a manner dependent on an illumination of a sensor region 130 by a light beam 132. Thus, according to the FiP effect, the longitudinal sensor signal, given the same total power of the illumination, is dependent on a beam cross-section of the light beam 132 in the respective sensor region 130, as will be outlined in further detail below. According to the present invention, the 130 sensor region comprises at least one photoconductive material 134, in particular a chalcogenide 136, preferably lead sulfide (PbS) or lead selenide (PbSe). However, other photoconductive materials 134, in particular other chalcogenides 136, may be used. As a result of the use of the photoconductive material 134 in the sensor region 130, an electrical conductivity of the sensor region 130, given the same total power of the illumination, depends on the beam cross-section of the light beam 132 in the sensor region 130. Consequently, the resulting longitudinal sensor signal as provided by the longitudinal optical sensor 114 upon impingement by the light beam 132 depends on the electrical conductivity of the photoconductive material 134 in the sensor region 130 and thus allows determining the beam cross-section of the light beam 132 in the sensor region 130. Via a longitudinal signal lead 138, the longitudinal sensor signal may be transmitted to an evaluation device 140, which will be explained in further detail below.

Preferably, the sensor region 130 of the longitudinal optical sensor 114 may be transparent or translucent with respect to the light beam 132 travelling from the object 112 to the detector 110. However, this feature may not be required since the sensor region 130 of longitudinal optical sensor 114 may also be intransparent.

In a preferred embodiment, the longitudinal optical sensor 114 may be located at a focal point 142 of the transfer device 120. Additionally or alternatively, in particular in embodiment in which the optical detector 110 may not comprise a transfer device 120, the longitudinal optical sensor 114 may be arranged in a movable fashion along the optical axis 116, such as by means of an optional actuator 144, which may be controllable by using an actuator control unit 146, which may be placed within the evaluation device 136. However, other kinds of setups are feasible.

The evaluation device 140 is, generally, designed to generate at least one item of information on a position of the object 112 by evaluating the sensor signal of the transversal optical sensor 114. For this purpose, the evaluation device 140 may comprise one or more electronic devices and/or one or more software components, in order to evaluate the sensor signals, which are symbolically denoted by a longitudinal evaluation unit 148 (denoted by "z"). As will be explained below in more detail, the evaluation device 140 may be adapted to determine the at least one item of information on the longitudinal position of the object 112 by comparing more than one longitudinal sensor signals of the longitudinal optical sensor 114.

As explained above, the longitudinal sensor signal as provided by the longitudinal optical sensor 114 upon impingement by the light beam 132 depends on the electrical conductivity of the photoconductive material 134 in the sensor region 130. In order to determine a variation of the electrical conductivity of the photoconductive material 134 it may, as schematically depicted in FIG. 1, therefore be advantageous to measure a current, which may also be denominated a "photocurrent", through the longitudinal optical sensor 114. For this purpose, in a particularly preferred embodiment, a bias voltage source 150 may be provided which may be configured to provide a bias voltage above ground 152. Further, the longitudinal sensor signal as provided by the longitudinal optical sensor 114 may first be amplified by application of an amplifier 154 before supplying it to the longitudinal evaluation unit 148.

The light beam 132 for illumining the sensor region 130 of the longitudinal optical sensor 114 may be generated by a light-emitting object 112. Alternatively or in addition, the light beam 132 may be generated by a separate illumination source 156, which may include an ambient light source and/or an artificial light source, such as a light-emitting diode 158, being adapted to illuminate the object 112 that the object 112 may be able to reflect at least a part of the light generated by the illumination source 156 in a manner that the light beam 132 may be configured to reach the sensor region 130 of the longitudinal optical sensor 114, preferably by entering the housing 118 of the optical detector 110 through the opening 124 along the optical axis 116. In a specific embodiment, the illumination source 156 may be a modulated light source 160, wherein one or more modulation properties of the illumination source 156 may be controlled by at least one optional modulation device 162. Alternatively or in addition, the modulation may be effected in a beam path between the illumination source 156 and the object 112 and/or between the object 112 and the longitudinal optical sensor 114. Further possibilities may be conceivable. In this specific embodiment, it may be advantageous taking into account one or more of the modulation properties, in particular the modulation frequency, when evaluating the sensor signal of the transversal optical sensor 114 for determining the at least one item of information on the position of the object 112. For this purpose, the respective property as provided by the modulation device 162 may also be supplied to the amplifier 154, which, in this specific embodiment, may be a lock-in amplifier 164.

Generally, the evaluation device 140 may be part of a data processing device 166 and/or may comprise one or more data processing devices 166. The evaluation device 140 may be fully or partially integrated into the housing 118 and/or may fully or partially be embodied as a separate device which is electrically connected in a wireless or wire-bound fashion to the longitudinal optical sensor 114. The evaluation device 140 may further comprise one or more additional components, such as one or more electronic hardware components and/or one or more software components, such as one or more measurement units and/or one or more evaluation units and/or one or more controlling units (not depicted here).

Figure 2A:
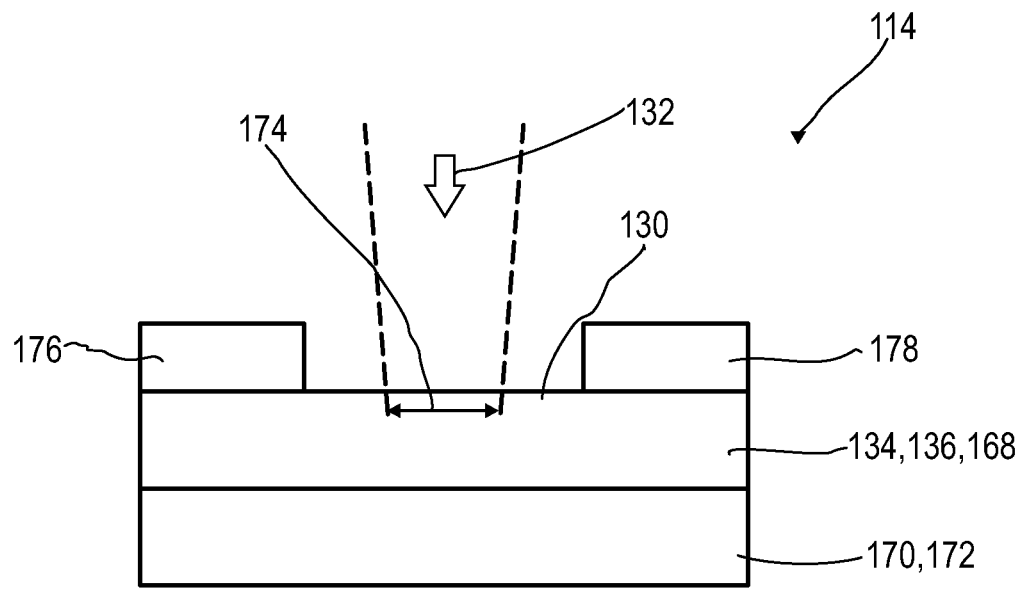
FIGS. 2A and 2B show exemplary embodiments of the longitudinal optical sensor having a sensor region, wherein the sensor region comprises a photoconductive material in an arrangement as a photoconductor.
Figure 2B:
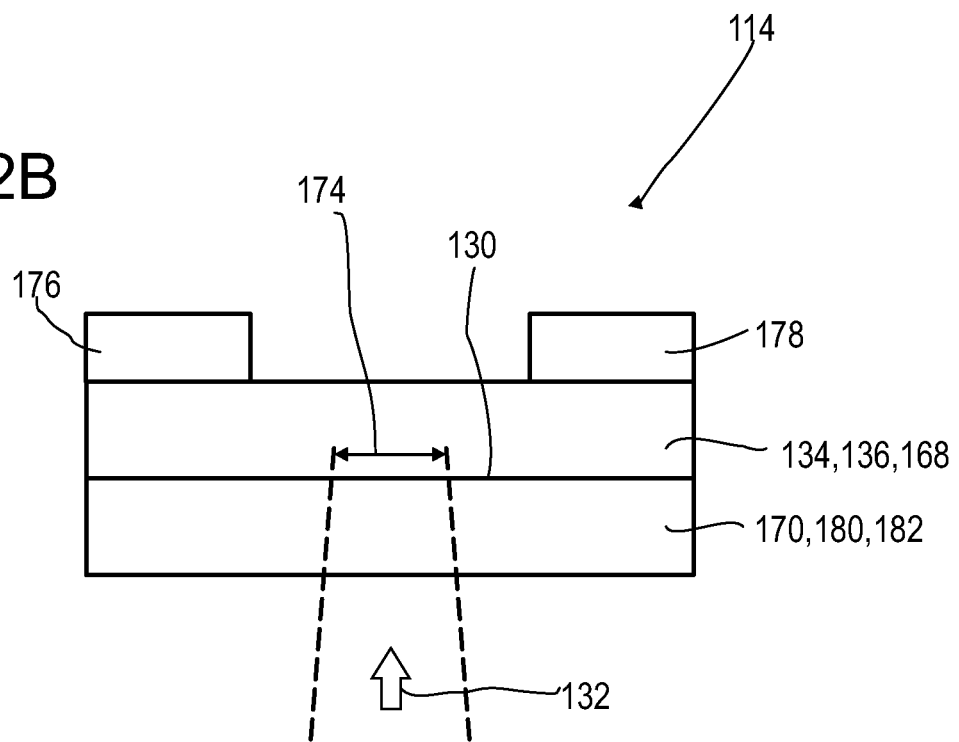

FIGS. 2A and 2B show exemplary embodiments of the longitudinal optical sensor 114 in an arrangement of a photoconductor. Accordingly, the longitudinal optical sensor 114 comprises a layer 168 of at least one photoconductive material 134, in particular a chalcogenide 136, preferably lead sulfide (PbS), lead selenide (PbSe), or another photoconductive material as described elsewhere herein. The occurrence of the above-mentioned negative FiP effect in the longitudinal optical sensor 114 comprising the layer 168 of lead sulfide (PbS), lead selenide (PbSe), and or other photoconductive materials has been experimentally demonstrated as illustrated in FIGS. 3A to 6, respectively. Preferably, the photoconductive material 134 is placed on an insulating substrate 170, preferably on a ceramic substrate 172, in particular for providing mechanical stability to the layer 168 of the photoconductive material 134, which may exhibit a thickness from 10 nm to 1000 µm, in particular from 100 nm to 10 µm.

As described above, the illumination of the photoconductive material 134 in the sensor region 130 by the incident light beam 132 results in a variation of the electrical conductivity of the photoconductive material 134 which, given the same total power of the illumination, depends on a beam cross-section 174 of the light beam 132 in the sensor region 130. Consequently, upon impingement of the sensor region 130 by the light beam 132 at least two separated electrodes 176, 178 provide the longitudinal sensor signal which depends on the electrical conductivity of the photoconductive material 134 and, thus, allows determining the beam cross-section 174 of the light beam 132 in the sensor region 130. Preferably, the optically intransparent electrodes 176, 178 each comprise a metal electrode, in particular one or more of a silver (Ag) electrode, a platinum (Pt) electrode, an aluminum (Al) electrode, or a gold (Au) electrode, or, alternatively, a graphene electrode. Herein, the electrodes 176, 178 are, preferably, placed on different locations on top of the layer 168 of the photoconductive material 134, in particular in form of bars which may be spaced apart a distance between 1 mm and 10 cm, such as about 1 cm.

Whereas in the exemplary setup of the longitudinal optical sensor 114 according to FIG. 2A the incident light beam 132 may directly impinge on the photoconductive material 134, in the exemplary setup of the longitudinal optical sensor 114 according to FIG. 2B the incident light beam 132 may first impinge on the substrate 170 until it may reach the sensor region 130 in the photoconductive material 134. In this particular embodiment pursuant FIG. 2B, the insulating substrate 170, therefore, may advantageously be a transparent substrate 180 or at least a translucent substrate 182, such as a glass substrate or a quartz substrate. In this case, a part of the material may not be covered with the photoconductive material. Further, in the case a gold (Au) electrode may be used, a thin layer of Ni/Cr or Ti/Ni may be employed in order to bond the gold strongly to the glass substrate, thus, making it bondable for wires.

In an alternative embodiment, the layer 168 of the photoconductive material 134 within the longitudinal optical sensor 114 comprises a mixture of an organic donor polymer as electron donor material and a fullerene-based electron acceptor material. In a particular example, the organic donor polymer comprises a 80:20 wt % mixture of poly(3-hexyl-thiophene-2,5.diyl) (P3HT) as the electron donor material and of [6,6]-phenyl-C61-butyric acid methyl ester (PC60BM) as the electron acceptor material. However, other kinds of mixture ratios and/or organic photoconductive materials 134 may also be suitable. Preferably, the single layer 168 of the photoconductive material 134 comprising the mixture of P3HT: PC60BM is similarly placed on the insulating substrate 170, preferably on the transparent or translucent substrate 180, 182, such as a glass or a quartz substrate. For this purpose, the mixture of P3HT:PC60BM may, preferably, be cast from a solution, in particular from a chlorobenzene solution, by using a deposition method, preferably a coating method, more preferred a spin-coating method, a slot-coating method, or a blade-coating method, or, alternatively, by evaporation, into the single layer 168 which may exhibit a thickness from 100 µm to 2000 µm, in particular from 200 µm to 750 µm.

Irrespective whether the embodiment according to FIG. 2A or to FIG. 2B may actually be selected for the optical detector 110, both embodiments exhibit a comparatively simple and cost-efficient setup of the longitudinal optical sensor 114, for example when compared to the longitudinal optical sensor as exemplary depicted in WO 2012/110924 A1 or WO 2014/097181 A1. This result may, in particular, be attributed to a lower number of layers which may here be used in order to still provide a working embodiment for the longitudinal optical sensor 114. However, other embodiments not depicted here may also be appropriate as the setup for the longitudinal optical sensor 114 according to the present invention.

Figure 3A:
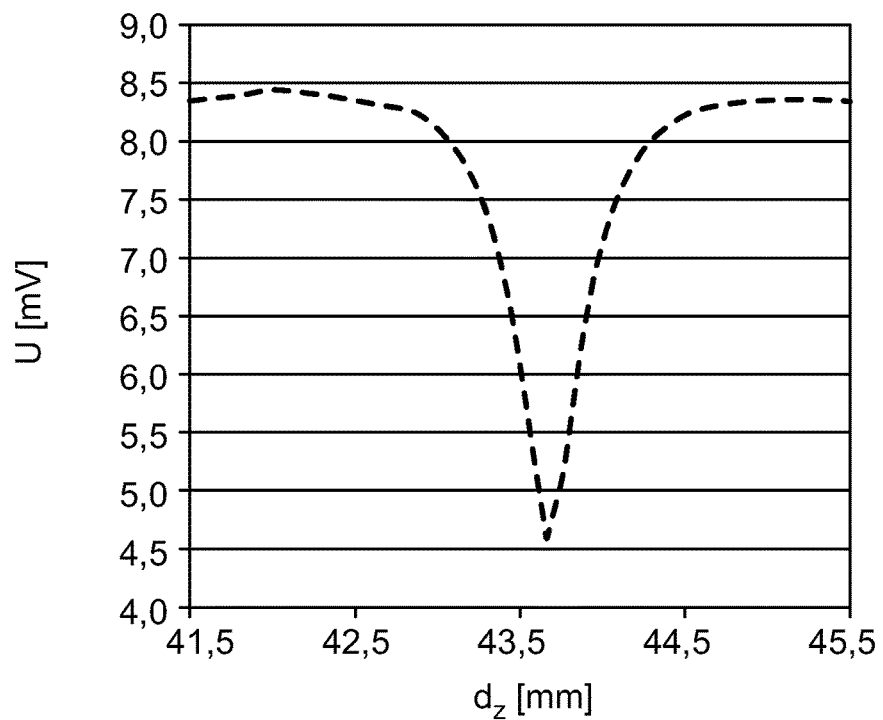
FIGS. 3A to 3C show experimental results demonstrating the negative FiP effect by using the longitudinal optical sensor having a sensor region, wherein the sensor region comprises lead sulfide (PbS) as photoconductive material.
Figure 3B:
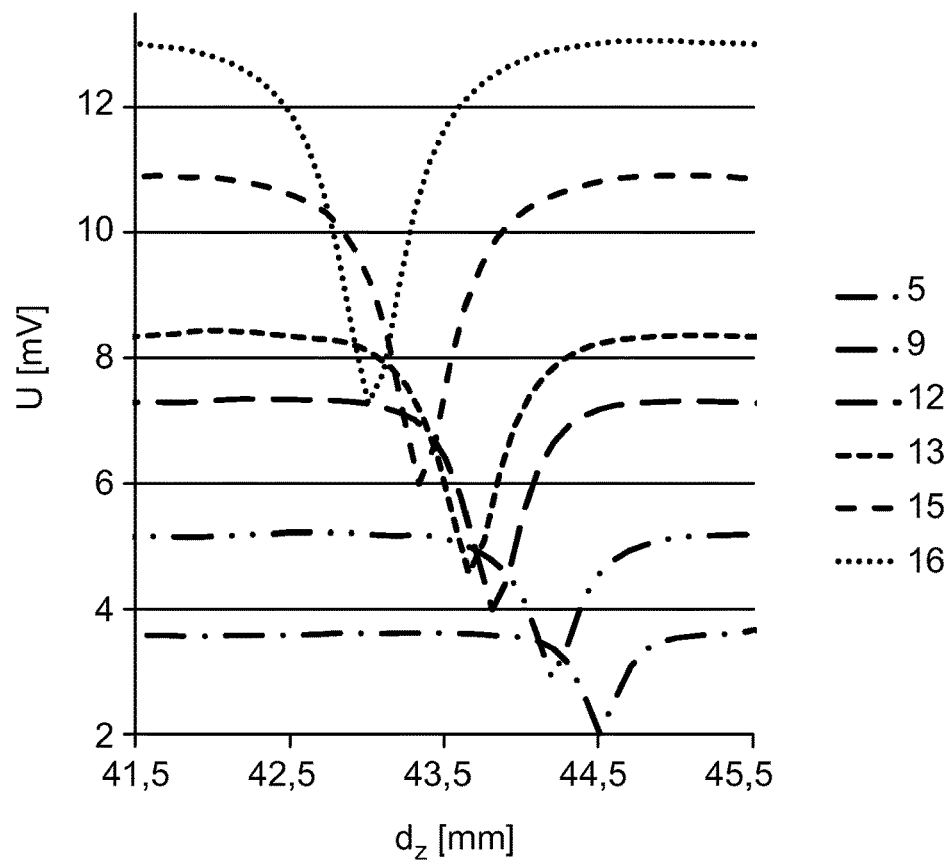
Figure 3C:
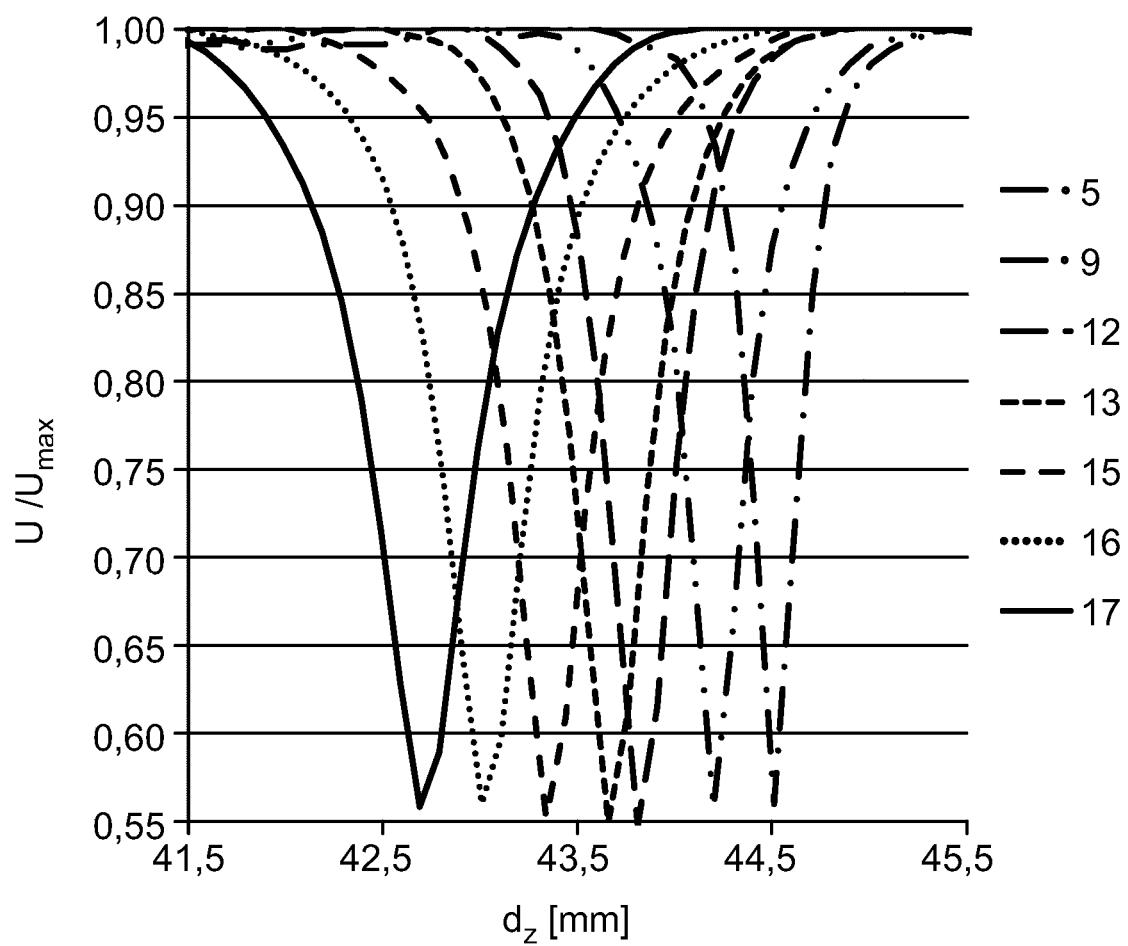

In FIGS. 3A to 3C, the occurrence of the above-mentioned negative FiP effect in the exemplary embodiments of FIGS. 1 and 2 shall be experimentally demonstrated.

Herein, FIG. 3A shows a so-called "FiP curve" as the experimental results in a setup in which the sensor region 130 of the longitudinal optical sensor 114 comprised lead sulfide (PbS) as the photoconductive material 134. Herein, the setup of the optical detector 110 comprised a green light-emitting diode (LED) 158 which was placed 80 cm in front of the refractive lens 122 and which was simultaneously employed as both the illumination source 156 for the light beam with an optical wavelength of 530 nm and the object 112. The sensor region 130 of the longitudinal optical sensor 114 comprised the commercially available lead sulfide (PbS) photoconductive material 134, which was operated under a 10 mV bias voltage provided by the bias voltage source 150. In this particular experiment, the light-emitting diode as the illumination source 156 was modulated with a modulation frequency of 375 Hz by using the modulation device 162. Consequently, the longitudinal sensor signal was measured by using the lock-in amplifier 164.

During the experiment, the longitudinal optical sensor 114 was moved along the z-axis of the optical detector 110 by using the actuator 144 and the resulting voltage in millivolts (mV) was measured. Herein, the focal point 142 of the refractive lens 122 was located at a distance of 43.5 mm, whereby the refractive lens 122 and the light-emitting diode 158 serving as the illumination source 156 were placed at larger z-values. Moving the sensor along the z-axis of the optical detector 110 during the experiment resulted in a variation of the beam cross-section (spot size) of the incident light beam 132 at the position of the sensor region 130, thus yielding a z-dependent voltage signal.

As can be seen in FIG. 3A, the FiP curve comprising the observable voltage which may be attributed as the longitudinal sensor signal varied with the varying distance of the longitudinal optical sensor 114 from the object 112 and comprises a distinct minimum in an event in which the object 112 was focused on the longitudinal optical sensor 114. Thus, the optical detector 110 according to the present invention may be arranged in a manner that it clearly exhibits the above-described negative FiP effect, i.e. the observation of a minimum of the longitudinal sensor signal under a condition in which the material in the sensor region 130 is impinged by the light beam 132 with the smallest possible cross-section, which occurs in this setup when the sensor region 130 is located at the focal point 142 as effected by the refractive lens 122, i.e. here at a distance of approximately 43.4 mm from the refractive lens 122.

In the experiment according to FIG. 3B, the same setup as in the previous experiment pursuant to FIG. 3A was used. Herein, the experiment as performed above with respect to FIG. 3A was repeated several times, wherein the light-emitting diode 158 serving as the illumination source 156 was being placed at different distances from the refractive lens 122. The recorded FiP curves are presented in FIG. 3B. As a result, the minimum of the recorded voltage attributed as the longitudinal sensor signal varied with varying distance of the light-emitting diode 158 from the refractive lens 122.

As can be, furthermore, extracted from FIG. 3B, the absolute values of the recorded voltage also increases with increasing distance of the light-emitting diode 158 from the refractive lens 122. Therefore, it may be useful to divide all values of an individual observed FiP curve by the value of the observed FiP curve acquired for a condition in which the sensor region 130 is located at a distance where the z-coordinate equals the focal distance of the refractive lens 122. As a result, the following graph as displayed in FIG. 3C is obtained. Herein, all normalized FiP curves have a minimum value of approximately 0.55 mV, and a value of 1.0 at a value of the z-coordinate of 43.4 mm, i.e. where the z-coordinate equals the focal distance of the refractive lens 122. This observation clearly demonstrates that the so-called "Iso-FiP relation" still holds in the case the photoconductive material 134 is used for sensing in the sensor region 130. As used herein, the "Iso-FiP relation" refers to a presentation in which the longitudinal sensor signal curves for different focus positions may be normalized to a corresponding longitudinal sensor signal of the focal longitudinal optical sensor. On further details, reference may be made to the European patent application, EP 14 176 112.2, filed Aug. 7, 2014, whose contents are included herein by reference. Consequently, two to three longitudinal optical sensors are sufficient to detect a distance without any ambiguity.

FIGS. 4A to D show experimental results of further measurements in which the sensor region 130 of the longitudinal optical sensor 114 comprised lead sulfide (PbS) as the photoconductive material 134. Again, the setup of the optical detector 110 comprised a green light-emitting diode (LED) 158 which was placed 80 cm in front of the refractive lens 122 and which was, simultaneously employed as both the illumination source 156 for the optical wavelength of 530 nm and the object 112. The longitudinal optical sensor 114 with the photoconductive material 134 lead sulfide (PbS) was operated under a 10 V bias voltage provided by the bias voltage source 150. In this particular experiment, the light-emitting diode 158 was again used as the illumination source 156 which was modulated with a modulation frequency by means of the modulation device 162, wherein, however in contrast to the experiments as performed according to FIGS. 3A to C, different values for one of the photocurrent and the modulation frequency were applied. Consequently, the longitudinal sensor signal was, again, measured by using the lock-in amplifier 164.

Figure 4A:
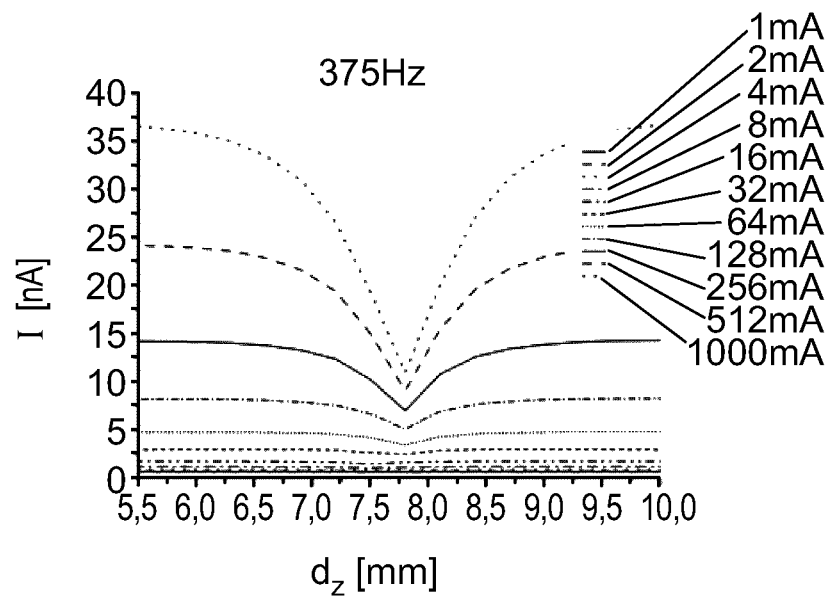
FIGS. 4A to 4D show further experimental results demonstrating the negative FiP effect by using the longitudinal optical sensor having a sensor region, wherein the sensor region comprises lead sulfide (PbS) as the photoconductive material.
Figure 4B:
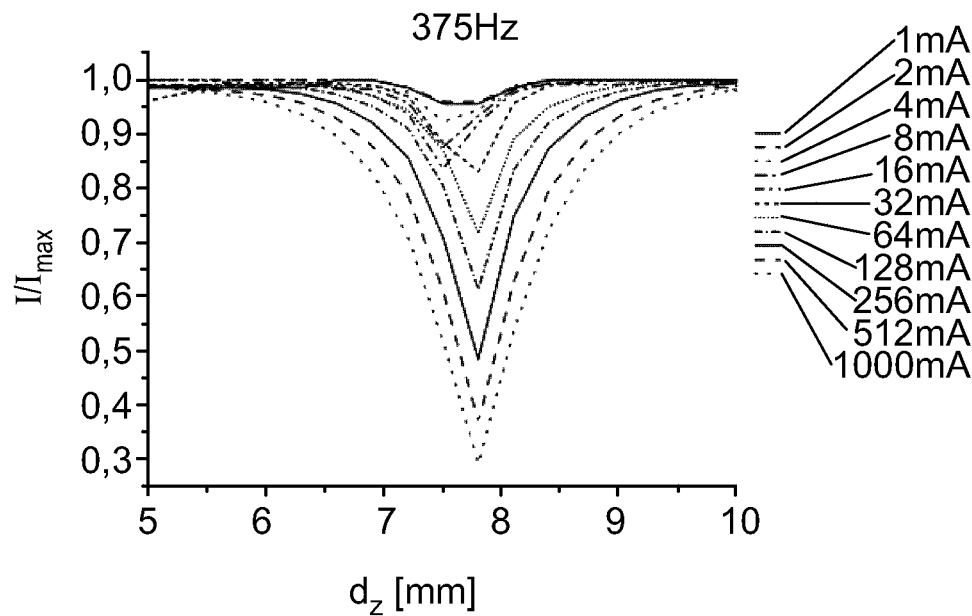

Whereas FIG. 4A shows the actual FiP curves as recorded under these conditions, wherein the modulation frequency was set to 375 Hz and the photocurrents have been varied between a minimum value of 1 mA and a maximum value of 1000 mA, FIG. 4B displays the respective normalized actual FiP which, again, demonstrate the validity of the Iso-FiP relation under these circumstances.

Figure 4C:
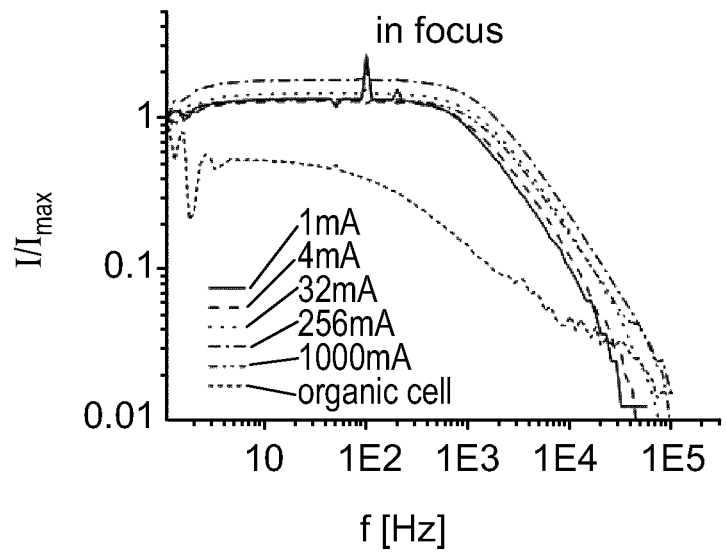
Figure 4D:
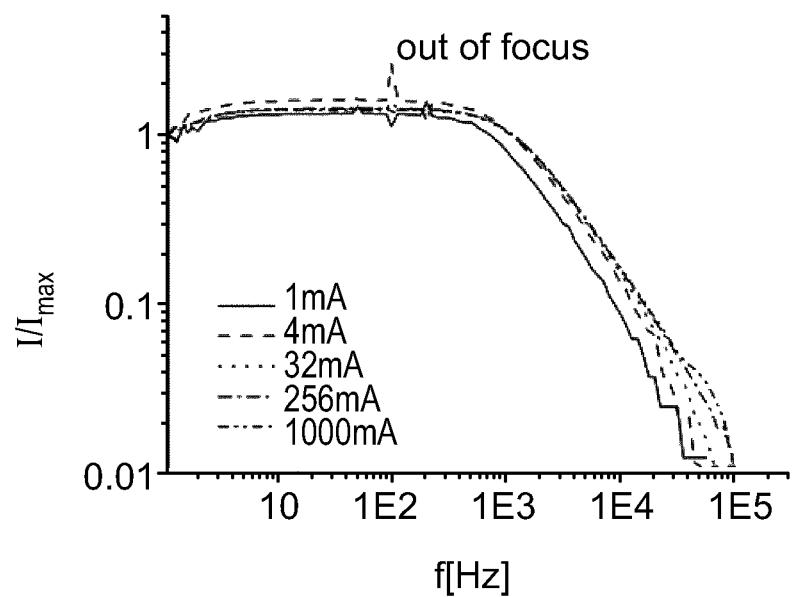

In FIGS. 4C and 4D, the FiP currents in focus (FIG. 4C) and out of focus (FIG. 4D) are recorded at a varying modulation frequency. The modulation frequencies are plotted on the x-axis in Hertz. The FiP-currents in focus are plotted on the y-axis. All curves were normalized to the value at 0 Hz. Both axis are plotted on a logarithmic scale. The different curves were recorded at varying currents which were applied for the LED-target (1 mA-1000 mA). Additionally, an organic sensor curve is shown for comparison in FIG. 4C. The curves show that the FiP-signals are not substantially affected by increasing the modulation frequency to more than 500 Hz. This result is independent of the light intensity and the focus position.

Figure 5:
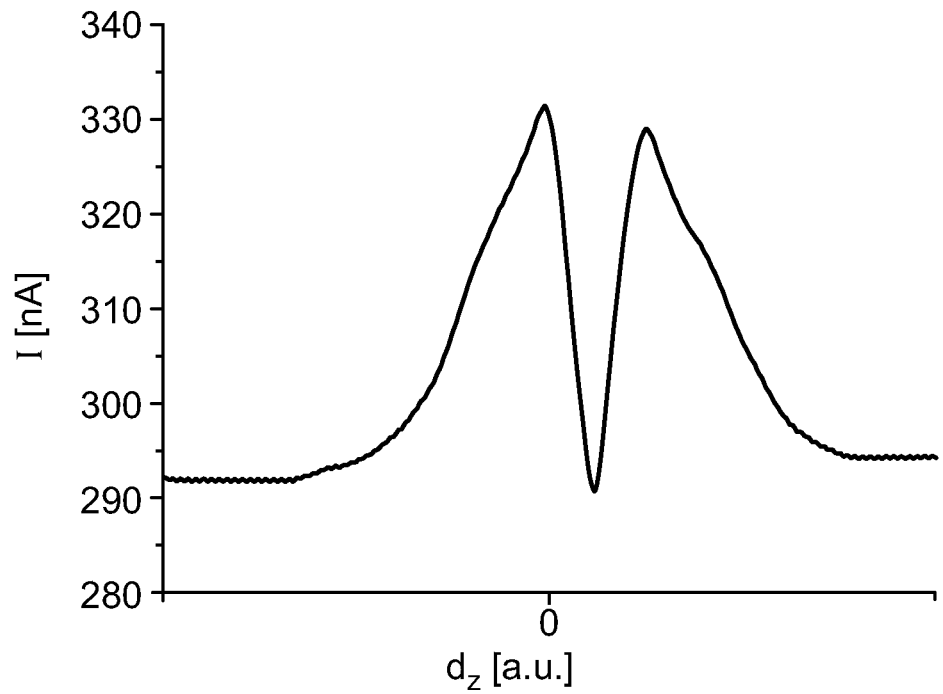
FIG. 5 shows further experimental results by using the longitudinal optical sensor having a sensor region, wherein the sensor region comprises lead sulfide (PbS) as photoconductive material, wherein the FiP effect is observed without applying a modulation to the incident light beam.

In measurement according to FIG. 5 the same setup as for the measurement pursuant to FIGS. 3A to 3C was employed, wherein, however, no modulation was applied so that the green light-emitting diode 158 emitted a light beam 132 which exhibited an optical wavelength of 530 nm in a continuous intensity. Herein, the longitudinal sensor signal was recorded by using the amplifier 154 and an oscilloscope. Thereby, the observable residual modulation in the photocurrent in FIG. 5 may be caused by an electromagnetic interference into the amplifier circuit through the power line and not by the non-existing modulation of the incident light beam 132. The observable decreasing of the intensity at both sides of the curve as shown in FIG. 5 may be attributed to the fact that, by increasing the spot size at the sensor region 130, at some point the spot size exceeds the area of the sensor region 130. Nevertheless, FIG. 5 clearly demonstrates that the occurrence of the FiP effect does not require the presence of a modulation.

FIG. 6 demonstrates that the measurements according to FIGS. 3 to 5 which have been performed in lead sulfide (PbS) as the applied photoconductive material 134 in the arrangement of the photoconductor within the sensor region 130 of the longitudinal optical sensor 114 may also be performed by using another photoconductive material 134 apart from PbS.

Figure 6A:
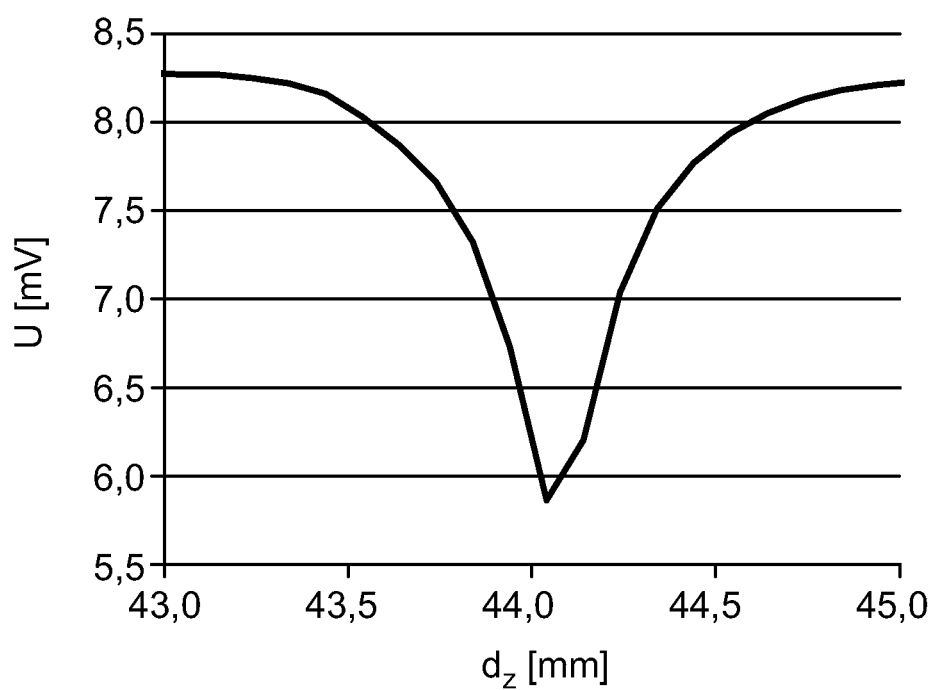
FIGS. 6A to 6H show further experimental results demonstrating the negative FiP effect by using the longitudinal optical sensor having a sensor region, wherein the sensor region comprises other photoconductive materials apart from lead sulfide (PbS), i.e. lead selenide (PbSe.

Accordingly, the photoconductive material 134 as used for the experiments as shown in FIG. 6A comprises the selenide chalcogenide lead selenide (PbSe) in the sensor region 130. Similar to the measurements according to FIG. 3A, again, the setup of the optical detector 110 comprised a light-emitting diode 158 which was placed 80 cm in front of the refractive lens 122 and which was, again, simultaneously employed as both the object 112 and the illumination source 156. This time, however, and in accordance with the known absorption spectrum of lead selenide (PbSe), the optical wavelength of 1050 nm which is located in the near infrared (NIR) spectral range was applied. The longitudinal optical sensor 114 with the photoconductive material 134 lead selenide (PbSe) was operated under a 10 V bias voltage which was provided by the bias voltage source 150. Again, the light-emitting diode 158 as the illumination source 156 was modulated with the modulation frequency of 375 Hz by using the modulation device 162. Consequently, the longitudinal sensor signal was, again, measured by using the lock-in amplifier 164. The result is the FiP curve as depicted in FIG. 6A which, again, demonstrates the occurrence of the negative FiP effect in this kind of materials.

Figure 6B:
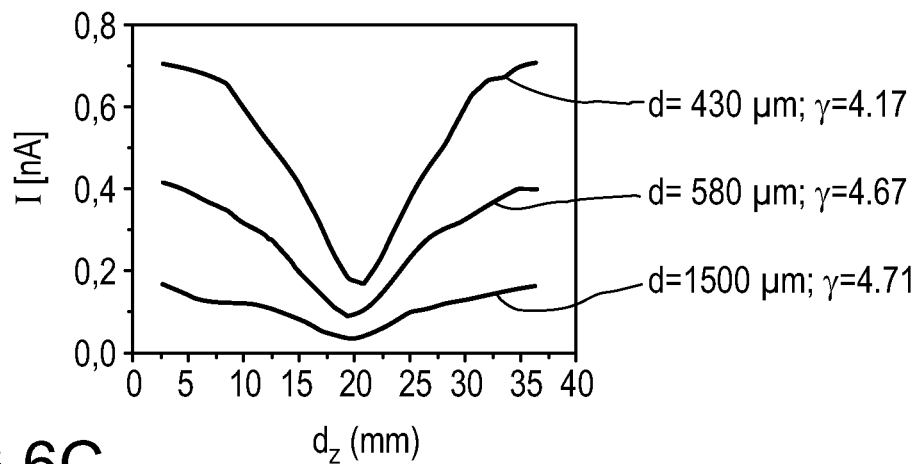
Figure 6C:
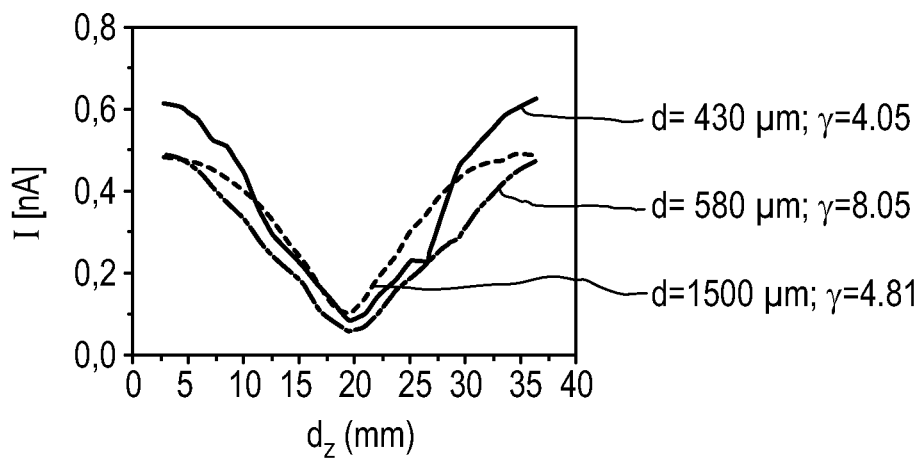

FIGS. 6B and 6C show experimental results in which the layer 168 in the sensor region 130 of the longitudinal optical sensor 114 comprised the above-mentioned 80:20 wt % mixture of P3HT:PC60BM as the organic photoconductive material 134. Herein, three different samples were used being distinguishable from each other by the corresponding thickness of the layer 168 of the organic photoconductive material 134. As indicated in the Figures, the respective thickness of the layer 168 amounted to d=430 μm, d=580 μm, and d=1500 μm.

Similar to the measurements according to FIGS. 3A and 6A, the setup of the optical detector 110 comprised a light-emitting diode 158 emitting an optical wavelength of 530 nm which was placed in front of the refractive lens 122 and which was simultaneously employed as both the object 112 and the illumination source 156. The longitudinal optical sensor 114 comprising the organic photoconductive material 134 was operated under a 10 V bias voltage which was provided by the bias voltage source 150. Further, the light-emitting diode 158 as the illumination source 156 was modulated by using a modulation frequency of 43 Hz provided by the modulation device 162, while the longitudinal sensor signal was, consequently, recorded by use of the lock-in amplifier 164.

As a result, the curves in both FIGS. 6B and 6C show that the observable photo-induced current which may be considered as the longitudinal sensor signal varied with a varying distance of the longitudinal optical sensor 114 from the object 112, thereby comprising a distinct minimum in an event in which the object 112 was focused on the longitudinal optical sensor 114. Thus, the optical detector 110 clearly exhibited the negative FiP effect, i.e. the observation of a minimum of the longitudinal sensor signal under a condition in which the organic photoconductive material 134 in the sensor region 130 is impinged by the light beam 132 with the smallest possible cross-section, which occurs in this setup when the sensor region 130 is located at the focal point 142 as effected by the refractive lens 122, i.e. at a distance of approximately 20 mm from the refractive lens 122. Further, by shifting the longitudinal optical sensor 114 up to 12.5 mm away from the focal point in both directions along the optical axis 116 the size of the light spot was filling most of the area of the sensor region 130 between the electrodes 176, 178.

The ratio which provides a quotient between the photo-induced current of the sensor region 130 being located at the focal point 142 to the sensor region 130 outside the focal point 142 assumes a value from 4 to 5 as indicated in FIG. 6B. The ratio could, however, be increased to a value more than 8 in a further experiment as depicted in FIG. 6C in which the same samples were used as for the experiment of FIG. 6B after they had been exposed to a halogen lamp in air, which is known to cause a doping of the organic photoconductive material P3HT:PC60BM. As can further be derived from both FIGS. 6B and 6C, generally, the ratio r assumes a high value, in particular since the photo-induced current nearly seem to vanish when the sensor region 130 becomes located near the focal point 142.

Figure 6D:
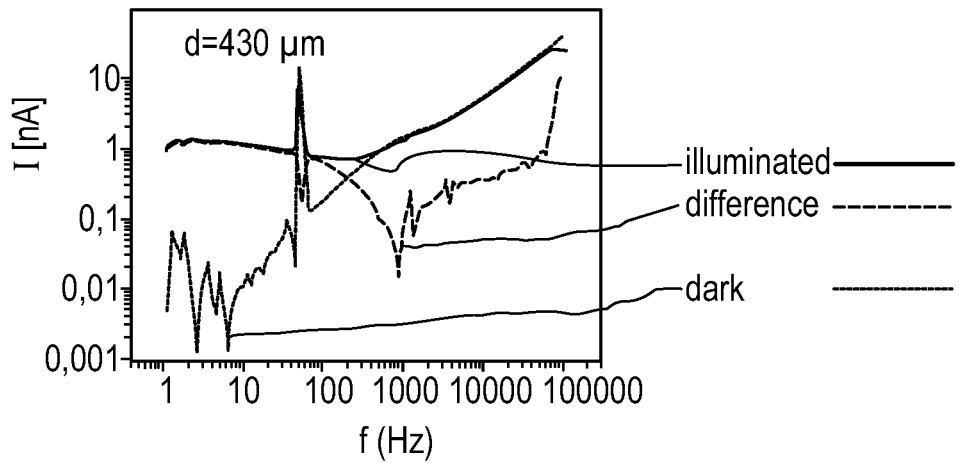

Further, FIG. 6D shows that the observable photo-induced current as the longitudinal sensor signal is a distinct function of the modulation frequency $f$ of the incident light beam. For this purpose, a single sample was used in which the layer 168 in the sensor region 130 of the longitudinal optical sensor 114 comprised the above-mentioned 80:20 wt % mixture of P3HT:PC60BM as the organic photoconductive material 134 and exhibited a thickness of d=430 μm. Accordingly, FIG. 6D displays three different curves whereof two were recorded under different illumination conditions:

with illumination by the light-emitting diode 158 emitting a wavelength of 530 nm; indicated as "illuminated"; and without illumination; indicated as "dark"; and with the third curve indicated as "difference" provides the difference between the respective values for the illuminated curve minus the values for the dark curve. As can be derived from a comparison of the three different curves in FIG. 6D, the measured signal proved to be undistinguishable from a noise level of the setup at a frequency above approximately 1 kHz. On the other hand, at a frequency below approximately 50 Hz, a signal-to-noise-ratio of approximately 100 can be observed. It may be mentioned that the obtained peak at a frequency of 50 Hz can be attributed to the frequency of the mains supply. Thus, the longitudinal optical sensors 114 in which the layer 168 in the sensor region 130 comprises the above-mentioned mixture of P3HT: PC60BM as the organic photoconductive material 134 may, particularly, be used for a determination of the FiP effect at a frequency below 100 Hz, preferably below 50 Hz. In this frequency range the noise seems to be considerably low, in particular due to a virtually zero leakage current in this kind of materials.

Figure 6E:
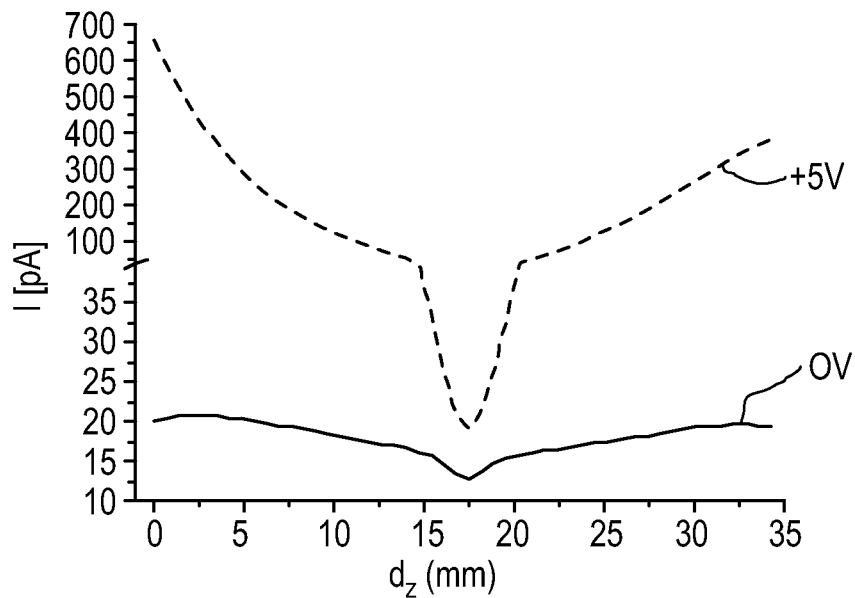
Figure 6F:
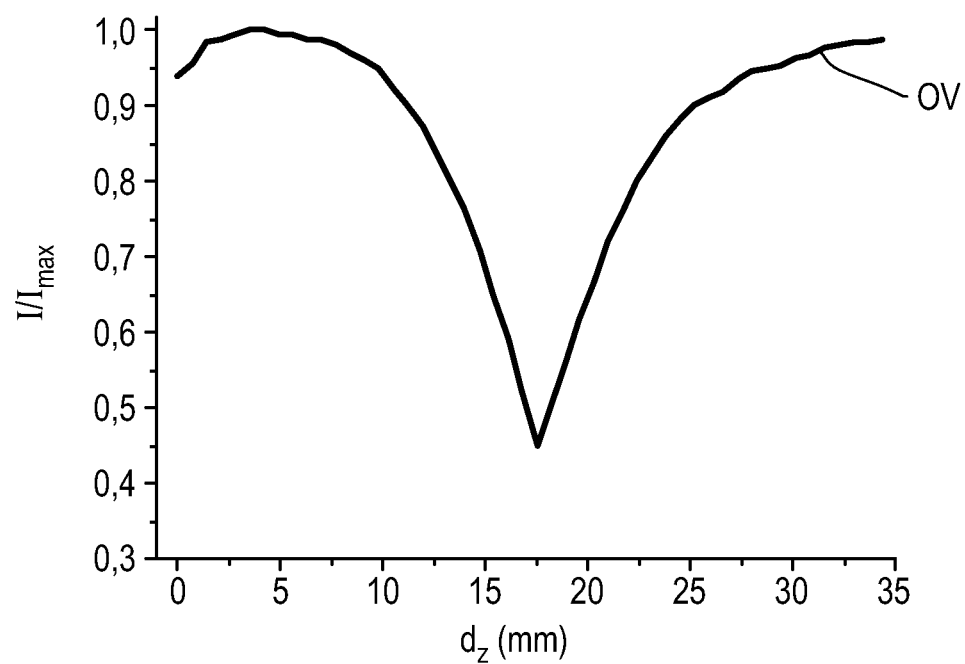
Figure 6G:
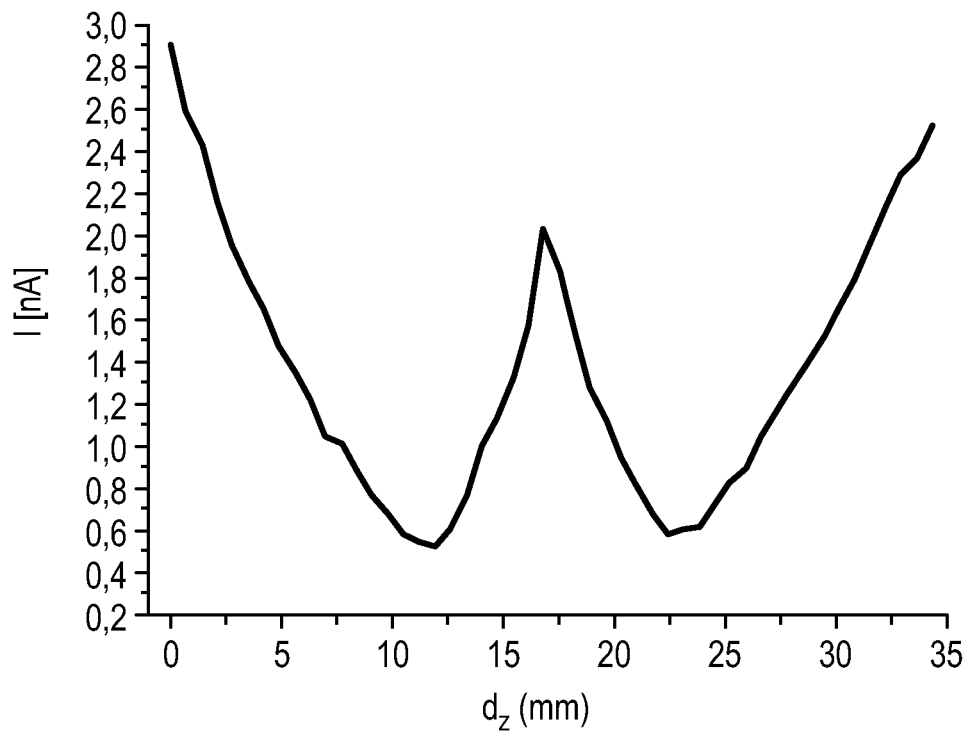

FIGS. 6E to 6G illustrate further experimental examples in which the photoconductive material 134 within the sensor region 130 comprises a layer 168 of antimony trisulfide ($Sb_2S_3$). In the particular example as shown in FIGS. 6E and 6F, the layer 168 of the $Sb_2S_3$ exhibited a thickness of 400 nm and was sandwiched by a silver (Ag) electrode 176, 178 and a silver(I) selenide ($Ag_2Se$) substrate 170. Herein, the longitudinal optical sensor 114 was operated under either a 5 V bias voltage across the longitudinal optical sensor 114 comprising this sample (see FIG. 6E, dashed line) or, alternatively, without an application of the bias voltage (see FIG. 6E, solid line; and FIG. 6F in amplified depiction). The FiP curves recorded without the application of a bias voltage in FIGS. 6F and 6G demonstrate that the longitudinal optical sensor 114 behaves here as a Schottky diode as, for example, described by J. P. Clifford et al., s. o. Accordingly, the incident light beam 132 may generate charge carriers, i.e. electrons and holes, within the layer 168 of the antimony trisulfide. Herein, the charge carriers may be collected at the boundaries towards both the silver(I)selenide substrate 170 and the silver electrode 176, 178. Thus, a depletion region may be formed within the layer 168 of the antimony trisulfide towards a Schottky barrier that may be located at an interface between the silver electrode 176, 178 and the layer 168 of the antimony trisulfide. Again, the light-emitting diode 158 as the illumination source 156 was modulated with the modulation frequency of 375 Hz by applying the modulation device 162 using 100 ms long current pulses with an amplitude of 1000 mA. Consequently, the longitudinal sensor signal was, again, measured by using the lock-in amplifier 164. In both cases, the result are the FiP curves as depicted in FIGS. 6E and 6F which, again, demonstrate the occurrence of the negative FiP effect under the mentioned conditions in this kind of material.

In contrast thereto, in the example as shown in FIG. 6G, the layer 168 of the antimony trisulfide exhibited a thickness of 1.3 μm and was sandwiched by a silver (Ag) electrode 176, 178 and a transparent indium tin oxide (ITO) substrate 170. Probably due to a higher intensity of the illumination with respect to the sample which had been used for recording the curves in FIGS. 6E and 6F, a positive FIP effect could be monitored here without an application of a bias voltage across the longitudinal optical sensor 114 comprising this sample. Again, FIG. 6G demonstrates that the longitudinal optical sensor 114 comprising this embodiment of the layer 168 of the antimony trisulfide behaves here as a Schottky diode similar as in the example presented in FIG. 6F. Further, it may be mentioned that the increase in current as shown in FIG. 6G for short distances below approx. 13 mm as well as for large distances above approx. 24 mm may, similar to FIG. 5, originate from a geometrical effect that, by increasing the spot size at the sensor region 130, at some point the spot size exceeds the area of the sensor region 130.

Figure 6H:
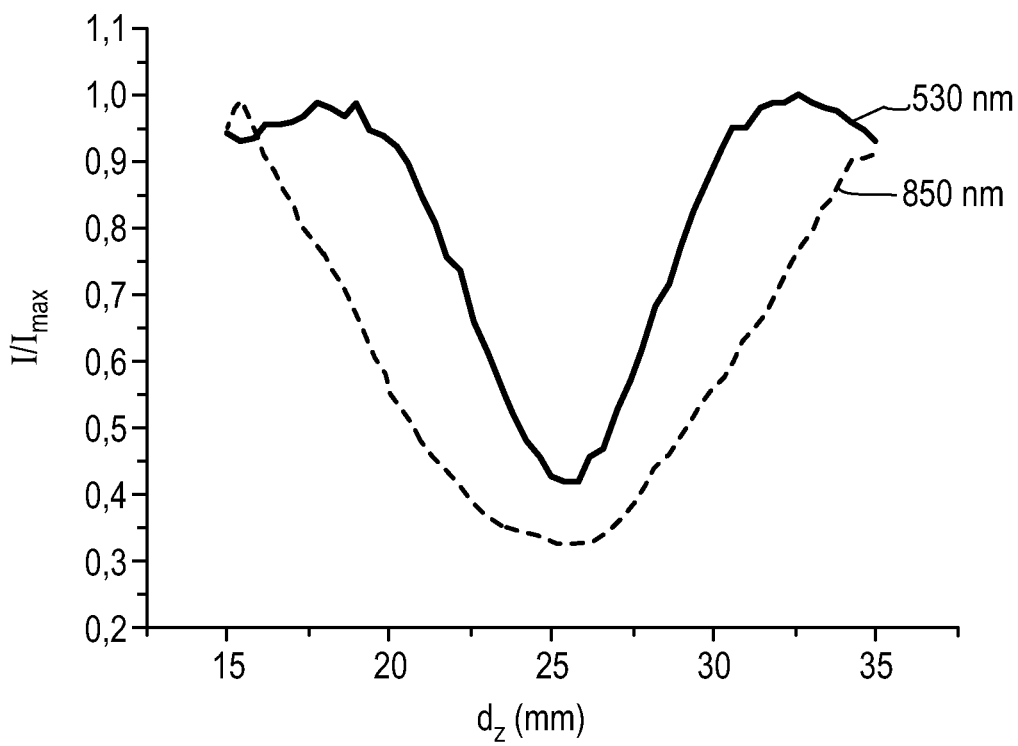

Finally, FIG. 6H illustrates further experimental results for which a 15 mm×15 mm doped crystalline silicon (Si) sample comprising a low dopant concentration and a low defect density was employed and furnished with contacts in a manner of a photoconductor in order to provide a silicon-based photoconductor which exhibited a high resistivity, a high charge-carrier lifetime, and a low surface recombination rate. As described above, the photoconductive material may here be contacted by an Ohmic contact, thus, providing an electrical junction which may exhibit a linear current-voltage ratio according to Ohm's law but does not comprise any photovoltaic properties. For this purpose, the silicon sample showing an electrical resistivity from 770 to 2020 Ω·cm was used. The experimental results as depicted in FIG. 6H were obtained by applying a bias voltage of 10 V across the longitudinal optical sensor 114 comprising this sample, thereby using two different wavelengths for the illumination, i.e. 530 nm (solid line) and 850 nm (dashed line), in order to investigate the behavior of this sample in the visual and the infrared spectral range, respectively. In both spectral ranges, the negative FIP effect could be observed.

As described above, the optical detector 110 may comprise a single longitudinal optical sensor 114 or, as e.g. disclosed in WO 2014/097181 A1, a stack of longitudinal optical sensors 114, particularly in combination with one or more transversal optical sensors 184. Hereby, using a layer of the organic photoconductive materials in the longitudinal optical sensors 114 may, particularly, by preferred, mainly due to the transparency, semitransparency or translucency of the organic photoconductive materials. As an example, one or more transversal optical sensors 184 may be located on a side of the stack of longitudinal optical sensors 114 facing towards the object. Alternatively or additionally, one or more transversal optical sensors 184 may be located on a side of the stack of longitudinal optical sensors 114 facing away from the object. Again, additionally or alternatively, one or more transversal optical sensors 184 may be interposed in between the longitudinal optical sensors 114 of the stack. However, embodiments which may only comprise a single longitudinal optical 114 sensor but no transversal optical sensor 184 may still be possible, such as in a case wherein only determining the depth, i.e. the z-coordinate, of the object may be desired.

Thus, in a case in which determining the x- and/or y-coordinate of the object in addition to the z-coordinate may be desired, it may be advantageous to employ, in addition to the at one longitudinal optical sensor 114 at least one transversal optical sensor 184 which may provide at least one transversal sensor signal. For potential embodiments of the transversal optical sensor, reference may be made to WO 2014/097181 A1. Accordingly, the transversal optical sensor 184 may be a photo detector having at least one first electrode, at least one second electrode and at least one photovoltaic material, wherein the photovoltaic material, preferably, one or more dye-sensitized organic solar cells, such as one or more solid dye-sensitized organic solar cells, may be embedded in between the first electrode and the second electrode.

Figure 7A:
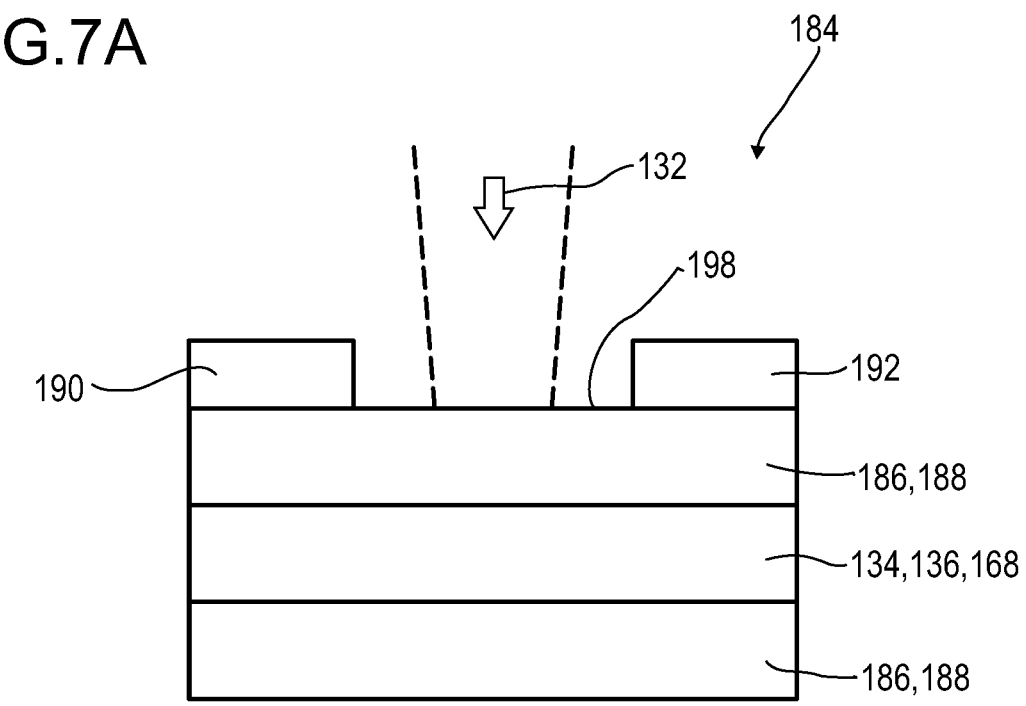
FIGS. 7A and 7B show further exemplary embodiments of a transversal optical sensor having a layer of a photoconductive material in the arrangement as a photoconductor.

In contrast to this known embodiment, FIG. 7A shows a side view of a preferred exemplary embodiment of the transversal optical sensor 184 pursuant to the present invention.

Accordingly, the transversal optical sensor 184 has a layer 168 of the photoconductive material 134 which, in particular comprises a chalcogenide 136, such as lead sulfide (PbS), lead selenide (PbSe), or another appropriate material. Herein, the layer 168 of the photoconductive material 134 may, preferably, be embedded in between two layers 186 of a transparent conducting oxide 188, preferably comprising indium tin oxide (ITO), fluorine doped tin oxide (FTO), or magnesium oxide (MgO). However, other material may be feasible, in particular according to the desired transparent spectral range.

Figure 7B:
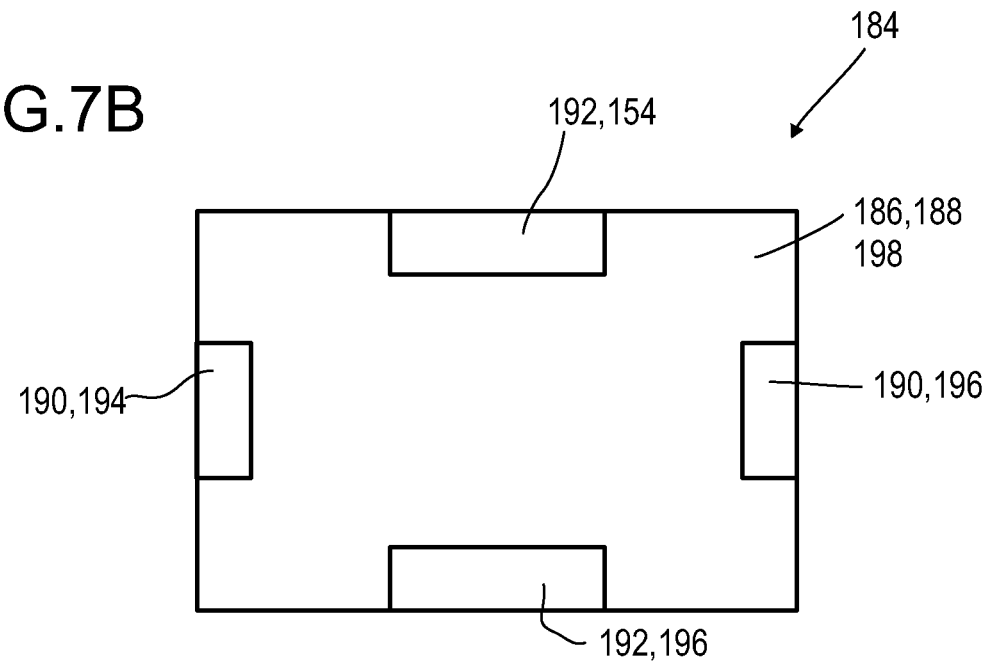

Further, at least two electrodes 190, 192 may be present for recording the transversal optical signal. As schematically depicted in the side view of the of the transversal optical sensor 184 according to FIG. 7B, at least of the electrodes 190, 192 of the transversal optical sensor 184 may be a split electrode having at least two partial electrodes 194, 196, wherein the transversal optical 184 sensor may have a sensor area 198, wherein the at least one transversal sensor signal may indicate a x- and/or a y-position of the incident light beam 132 within the sensor area 198 in a similar manner as described for the transversal optical sensor 184 as disclosed in WO 2014/097181 A1. Accordingly, the transversal optical sensor 184 may comprise the sensor area 198, which, preferably, may be transparent to the light beam 132 travelling from the object 112 to the detector 110. The transversal optical sensor 184 may, therefore, be adapted to determine a transversal position of the light beam 132 in one or more transversal directions, such as in x- and/or in y-direction. For this purpose, the at least one transversal optical sensor 184 may further be adapted to generate at least one transversal sensor signal. Thus, the evaluation device 140 may be designed to generate at least one item of information on a transversal position of the object 112 by evaluating the transversal sensor signal of the longitudinal optical sensor 184.

Figure 8:
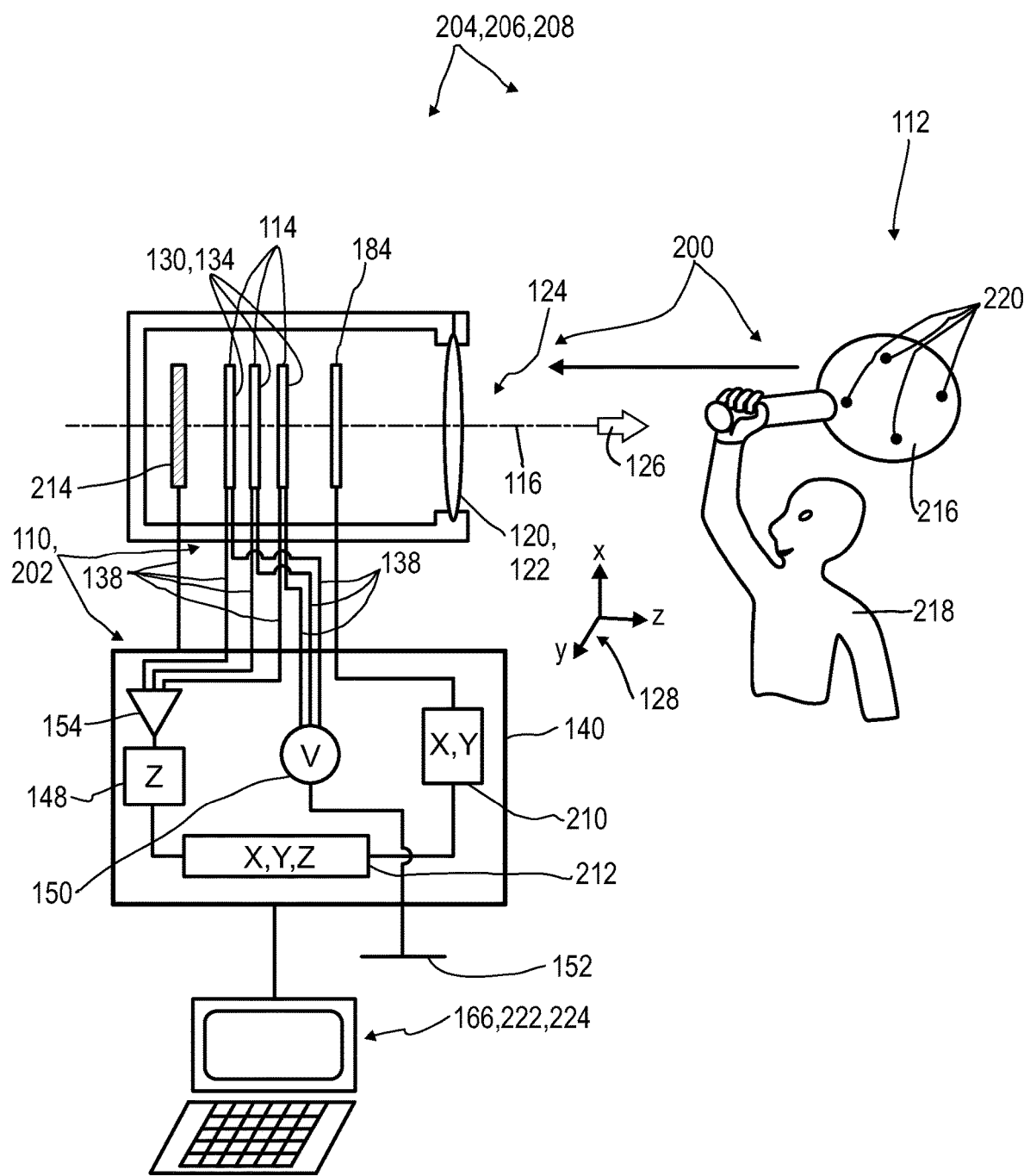
FIG. 8 shows an exemplary embodiment of an optical detector, a detector system, a human-machine interface, an entertainment device, a tracking system and a camera according to the present invention.

As an example, FIG. 8 shows an exemplary embodiment of a detector system 200, comprising at least one optical detector 110, such as the optical detector 110 as disclosed in one or more of the embodiments shown in FIGS. 1 to 7 and 9 to 12. Herein, the optical detector 110 may be employed as a camera 202, specifically for 3D imaging, which may be made for acquiring images and/or image sequences, such as digital video clips. Further, FIG. 8 shows an exemplary embodiment of a human-machine interface 204, which comprises the at least one detector 110 and/or the at least one detector system 200, and, further, an exemplary embodiment of an entertainment device 206 comprising the human-machine interface 204. FIG. 8 further shows an embodiment of a tracking system 208 adapted for tracking a position of at least one object 112, which comprises the detector 110 and/or the detector system 200.

With regard to the optical detector 110 and to the detector system 200, reference may be made to the full disclosure of this application. Basically, all potential embodiments of the detector 110 may also be embodied in the embodiment shown in FIG. 8. The evaluation device 140 may be connected to each of the at least two longitudinal optical sensors 114, in particular, by the signal leads 138. As described above, a use of two or, preferably, three longitudinal optical sensors 114 may support the evaluation of the longitudinal sensor signals without any remaining ambiguity. The evaluation device 140 may further be connected to the at least one optional transversal optical sensor 184, in particular, by the signal leads 138. By way of example, the signal leads 138 may be provided and/or one or more interfaces, which may be wireless interfaces and/or wire-bound interfaces. Further, the signal leads 138 may comprise one or more drivers and/or one or more measurement devices for generating sensor signals and/or for modifying sensor signals. Further, again, the at least one transfer device 120 may be provided, in particular as the refractive lens 122 or convex mirror. The optical detector 110 may further comprise the at least one housing 118 which, as an example, may encase one or more of components 114, 184.

Further, the evaluation device 140 may fully or partially be integrated into the optical sensors 114, 184 and/or into other components of the optical detector 110. The evaluation device 140 may also be enclosed into housing 118 and/or into a separate housing. The evaluation device 140 may comprise one or more electronic devices and/or one or more software components, in order to evaluate the sensor signals, which are symbolically denoted by the longitudinal evaluation unit 148 (denoted by "z") and a transversal evaluation unit 210 (denoted by "xy") and. By combining results derived by these evolution units 154, 156, a position information 212, preferably a three-dimensional position information, may be generated (denoted by "x, y, z"). Similar to the embodiment according to FIG. 1, a bias voltage source 150 may be provided configured to provide a bias voltage above ground 152. Further, the longitudinal sensor signals as provided by the longitudinal optical sensors 114 may first be amplified by means of an amplifier 154 before supplying it to the longitudinal evaluation unit 148.

Further, the optical detector 110 and/or to the detector system 200 may comprise an imaging device 214 which may be configured in various ways. Thus, as depicted in FIG. 8, the imaging device 214 can for example be part of the detector 110 within the detector housing 118. Herein, the imaging device signal may be transmitted by one or more imaging device signal leads 138 to the evaluation device 140 of the detector 110. Alternatively, the imaging device 214 may be separately located outside the detector housing 118. The imaging device 214 may be fully or partially transparent or intransparent. The imaging device 214 may be or may comprise an organic imaging device or an inorganic imaging device. Preferably, the imaging device 214 may comprise at least one matrix of pixels, wherein the matrix of pixels may particularly be selected from the group consisting of: an inorganic semiconductor sensor device such as a CCD chip and/or a CMOS chip; an organic semiconductor sensor device.

In the exemplary embodiment as shown in FIG. 8, the object 112 to be detected, as an example, may be designed as an article of sports equipment and/or may form a control element 216, the position and/or orientation of which may be manipulated by a user 218. Thus, generally, in the embodiment shown in FIG. 8 or in any other embodiment of the detector system 200, the human-machine interface 204, the entertainment device 206 or the tracking system 208, the object 112 itself may be part of the named devices and, specifically, may comprise the at least one control element 216, specifically, wherein the at least one control element 216 has one or more beacon devices 220, wherein a position and/or orientation of the control element 216 preferably may be manipulated by user 218. As an example, the object 112 may be or may comprise one or more of a bat, a racket, a club or any other article of sports equipment and/or fake sports equipment. Other types of objects 112 are possible. Further, the user 218 may be considered as the object 112, the position of which shall be detected. As an example, the user 218 may carry one or more of the beacon devices 220 attached directly or indirectly to his or her body.

The optical detector 110 may be adapted to determine at least one item on a longitudinal position of one or more of the beacon devices 220 and, optionally, at least one item of information regarding a transversal position thereof, and/or at least one other item of information regarding the longitudinal position of the object 112 and, optionally, at least one item of information regarding a transversal position of the object 112. Particularly, the optical detector 110 may be adapted for identifying colors and/or for imaging the object 112, such as different colors of the object 112, more particularly, the color of the beacon devices 220 which might comprise different colors. The opening 124 in the housing 118, which, preferably, may be located concentrically with regard to the optical axis 116 of the detector 110, may preferably define a direction of a view 126 of the optical detector 110.

The optical detector 110 may be adapted for determining the position of the at least one object 112. Additionally, the optical detector 110, specifically an embodiment including the camera 202, may be adapted for acquiring at least one image of the object 112, preferably a 3D-image. As outlined above, the determination of a position of the object 112 and/or a part thereof by using the optical detector 110 and/or the detector system 200 may be used for providing a human-machine interface 204, in order to provide at least one item of information to a machine 222. In the embodiments schematically depicted in FIG. 8, the machine 222 may be or may comprise at least one computer and/or a computer system comprising the data processing device 166. Other embodiments are feasible. The evaluation device 140 may be a computer and/or may comprise a computer and/or may fully or partially be embodied as a separate device and/or may fully or partially be integrated into the machine 222, particularly the computer. The same holds true for a track controller 224 of the tracking system 208, which may fully or partially form a part of the evaluation device 140 and/or the machine 222.

Similarly, as outlined above, the human-machine interface 204 may form part of the entertainment device 206. Thus, by means of the user 218 functioning as the object 112 and/or by means of the user 218 handling the object 112 and/or the control element 216 functioning as the object 112, the user 218 may input at least one item of information, such as at least one control command, into the machine 222, particularly the computer, thereby varying the entertainment function, such as controlling the course of a computer game.

Figure 9:
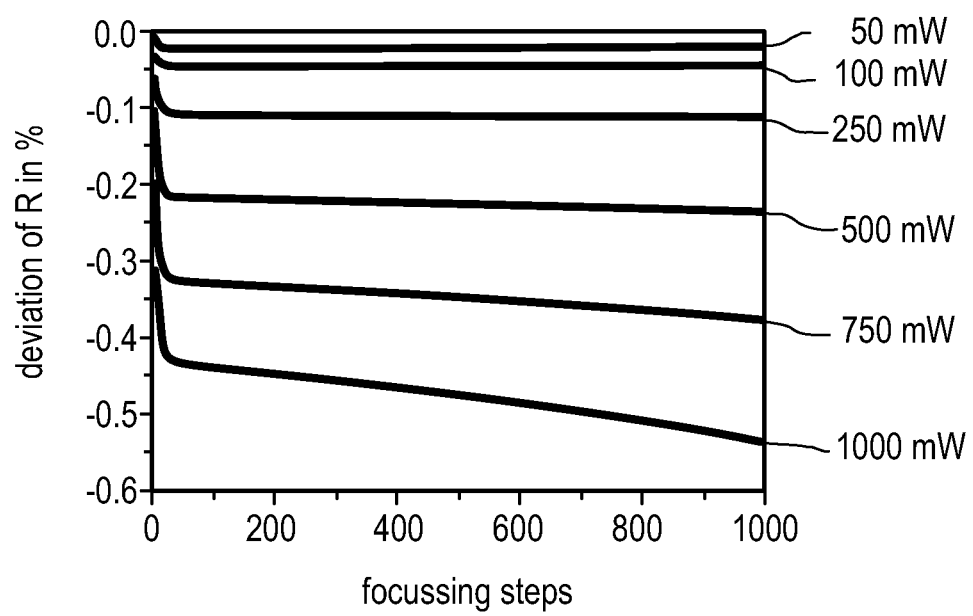
FIG. 9 shows a simulation of a change in a resistance of a longitudinal sensor signal in a detector having an interconnected array of longitudinal optical sensors.

FIG. 9 shows a simulation of a change in a resistance in percent of the longitudinal sensor signal in a detector which comprises an interconnected array of individual photoconductors as the longitudinal optical sensor 114. In FIG. 9, the resistance for an entire grid comprising the interconnected array is depicted for a number of focusing steps, starting from the fully illuminated array and, consecutively, increasing the focus of the light beam 132 step-by-step, thereby, however, maintaining the incident power of the illumination for each of the levels from 50 mW to 1000 mW as indicated. Hereby, the value of the resistance for the first step which corresponds to the fully illuminated array was used as a reference.

For this simulation, a resistor network software was initially compared with experimental results for photoconductors comprising PbS as the photoconductive material in the longitudinal optical sensor. After having achieved reasonable agreement between simulation and experiment, an interconnected array of individual photoconductors was employed for simulation. Herein, the array yielded an aggregate DC resistance which turned out to be non-linear with respect to the illumination density as long as not all of the individual photoconductors were illuminated equally. This feature could even be observed in a case in which the individual photoconductors exhibit a perfectly linear resistive response to the illumination density. Consequently, this feature could be employed to determine the cross-section of the light beam 132 on the array within the sensor region 130 and, hence, the distance between the detector 110 and the source of the light or IR radiation, even within the LWIR spectral range, i.e. from 5 µm to 15 µm. For the purposes of the simulation, a Gaussian profile was assumed for the light beam 132, which, at the first step, significantly overfilled the array until it was consecutively reduced in diameter in the following steps.

Figure 10A:
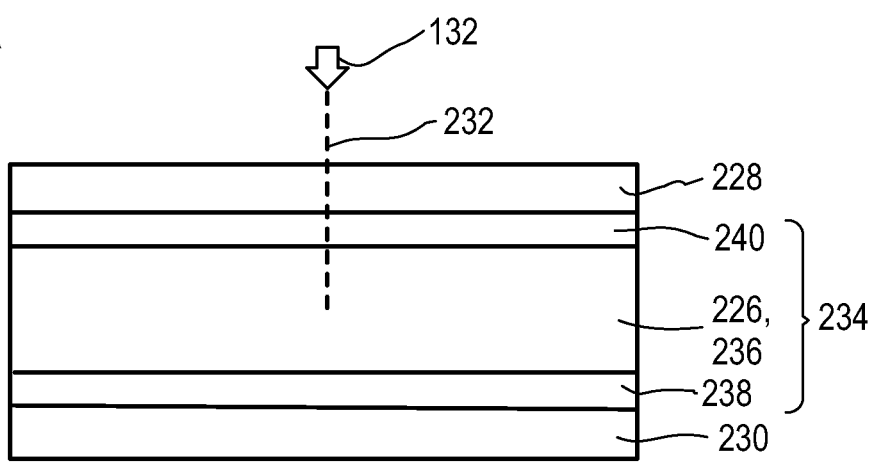
FIGS. 10A to 10G show a further exemplary embodiment of the longitudinal optical sensor in the arrangement as a photodiode (FIG. 10A) as well as experimental results demonstrating the positive FiP effect obtained by using this arrangement which comprises a layer of amorphous silicon (a-Si:H.

FIG. 10A shows a further exemplary embodiment of an arrangement of the longitudinal optical sensor 114. Herein, the longitudinal optical sensor 114 has a layer 226 of a material capable of sustaining an electrical current located between a first electrode 228 and a second electrode 230. Herein, the sensor region 130 comprises the material being capable of sustaining an electrical current, wherein the electrical current of the material, given the same total power of the illumination, is dependent on the beam cross-section of the light beam 132 in the sensor region 130. In particular for enabling the light beam 132 to reach the layer 226, the first electrode 228 being located within the beam path 232 of the incident light beam 132 is at least partially optically transparent. Preferably, the at least partially optically transparent first electrode 228 may, thus, comprise one or more transparent conductive oxides (TCO), in particular indium-doped tin oxide (ITO). The second electrode 230, also denominated as "back electrode", was here selected to be optically intransparent, and may, thus, comprise a metal electrode. As schematically depicted in FIG. 10A, the second electrode 230 may, herein, comprise a uniform metal layer. Alternatively, the second electrode 230 may be a split electrode which might be arranged as a number of partial electrodes or in form of a metallic grid. In this embodiment, the layer 226 is exemplarily arranged in order to form a PIN diode 234. As shown in FIG. 10A, the PIN diode 234 comprises an i-type semiconductor layer 236 being located between an n-type semiconductor layer 238 and a p-type semiconductor layer 240. In particular, the i-type semiconductor layer 236 exhibits a thickness which exceeds the thickness of the n-type semiconductor layer 238 as well as of the p-type semiconductor layer 240.

Figure 10B:
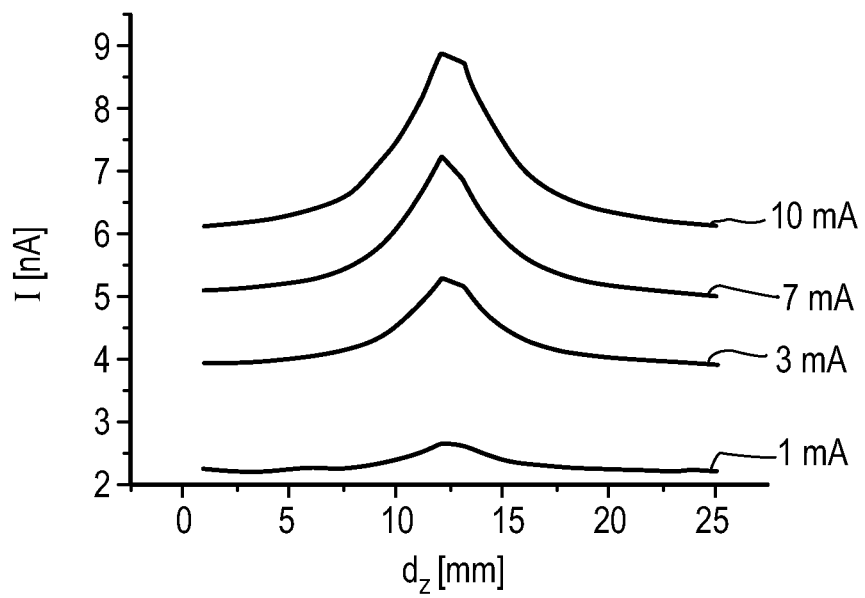

In the example as depicted in FIG. 10B, all three layers, i.e. the i-type, the n-type, and the p-type semiconductor layers 236, 238, 240, comprised optically transparent hydrogenated amorphous silicon (a-Si:H). Herein, the thickness of the i-type semiconducting layer was approx. 690 nm while the thickness of both the n-type and the p-type semiconductor layer was below 50 nm. The PIN diode 234 which comprises a-Si and/or a-Si:H in at least one of the semiconductor layers 236, 238, 240 may preferably be employed in the detector 110 in a case in which the incident beam 132 has a wavelength within the visual spectral range, especially from 380 nm to 700 nm.

As shown in FIG. 10B, the positive FiP effect could be observed in the longitudinal sensor 114 comprising the arrangement as schematically depicted in FIG. 10A. Herein, for a modulation frequency of 375 Hz, resulting FiP curves, i.e. ac photocurrents I in nA vs. a distance d of the longitudinal optical sensor 114 from the object 112, are presented for a number of different illumination intensities, which are given in control currents in mA as required for controlling an light-emitting diode 158 as the modulated illumination source 160. It is emphasized here that a control current of 1 mA for controlling the light-emitting diode 158 corresponds to a very weak 5 nA longitudinal sensor signal. Thus, FIG. 10B further demonstrates that a considerably high signal-to-noise ratio compared to other known FiP devices could be observed here.

Figure 10C:
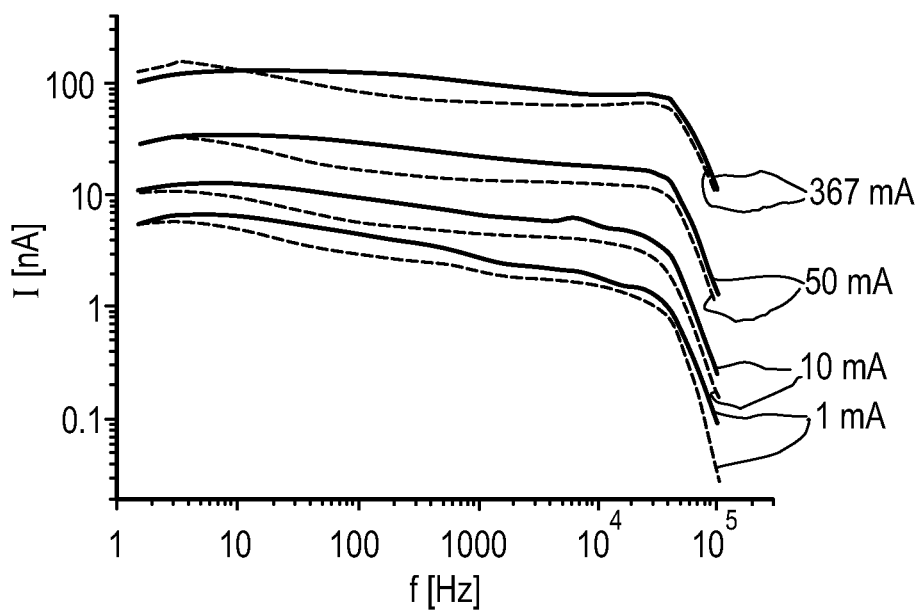

Moreover, as can be derived from FIG. 10C, the ac current I as the longitudinal sensor signal exhibits a substantially frequency-independent behavior in a range of a modulation frequency f of the light beam of 0 Hz to 50 kHz. Herein, the solid lines represent the respective curves in an in-focus position while the dashed lines refer to a 2 cm out-of-focus position. The various curves relate to various settings of a bias current from 1 mA to 367 mA. The curves as presented here are all taken without room light.

Figure 10D:
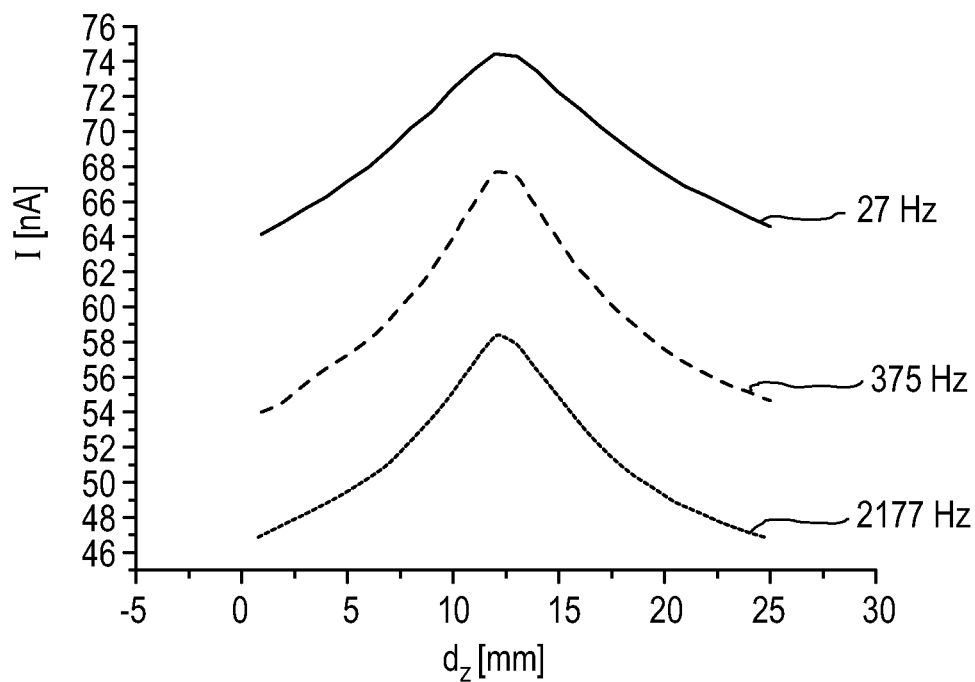
Figure 10E:
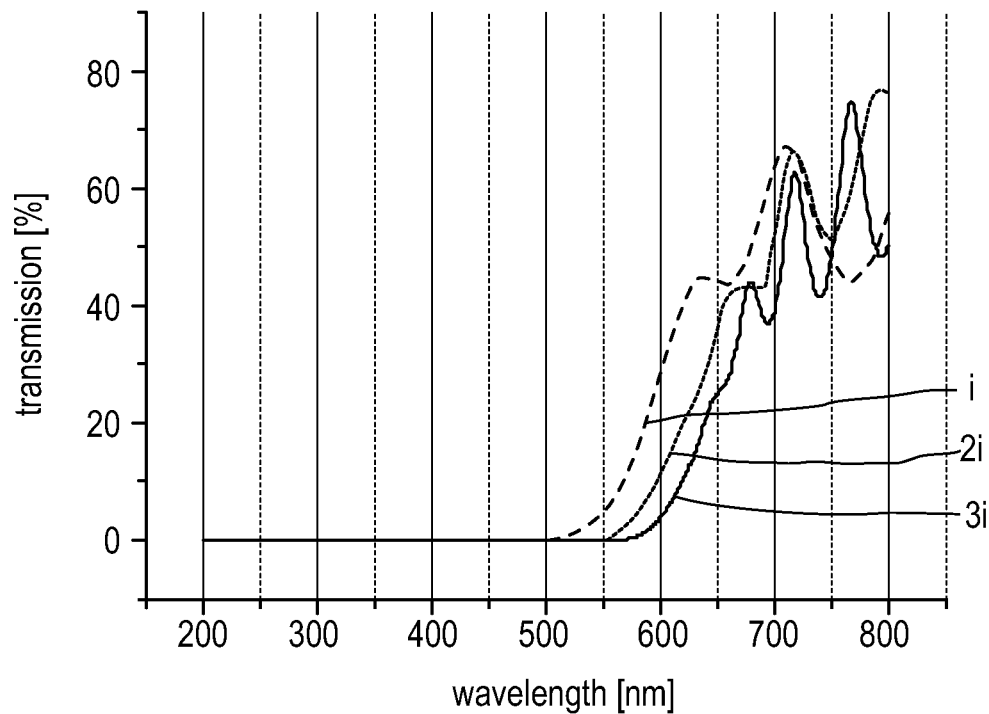

Further, FIG. 10D illustrates a variation of the FIP curves as observed for different modulation frequencies of 27 Hz (solid line), 375 Hz (dashed line), and 2177 Hz (dotted line), whereby the modulation current of 69 mA and the illumination wavelength of 530 nm were kept constant. No bias voltage was applied here to the sample. Further, from FIG. 10E it can be derived that the amplitude of the optical transmission for the optically transparent a-Si:H depends over a wavelength range from 500 nm to 800 nm on the thickness of the i-type semiconducting layer. As illustrated in FIG. 10E, the transmission optical depends on the thickness of the optically transparent hydrogenated amorphous silicon (a-Si:H). Herein, i denotes a thickness of the optically transparent layer of 230 nm, whereas 2i refers to a thickness of 460 nm and 3i to a thickness of 690 nm.

In an alternative embodiment (not depicted here), at least one of the i-type semiconductor layer 236, the n-type semiconductor layer 238, and the p-type semiconductor layer 240 in the PIN diode 234 comprises an amorphous silicon carbon alloy (a-SiC), preferably a hydrogenated amorphous silicon carbon alloy (a-SiC:H). In this alternative embodiment, at least one of the p-type semiconductor layer 240 or the i-type semiconductor layer 236 may exhibit a thickness from 2 nm to 20 nm, preferably from 4 nm to 10 nm, in particular about 5 nm. This kind of alternative PIN diode 234 may preferably be used in the detector 110 according to the present invention for detecting a wavelength of the incident beam 132 within the UV wavelength range, in particular, completely over at least one of UVA wavelength range from 315 nm to 400 nm and the UVB wavelength range from 280 nm to 315 nm.

Figure 10F:
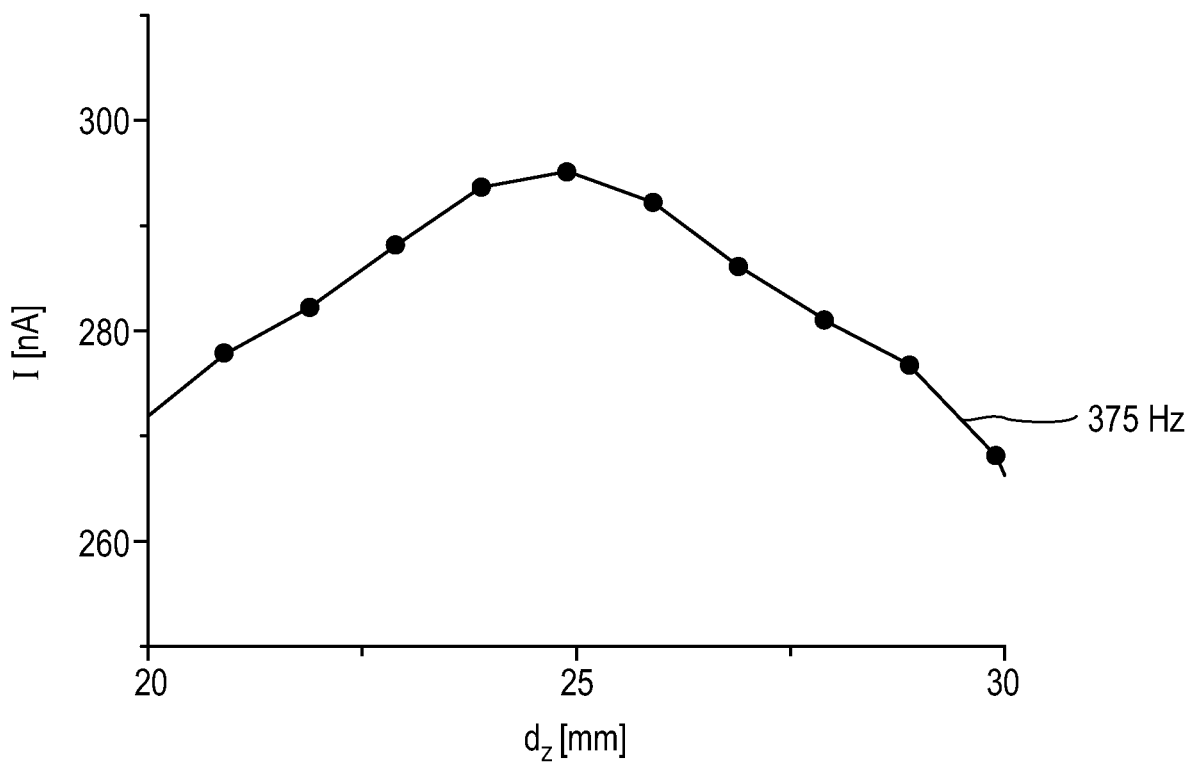

In a further alternative embodiment as illustrated in FIG. 10F, at least one of the three kinds of the layers, preferably all of the three kinds of the layers, i.e. the i-type semiconductor layer 236, the n-type semiconductor layer 238, and the p-type semiconductor layer 240 in the PIN diode 234, comprise a microcrystalline silicon (μc-Si), preferably a hydrogenated microcrystalline silicon (μc-Si:H). Alternatively (not depicted here), an amorphous alloy of germanium and silicon (a-GeSi), preferably a hydrogenated amorphous germanium silicon alloy (a-GeSi:H), can also be used. This further kind of alternative PIN diode 234 may preferably be suitable for detecting wavelengths within the NIR wavelength range from 760 nm to 1400 nm, in particular from 760 nm to 1000 nm. Therefore, the curve as shown in FIG. 10F has been recorded by using an illumination source with the wavelength of 850 nm and the modulation frequency of 375 Hz. The longitudinal optical sensor 114 equipped with this kind of alternative PIN diode 234 may, in particular, be employed for night vision or fog vision or in case animals or human being may be left undisturbed for any reason by using an NIR illumination source.

Figure 10G:
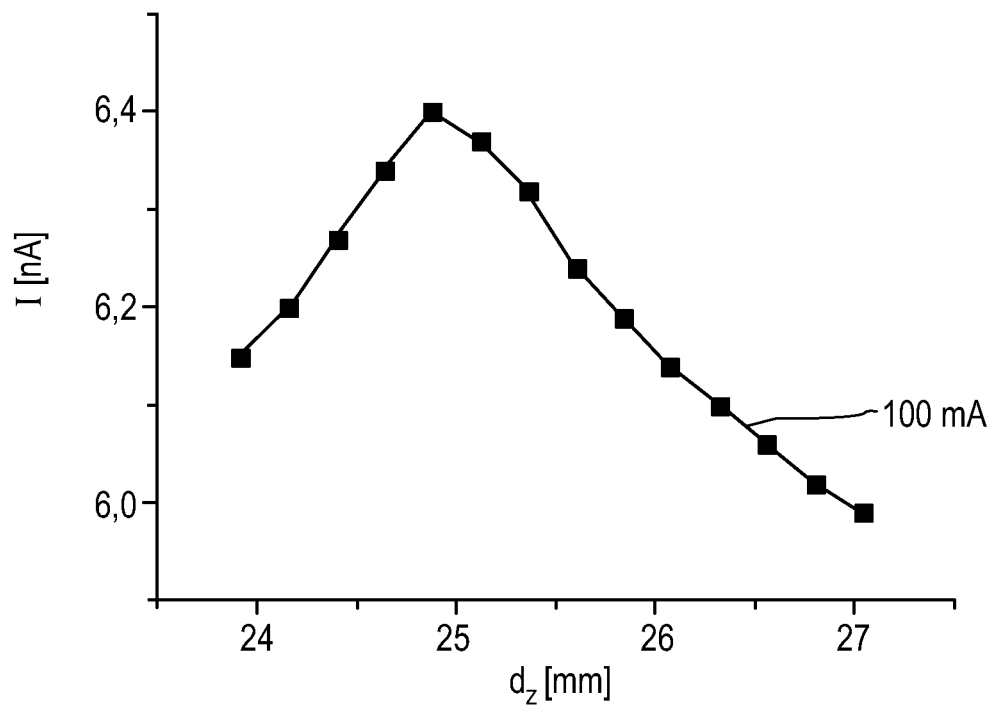

In order to enable the longitudinal optical sensor 114 also to be sensitive within at least a part of the ultraviolet (UV) spectral range, a further alternative embodiment, such as depicted in FIG. 10G where a gallium phosphide (GaP) photodiode has been used, may be employed. As known to the skilled person, the material GaP exhibits a non-negligible spectral response within the spectral range from about 140 nm to 580 nm and may, therefore, employed for this purpose. Accordingly, the curve as depicted in FIG. 10G has been recorded by using an illumination wavelength of 490 nm, wherein the light-emitting diode was driven with a current of 100 mA. However, further materials which may exhibit a different non-negligible spectral response within at least a part of the UV spectral range may also be feasible.

Figure 11A:
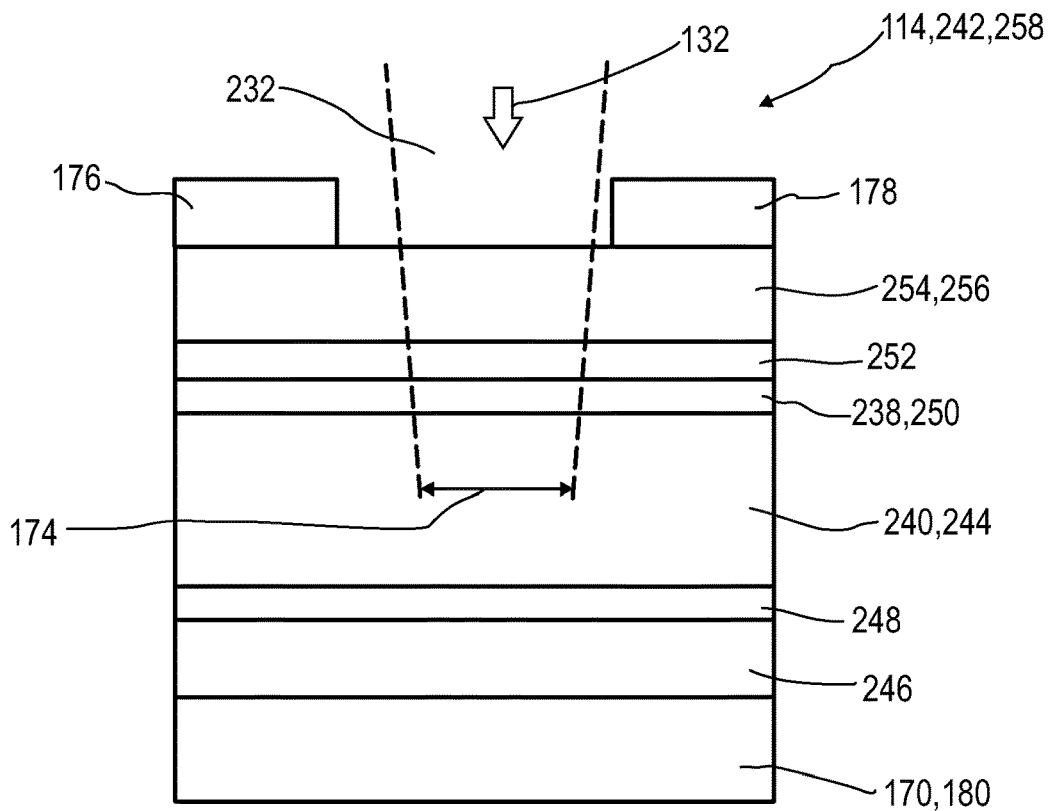

FIG. 11A illustrates a further preferred example of the optical detector 110 in a further arrangement in which the longitudinal optical sensor 114 exhibits a device structure of a typical thin-film solar cell 242, wherein the p-type semiconductor layer 240 comprises a p-type absorber material 244 as described above. Preferably, a I-III-VI$_2$ compound, in particular copper indium sulfide (CuInS$_2$; CIS) or copper indium gallium selenide (CIGS; see FIG. 11E), or a I$_2$-II-IV-VI$_4$ compound, in particular copper zinc tin sulfide (CZTS; see FIGS. 11F to 11H), copper zinc tin selenide (CZTSe), or a copper-zinc-tin sulfur-selenium chalcogenide (CZTSSe) and doped variants of all of them may be applied for this purpose. Alternatively, a halide perovskite compound, in particular an organic-inorganic halide perovskite, especially methylammonium lead iodide (CH$_3$NH$_3$PbI$_3$), may also be employed. However, further examples, wherein cadmium telluride (CdTe; see FIG. 11C) or zinc cadmium telluride (ZnCdTe; see FIG. 11D) have been used as the p-type absorber material 244, demonstrate that the concept as presented here is more general.

Herein, a glass of about of a thickness of 1 mm to 3 mm, such as a soda-lime glass, may here, as commonly, used as the transparent substrate 170, 180, in particular since a presence of sodium in the glass substrate allowing yielding a substantial open-circuit voltage increase, presumably through surface and/or grain boundary defects passivation. However, as in this example as depicted in FIG. 11A in which the beam path 232 of the incident light beam 132 may not traverse the substrate 170, which, therefore, may not require to be transparent, other kinds of substrates 170 may also be feasible, in particular lighter and more flexible substrates, such as polyimide sheets or metal foils.

A back-contact layer 246 which can serve as the back contact and, additionally, may reflect a considerable amount of unabsorbed light into the absorbing p-type semiconductor layer 240 may comprise a thin metal layer, such as a molybdenum (Mo) metal layer, which might be produced by depositing, such as by sputtering, the respective metal onto the substrate 170. Further, following molybdenum deposition, the p-type absorber material 244 may be grown on top of the back-contact layer 246 by one of several methods, such as, for example, described in W. Hermes et al., s. o. Accordingly, thin-films of can, generally, be prepared via a two-step process. During a first step, a thin film of the p-type absorber material 244 may be deposited by a vacuum-based or a solution-based method. For this purpose, elements or a precursor material can be coated sequentially or mixed, wherein high efficiency is obtained for elements already mixed in the film. As an alternative, nanoparticles comprising the p-type absorber material 244 can be deposited. In the second step, the layer may be annealed at temperatures from 500° C. and 600° C. which may result in the formation of the desired p-type absorber material 244 from the elements or a sintering of the nanoparticles. To alternatively fabricate the p-type absorber material 244 absorber material in a one-step approach, the elements may be simultaneously deposited at elevated temperatures, such via co-sputtering or co-evaporation onto heated substrates, thus, leading to a direct formation of the p-type absorber material 244 during deposition. However, other kinds of materials may be possible.

Further, particularly as a result of a direct contact between the molybdenum (Mo) metal present in the back-contact layer 246 and the adjacent p-type absorber material 244 comprising sulfur (S) atoms as in this example, a layer comprising molybdenum sulfide $MoS_2$ may be obtained in-situ as a thin boundary layer 248 located between the back contact layer 246 and the p-type absorber material 244.

On top of the p-type absorber material 244, a thin n-type semiconductor layer 238 which may, preferably, work as a buffer layer 250 may be provided. As typically in the case of the thin-film solar devices 242, the buffer layer 250 can comprise a material such as cadmium sulfide (CdS) which might, for example, be deposited via chemical bath deposition. In addition, the buffer layer 250 may be overlaid with a thin protection layer 252 which may, further, be capped by a comparatively thicker charge-carrier collection layer 254. Generally, the protection layer 252 may comprise a layer of intrinsic zinc oxide (i-ZnO) which can, particularly, be used for protecting both the buffer layer 250 and the p-type absorber material 244 from sputtering damages which may otherwise occur during deposition of the charge-carrier collection layer 254. Herein, the charge-carrier collection layer 254 may, preferably, comprise an aluminum (Al) doped ZnO layer (ZnO:Al), usually denoted as ZnO:Al window layer, which may, as usually, produced by DC sputtering which is known as a rather damaging process. Other kinds of materials may also be feasible for being used within the respective layers, such as zinc sulfide (ZnS), zinc oxide (ZnO), or zinc hydroxide (ZnOH) within the buffer layer 250 in order to avoid toxic cadmium (Cd). The charge-carrier collection layer 254 can, preferably, serve as a transparent conducting oxide layer 256 for collecting and moving charge-carriers from the p-type absorber material 244 while absorbing incident light from the light beam 132 to the at least one first electrode 176 and the at least one second electrode 178 as arranged here on top of the charge-carrier collection layer 254. Accordingly, a photodiode 258 is, thus, formed at least by the n-type semiconductor layer 238 and the p-type semiconductor layer 240 and which may, as further illustrated in FIG. 11A, be supplemented by one or more other kinds of additional layers, such as the ones described here, i.e. the back-contact layer 246, the boundary layer 248, the protection layer 252 and the charge-carrier collection layer 254, or by one or more further layers, as well as by the at least one first electrode 176 and the at least one second electrode 178.

Figure 11B:
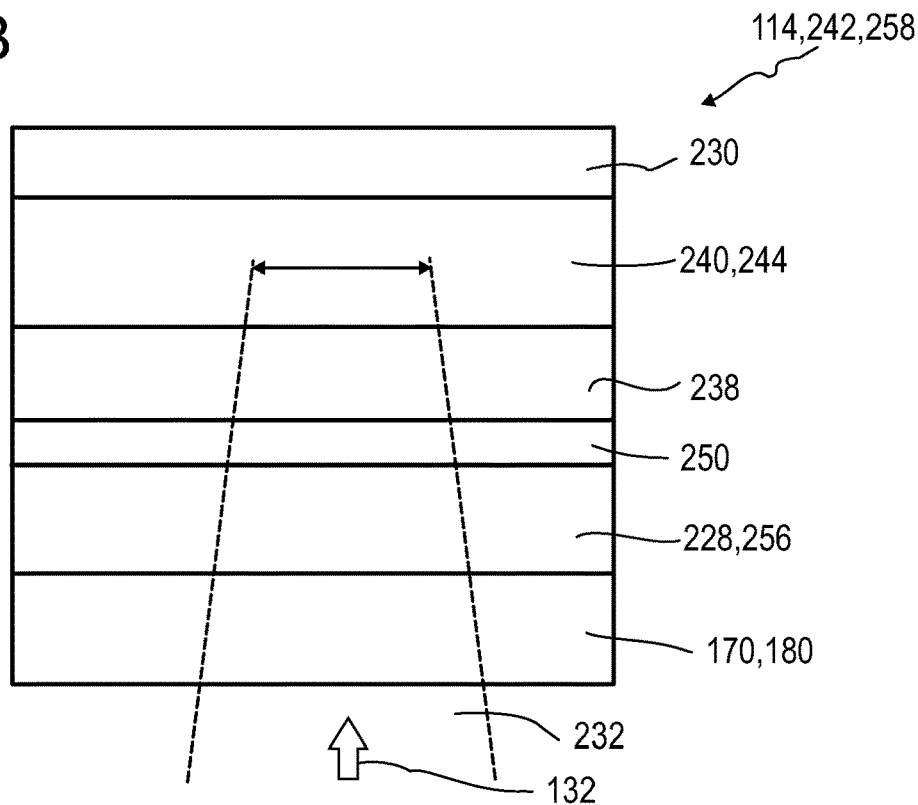

FIG. 11B presents a further preferred example of the optical detector 110 in an arrangement in which the longitudinal optical sensor 114 exhibits a device structure of a typical thin-film solar cell 242 as a photodiode 258 which deviates from the depiction in FIG. 11A in some way. In particular contrast to the setup of the device according to FIG. 11A, the thin-film solar cell 242 pursuant to FIG. 11B may be employed in a setup in which the beam path 232 of the incident light beam 132 may be capable of traversing the substrate 170 which is, therefore, transparent in this example. Accordingly, a transparent substrate 170, 180, preferably glass, quartz or a solid transparent polymer, is used as a basis on which a transparent conducting oxide layer 256 may serve as the first transparent electrode 228. Between the transparent electrode 228 and the second electrode 230, which can exhibit optically transparent or, preferably, intransparent properties, the photodiode 258 is, again, formed at least by the p-type semiconductor layer 240 and the n-type semiconductor layer 238, wherein here, additionally, the buffer layer 250 as described above in more detail is employed. Preferably, one of the above-mentioned p-type absorber materials 244, is used here as the p-type semiconductor layer 240. For further details concerning this type of arrangement, reference may be made to the description of FIG. 11A.

FIGS. 11C to 11H present experimental results which have been acquired by employing the optical detector 110 according to the present invention in which the longitudinal optical sensor 114 uses the a thin-film solar cell 242 as the photodiode 258, preferably according to one of the arrangements as depicted in FIG. 11A or 11B.

Figure 11C:
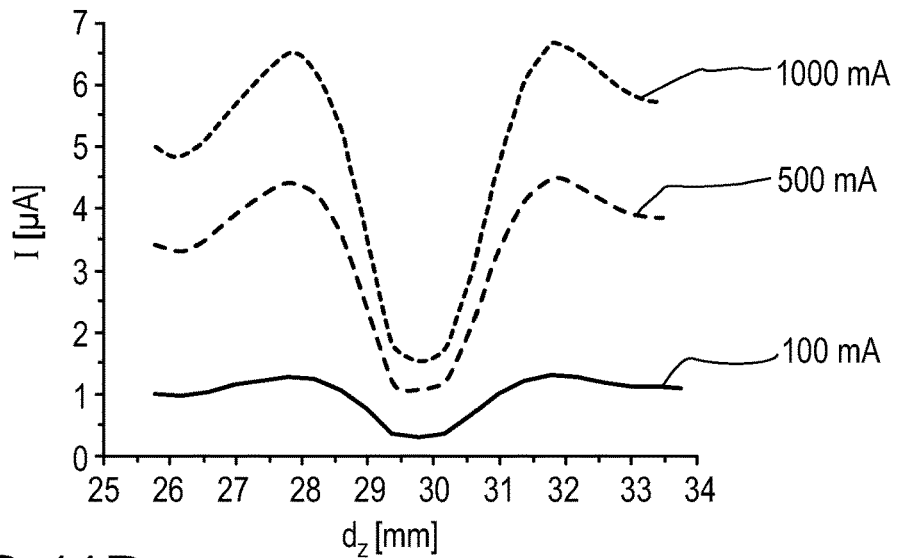

FIG. 11C shows three different HP curves in which the longitudinal optical sensor 114 uses a thin-film solar cell 242 as the photodiode 258 in the setup according to FIG. 11B, wherein the p-type semiconductor layer 240 comprising cadmium telluride (CdTe), the n-type semiconductor layer 238 comprising cadmium sulfide (CdS), and the additional buffer layer 250 comprising tin oxide ($SnO_2$) are arranged between a layer of transparent indium tin oxide (ITO) as the first electrode 228 located on a glass substrate 170, 180 and a metal layer as the second electrode 230. Herein, the three FiP curves which demonstrate the occurrence of the negative FiP effect within this arrangement are recorded without the application of a bias voltage at an illumination wavelength of 850 nm, i.e. in the NIR spectral range, provided by a light-emitting diode 158 which was driven with a current of 100 mA (solid line), 500 mA (dashed line) or 1000 mA (dotted line), respectively.

Figure 11D:
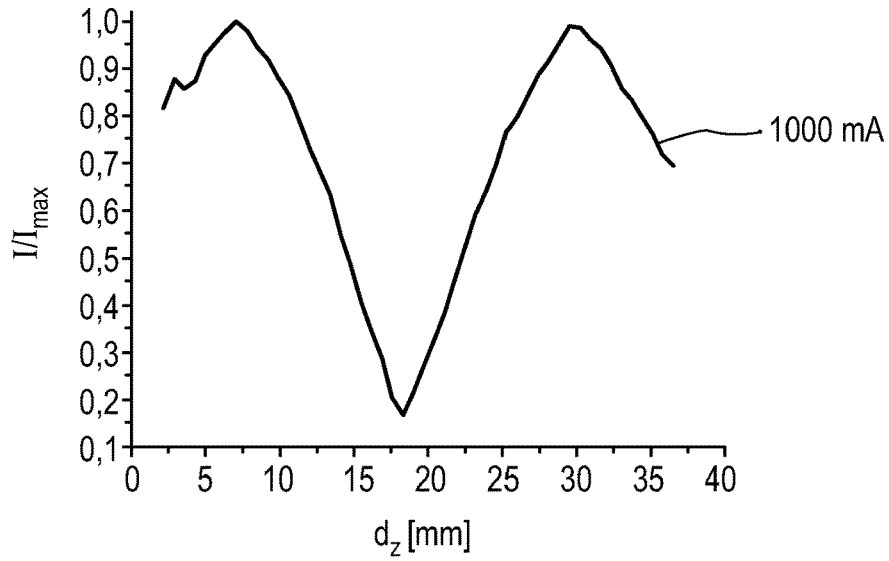

A similar example is presented in FIG. 11D. Herein, the p-type semiconductor layer 240 which comprises a layer of zinc cadmium telluride (ZnCdTe) with a thickness of 2.5 µm and the n-type semiconductor layer 238 which comprises a layer of zinc selenide (ZnSe) with a thickness of 220 nm are arranged between a layer of transparent indium tin oxide (ITO) as the first electrode 228 and a metallic silver (Ag) layer as the second electrode 230. Again, the negative FiP effect may be derived from the FiP curve as depicted in FIG.

11D which has been recorded without the application of a bias voltage, wherein the illumination source 156 was modulated with the modulation frequency of 375 Hz using 100 ms long current pulses exhibiting an amplitude of 1000 mA.

Figure 11E:
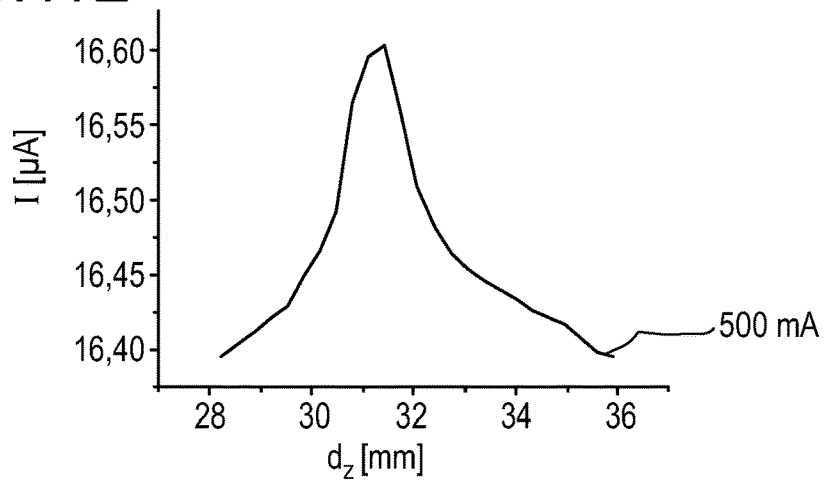
Figure 11F:
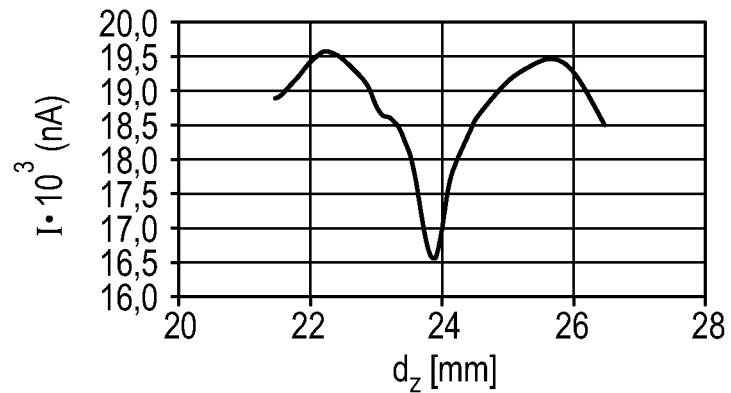
Figure 11G:
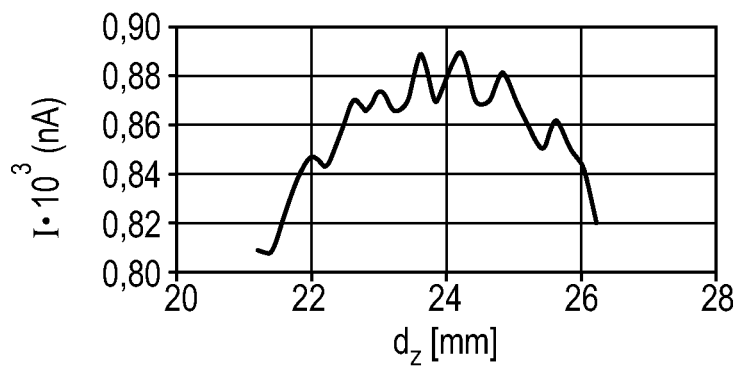
Figure 11H:
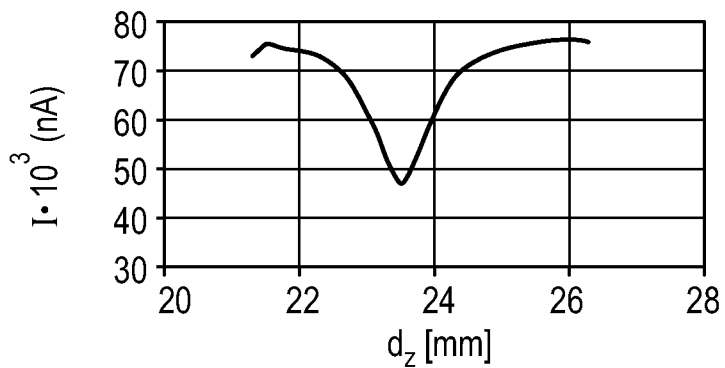

FIGS. 11E to 11H present experimental results in which the longitudinal optical sensor 114 uses the thin-film solar cell 242 as the photodiode 258, wherein the p-type semiconductor layer 240 comprises one of the p-type absorber materials 244 as described above, i.e. the I-III-VI$_2$ compound copper indium gallium selenide (GIGS; see FIG. 11E) or the I$_2$-II-IV-VI$_4$ compound copper zinc tin sulfide (CZTS; see FIGS. 11F to 11H). Alternatively, a halide perovskite compound, in particular an organic-inorganic halide perovskite, especially methylammonium lead iodide (CH$_3$NH$_3$PbI$_3$), may also be employed for this purpose. Without any loss of generality, the compounds CIGS and CZTS are, however, used as paradigmatic examples in the following description although the examples from FIGS. 11C and 11D have illustrated that the concept of using the thin-film solar cell 242 as the photodiode 258 may be applied more generally.

Thus, FIG. 11E presents an experimental result in which the p-type semiconductor layer 240 comprises the I-III-VI$_2$ compound copper indium gallium selenide (CIGS) as the p-type absorber material 244. Herein, the FiP curve as shown here which has been recorded without application of a bias voltage at an illumination wavelength of 850 nm, i.e. in the NIR spectral range, provided by a light-emitting diode 158 being driven with a comparatively high current of 500 mA clearly demonstrates the occurrence of the positive FiP effect in this kind of arrangement.

Further, FIGS. 11E to 11H present experimental results in which the p-type semiconductor layer 240 comprises the I$_2$-II-IV-VI$_4$ compound copper zinc tin sulfide (CZTS) as the p-type absorber material 244. As can be derived from a comparison from FIGS. 11F and 11H, on one hand, and FIG. 11G, on the other hand, it could be demonstrated here that, in case the photodiode 258 is driven in the photoconductive mode, a sign of the FiP effect may depend on an intensity of the incident light beam 132 impinging on the p-type absorber material 244 CZTS exhibiting a size of 3 mm×3 mm. Thus, by using two suitably different values for the intensity of the incident light beam 132, it may be feasible to, again, acquire two individual measurement curves which may, particularly, be used as a reference base for resolving the above-mentioned ambiguities with respect to the longitudinal sensor signal by comparing the two individual measurement curves.

As illustrated in FIG. 11F, for a comparatively high intensity in which the illumination source 156 comprised the green light-emitting diode (LED) 158 emitting a wavelength of 530 nm and driven by a comparatively high current of 600 mA, the negative FiP effect could be observed. As a further example for comparatively high intensity in the same optical detector 110, the NIR light-emitting diode (LED) 158 emitting a wavelength of 850 nm and driven by an even higher current of 1000 mA was employed for obtaining the measurement curve as illustrated in FIG. 11H which also exhibits the negative FiP effect.

In contrast to these findings, the positive FiP effect could, although having a comparatively smaller amplitude, as illustrated in FIG. 11G, be observed in the same optical detector 110 by illuminating the p-type absorber material 244 CZTS within the longitudinal optical sensor 114 by a comparatively low intensity. For this purpose, the illumination source 156 comprised the green light-emitting diode (LED) 158 emitting a wavelength of 530 nm which was driven in the experiment here by a rather low current of only 8 mA, thus, providing the incident light beam 132 only with a comparatively low intensity.

This kind of behavior with respect to the sign of the FiP effect depending on the intensity of the incident light beam 132 may, in particular, be explained by an assumption that in case in which the incident light beam 132 has, given the same total power of the illumination, a small beam cross-section 174 and, thus, causes a high intensity within the area of the beam cross-section 174, recombination of a great number of generated charge-carriers may occur within the p-type absorber material 244 CZTS. In the opposing situation in which the incident light beam 132 has, given the same total power of the illumination, a large beam cross-section 174 and, therefore, may only lead to a low intensity within the area of the beam cross-section 174, virtually no recombination can occur within the p-type absorber material 244 CZTS, moreover, since this kind of material may, in particular, have a large number of defects.

Consequently, by switching between the at least two operational modes of the longitudinal optical sensor 114, it may, thus, be feasible to acquire two individual measurement curves, wherein one of the individual curves may, in particular, be used for reference purposes. Since the photodiode 258 may, generally, not exhibit the FIR effect in the photovoltaic mode while the same photodiode 258 may actually exhibit the FiP effect in the photoconductive mode, it may, accordingly, be possible to use the measurement curve acquired in the photovoltaic mode as a reference base for resolving the above-mentioned ambiguities with respect to the longitudinal sensor signal by comparing the two individual measurement curves.

Compared to the detector 110 in which the sensor region 130 of the longitudinal optical sensor 114 comprises the chalcogenide 136 lead sulfide (PbS) or lead selenide (PbSe) as the photoconductive material 134, the detectors 110 of this the kind as illustrated in FIGS. 11A to 11H exhibit a number of advantages, in particular, a homogeneous film formation, a low observable voltage, a lack of a dark current resulting in a higher signal-to noise ratio, a zero offset, a higher current at the same total power of the illumination, and a capability that the longitudinal optical sensor 114 may be transparent or translucent.

Figure 11J:
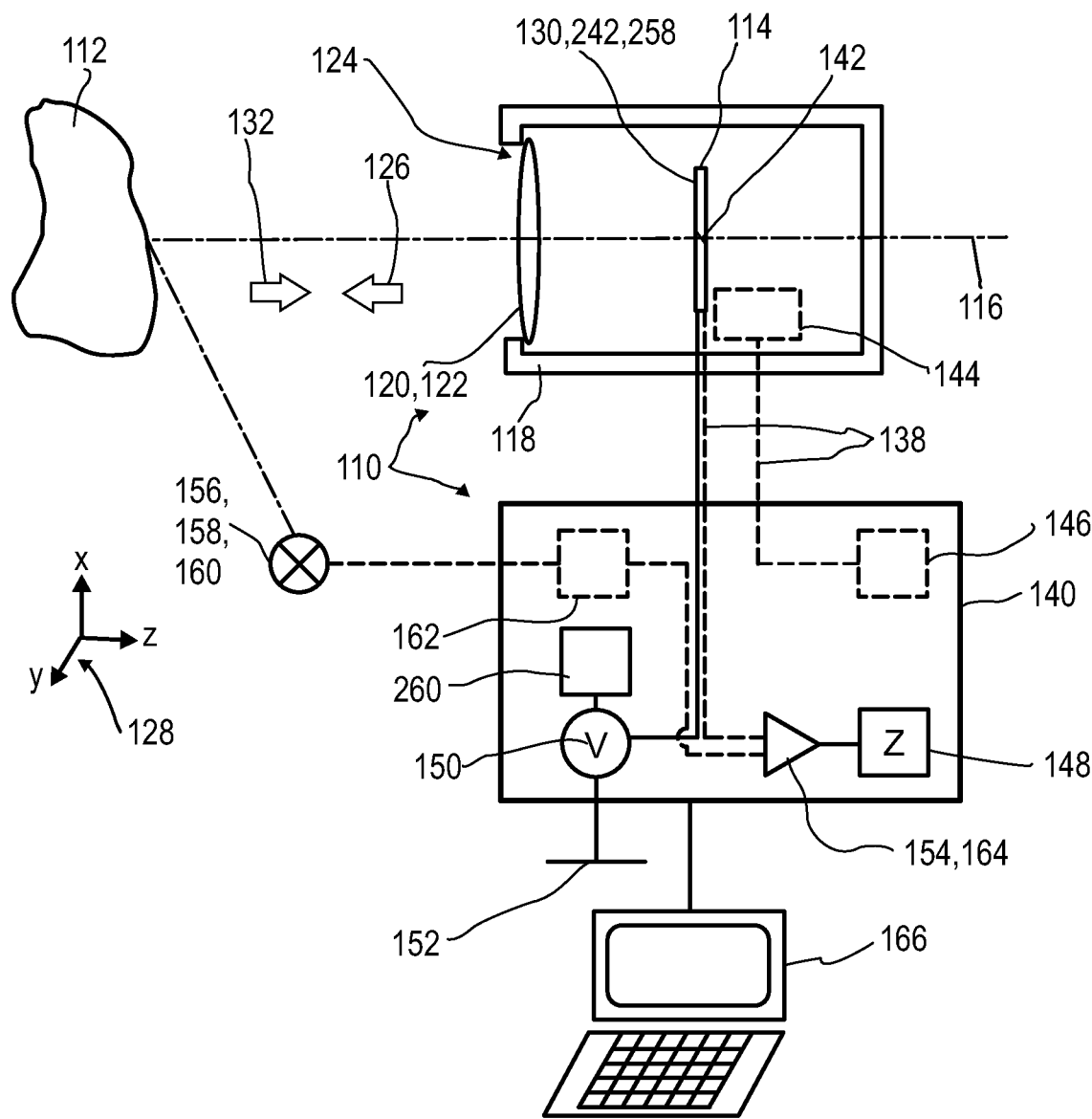

Further, as illustrated in FIG. 11J, the photocurrent through the longitudinal optical sensor 114 as presented here may, accordingly, be determined by using the detector 110, wherein, for this purpose, the bias voltage source 150 configured to provide a bias voltage, in particular, above ground 152 may, preferably, be used to drive the photodiode 258 in a photoconductive mode. For this purpose, the photodiode 258 is employed in a reverse biased mode, in which the n-type semiconductor layer 238 of the photodiode 258 is driven with a positive voltage with respect to the p-type semiconductor layer 240. This is in contrast to the so-called "photovoltaic mode", in which a zero bias is used between the n-type semiconductor layer 238 and the p-type semiconductor layer 240 of the photodiode 258. Applying the photoconductive mode to the photodiode 258 may, generally, lead to the observation of the FIR effect in the photodiode 258, i.e. that, given the same total power of the illumination, the photocurrent as generated by the photodiode 258 may be found to be dependent on the beam cross-section of the light beam in the sensor region 130. Consequently, since the longitudinal sensor signal is dependent on the electrical conductivity within the sensor region 130, recording the at least one longitudinal sensor signal, thus, allows determining the beam cross-section of the light beam in the sensor region 130 and, thus, generating at least one item of information on the longitudinal position of the object 112. For further details in FIG. 11J, reference may be made to the description of FIG. 11A or 11B.

In a preferred embodiment as further illustrated in FIG. 11J, a switching device 260 may, additionally, be employed, wherein the switching device 260 may, in particular, be adapted to exert an influence on the bias voltage source 150 in order to set the bias voltage to at least two individual values which may be different with respect to each other. Thus, the bias voltage source 150 may be configured to apply at least two different bias voltages to the photo-diode 258 in a manner that it may be possible to switch between at least two operational modes of the longitudinal optical sensor 114. As a result, the electrical conductivity within the sensor region 130 of the longitudinal optical sensor 114 may be adjustable by applying different bias voltages. In this embodiment, in a first operational mode, a non-zero bias voltage may be applied to the photodiode 258, in particular, in a reverse biased mode, in which the n-type semiconductor layer 238 of the photodiode 258 may, as described above, be driven with a positive voltage with respect to the p-type semiconductor layer 240. Thus, in the first operational mode, a first longitudinal sensor signal may be acquired. Further, in a second operational mode, a zero bias may be applied to the photodiode 258 which may result in an observation that the photodiode 258 may be unbiased and, thus, adopt the photovoltaic mode as also described above. Thus, in the second operational mode, a second longitudinal sensor signal may, similarly, be acquired which, generally, differs from the first longitudinal sensor signal.

Figure 12A:
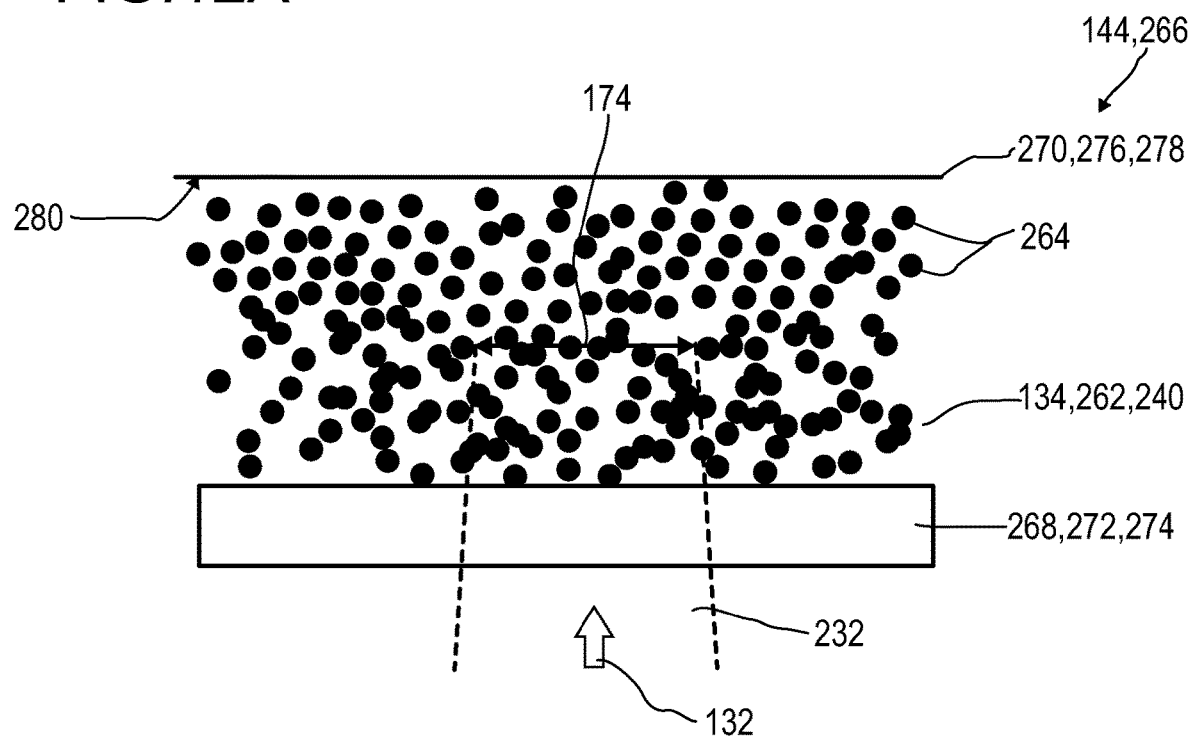
FIGS. 12A to 12D show further exemplary embodiments of different arrangements of longitudinal optical sensors in which the photoconductive material within the photodiode is provided as a film comprising quantum dots (FIGS. 12A, 12C and 12D), and experimental results which demonstrate the occurrence of the FiP effect in the longitudinal optical sensor according to FIG. 12A (FIG. 12B).
Figure 12B:
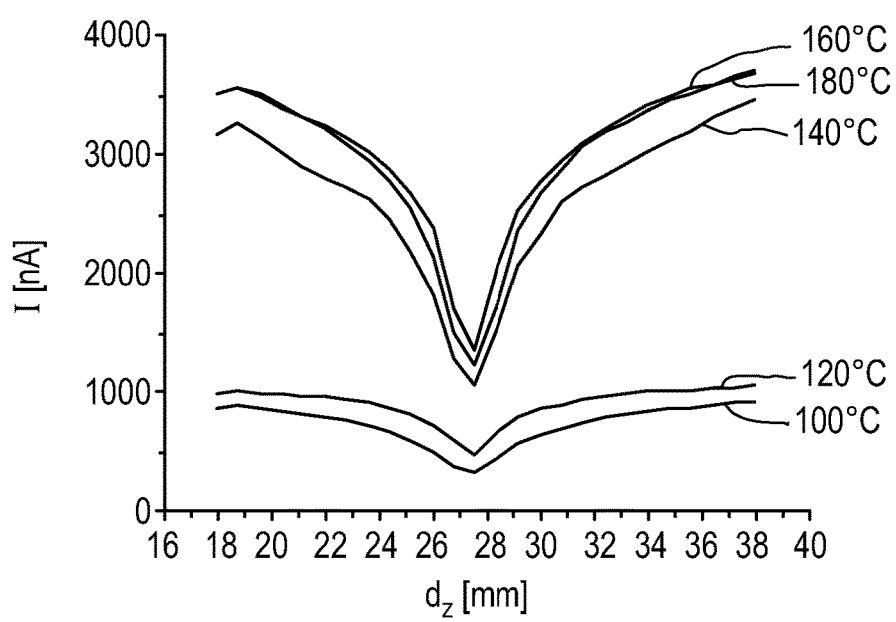
Figure 12C:
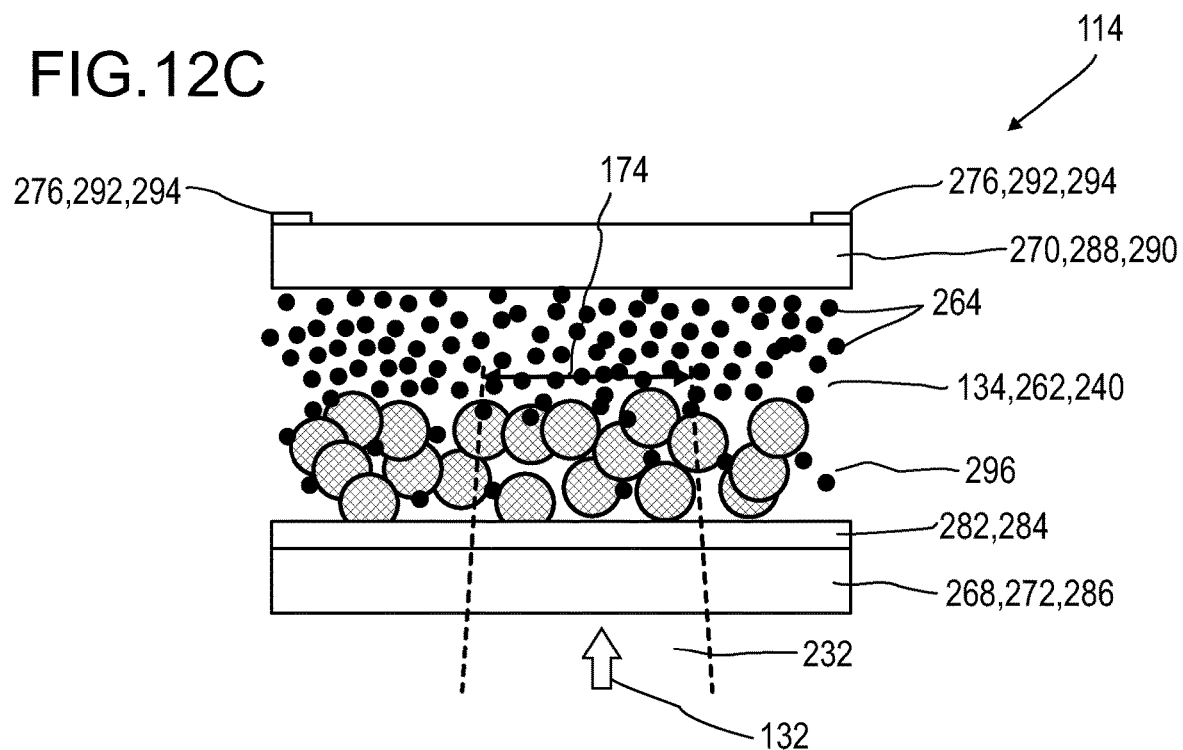
Figure 12D:
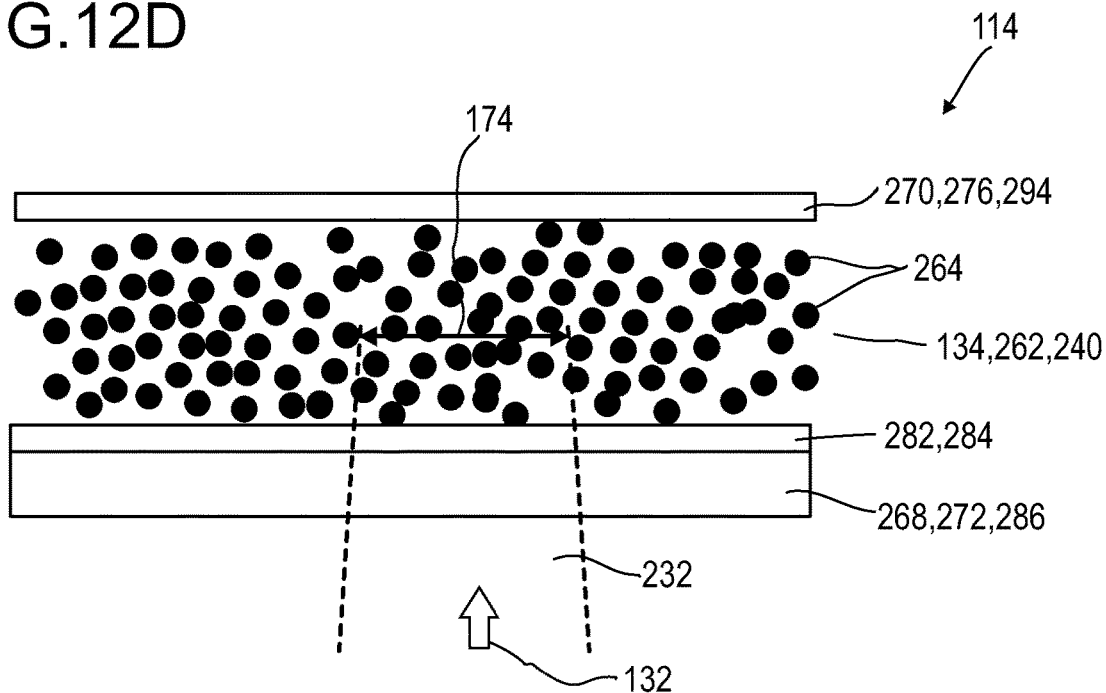

FIGS. 12A, 12B, and 12D illustrate three further preferred examples of the longitudinal optical sensor 114 in which the photoconductive material 134 is provided in form of a colloidal film 262 which comprises quantum dots 264. Further, FIG. 12B shows experimental results which demonstrate the occurrence of the negative FiP effect in the longitudinal optical sensor 114 according to FIG. 12A, wherein the photoconductive material selected for the quantum dots 264 has been lead sulfide (PbS).

In a first embodiment as illustrated in FIG. 12A, the longitudinal optical sensor 114 behaves as a Schottky diode 266 as, for example, described by J. P. Clifford et al., s. o., wherein, the film 262 of the colloidal PbS quantum dots 264 (PbS CQD film) which acts as the photoconductive material 134 is sandwiched between a first electrode 268 and a second electrode 270. Herein, the first electrode 268 which is impinged by the incident light beam 132, preferably, comprises a layer of an electrically conducting and at least partially optically transparent electrode 272, more preferred at least one transparent conductive oxide (TCO), in particular an indium-doped tin oxide (ITO) electrode 274. However, other kinds of electrically conducting and optically transparent materials 272 may also be suitable as material for the first electrode 268, in particular one or more of fluorine-doped tin oxide (FTO), magnesium oxide (MgO), aluminum-doped zinc oxide (AZO), or, alternatively, metal nanowires, such as Ag or Cu nanowires. In contrast hereto, the second electrode 270 may be at least one optically intransparent electrode and may, thus, preferably comprise a metal electrode 276, in particular an aluminum (Al) electrode 278. In this particular example, the second electrode 270 may, preferably, comprise a uniform metal layer. As a result of this setup, a Schottky barrier 280 may form at an interface between the PbS CQD film 262 and the aluminum electrode 278. The incident light beam 132 through the ITO electrode 274 may generate electrons and holes in the CQD film 262 which can be collected at the boundaries towards the ITO electrode 274 and the aluminum electrode 278, respectively. Consequently, a depletion region may form in the CQD film 262 at the Schottky barrier 280 which is located at the metal-CQD interface, whereas the remaining volume of the CQD film 262 may be considered as a p-type semiconductor layer 240.

In this particular example, the PbS CQD film 262 which comprises PbS quantum dots 264 having diameters above 5 nm still exhibits a good absorption above 1000 nm. In order to achieve this result, a 100 mg/ml solution of PbS quantum dots 264 in an unpolar organic solvent, preferably octane, have been provided, from which two subsequent layers have been formed on the ITO electrode 274 by application of a deposition method, preferably by a spin-coating method with a rotation frequency from 1000 rpm to 6000 rpm, such as 4000 rpm. Each of the two layers has individually been treated with ethanedithiol during a treatment time, preferably from 10 s to 10 min, more preferred from 10 s to 1 min, such as 30 s, before a drying step was performed for a drying time, preferably from 1 min to 2 h, more preferred from 10 min to 1 h, such as 30 min, at a drying temperature from 50° C. to 250° C., preferred from 100° C. to 200° C. This kind of procedure turned out to be particularly advantageous with respect to obtaining a setup for the longitudinal optical sensor 114 with as little short circuits through the COD film 262 as possible. Finally, a 100 nm thick layer of aluminum was deposited through evaporation onto the colloidal film 262 as the metal electrode 276. Experimental results which demonstrate the occurrence of the negative FiP effect in this kind of specimen are shown in FIG. 12B for drying temperatures from 100° C. to 180° C. in 20° C. intervals. Similar as above, the NIR light-emitting diode (LED) 158 emitting a wavelength of 850 nm and driven by a comparatively high current of 1000 mA was employed for illuminating the longitudinal optical sensor 114 pursuant to FIG. 12A which behaves as a Schottky diode 266.

In an alternative embodiment as illustrated in FIG. 12C, a blocking layer 282 which, preferably, comprises a titanium dioxide ($TiO_2$) blocking layer 284, was deposited onto the layer of the first electrode 268 which, preferably, comprises a layer of the electrically conducting and at least partially optically transparent electrode 272, more preferred the at least one transparent conductive oxide (TCO), in particular a fluorine-doped tin oxide ($SnO_2$:F, FTO) electrode 286, before the CQD film 262 was deposited on top of the blocking layer 282 as the photoconductive material 134 similar to FIG. 12A. In the example as illustrated in FIG. 12C, an electrically conducting polymer 288, preferably a poly(3,4-ethylenedioxythiophene) (PEDOT) layer 290, was deposited onto the CQD film 262. In order to achieve a good electrical contact to outside electrical means, a split electrode 292 comprising at last two evaporated 200 nm silver (Ag) electrodes 294 have been deposited onto the PEDOT layer 290. Alternatively, the split electrode 292 may be selected from the group comprising a platinum (Pt) electrode and a gold (Au) electrode. Herein, the split electrode 292 may, preferably be arranged as a number of partial electrodes or in form of a metallic grid. Alternatively, as illustrated in FIG. 12C, a mesoporous titanium oxide ($TiO_2$) layer 296 can, additionally, be deposited between the titanium dioxide ($TiO_2$) blocking layer 284 and the CQD film 262, wherein the mesoporous titanium oxide ($TiO_2$) layer 296 may be considered here as the n-type semiconductor layer 238 while the CQD film 262 may be attributed as the p-type semiconductor layer 240 also in this particular embodiment.

In a further embodiment as illustrated in FIG. 12D, the blocking layer 282 which, preferably, comprises the titanium dioxide (TiO$_2$) blocking layer 284, was deposited onto the layer of the first electrode 268 which, preferably, comprises the layer of the electrically conducting and at least partially optically transparent electrode 272, more preferred the at least one transparent conductive oxide (TCO), in particular the fluorine-doped tin oxide (SnO$_2$:F, FTO) electrode 286, before the CQD film 262 was deposited on top of the blocking layer 282 as the photoconductive material 134 similar to FIG. 12C. However, in contrast to FIG. 12C, the metal electrode 276 comprising the single evaporated 200 nm silver (Ag) electrode 294 is used in this embodiment as the second electrode 270. Alternatively, the mesoporous titanium oxide (TiO$_2$) layer 296 may, additionally, be deposited between the titanium dioxide (TiO$_2$) blocking layer 284 and the CQD film 262 in a similar manner as described in the embodiment as depicted in FIG. 12C. However, leaving out the additional mesoporous titanium oxide (TiO$_2$) layer 296 as shown in FIG. 12D may result in more homogeneous layers.

As outlined above, the detector 110 may have a straight beam path or a tilted beam path, an angulated beam path, a branched beam path, a deflected or split beam path or other types of beam paths. Further, the light beam 132 may propagate along each beam path or partial beam path once or repeatedly, unidirectionally or bidirectionally. Thereby, the components listed above or the optional further components listed in further detail below may fully or partially be located in front of the longitudinal optical sensors 114 and/or behind the longitudinal optical sensors 114.

LIST OF REFERENCE NUMBERS 110 detector
112 object
114 longitudinal optical sensor
116 optical axis
118 housing
120 transfer device
122 refractive lens
124 opening
126 direction of view
128 coordinate system
130 sensor region
132 light beam
134 photoconductive material
136 chalcogenide
138 signal leads
140 evaluation device
142 focal point
144 actuator
146 actuator control unit
148 longitudinal evaluation unit
150 bias voltage source
152 ground
154 amplifier
156 illumination source
158 light-emitting diode
160 modulated illumination source
162 modulation device
164 lock-in amplifier
166 data processing device
168 layer of photoconductive material
170 substrate
172 ceramic substrate
174 beam cross-section
176 first electrode
178 second electrode
180 transparent substrate
182 translucent substrate
184 transversal optical sensor
186 layer of transparent conducting oxide
188 transparent conducting oxide
190 first electrode
192 second electrode
194 first split electrode
196 second split electrode
198 sensor area
200 detector system
202 camera
204 human-machine interface
206 entertainment device
208 tracking system
210 transversal evaluation unit
212 position information
214 imaging device
216 control element
218 user
220 beacon device
222 machine
224 track controller
226 layer of material capable of sustaining an electrical current
228 first electrode
230 second electrode
232 beam path
234 PIN diode
236 i-type semiconductor layer
238 n-type semiconductor layer
240 p-type semiconductor layer
242 thin-film solar cell
244 p-type absorber material
246 back-contact layer
248 boundary layer
250 buffer layer
252 protection layer
254 charge-carrier collection layer
256 transparent conducting oxide layer
258 photodiode
260 switching device
262 colloidal film
264 quantum dots
266 Schottky diode
268 first electrode
270 second electrode
272 optically transparent electrode
274 indium-doped tin oxide (ITO) electrode
276 metal electrode
278 aluminum (Al) electrode
280 Schottky barrier
282 blocking layer
284 titanium dioxide (TiO$_2$) layer
286 fluorine-doped tin oxide (SnO$_2$:F, FTO) electrode
288 electrically conducting polymer
290 PEDOT layer
292 split electrode
294 silver (Ag) electrode
296 mesoporous titanium oxide (TiO$_2$) layer

The invention claimed is:

1. A detector, the detector comprising:
   at least one longitudinal optical sensor, wherein the longitudinal optical sensor has at least one sensor region, wherein the longitudinal optical sensor is designed to generate at least one longitudinal sensor signal in a manner dependent on an illumination of the sensor region by a light beam, wherein the longitudinal sensor signal, given the same total power of the illumination, is dependent on a beam cross-section of the light beam in the sensor region, wherein the sensor region comprises at least one material capable of sustaining an electrical current, wherein at least one property of the material, given the same total power of the illumination, is dependent on the beam cross-section of the light beam in the sensor region, wherein the longitudinal sensor signal is dependent on the at least one property; and
   at least one evaluation device, wherein the evaluation device is designed to generate at least one item of information on a longitudinal position of the object by evaluating the longitudinal sensor signal of the longitudinal optical sensor.

2. The detector according to claim 1, wherein the longitudinal optical sensor is a photo detector having at least one first electrode, at least one second electrode, and a layer of the material capable of sustaining an electrical current located between the first electrode and the second electrode, wherein at least one of the first electrode and the second electrode is a transparent electrode.

3. The detector according to claim 1, wherein the material capable of sustaining the electrical current is located between the first electrode and the second electrode is arranged as a PIN diode, wherein the PIN diode comprises an i-type semiconductor layer located between an n-type semiconductor layer and a p-type semiconductor layer, wherein the i-type semiconductor layer exhibits a thickness which exceeds the thickness of each of the n-type semiconductor layer and the p-type semiconductor layer.

4. The detector according to claim 1,
   wherein the longitudinal sensor signal, given the same total power of the illumination, is dependent on a beam cross-section of the light beam in the sensor region, wherein the longitudinal optical sensor, given the same total power of the illumination, is capable of generating at least one longitudinal sensor signal being dependent on the beam cross-section of the light beam in the sensor region.

5. A detector according to claim 1, where the detector is adapted to function as a detector for at least one application selected from the group consisting of: a distance measurement; a position measurement; an entertainment application; a security application; a human-machine interface application; a tracking application; a scanning application; in stereoscopic vision; a photography application; an imaging application or camera application; a mapping application for generating maps of at least one space; a homing or tracking beacon detector for vehicles; a distance and/or position measurement of objects with a thermal signature; a machine vision application; a robotic application; a logistics application.

6. The detector according to claim 1, wherein the sensor region comprises at least one photoconductive material, wherein an electrical conductivity of the photoconductive material, given the same total power of the illumination, is dependent on the beam cross-section of the light beam in the sensor region, wherein the longitudinal sensor signal is dependent on the electrical conductivity.

7. The detector according to claim 1, wherein the photoconductive material is an inorganic photoconductive material.

8. The detector according to claim 7, wherein the inorganic photoconductive material is a chalcogenide that is selected from the group consisting of: a sulfide chalcogenide, a selenide chalcogenide, a telluride chalcogenide, a ternary chalcogenide, a quaternary chalcogenide, a higher chalcogenide, and a solid solution and/or a doped variant thereof.

9. The detector according to claim 8, wherein the chalcogenide is selected from the group consisting of: lead sulfide (PbS), copper indium sulfide (CIS), copper indium gallium selenide (CIGS), copper zinc tin sulfide (CZTS), lead selenide (PbSe), copper zinc tin selenide (CZTSe), cadmium telluride (CdTe), mercury cadmium telluride (HgCdTe), mercury zinc telluride (HgZnTe), lead sulfoselenide (PbSSe), copper-zinc-tin sulfur-selenium chalcogenide (CZTSSe), and a solid solution and/or a doped variant thereof.

10. The detector according to claim 7, wherein the inorganic photoconductive material is a pnictogenide that is selected from the group consisting of: nitride pnictogenides, phosphide pnictogenides, arsenide pnictogenides, antimonide pnictogenides, ternary pnictogenides, quarternary, and higher pnictogenides.

11. The detector according to claim 1, wherein the photoconductive material comprises doped silicon.

12. The detector according to claim 1, wherein the photoconductive material is provided as a colloidal film, wherein the colloidal film comprises quantum dots.

13. The detector according to claim 1, wherein the photoconductive material is an organic photoconductive material, wherein the organic photoconductive material comprises a compound selected from the group consisting of: phthalocyanines, naphthalocyanines, subphthalocyanines, perylenes, anthracenes, pyrenes, oligo- and polythiophenes, fullerenes, indigoid dyes, bis-azo pigments, squarylium dyes, thiapyrilium dyes, azulenium dyes, dithioketo-pyrrolopyrroles, quinacridones, dibromoanthanthrone, polyvinylcarbazole, derivatives and combinations thereof and/or a mixture comprising an electron donor material and an electron acceptor material.

14. The detector according to claim 13, wherein the electron donor material comprises an organic donor polymer.

15. The detector according to claim 1, wherein the at least one longitudinal optical sensor comprises at least one transparent longitudinal optical sensor.

16. The detector according to claim 1, wherein the detector comprises at least one stack of at least two longitudinal optical sensors.

17. The detector according to claim 1, wherein the detector comprises at least one array of at least two longitudinal optical sensors, wherein the array is arranged perpendicular to the optical axis.

18. The detector according to claim 1, wherein the longitudinal optical sensor is furthermore designed in such a manner that the illumination of the sensor region by the light beam additionally causes an increase in temperature of the sensor region, wherein the electrical conductivity in the sensor region, given the same total power of the illumination, is further dependent on the temperature of the sensor region, wherein the longitudinal sensor signal, given the same total power of the illumination, is further dependent on the temperature in the sensor region.

19. The detector according to claim 1, further comprising:
at least one transversal optical sensor, the transversal optical sensor being adapted to determine a transversal position of the light beam traveling from the object to the detector, the transversal position being a position in at least one dimension perpendicular an optical axis of the detector, the transversal optical sensor being adapted to generate at least one transversal sensor signal,
wherein the evaluation device is further designed to generate at least one item of information on a transversal position of the object by evaluating the transversal sensor signal.

20. The detector according to claim 19, wherein the at least one transversal optical sensor comprises at least one transparent transversal optical sensor.

21. The detector according to claim 1, wherein the detector further comprises at least one imaging device which is a camera.

22. A method for an optical detection of at least one object, the method comprising:
generating at least one longitudinal sensor signal by using at least one longitudinal optical sensor, wherein the longitudinal sensor signal is dependent on an illumination of a sensor region of the longitudinal optical sensor by a light beam, wherein the longitudinal sensor signal, given the same total power of the illumination, is dependent on a beam cross-section of the light beam in the sensor region, wherein the sensor region comprises at least one photoconductive material, wherein an electrical conductivity of the photoconductive material in the sensor region, given the same total power of the illumination, is dependent on the beam cross-section of the light beam in the sensor region, wherein the longitudinal sensor signal is dependent on the electrical conductivity; and
generating at least one item of information on a longitudinal position of the object by evaluating the longitudinal sensor signal of the longitudinal optical sensor.

* * * * *

UNITED STATES PATENT AND TRADEMARK OFFICE
CERTIFICATE OF CORRECTION

PATENT NO. : 10,775,505 B2
APPLICATION NO. : 15/547664
DATED : September 15, 2020
INVENTOR(S) : Sebastian Valouch et al.

It is certified that error appears in the above-identified patent and that said Letters Patent is hereby corrected as shown below:

On the Title Page

Column 1, Item (51), under "Int. Cl.", Lines 1-2, delete
"*G01S 17/66*  (2006.01)
*G01S 7/481*  (2006.01)" and insert -- *G01S 17/66*  (2006.01) --, therefor.

Column 1, Item (51), under "Int. Cl.", Lines 1-10, delete
"*H01L 31/09*  (2006.01)
*H01L 27/30*  (2006.01)
*H01L 27/146*  (2006.01)
*H01L 31/0224*  (2006.01)
*A63F 13/213*  (2014.01)
*A63F 13/30*  (2014.01)
*A63F 13/655*  (2014.01)
*G01S 17/06*  (2006.01)
*H01L 51/42*  (2006.01)
*H01L 51/00*  (2006.01)".

On Page 5, Column 1, Item (56), under "OTHER PUBLICATIONS", Line 2, delete "p." and insert -- pp. --, therefor.

On Page 5, Column 1, Item (56), under "OTHER PUBLICATIONS", Line 5, delete "p." and insert -- pp. --, therefor.

On Page 5, Column 2, Item (56), under "OTHER PUBLICATIONS", Line 2, delete "p." and insert -- pp. --, therefor.

On Page 5, Column 2, Item (56), under "OTHER PUBLICATIONS", Line 3, delete "Preiiminary Report on Patentabiiity" and insert -- Preliminary Report on Patentability --, therefor.

Signed and Sealed this
Second Day of March, 2021

Drew Hirshfeld
*Performing the Functions and Duties of the
Under Secretary of Commerce for Intellectual Property and
Director of the United States Patent and Trademark Office*

CERTIFICATE OF CORRECTION (continued)
U.S. Pat. No. 10,775,505 B2

On Page 5, Column 2, Item (56), under "OTHER PUBLICATIONS", Line 31, delete "p." and insert -- pp. --, therefor.

On Page 6, Column 1, Item (56), under "OTHER PUBLICATIONS", Line 6, delete "p." and insert -- pp. --, therefor.

On Page 6, Column 1, Item (56), under "OTHER PUBLICATIONS", Line 52, delete "p." and insert -- pp. --, therefor.

On Page 7, Column 1, Item (56), under "OTHER PUBLICATIONS", Line 45, delete "Applications",Electrical" and insert -- Applications", Electrical --, therefor.

On Page 7, Column 1, Item (56), under "OTHER PUBLICATIONS", Line 48, delete "al,," and insert -- al., --, therefor.

On Page 7, Column 2, Item (56), under "OTHER PUBLICATIONS", Line 6, delete "Manfacturers" and insert -- Manufacturers --, therefor.

On Page 8, Column 2, Item (56), under "OTHER PUBLICATIONS", Lines 48-49, delete "Uriel Levy et al., "Tunable Optofluidic Devices," Microfluid Nanofluid (2008) 4:97-105.".

In the Specification

Column 2, Line 22, delete "Theo-charous," and insert -- Theocharous, --; and
    Lines 36-37, delete "Theo-charous," and insert -- Theocharous, --.

Column 5, Line 20, delete "CODs" and insert -- CQDs --.

Column 9, Line 22, delete "FP" and insert -- FiP --.

Column 15, Line 65, delete "quarternary" and insert -- quaternary --.

Column 20, Lines 14-16, delete " 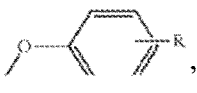 " and insert --  --.

Column 24, Line 39, delete "diketopyrrolopyrrol" and insert -- diketopyrrolopyrrole --;
    Line 43, delete "diketopyrrolopyrrol" and insert -- diketopyrrolopyrrole --;
    Lines 46-47, delete "diketopyrrolopyrrol" and insert -- diketopyrrolopyrrole --;
    Line 49, delete "diketopyrrolopyrrol" and insert -- diketopyrrolopyrrole --; and
    Lines 50-51, delete "diketopyrrolopyrrol" and insert -- diketopyrrolopyrrole --.

Column 30, Line 15, delete "In" and insert -- in --.

Column 32, Line 43, delete "quarternary" and insert -- quaternary --.

Column 33, Line 1, delete "ternay" and insert -- ternary --.

Column 35, Line 29, delete "Specifically" and insert -- Specifically, --.

Column 36, Line 65, delete "particular" and insert -- particular, --.

Column 42, Line 35, delete "particular" and insert -- particular, --.

Column 43, Line 15, delete "Least" and insert -- least --.

Column 50, Line 7, delete "comprising" and insert -- comprising: --.

Column 53, Lines 10-11, delete "at at" and insert -- at --.

Column 54, Line 2, delete "handleablity" and insert -- handleability --.

Column 57, Line 37, delete "butyiamine." and insert -- butylamine. --.

Column 65, Line 36, delete "Therefore" and insert -- Therefore, --.

Column 88, Line 16, delete "at at" and insert -- at --.

Column 90, Line 30, delete "a an" and insert -- an --.

Column 91, Line 49, delete "invention." and insert -- invention; --.

Column 95, Line 16, delete "a 80:20 wt %" and insert -- an 80:20 wt. % --.

Column 96, Line 65, delete "4A to D" and insert -- 4A to 4D --.

Column 97, Line 14, delete "3A to C," and insert -- 3A to 3C, --.

Column 98, Line 20, delete "wt %" and insert -- wt. % --.

Column 99, Line 14, delete "wt %" and insert -- wt. % --.

Column 104, Line 48, delete "particular" and insert -- particular, --.

Column 108, Line 41, delete "FIG." and insert -- FIGS. --.

Column 111, Line 5, delete "FIG." and insert -- FIGS. --.

In the Claims

Column 116, Line 28, Claim 10, delete "quarternary," and insert -- quaternary, --.